US012703715B2

(12) United States Patent
Yan et al.

(10) Patent No.: US 12,703,715 B2
(45) Date of Patent: Aug. 11, 2026

(54) ORGANOMETALLIC COMPOUND AND APPLICATION THEREOF

(71) Applicant: GUANGDONG AGLAIA OPTOELECTRONIC MATERIALS CO., LTD, Foshan (CN)

(72) Inventors: Liangliang Yan, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 775 days.

(21) Appl. No.: 18/030,964

(22) PCT Filed: Aug. 15, 2021

(86) PCT No.: PCT/CN2021/112646
§ 371 (c)(1),
(2) Date: Apr. 7, 2023

(87) PCT Pub. No.: WO2022/088853
PCT Pub. Date: May 5, 2022

(65) Prior Publication Data
US 2024/0051980 A1 Feb. 15, 2024

(30) Foreign Application Priority Data
Oct. 28, 2020 (CN) ......................... 202011167564.6

(51) Int. Cl.
*C07F 15/00* (2006.01)
*H10K 50/12* (2023.01)
(Continued)

(52) U.S. Cl.
CPC ......... *C07F 15/0033* (2013.01); *H10K 50/12* (2023.02); *H10K 85/00* (2023.02); *H10K 85/342* (2023.02)

(58) Field of Classification Search
CPC .......................... H10K 85/342; C07F 15/0033
See application file for complete search history.

(56) References Cited

U.S. PATENT DOCUMENTS 6,687,266 B1 2/2004 Ma et al.
8,367,223 B2 2/2013 Xia et al.
(Continued)

FOREIGN PATENT DOCUMENTS

CN 1726606 A 1/2006
CN 102272261 A 12/2011
(Continued)

OTHER PUBLICATIONS

Huang et al. "Highly Phosphorescent Bis-Cyclometalated Iridium Complexes Containing Benzoimidazole-Based Ligands" (Chem. Mater. 2004, 16, 2480-2488).

*Primary Examiner* — Sean M DeGuire
(74) *Attorney, Agent, or Firm* — Maschoff Brennan

(57) ABSTRACT

The present disclosure relates to an organometallic compound and application thereof. The organometallic compound has a structure as shown in a formula (1). The compound provided by the present disclosure has the advantages of high optical and electrochemical stability, small half-peak width of emission spectrum, high color saturation, high luminous efficiency and long device service life, and can be used in organic electroluminescent devices. In par-
(Continued)

ticular, the compound has the potential for application in the AMOLED industry as a green light-emitting dopant.

(1)

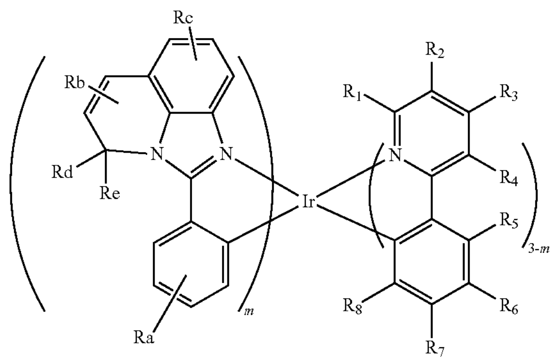

20 Claims, 2 Drawing Sheets

(51) Int. Cl.
*H10K 85/00* (2023.01)
*H10K 85/30* (2023.01)

(56) References Cited

U.S. PATENT DOCUMENTS

| | | | | |
|---|---|---|---|---|
| 10,211,413 | B2 | 2/2019 | Ma et al. | |
| 10,312,458 | B2 | 6/2019 | Kottas et al. | |
| 2013/0341599 | A1* | 12/2013 | Xia | H10K 85/342 546/4 |
| 2017/0040552 | A1 | 2/2017 | Xia et al. | |

FOREIGN PATENT DOCUMENTS

| | | | |
|---|---|---|---|
| CN | 102898477 | A | 1/2013 |
| CN | 102939295 | A | 2/2013 |
| CN | 103254238 | A | 8/2013 |
| CN | 103396455 | A | 11/2013 |
| WO | 2012/020327 | A1 | 2/2012 |

* cited by examiner

ORGANOMETALLIC COMPOUND AND APPLICATION THEREOF

TECHNICAL FIELD

The present disclosure relates to the technical field of organic electroluminescence, in particular to an organic light-emitting material applicable to organic electroluminescent devices, and specially in particular to an organometallic compound and application thereof to an organic electroluminescent device.

BACKGROUND

At present, as a new-generation display technology, an organic electroluminescent device (OLED) has attracted more and more attention in display and lighting technologies, thus having a wide application prospect. However, compared with market application requirements, properties, such as luminous efficiency, driving voltage, and service life of the OLED still need to be strengthened and improved.

In generally, the OLED includes various organic functional material films with different functions sandwiched between metal electrodes as basic structures, which are similar to a sandwich structure. Under the driving of a current, holes and electrons are injected from a cathode and an anode, respectively. After moving a certain distance, the holes and the electrons are compounded in a light-emitting layer, and then released in the form of light or heat to achieve luminescence of the OLED.

However, organic functional materials are core components of the OLED, and the thermal stability, photochemical stability, electrochemical stability, quantum yield, film forming stability, crystallinity, and color saturation of the materials are main factors affecting properties of the device.

Generally, the organic functional materials include fluorescent materials and phosphorescent materials. The fluorescent materials are usually organic small-molecule materials, which can only utilize 25% of a singlet state for luminescence, so that the luminous efficiency is relatively low. Meanwhile, due to an earth-spin orbit coupling effect caused by a heavy atom effect, the phosphorescent materials can utilize 25% of a singlet state and can also utilize 75% of the energy of triplet excitons, so that the luminous efficiency can be improved. However, compared with the fluorescent materials, the phosphorescent materials are started later, and the thermal stability, service life, and color saturation of the materials need to be improved. Thus, the phosphorescent materials are a challenging topic. Various organometallic compounds have been developed to serve as the phosphorescent materials. For example, according to a patent for invention (CN1726606), an aryl-benzimidazole iridium compound is disclosed. However, the luminous efficiency of such compound is far from enough to meet market demands. According to a non-patent document published by Wen et al. (Chem. Mater. 2004, 16, 2480-2488) in 2004, a benzimidazole-aromatic ring metallic iridium complex is disclosed. Although the complex has certain luminous efficiency, market application demands are difficult to meet due to too large half-peak width of the material and too short device service life, especially too short T95 service life, and the material needs to be further improved. According to a patent document for invention (CN102272261), an iridium compound connected with aryl-substituted benzimidazole having steric hindrance on N is disclosed. However, the color saturation, half-peak width of emission spectrum and device properties, especially luminous efficiency and device service life, of the compound need to be improved. According to a patent document for invention (CN103396455), an iridium compound connected with alkyl-substituted benzimidazole on N is disclosed. Similarly, the compound also has problems such as poor color saturation, too large half-peak width of emission spectrum, insufficient device efficiency and short device service life, and needs to be improved. According to a patent document for invention (CN103254238), an iridium compound connected with aryl-substituted benzimidazoline-dibenzoheterocycle having steric hindrance on N is disclosed. However, the compound also has related problems of too large half-peak width of emission spectrum, insufficient device efficiency and short device service life, and needs to be improved. According to a patent document for invention (CN102898477), an iridium compound as shown as

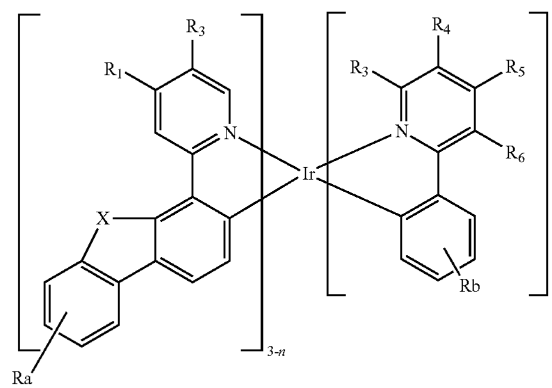

is disclosed. However, the compound also has related problems of too large half-peak width of emission spectrum, insufficient device efficiency and short device service life, and needs to be improved.

SUMMARY

In order to overcome the above defects, the present disclosure provides an organic electroluminescent device with high properties and an organometallic compound material capable of realizing the organic electroluminescent device.

An organometallic compound of the present disclosure has the following structure as shown in a formula (1). An iridium complex provided by the present disclosure has the advantages of great optical and electrical stability, small half-peak width of emission spectrum, high luminous efficiency, long service life and high color saturation, and can be used in organic light-emitting devices. In particular, the compound has the potential for application in the AMOLED industry as a green light-emitting phosphorescent material.

An organometallic compound has a structure formula as shown in the following formula (1):

(1)

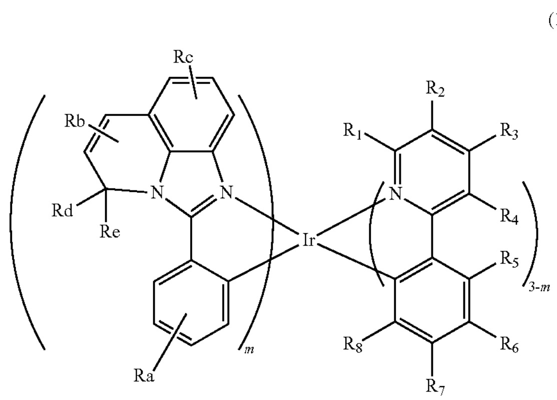

where

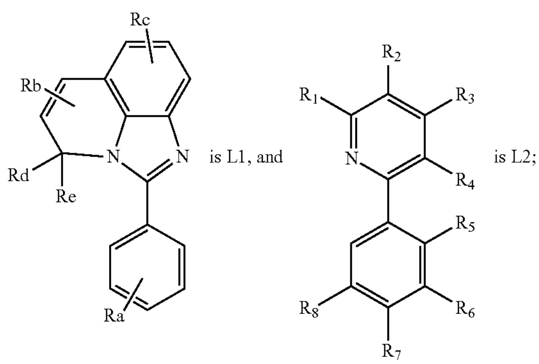

is L1, and is L2;

m is 1, 2, or 3, and when m is 1, the two L2 are the same or different;

the number of Ra, Rb and Rc is from 1 to a maximum substitution number;

Ra, Rb, Rc, Rd and Re are independently selected from hydrogen, deuterium, halogen, substituted or unsubstituted $C_1$-$C_{10}$ alkyl, substituted or unsubstituted $C_3$-$C_{20}$cycloalkyl, substituted or unsubstituted $C_6$-$C_{18}$ aryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl;

$R_1$-$R_8$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$heteroalkyl, substituted or unsubstituted $C_3$-$C_{20}$cycloalkyl, substituted or unsubstituted $C_2$-$C_{10}$ alkenyl, substituted or unsubstituted $C_2$-$C_{10}$alkynyl, substituted or unsubstituted $C_6$-$C_{18}$ aryl, substituted or unsubstituted $C_2$-$C_{17}$heteroaryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl, or two adjacent groups of $R_1$-$R_8$ may be connected with each other to form an aliphatic ring structure or an aromatic ring structure;

the heteroalkyl and the heteroaryl at least contain one O, N or S heteroatom;

and the "substituted" refers to substitution with deuterium, F, Cl, Br, $C_1$-$C_6$ alkyl, $C_3$-$C_6$cycloalkyl, amino substituted with $C_1$-$C_6$ alkyl, nitrile, isonitrile, or phosphino, and the substitution ranges from a single substitution number to a maximum substitution number.

When the m is 1 or 2, the two L1 or the two L2 are the same.

As a preferred organometallic compound, the Ra, the Rd and the Re are hydrogen.

As a preferred organometallic compound, at least one of the $R_1$-$R_4$ is not hydrogen.

As a preferred organometallic compound, at least one of the $R_5$-$R_8$ is not hydrogen.

As a preferred organometallic compound, at least one of the $R_1$-$R_4$ is not hydrogen, and at least one of the $R_5$-$R_8$ is not hydrogen.

As a preferred organometallic compound, one of the $R_1$-$R_4$ is deuterium, $C_1$-$C_5$ alkyl substituted or unsubstituted with deuterium, or $C_3$-$C_5$cycloalkyl substituted or unsubstituted with deuterium, one of the $R_5$-$R_8$ is deuterium, $C_1$-$C_5$ alkyl substituted or unsubstituted with deuterium, or $C_3$-$C_5$cycloalkyl substituted or unsubstituted with deuterium, and the other groups are hydrogen.

As a preferred organometallic compound, the $R_5$ and the $R_6$, the $R_6$ and the $R_7$, or the $R_7$ and the $R_8$ are connected with each other to form a parallel ring structure as shown in a formula (2):

(2)

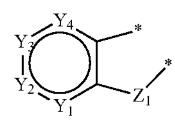

where * indicates a connecting position;

$Y_1$-$Y_4$ are independently $CR_0$ or N;

$Z_1$ is selected from O or S;

$R_0$ is independently hydrogen, deuterium, F, cyano, substituted or unsubstituted $C_1$-$C_{10}$ alkyl, substituted or unsubstituted $C_3$-$C_{20}$cycloalkyl, substituted or unsubstituted $C_2$-$C_{30}$ alkenyl, substituted or unsubstituted $C_2$-$C_{30}$alkynyl, substituted or unsubstituted $C_6$-$C_{30}$ aryl, substituted or unsubstituted $C_1$-$C_{30}$heteroaryl, substituted or unsubstituted tri-$C_1$-$C_{10}$ alkyl silyl, substituted or unsubstituted tri-$C_6$-$C_{30}$ aryl silyl, or substituted or unsubstituted di-$C_1$-$C_{10}$ alkyl mono-$C_6$-$C_{30}$ aryl silyl;

and the "substituted" refers to substitution with deuterium, F, Cl, Br, $C_1$-$C_4$ alkyl, $C_1$-$C_4$alkoxyl, $C_3$-$C_6$cycloalkyl, amino substituted with $C_1$-$C_4$ alkyl, nitrile, isonitrile, or phosphino.

As a preferred organometallic compound, the $R_4$ and the $R_5$ are connected with each other to form an aliphatic ring structure as shown in a formula (3):

(3)

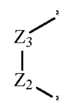

where * indicates a connecting position;

$Z_2$ and $Z_3$ are independently selected from O, S, $N(R_0)$ and $C(R_0)_2$, and at least one of the $Z_2$ and $Z_3$ is $C(R_0)_2$;

$R_0$ is independently hydrogen, deuterium, F, cyano, substituted or unsubstituted $C_1$-$C_{10}$ alkyl, substituted or unsubstituted $C_3$-$C_{20}$cycloalkyl, substituted or unsubstituted $C_2$-$C_{30}$ alkenyl, substituted or unsubstituted $C_2$-$C_{30}$alkynyl, substituted or unsubstituted $C_6$-$C_{30}$ aryl, substituted or unsubstituted $C_1$-$C_{30}$heteroaryl, substituted or unsubstituted tri-$C_1$-$C_{10}$ alkyl silyl, substituted or unsubstituted tri-$C_6$-$C_{30}$ aryl silyl, or substituted or unsubstituted di-$C_1$-$C_{10}$ alkyl mono-$C_6$-$C_{30}$ aryl silyl;

and the “substituted” refers to substitution with deuterium, F, Cl, Br, $C_1$-$C_4$ alkyl, $C_1$-$C_4$alkoxyl, $C_3$-$C_6$cycloalkyl, amino substituted with $C_1$-$C_4$ alkyl, nitrile, isonitrile, or phosphino.

As a preferred organometallic compound, at least one of the Rb and the Rc is not hydrogen.

As a preferred organometallic compound, at least one of the Rb and the Rc is substituted or unsubstituted $C_1$-$C_6$ alkyl, or substituted or unsubstituted $C_3$-$C_6$cycloalkyl.

As a preferred organometallic compound, at least one of the Rb and the Rc is substituted or unsubstituted $C_1$-$C_6$ alkyl, or substituted or unsubstituted $C_3$-$C_6$cycloalkyl, and the other group is hydrogen.

As a preferred organometallic compound, the L1 preferably has one of the following structural formulas, or is partially or completely deuterated or fluorinated correspondingly,

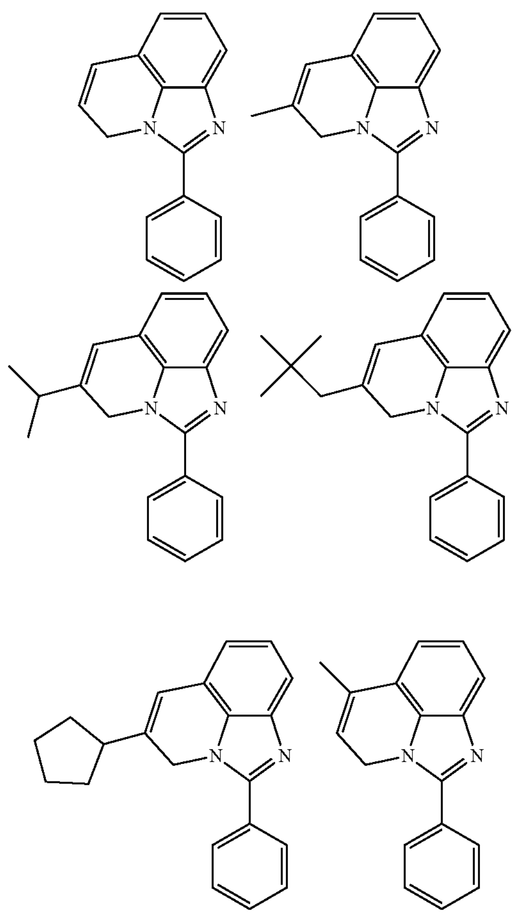

-continued

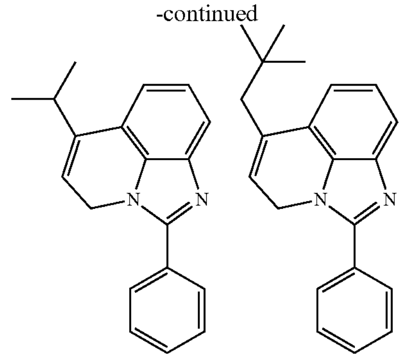

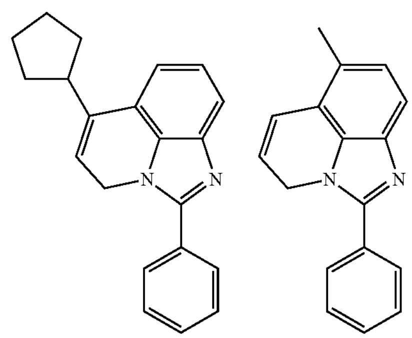

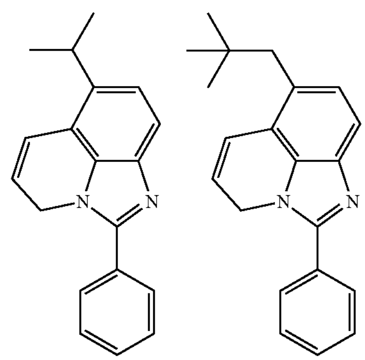

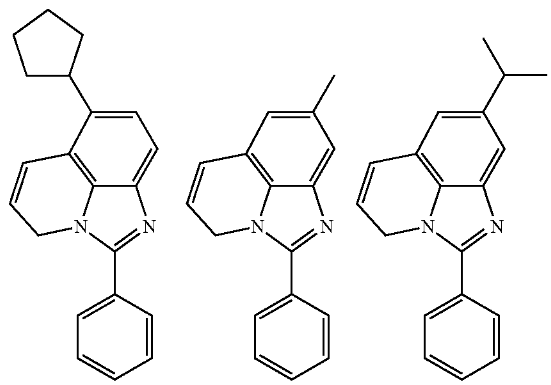

-continued
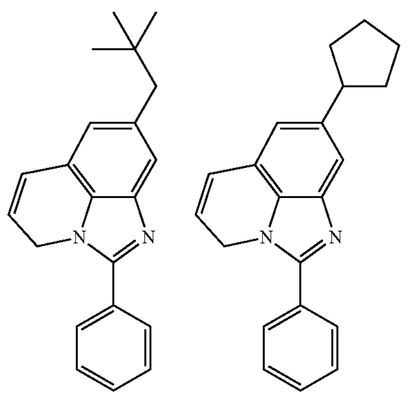
As a preferred organometallic compound, the L2 preferably has one of the following structural formulas, or is partially or completely deuterated or fluorinated correspondingly,
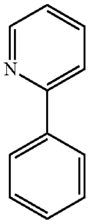
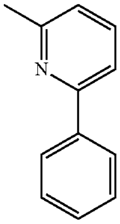
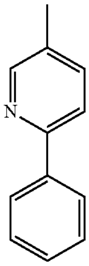
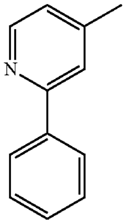
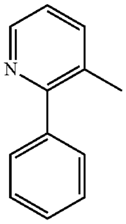
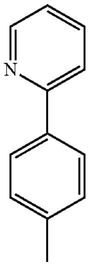
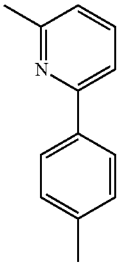
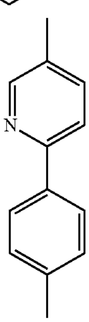
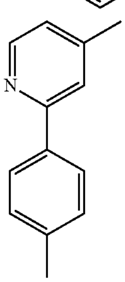
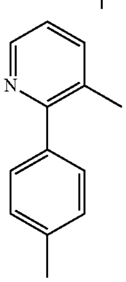
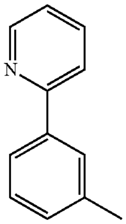
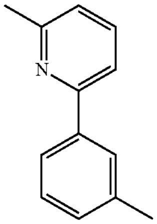
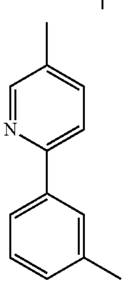
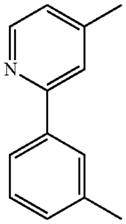
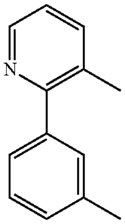
-continued
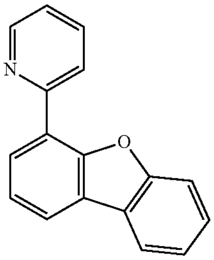
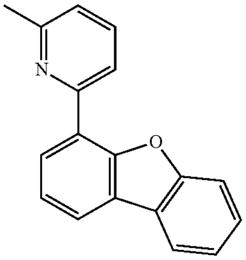
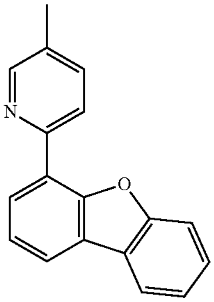
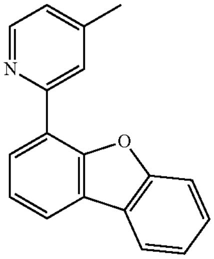
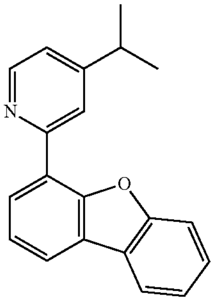
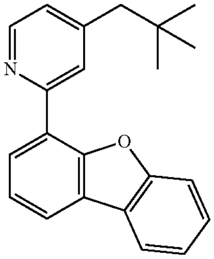
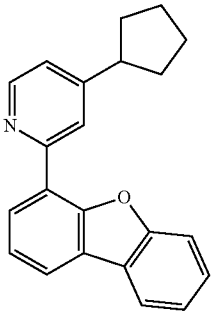
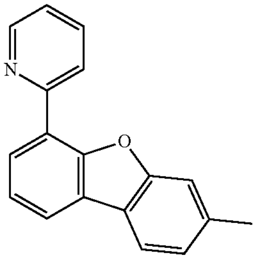
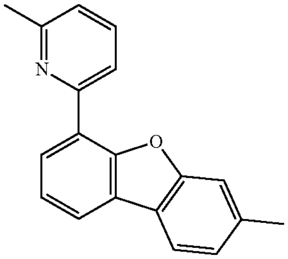
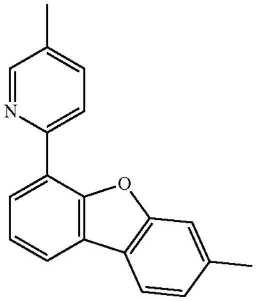

-continued
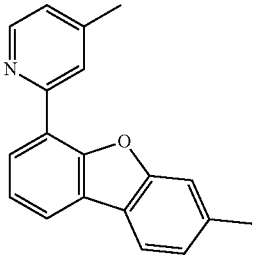
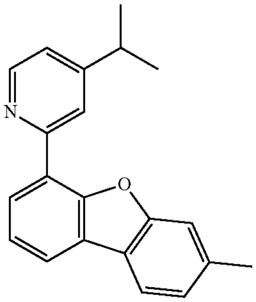
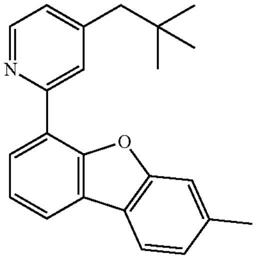
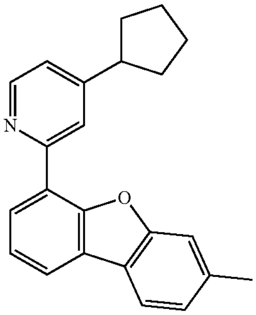
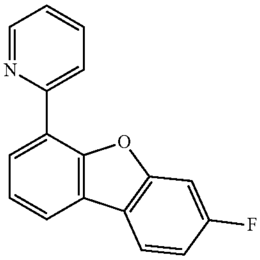
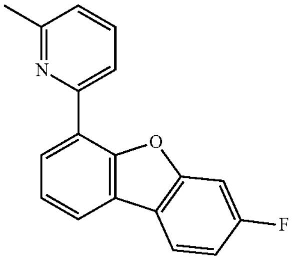
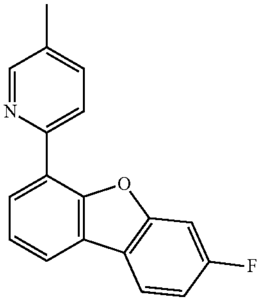
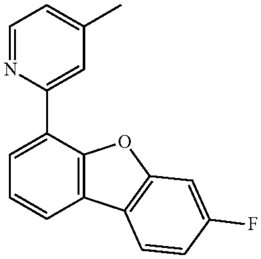
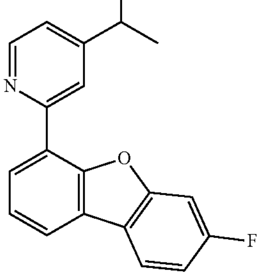
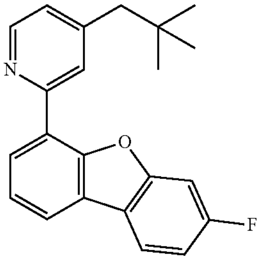
-continued
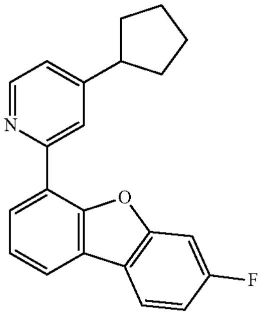
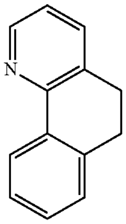
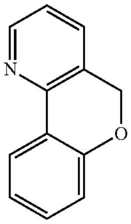
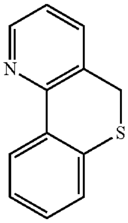
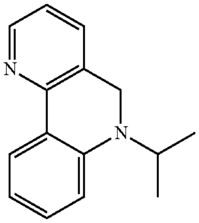
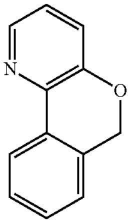
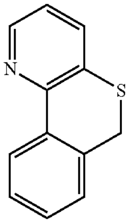
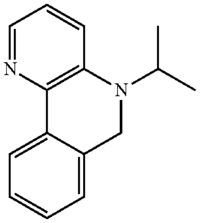
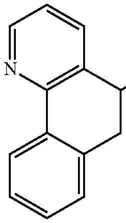
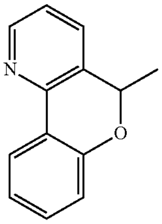
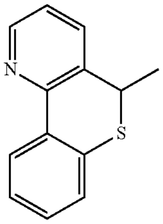
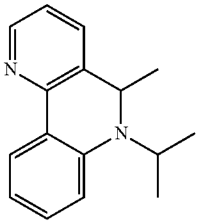
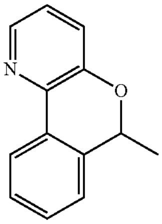
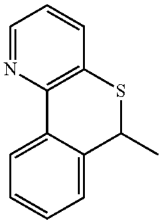
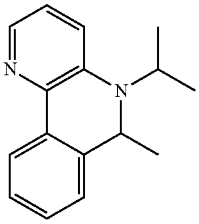
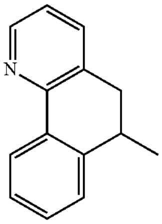
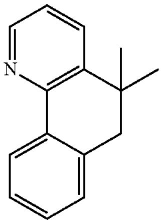
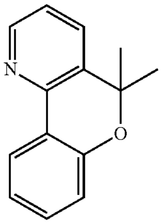
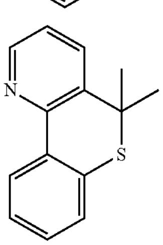
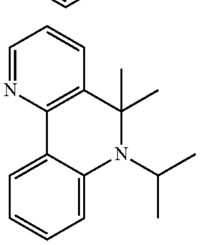
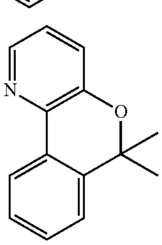

-continued
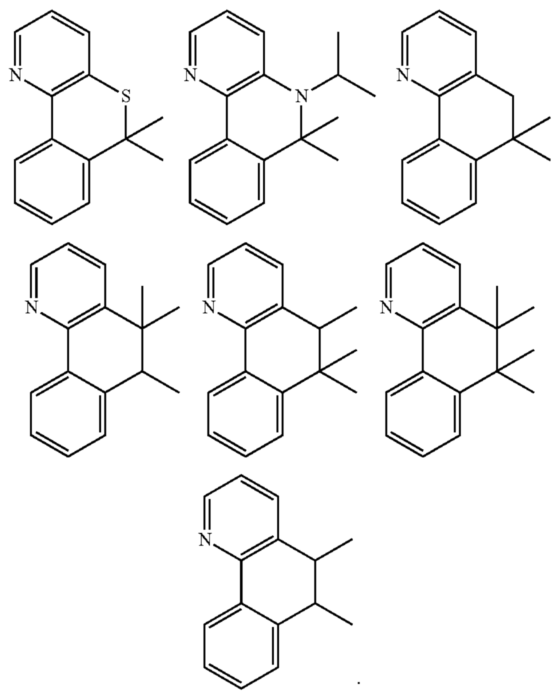
As a preferred organometallic compound, the compound as shown in the formula (1) preferably has one of the following structural formulas, or corresponding partial or complete deuterides thereof, or corresponding partial or complete fluorides thereof.
CPD 1
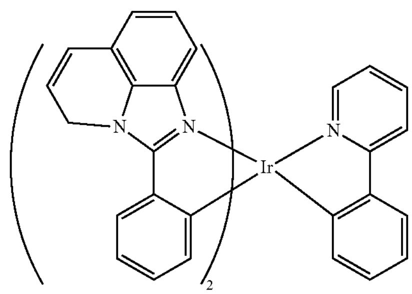
CPD 2
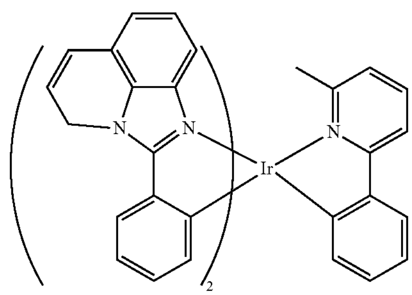
-continued
CPD 3
CPD 4
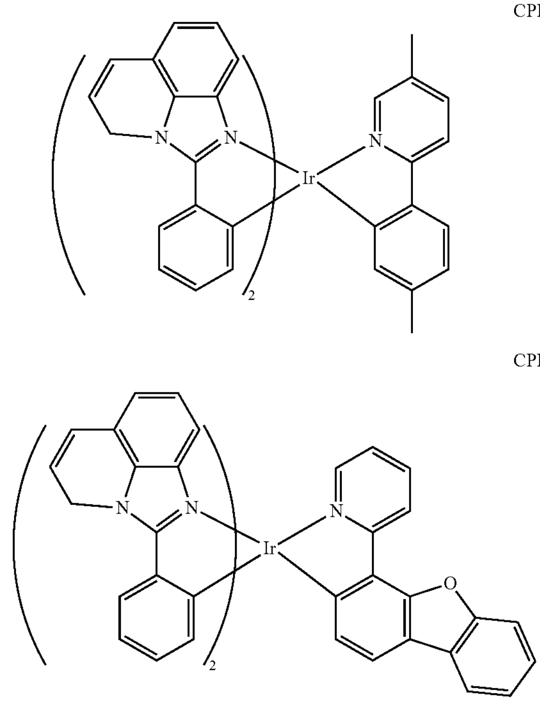
CPD 5
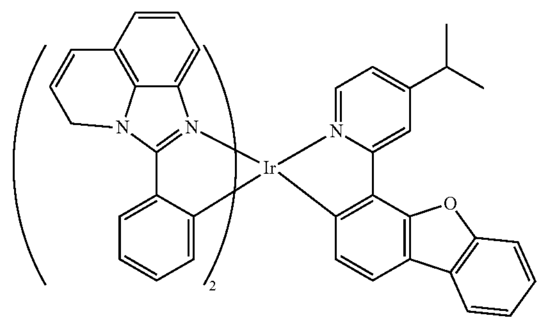
CPD 6
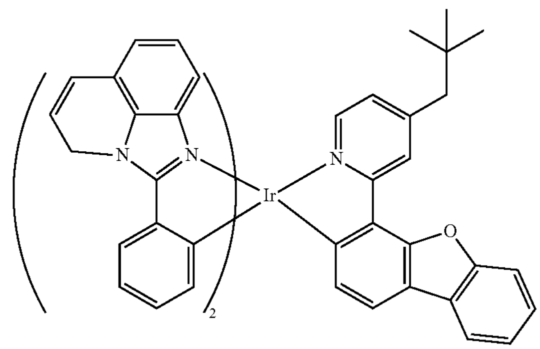

-continued
CPD 7
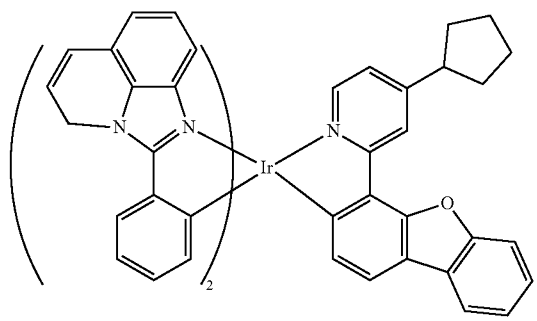
CPD 8
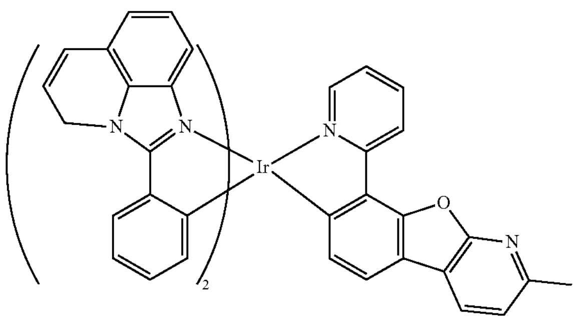
CPD 9
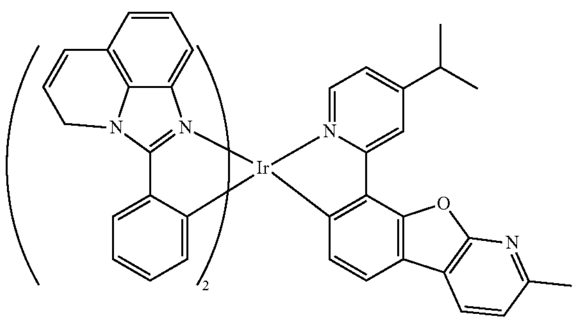
CPD 10
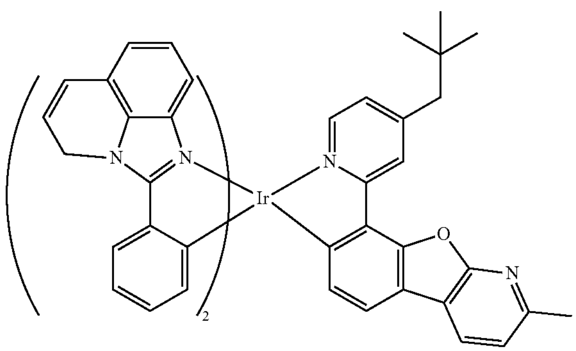
-continued
CPD 11
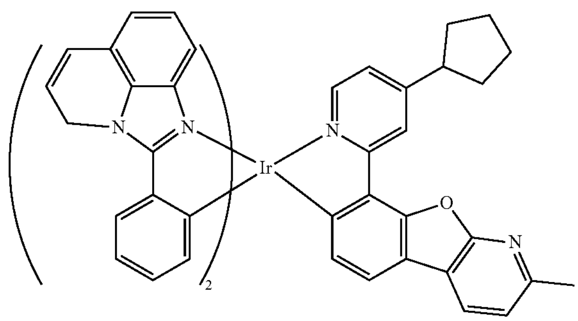
CPD 12
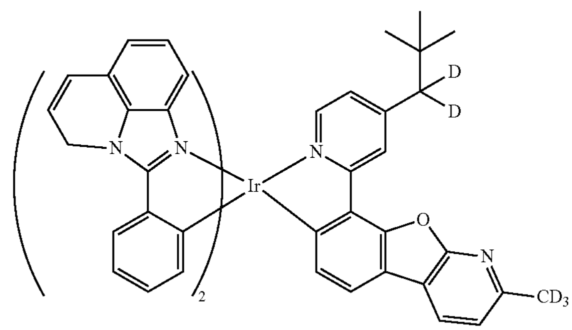
CPD 13
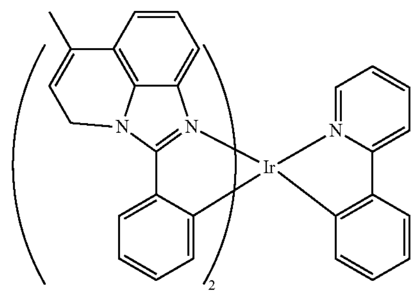
CPD 14
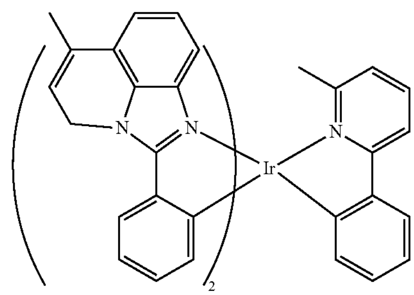
CPD 15
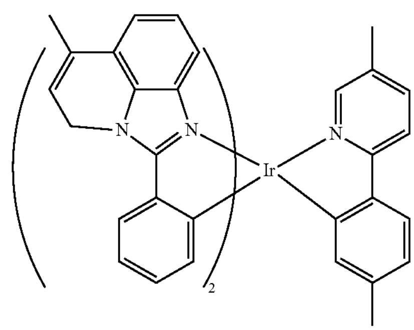

-continued
CPD 16
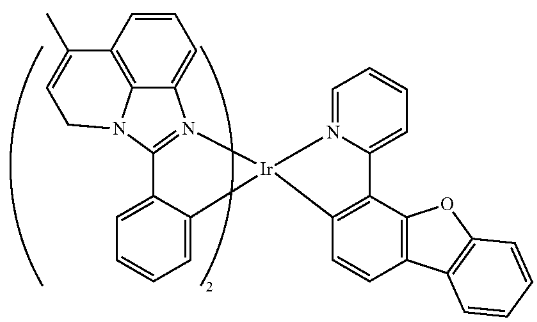
CPD 17
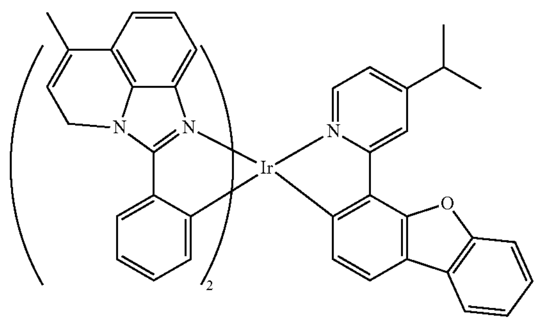
CPD 18
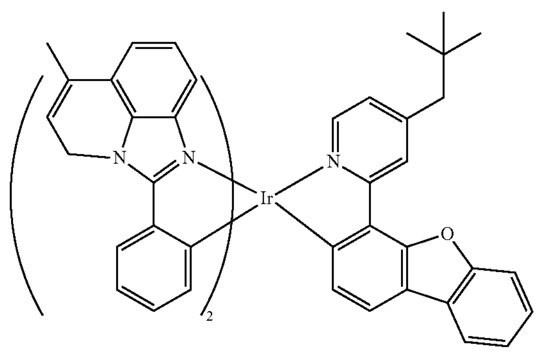
CPD 19
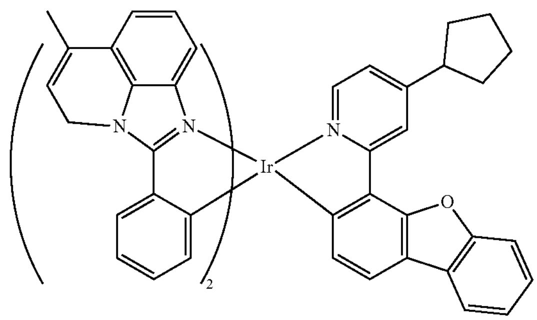
-continued
CPD 20
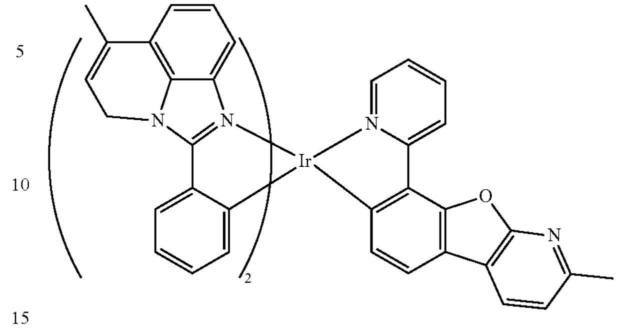
CPD 21
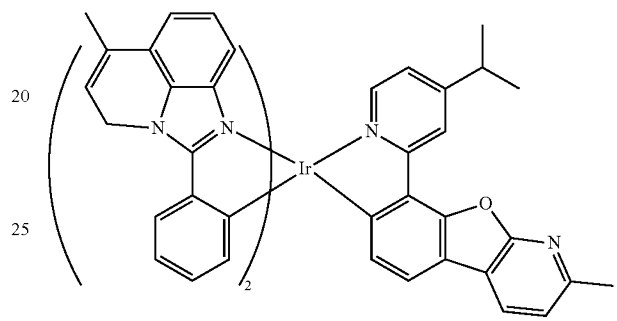
CPD 22
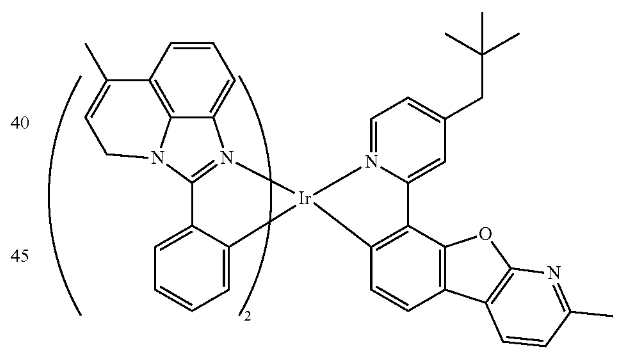
CPD 23
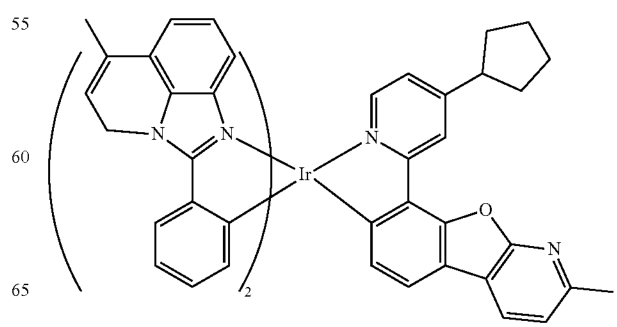

-continued
CPD 24
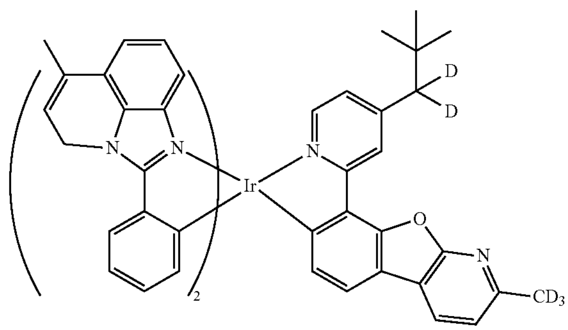
CPD 25
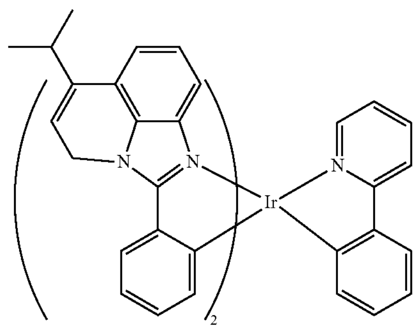
CPD 26
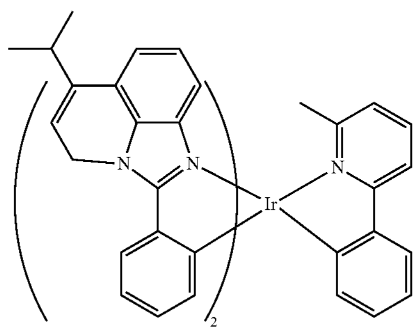
CPD 27
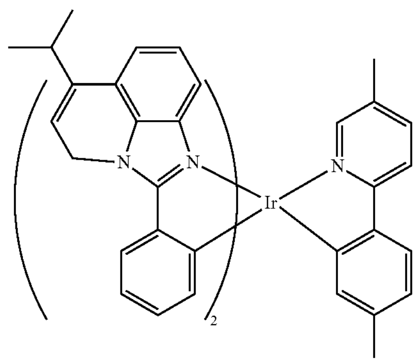
-continued
CPD 28
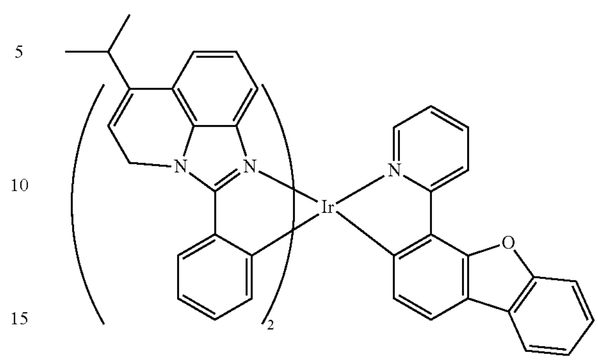
CPD 29
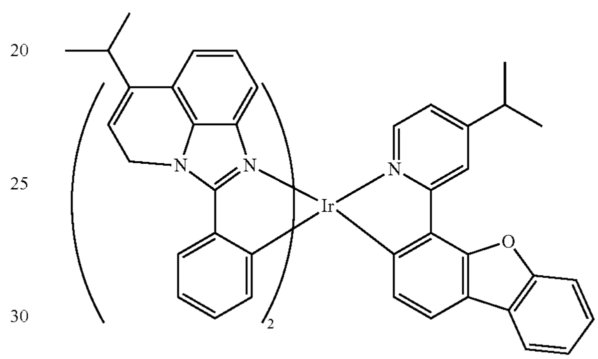
CPD 30
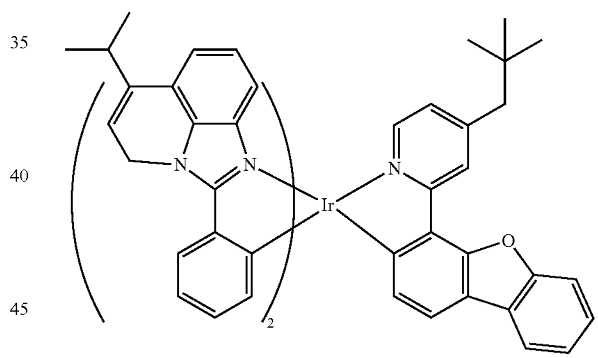
CPD 31
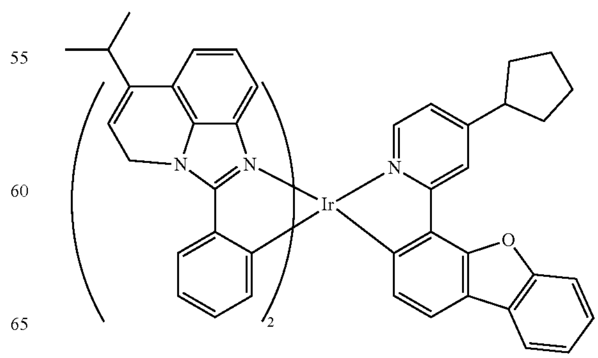

CPD 32
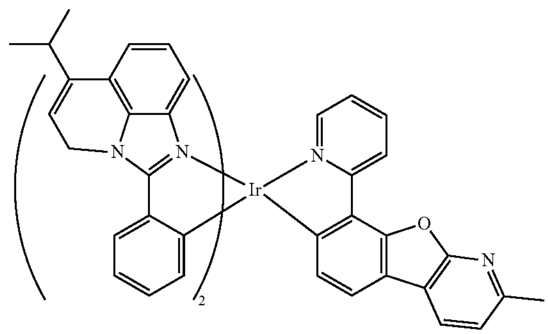
CPD 33
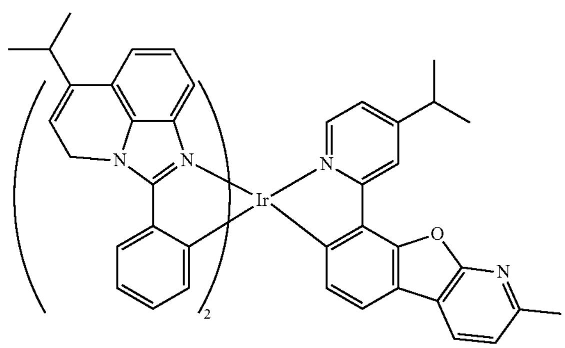
CPD 34
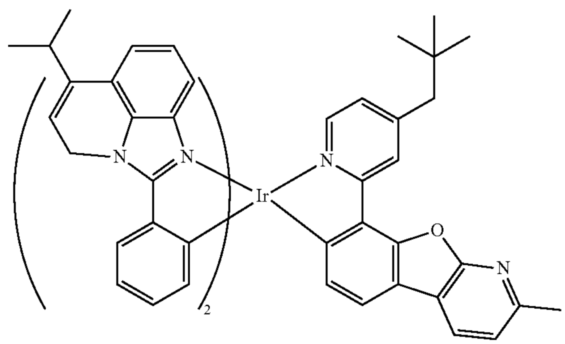
CPD 35
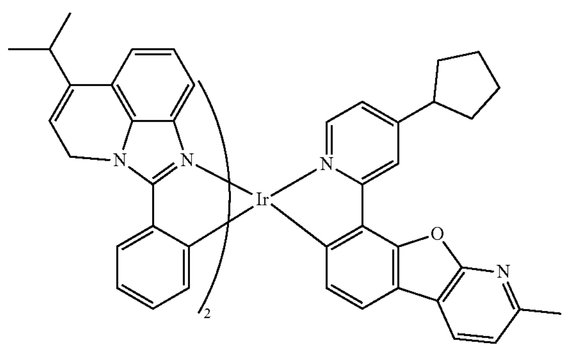
CPD 36
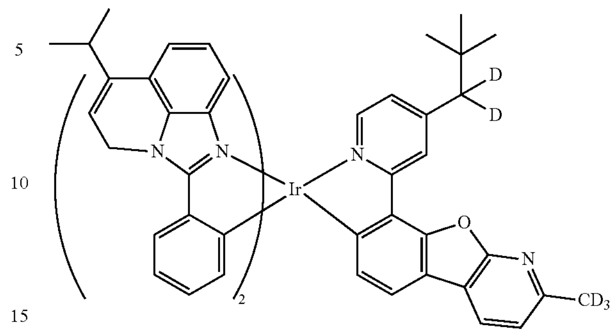
CPD 37
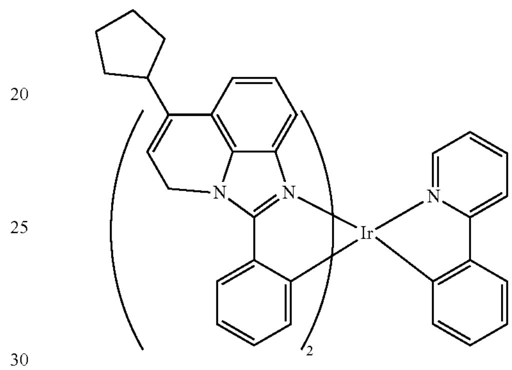
CPD 38
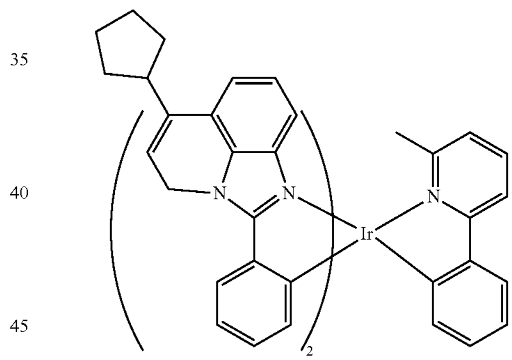
CPD 39
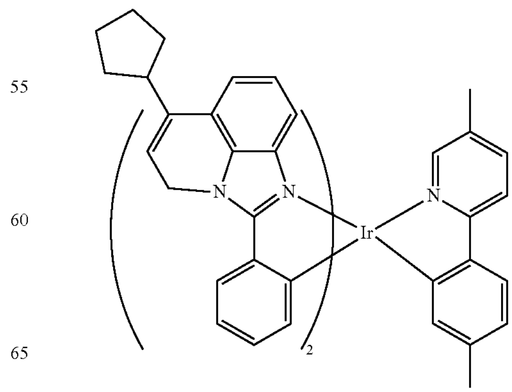

-continued
CPD 40
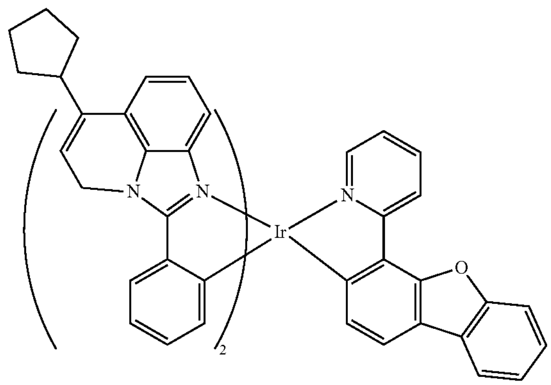
CPD 41
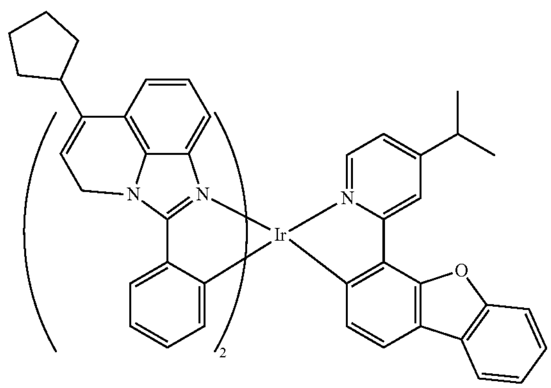
CPD 42
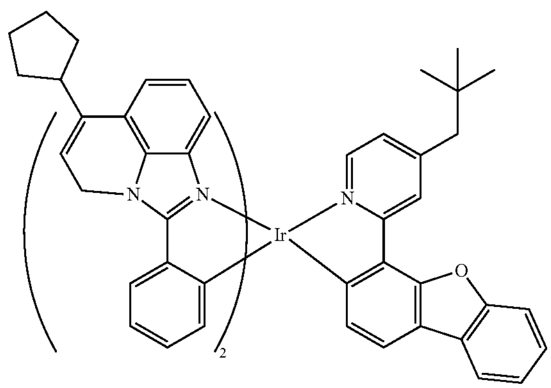
CPD 43
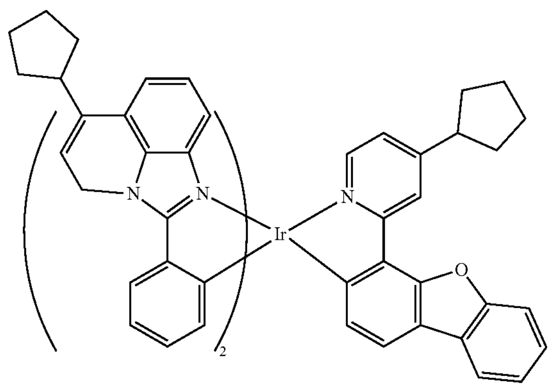
-continued
CPD 44
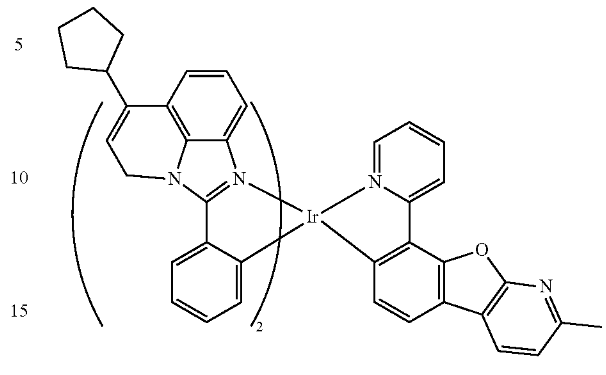
CPD 45
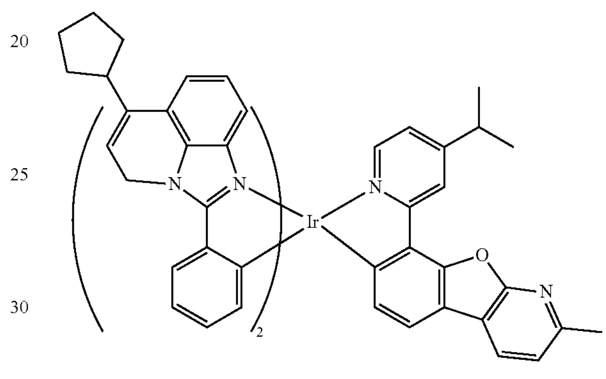
CPD 46
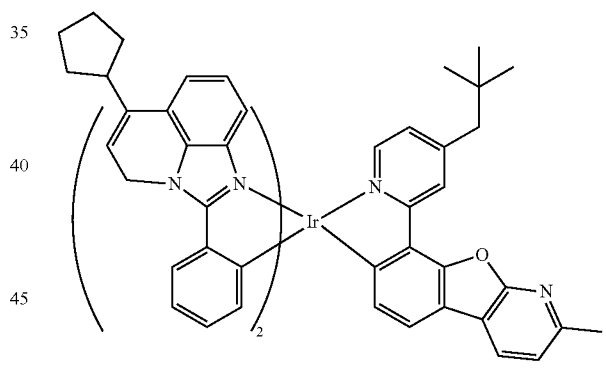
CPD 47
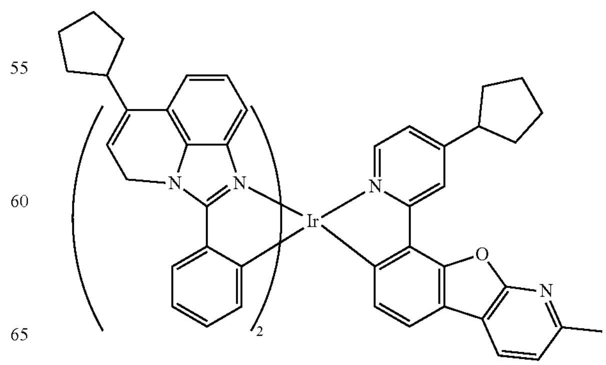

-continued
CPD 48
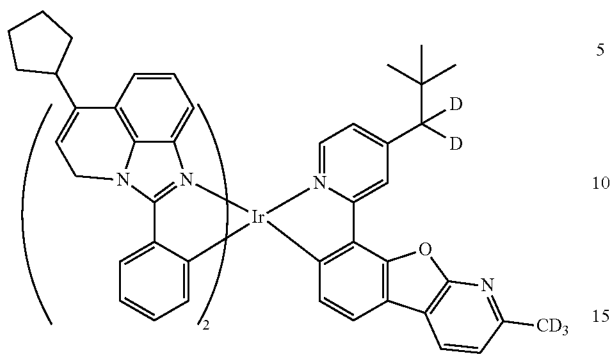
CPD 49
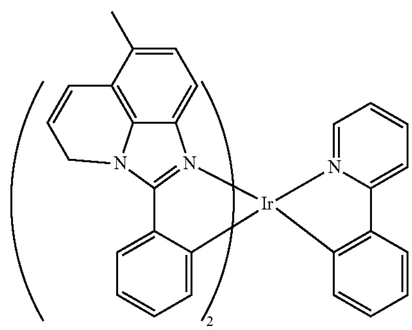
CPD 50
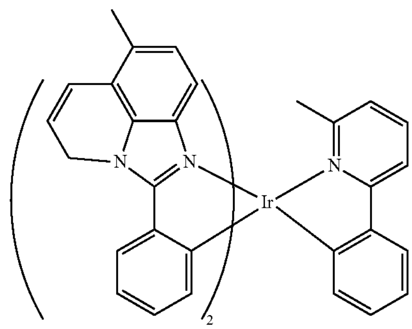
CPD 51
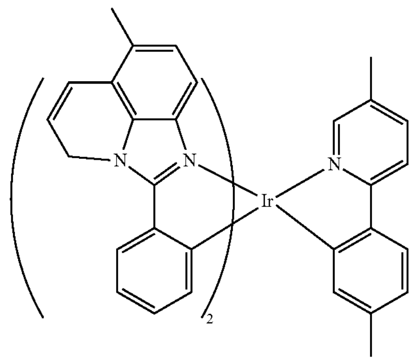
-continued
CPD 52
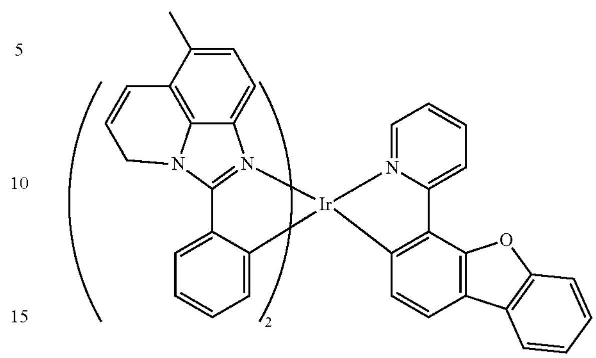
CPD 53
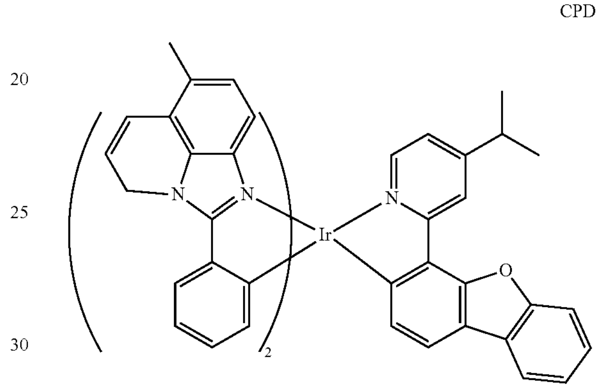
CPD 54
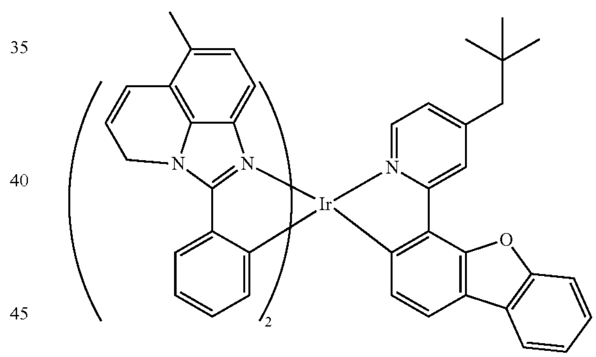
CPD 55
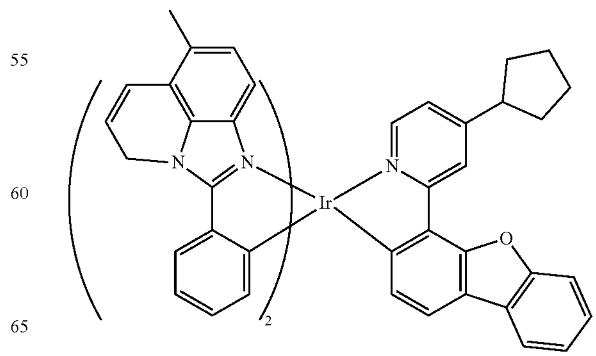

-continued
CPD 56
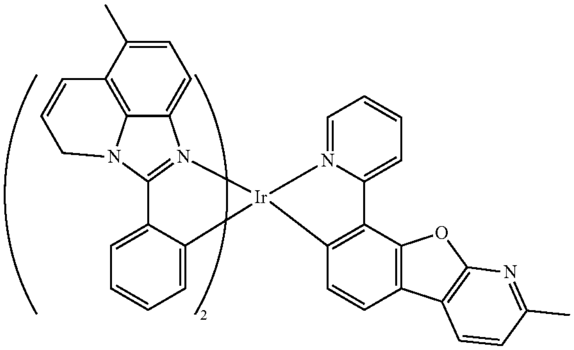
CPD 57
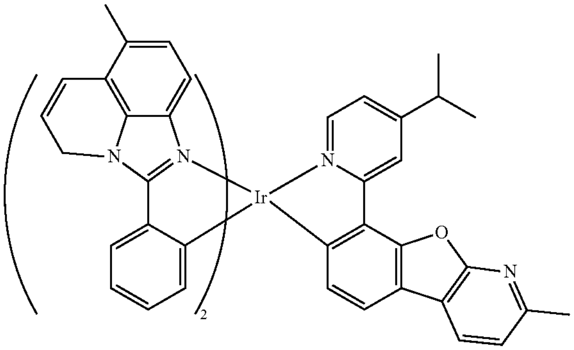
CPD 58
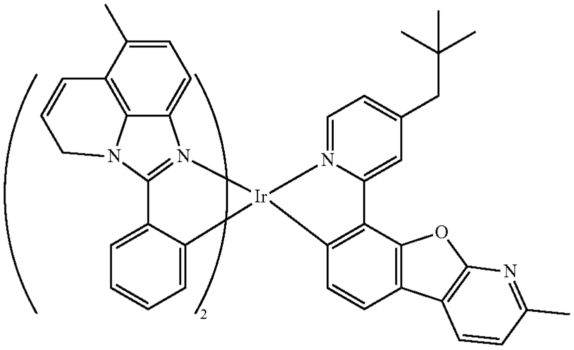
CPD 59
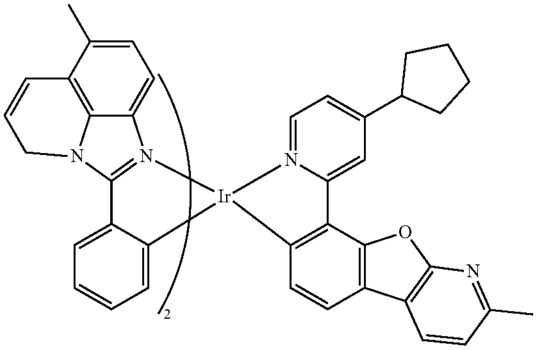
-continued
CPD 60
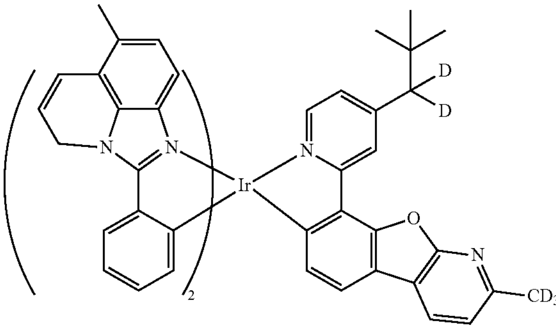
CPD 61
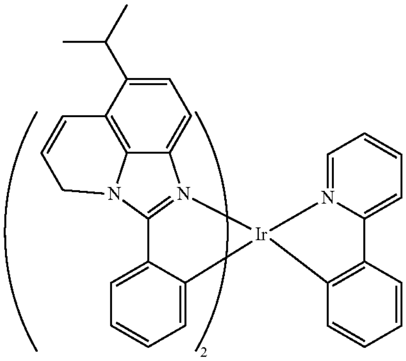
CPD 62
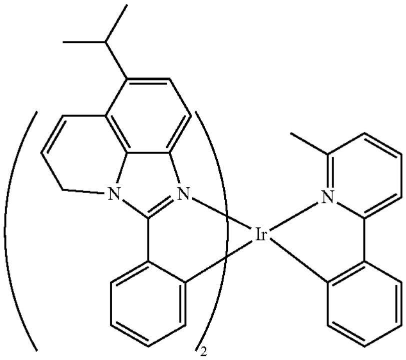
CPD 63
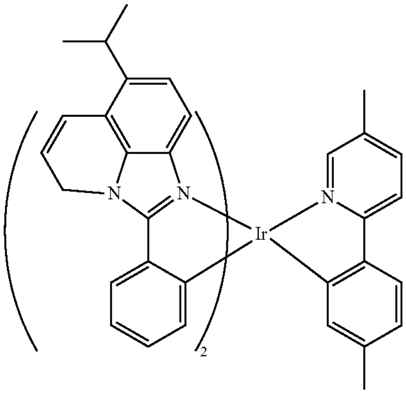

-continued
CPD 64
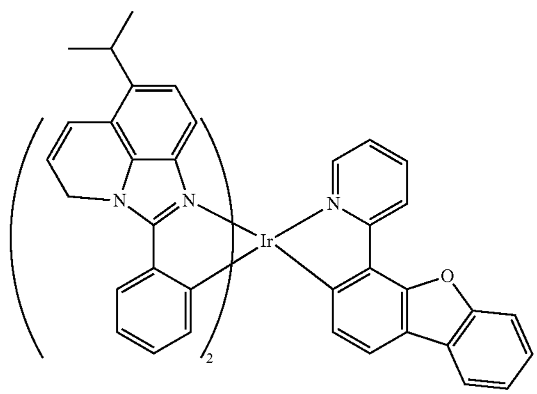
CPD 65
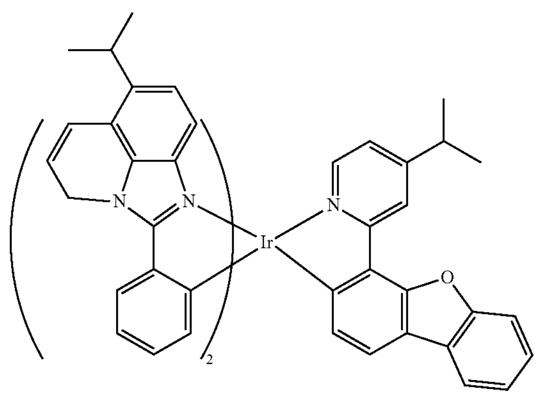
CPD 66
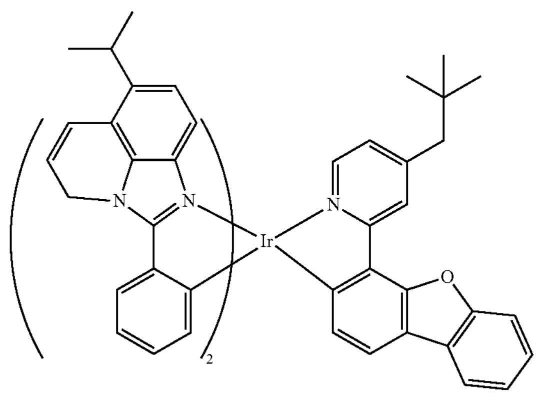
CPD 67
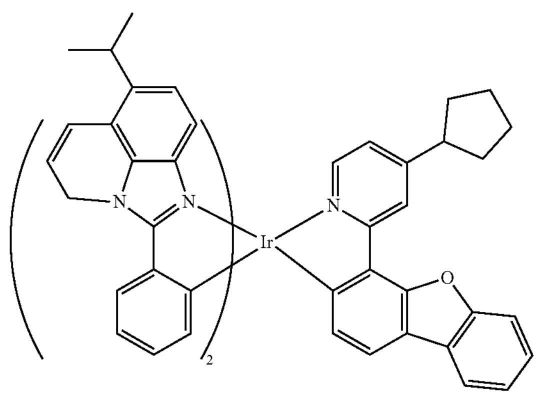
-continued
CPD 68
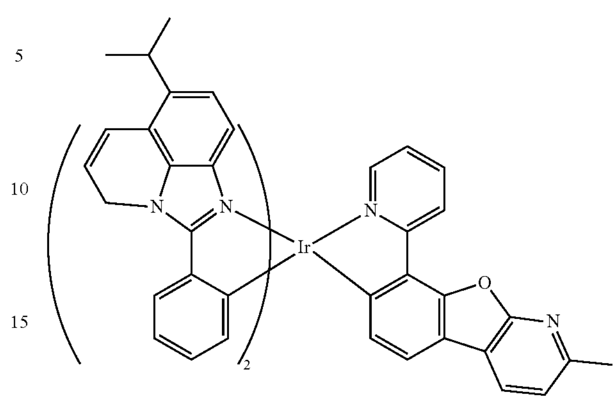
CPD 69
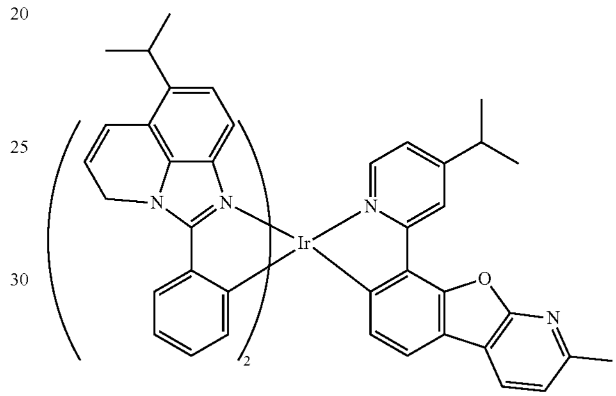
CPD 70
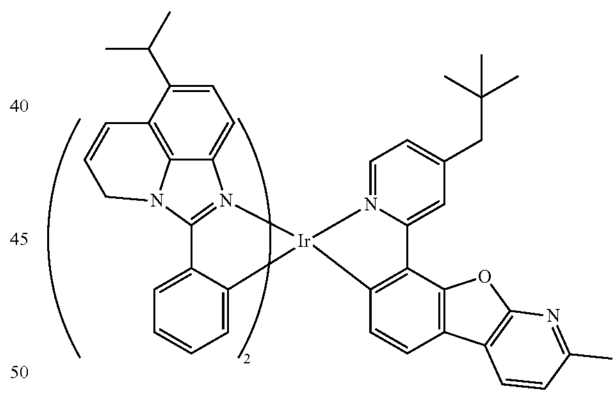
CPD 71
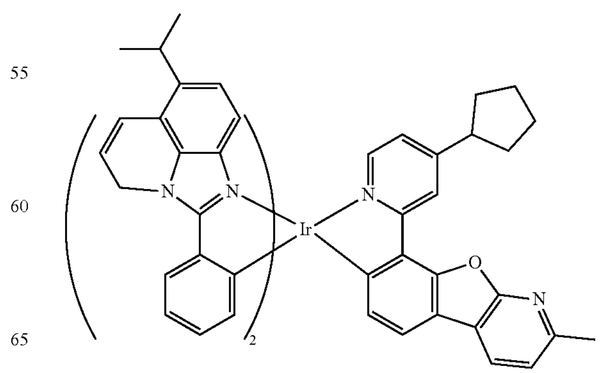

-continued
CPD 72
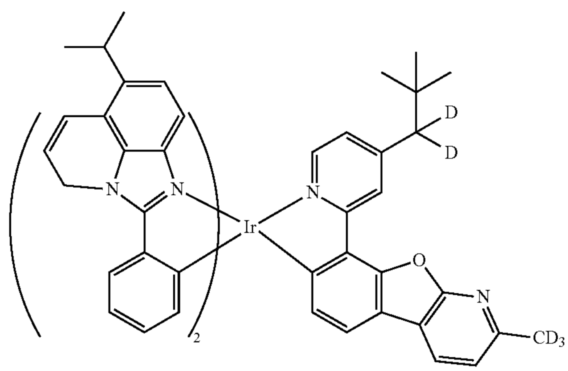
CPD 73
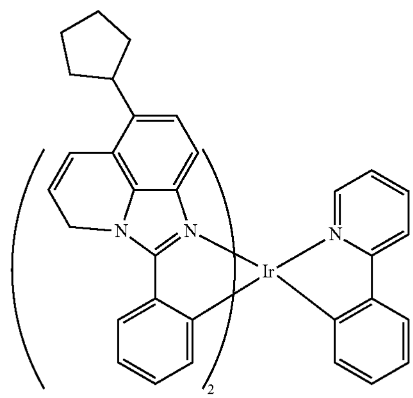
CPD 74
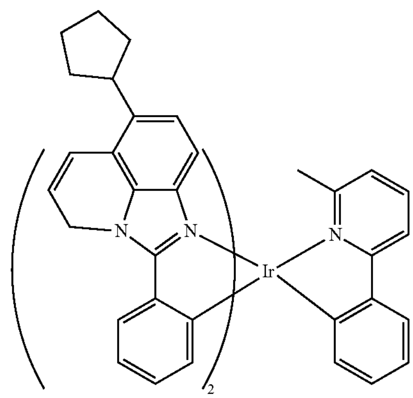
CPD 75
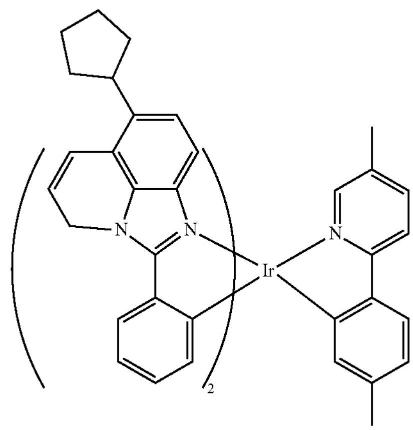
-continued
CPD 76
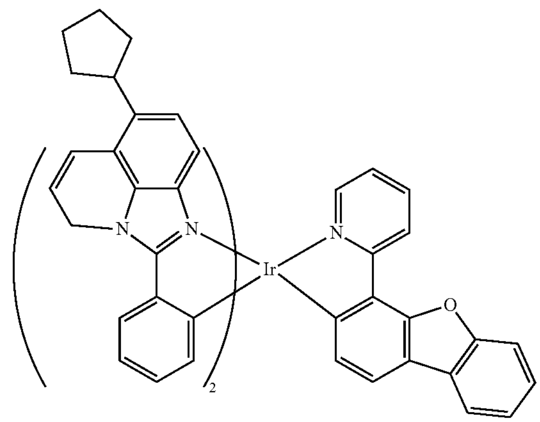
CPD 77
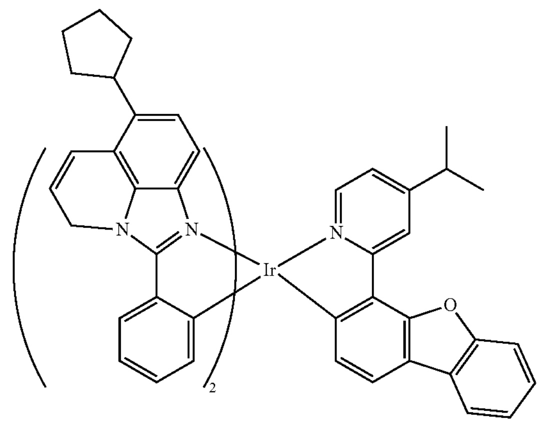
CPD 78
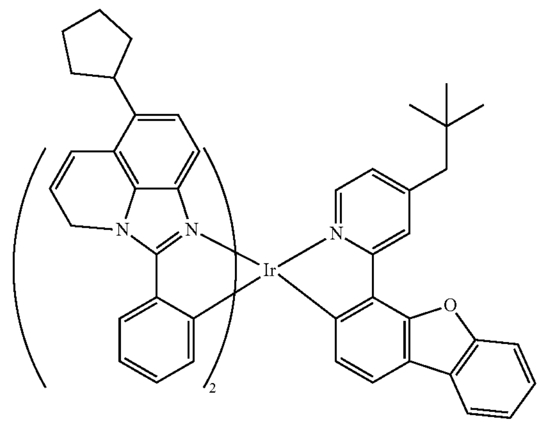

-continued
CPD 79
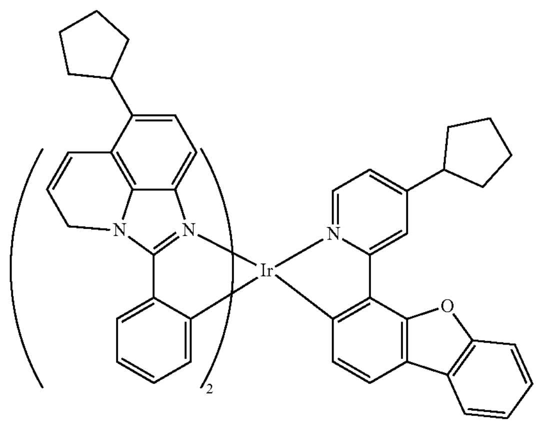
CPD 80
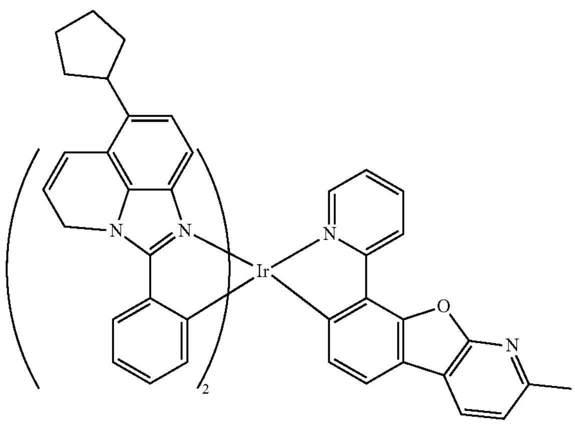
CPD 81
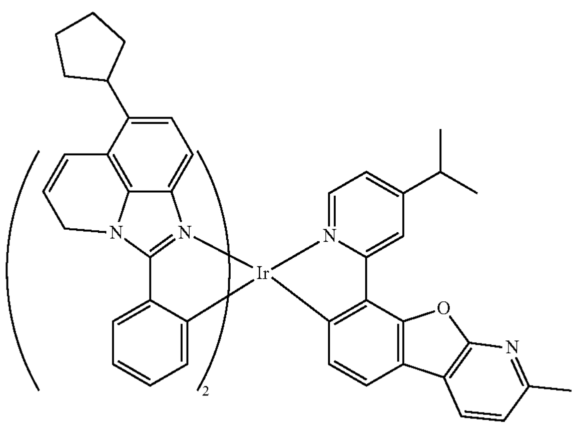
-continued
CPD 82
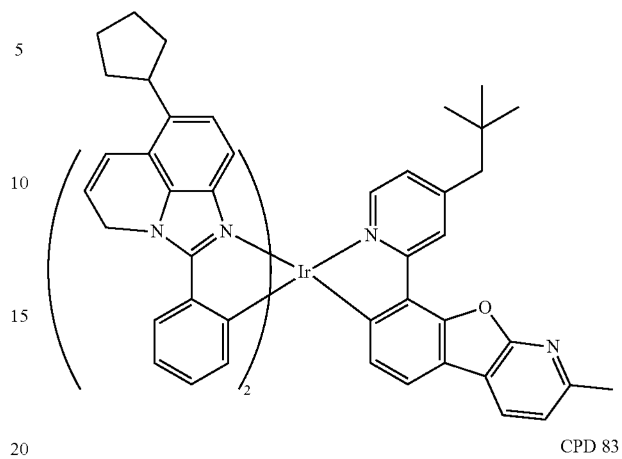
CPD 83
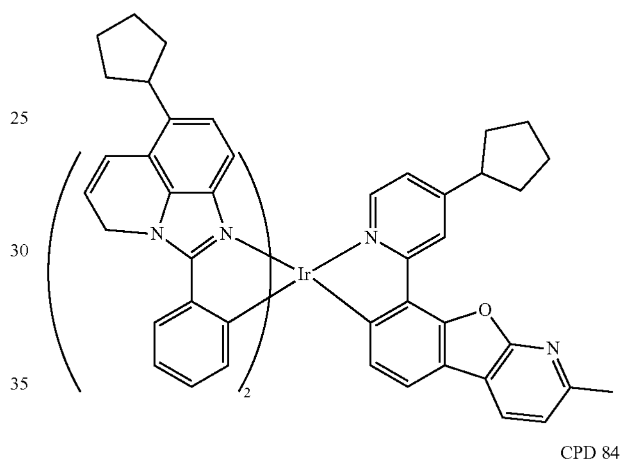
CPD 84
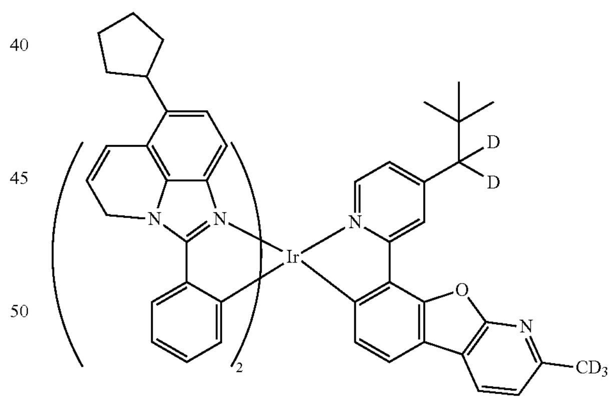
CPD 85
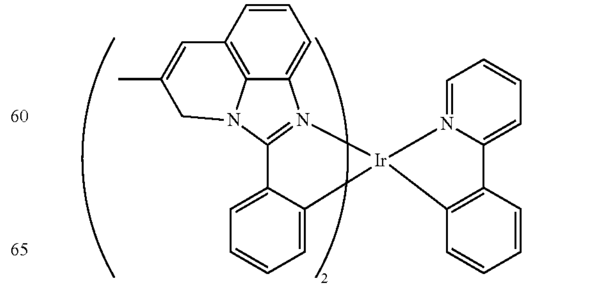

-continued
CPD 86
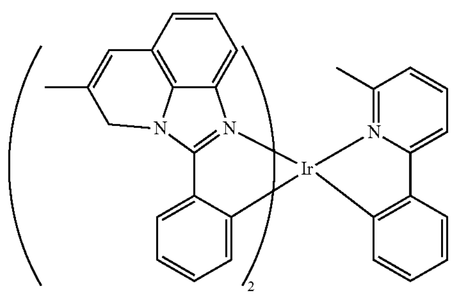
CPD 87
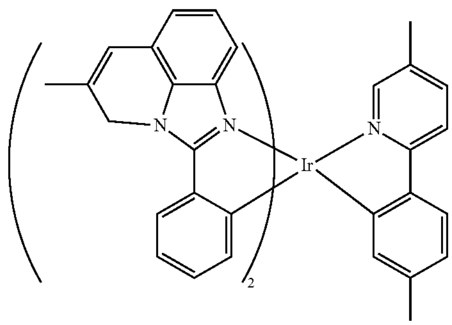
CPD 88
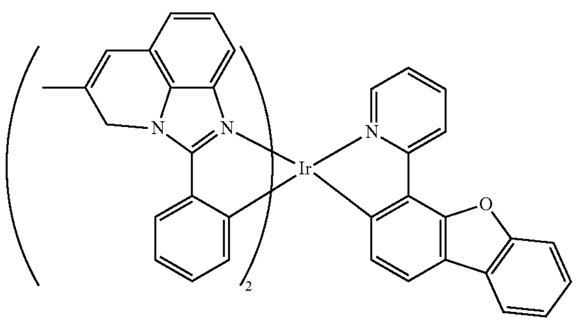
CPD 89
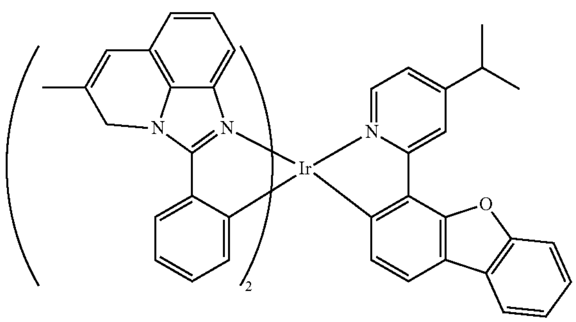
-continued
CPD 90
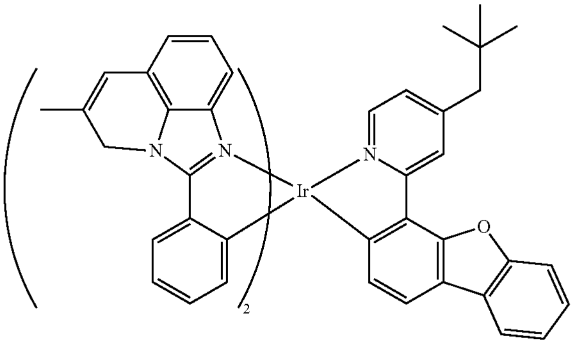
CPD 91
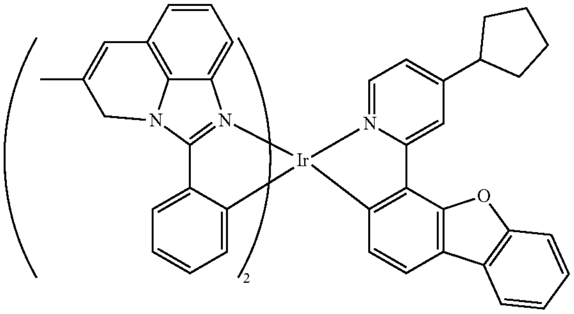
CPD 92
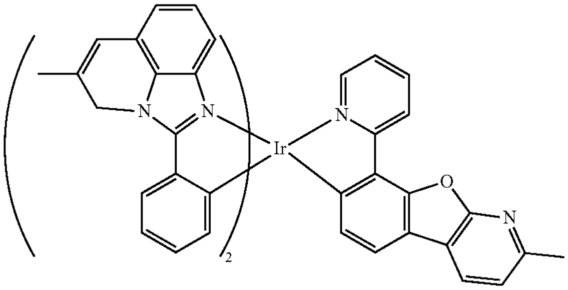
CPD 93
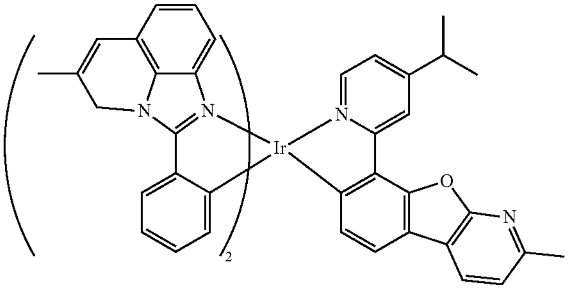

-continued
CPD 94
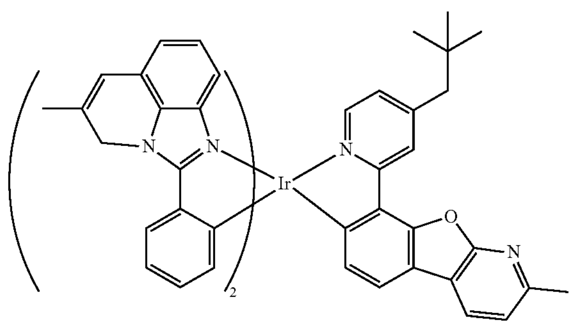
CPD 95
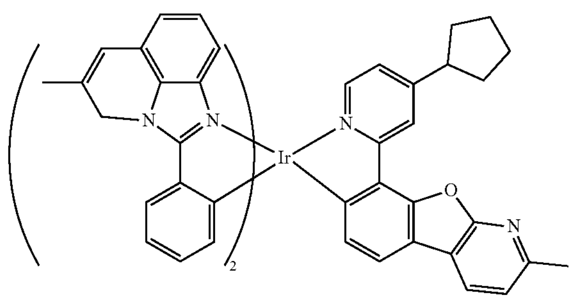
CPD 96
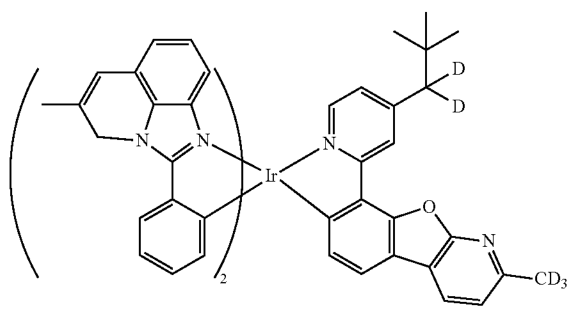
CPD 97
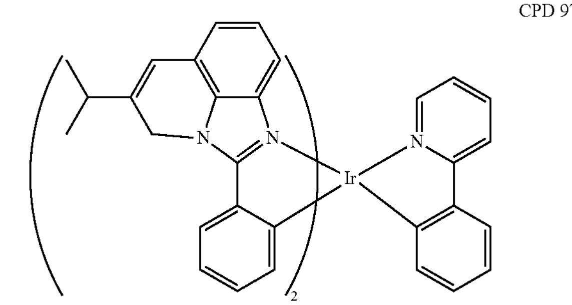
CPD 98
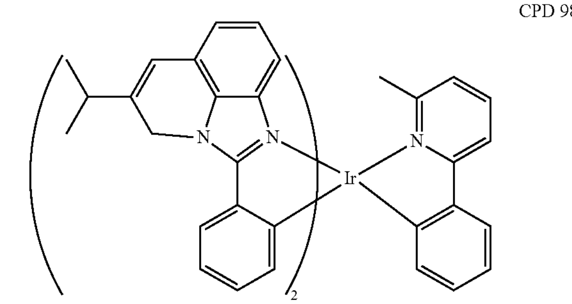
-continued
CPD 99
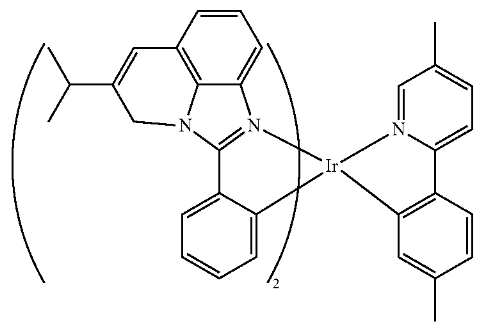
CPD 100
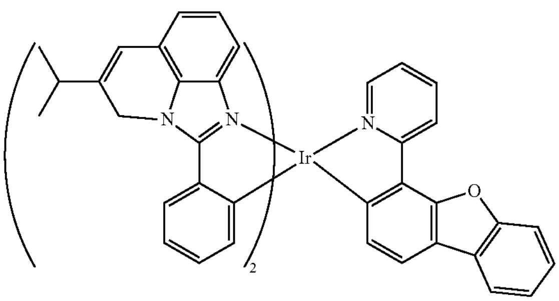
CPD 101
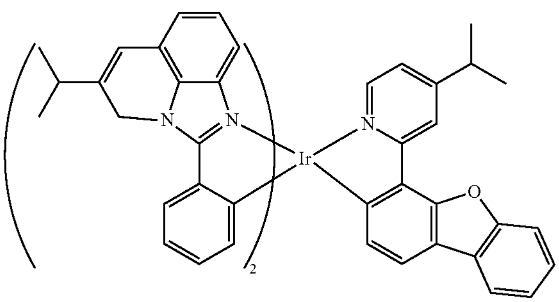
CPD 102
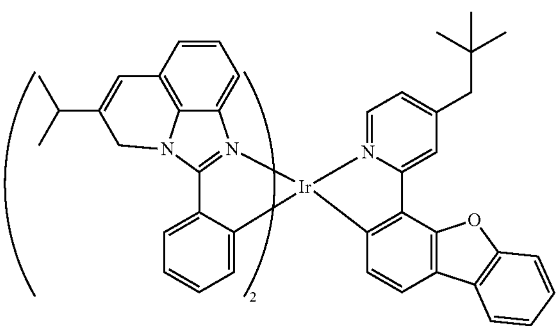
CPD 103
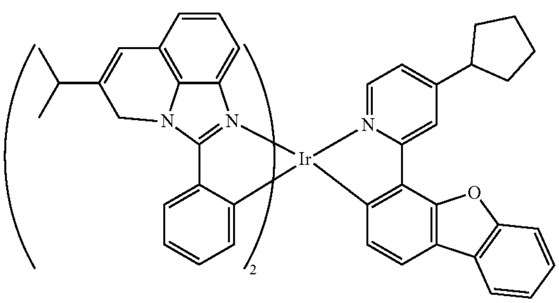

-continued
CPD 104
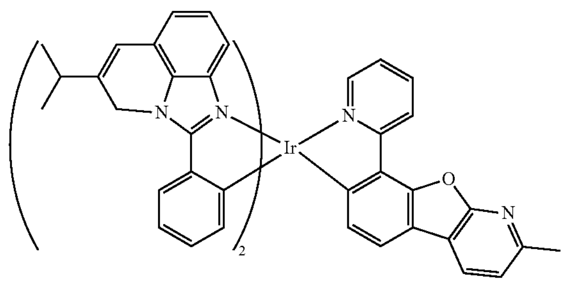
CPD 105
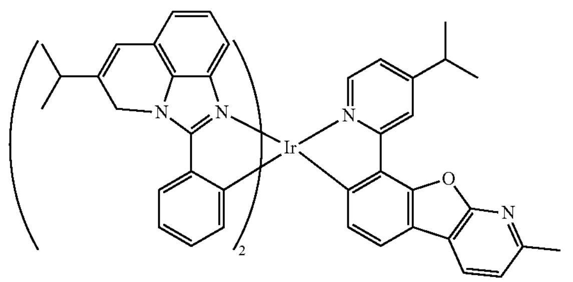
CPD 106
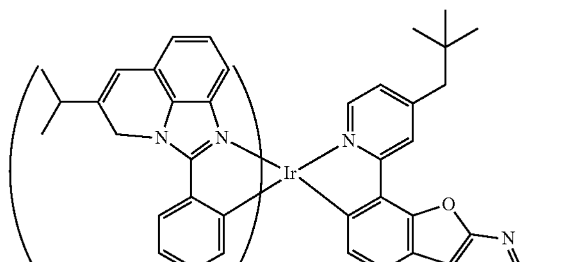
CPD 107
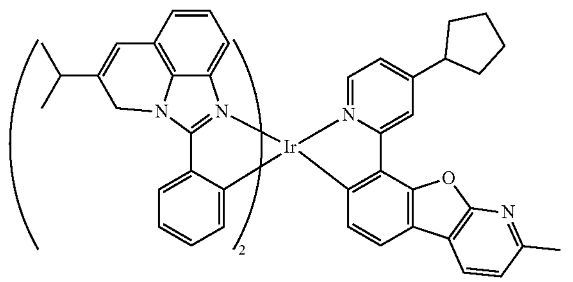
CPD 108
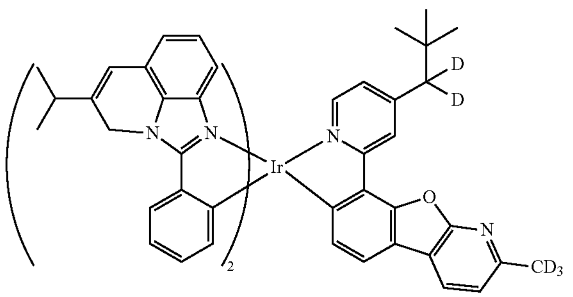
-continued
CPD 109
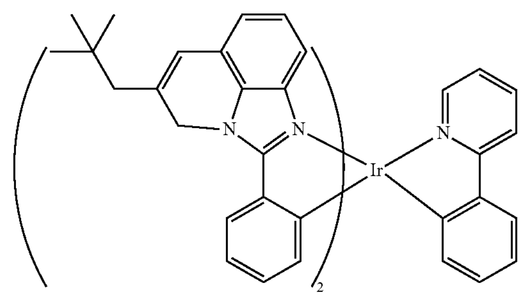
CPD 110
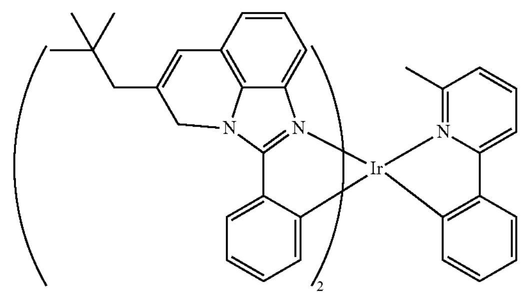
CPD 111
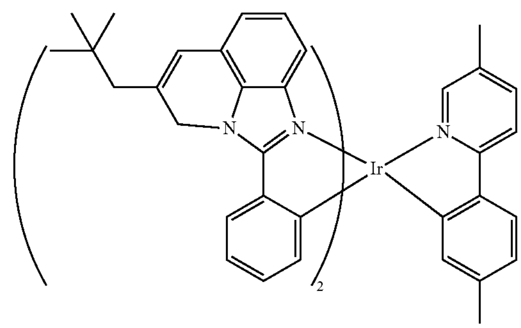
CPD 112
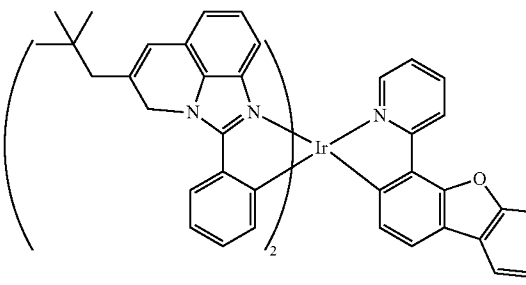
CPD 113
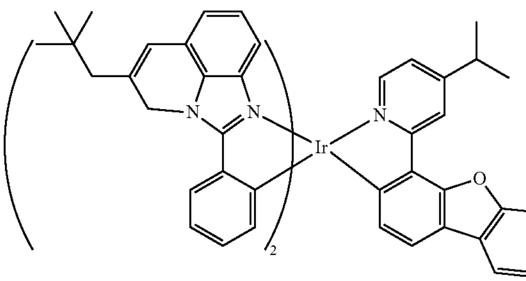

-continued
CPD 114
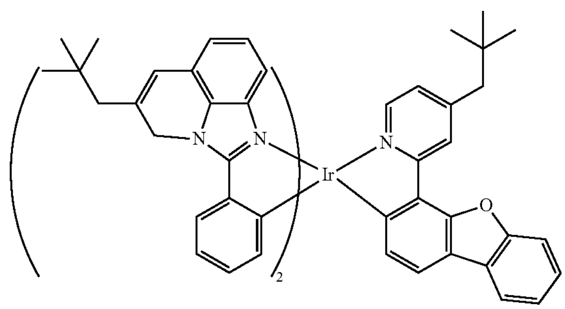
CPD 115
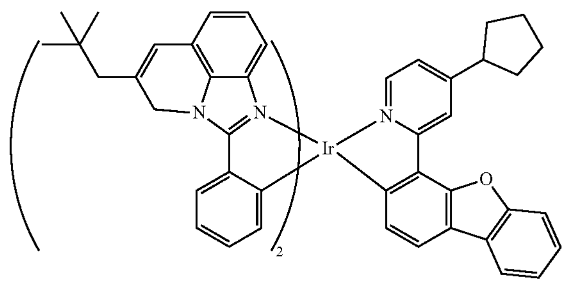
CPD 116
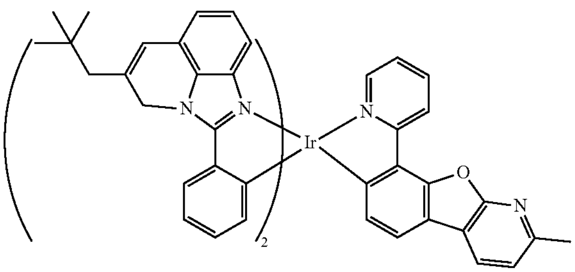
CPD 117
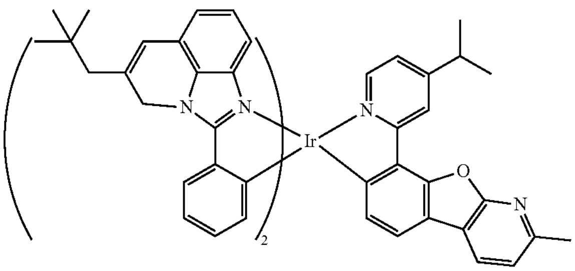
CPD 118
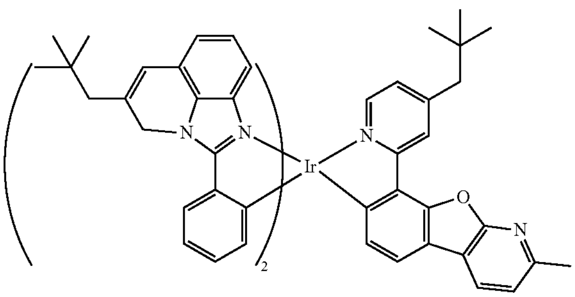
-continued
CPD 119
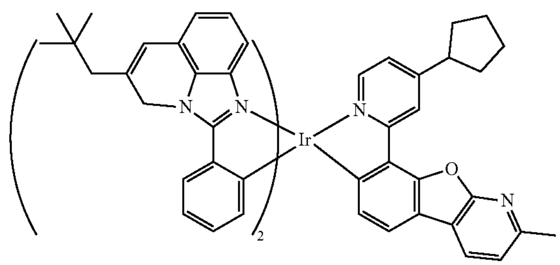
CPD 120
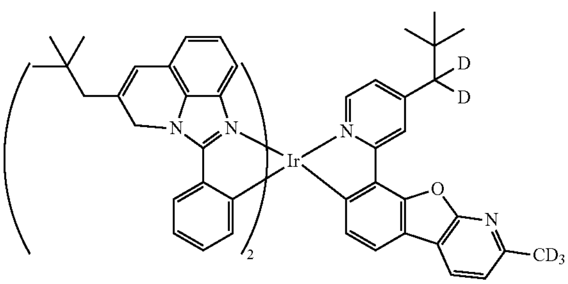
CPD 121
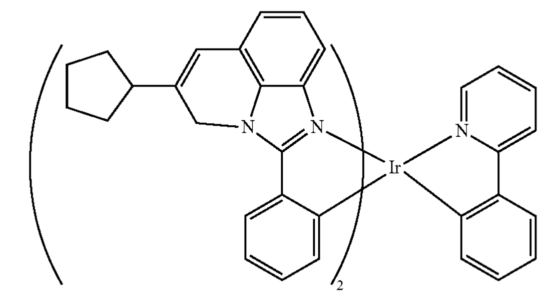
CPD 122
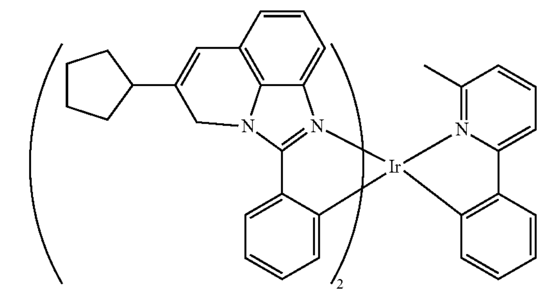
CPD 123
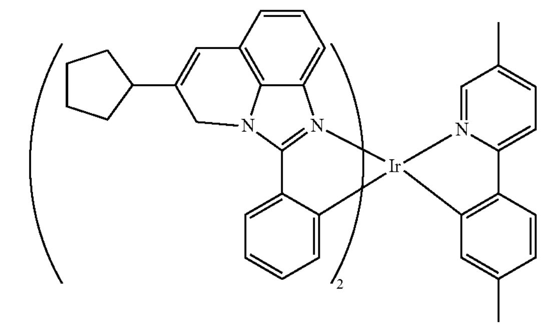

-continued
CPD 124
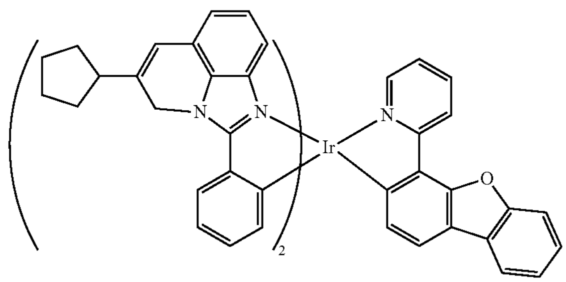
CPD 125
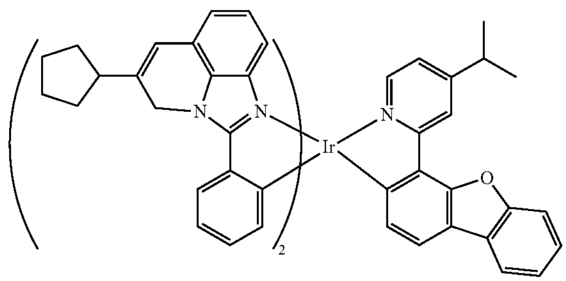
CPD 126
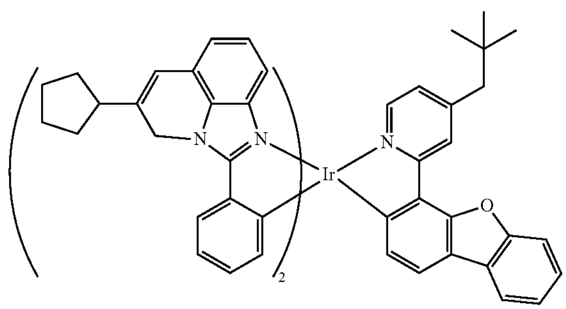
CPD 127
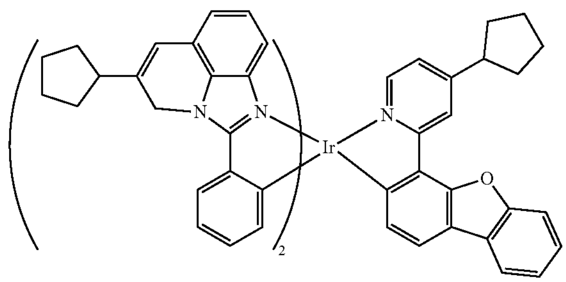
CPD 128
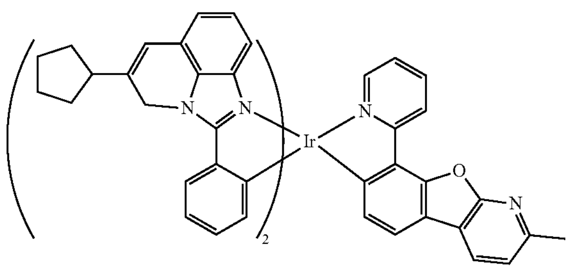
-continued
CPD 129
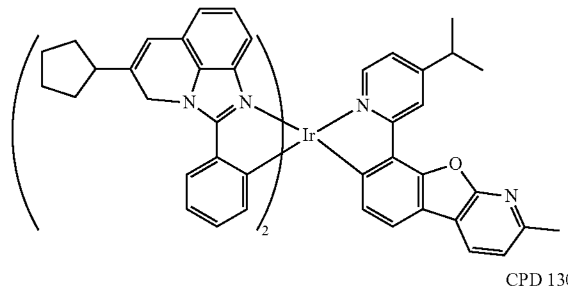
CPD 130
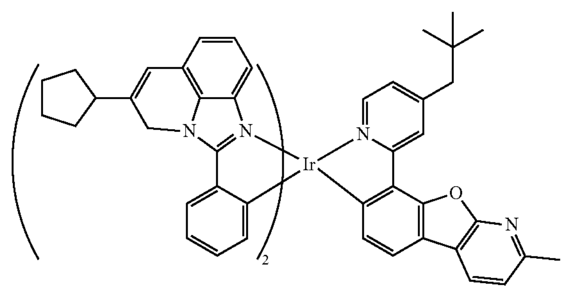
CPD 131
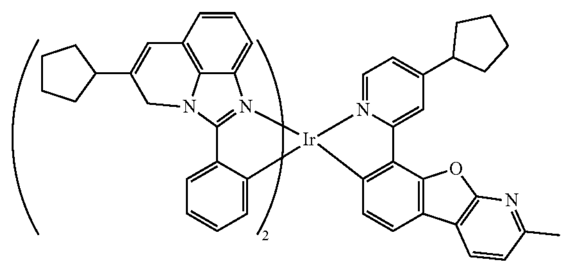
CPD 132
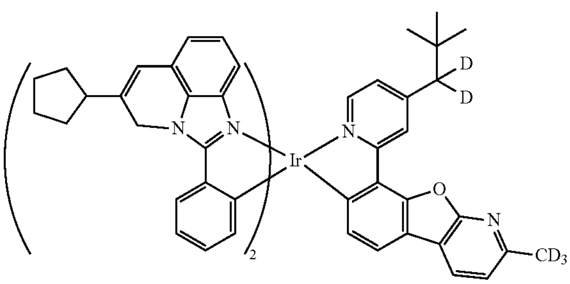
CPD 133
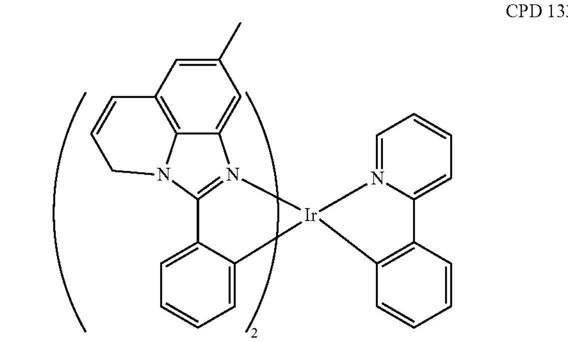

-continued
CPD 134
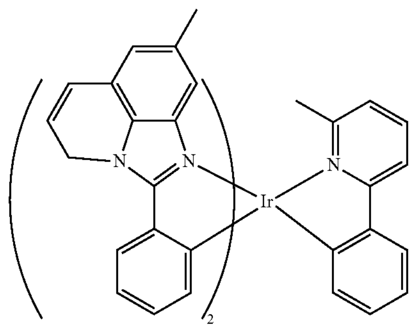
CPD 135
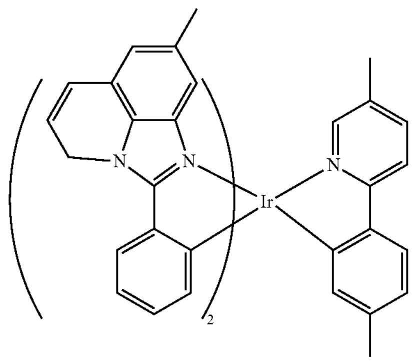
CPD 136
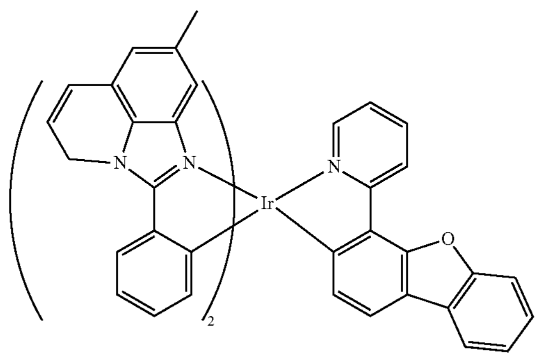
CPD 137
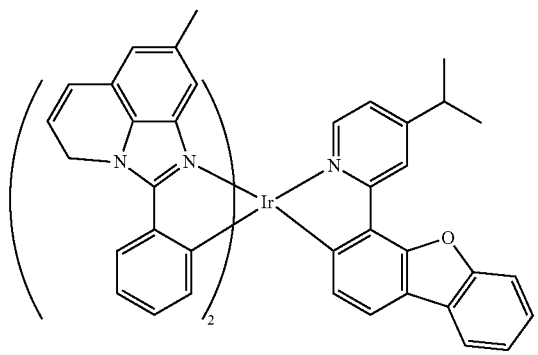
-continued
CPD 138
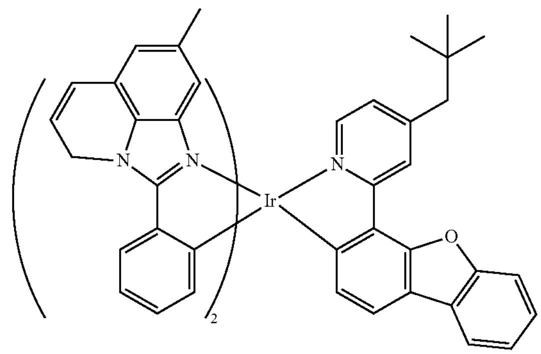
CPD 139
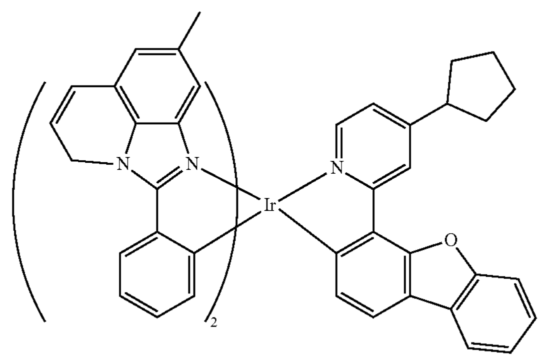
CPD 140
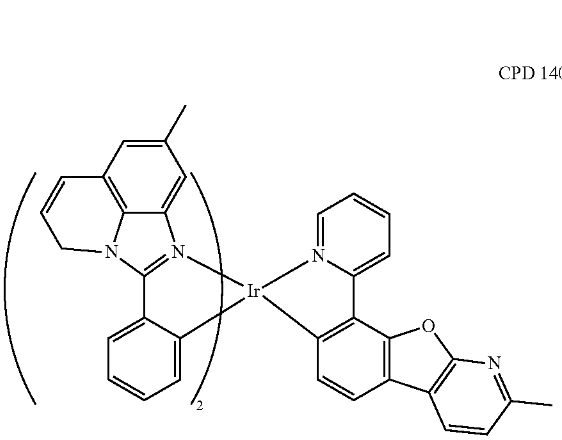
CPD 141
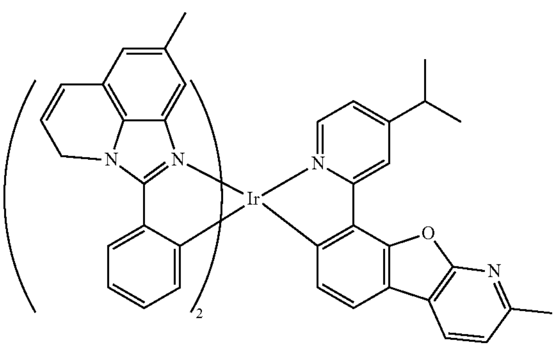

-continued
CPD 142
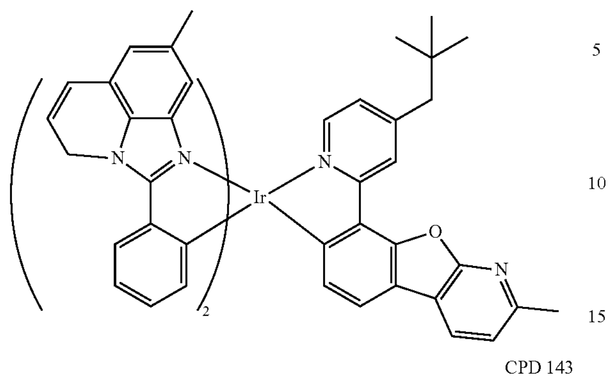
CPD 143
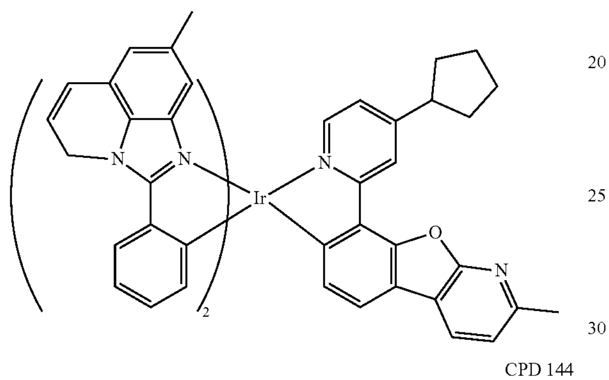
CPD 144
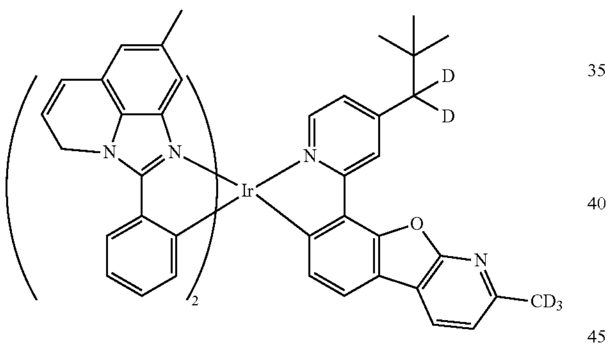
CPD 145
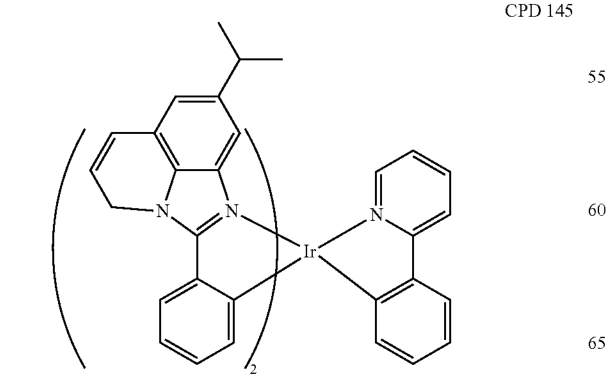
-continued
CPD 146
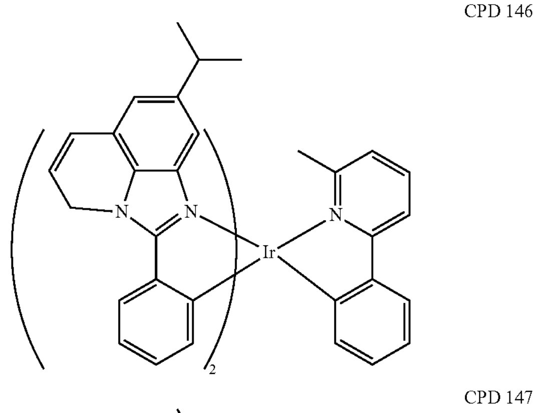
CPD 147
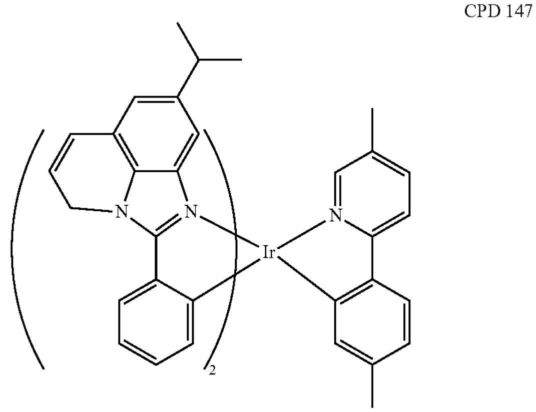
CPD 148
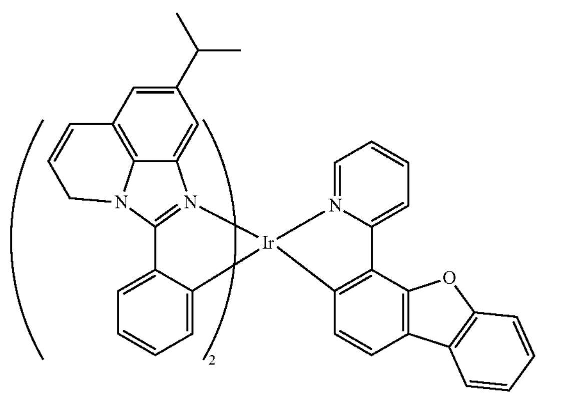
CPD 149
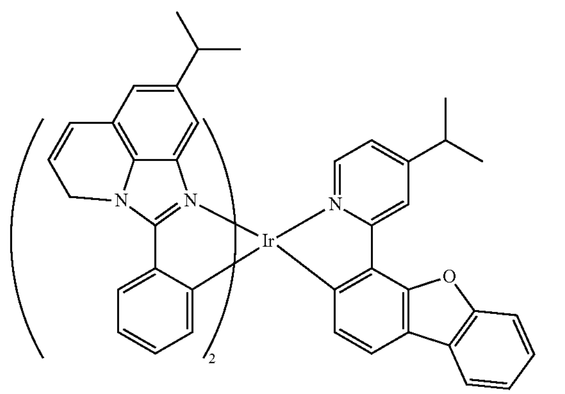

-continued
CPD 150
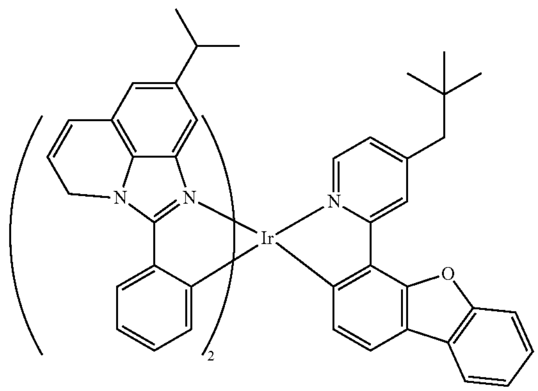
CPD 151
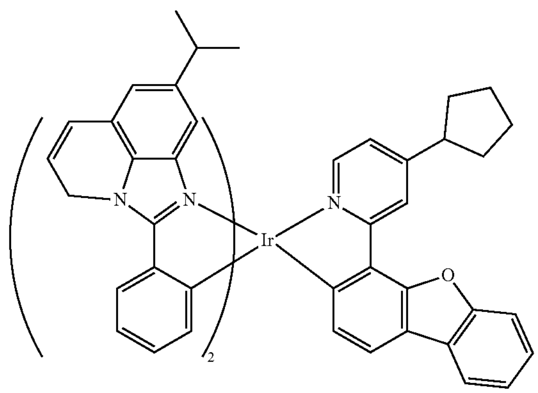
CPD 152
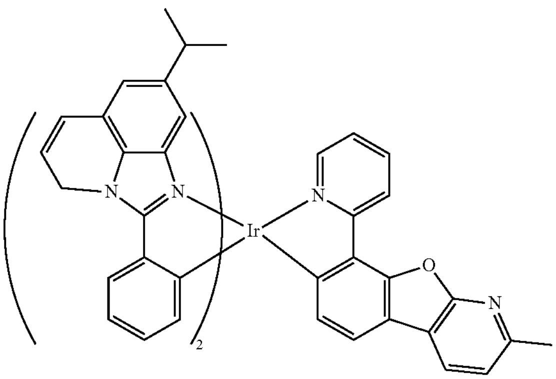
CPD 153
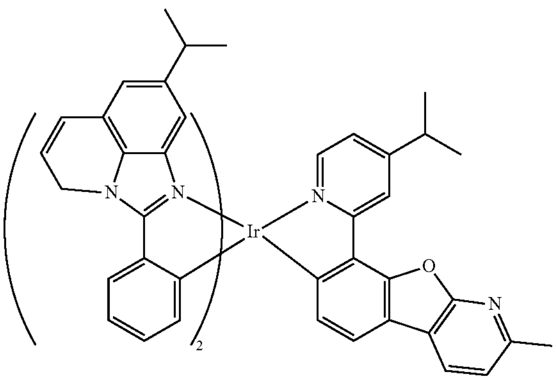
-continued
CPD 154
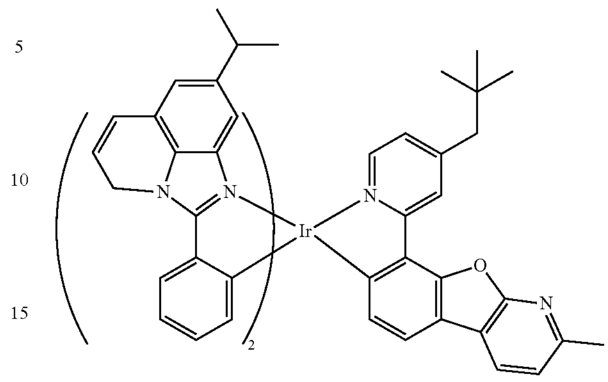
CPD 155
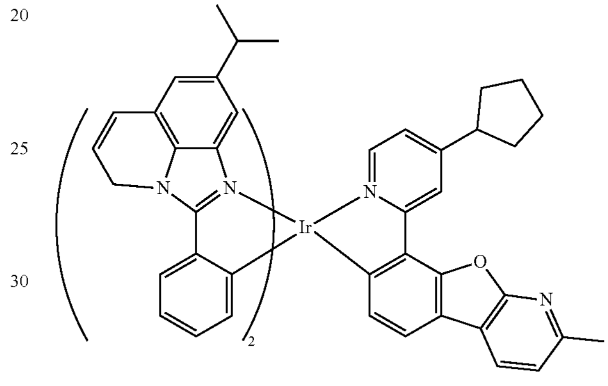
CPD 156
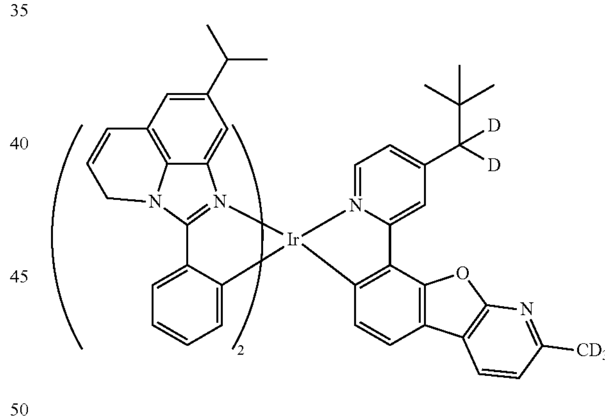
CPD 157
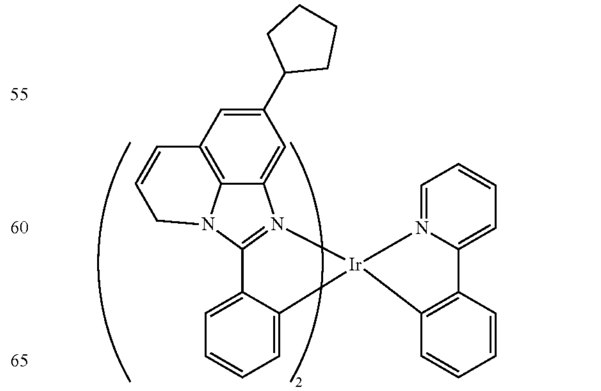

-continued
CPD 158
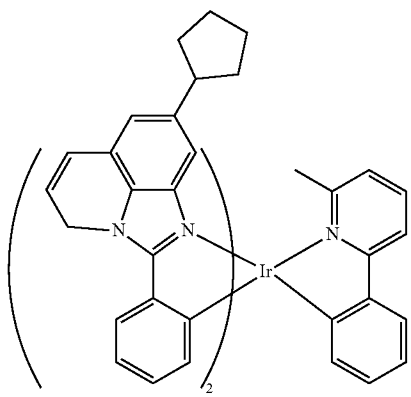
CPD 159
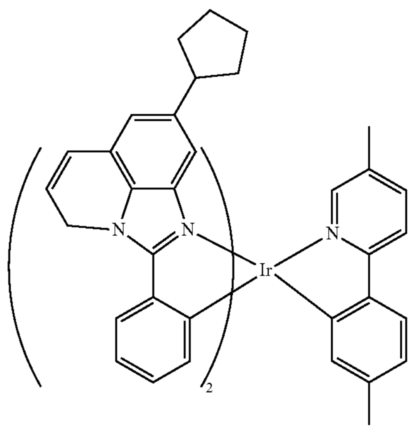
CPD 160
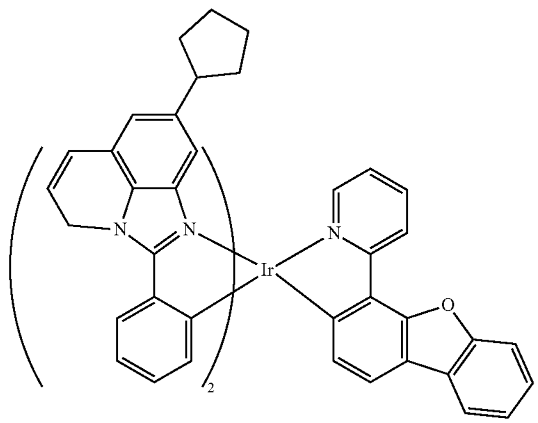
-continued
CPD 161
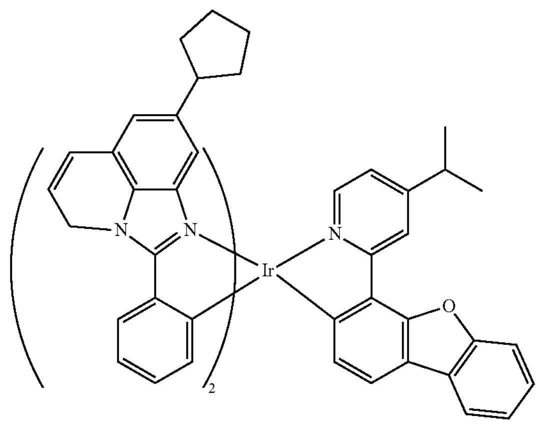
CPD 162
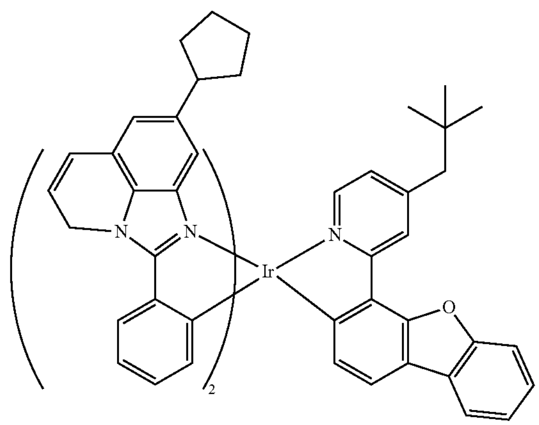
CPD 163
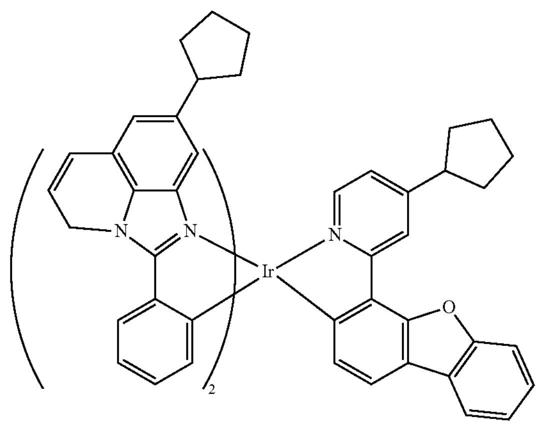

CPD 164
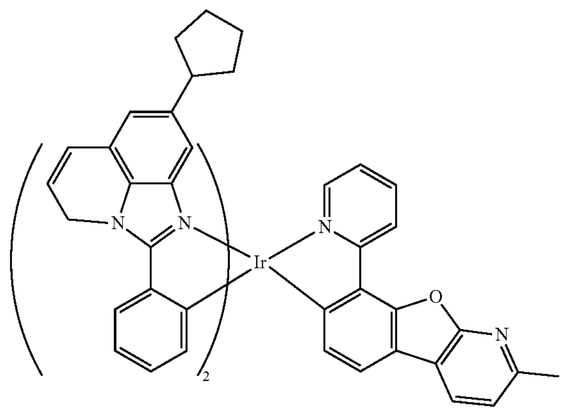
CPD 165
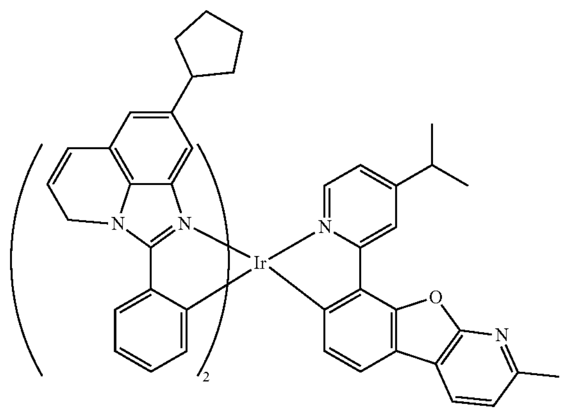
CPD 166
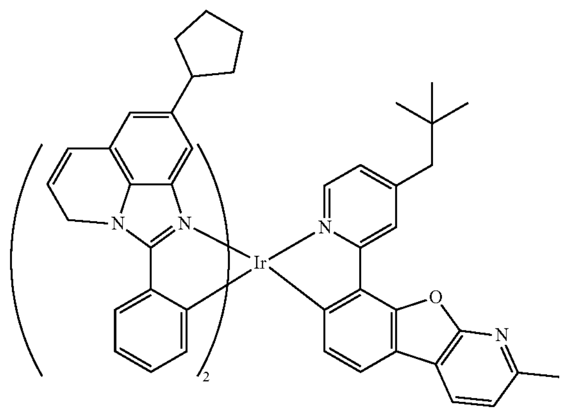
CPD 167
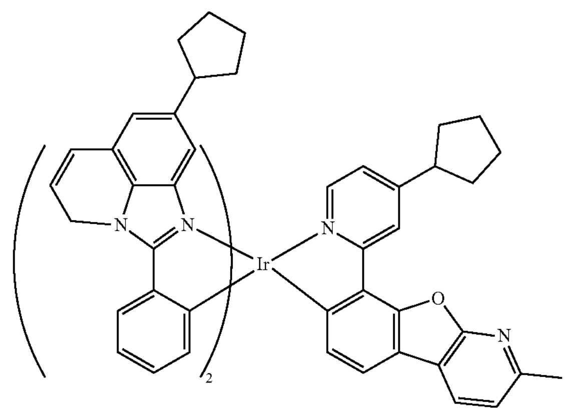
CPD 168
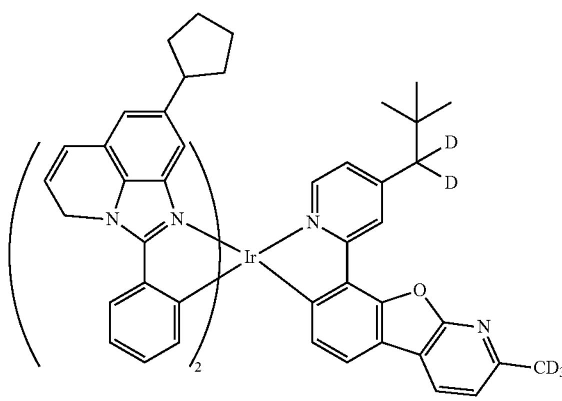
CPD 169
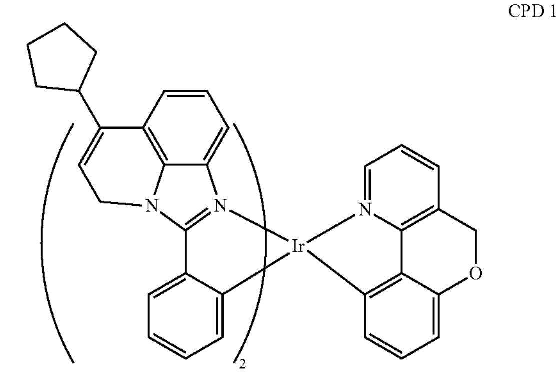
CPD 170
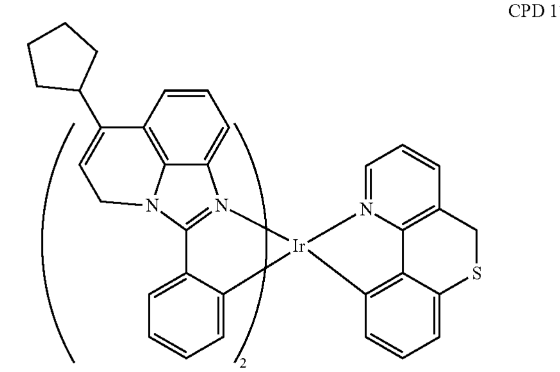

-continued
CPD 171
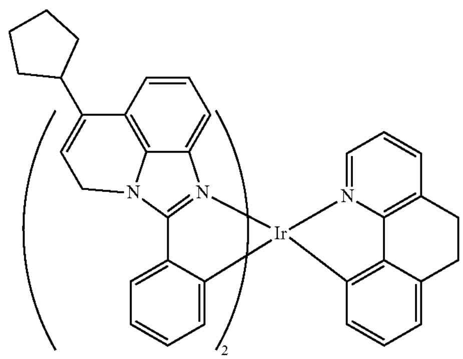
CPD 172
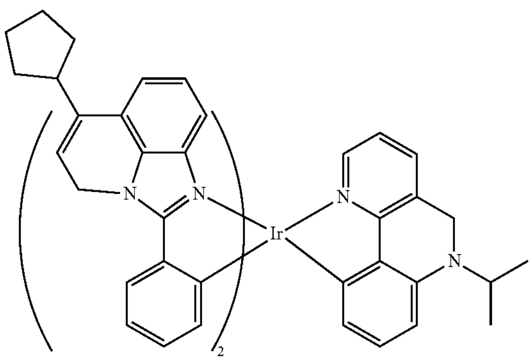
CPD 173
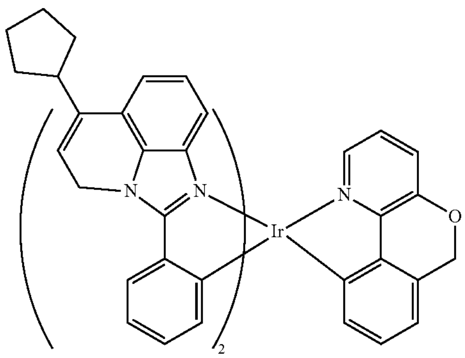
CPD 174
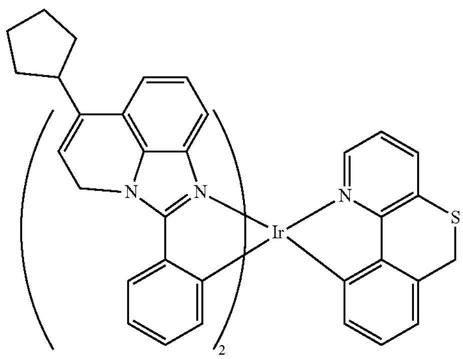
CPD 175
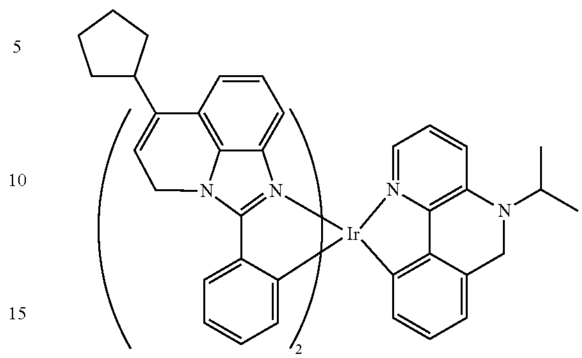
CPD 176
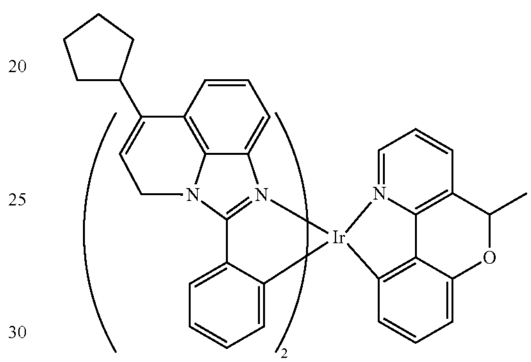
CPD 177
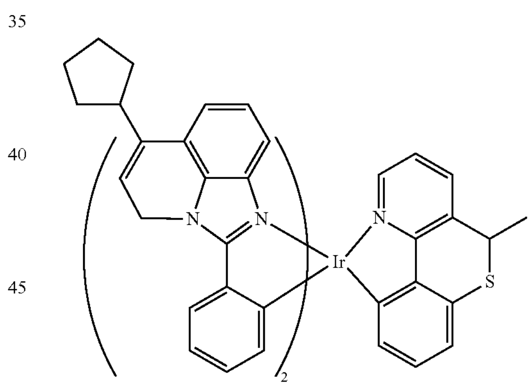
CPD 178
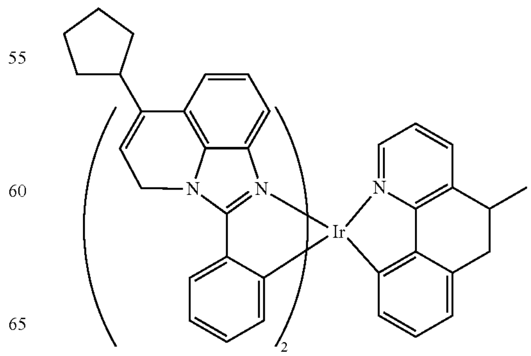

-continued
CPD 179
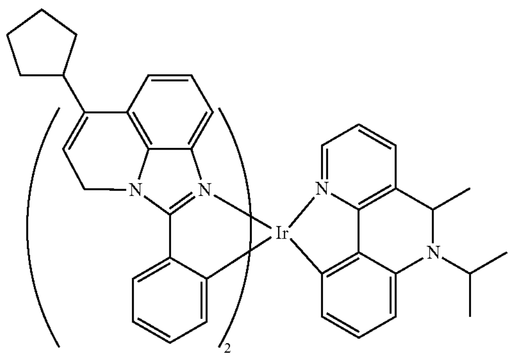
CPD 180
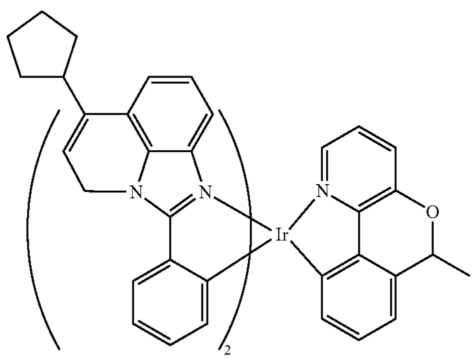
CPR 181
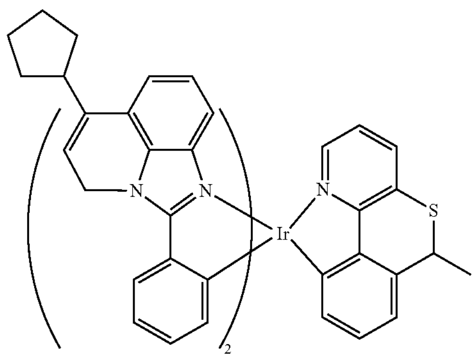
CPD 182
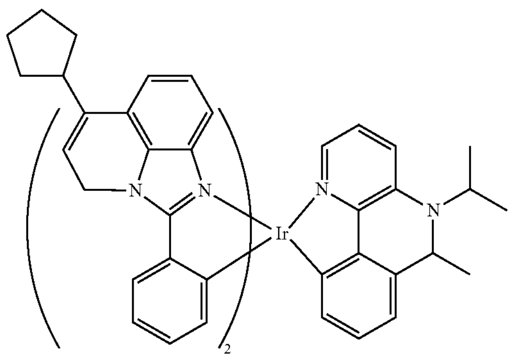
-continued
CPD 183
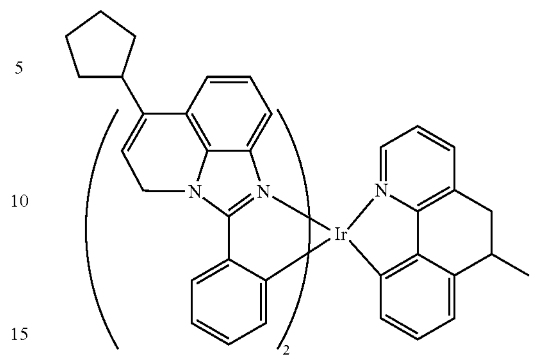
CPD 184
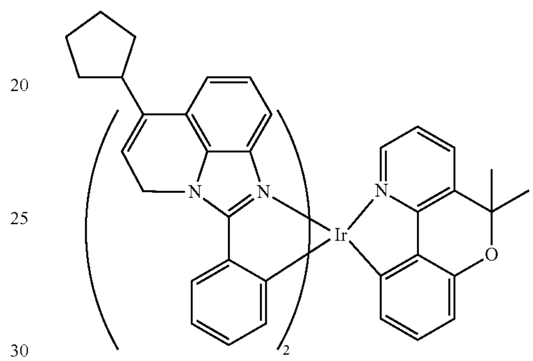
CPD 185
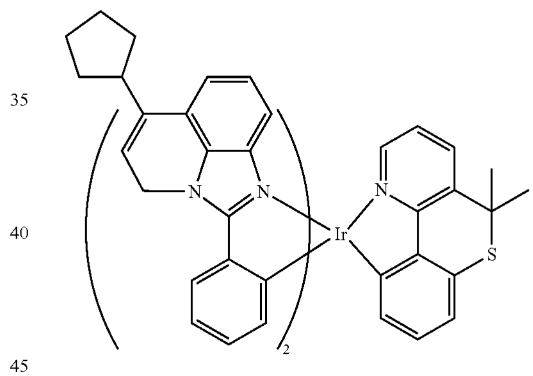
CPD 186
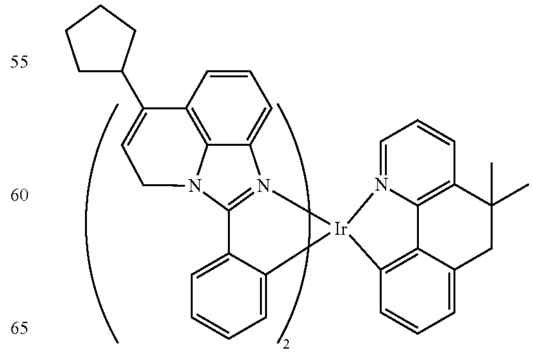

-continued
CPD 187
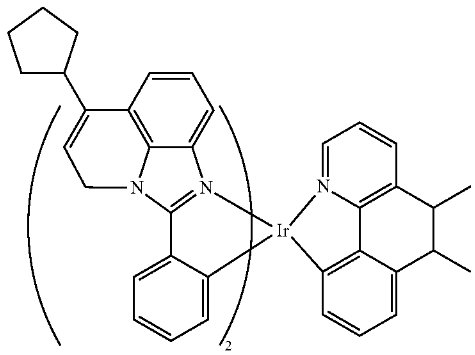
CPD 188
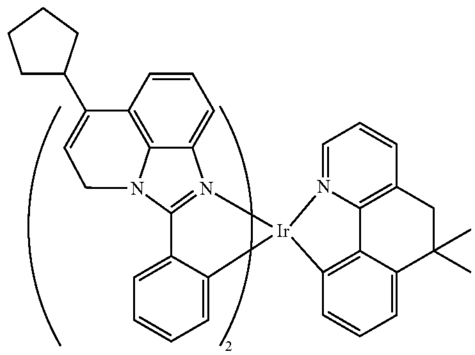
CPD 189
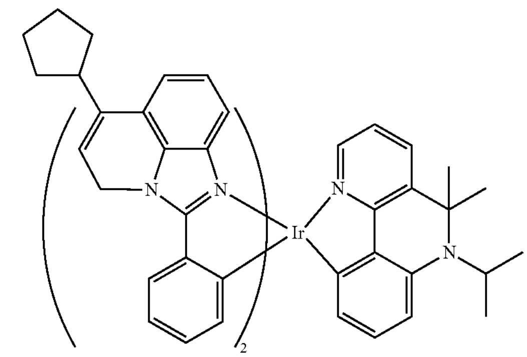
CPD 190
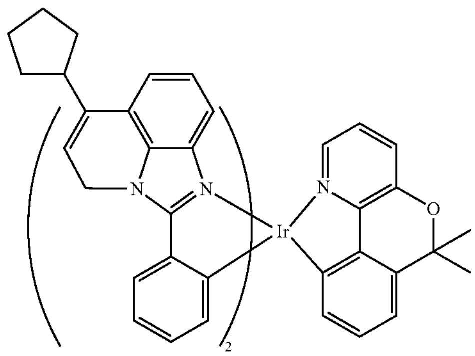
-continued
CPD 191
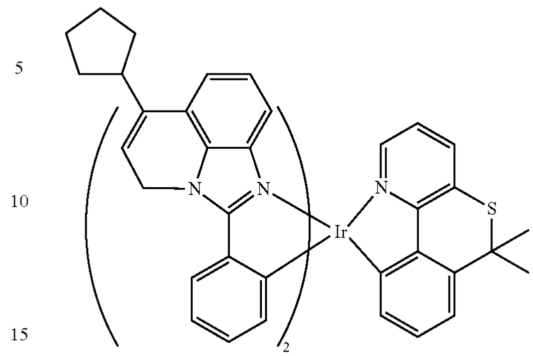
CPD 192
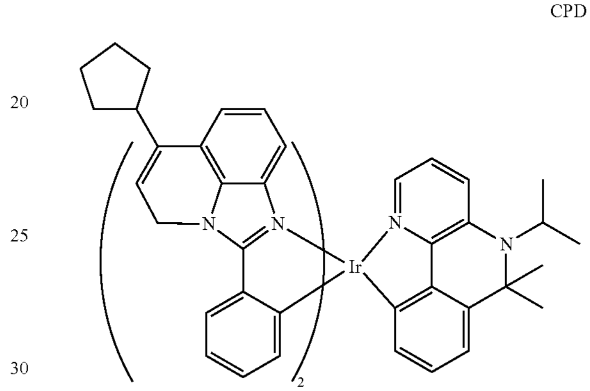
CPD 193
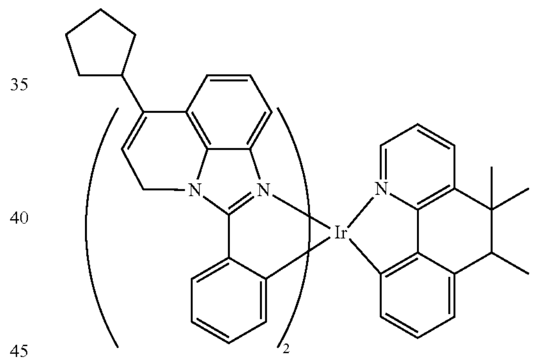
CPD 194
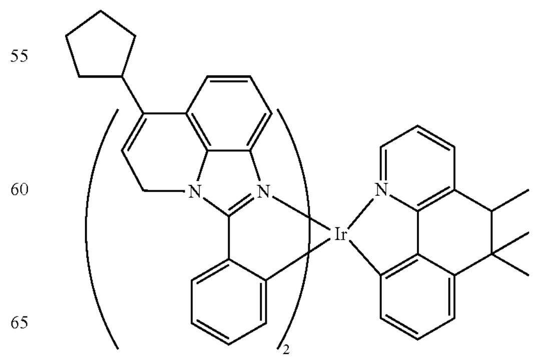

-continued
CPD 195
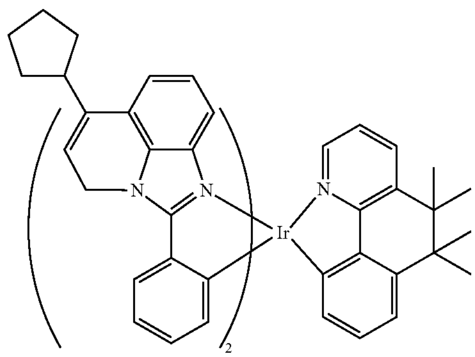
CPD 196
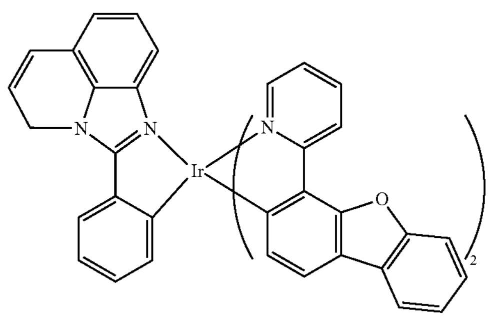
CPD 197
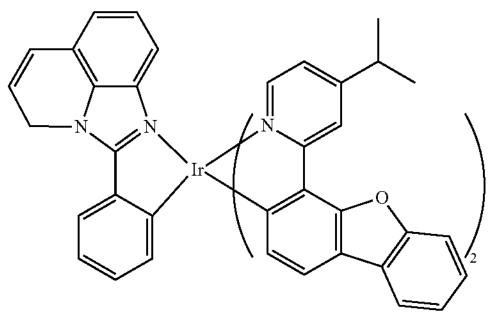
CPD 198
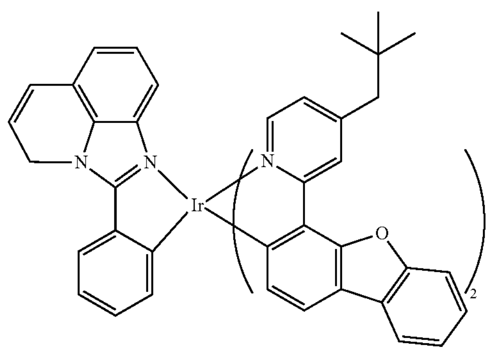
-continued
CPD 199
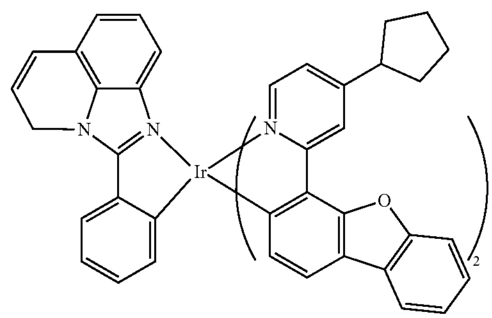
CPD 200
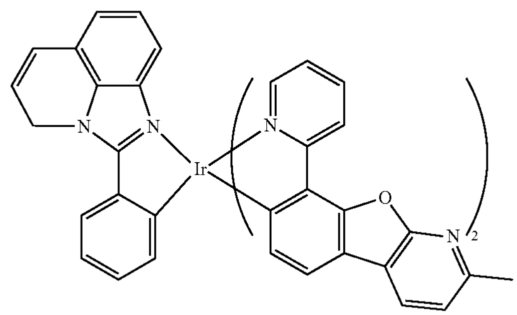
CPD 201
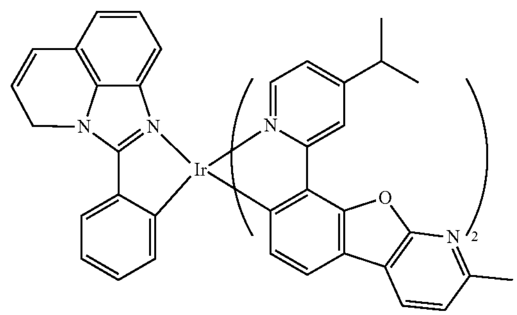
CPD 202
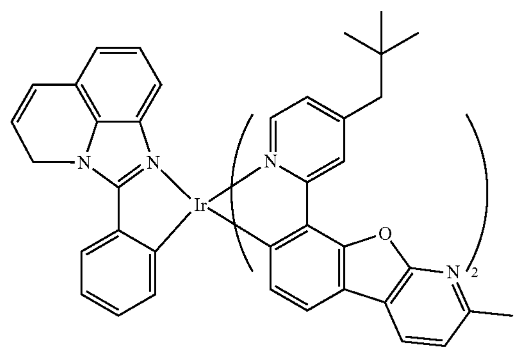

-continued
CPD 203
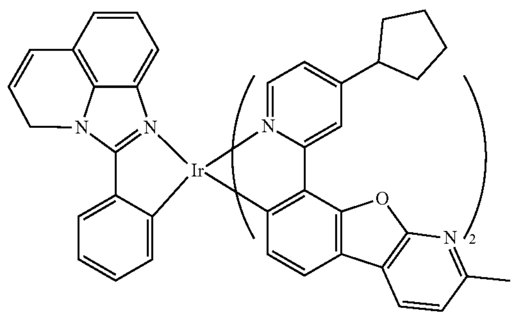
CPD 204
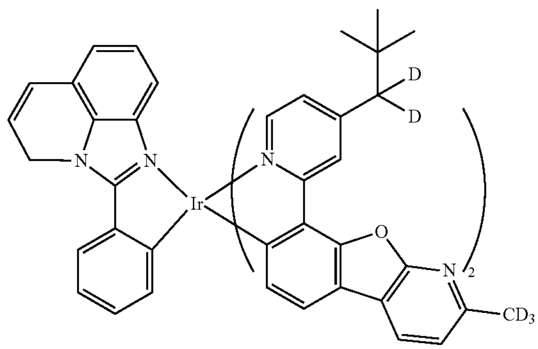
CPD 205
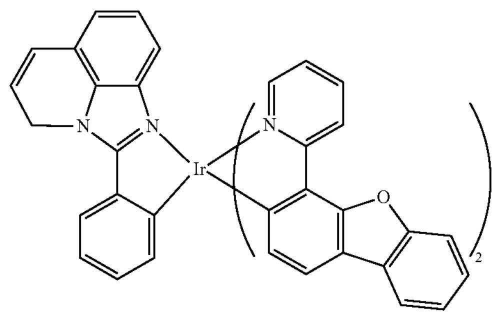
CPD 206
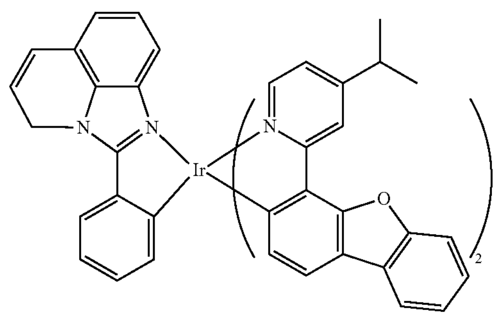
-continued
CPD 207
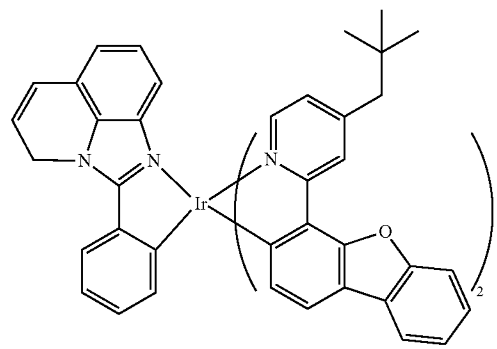
CPD 208
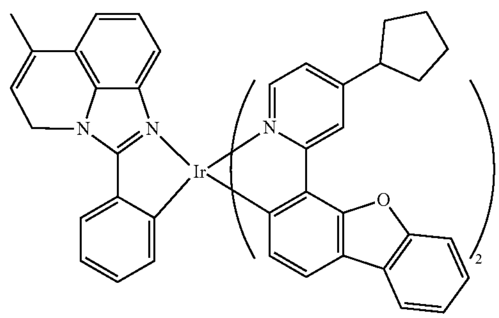
CPD 209
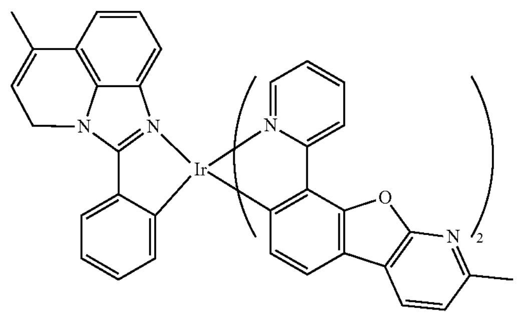
CPD 210
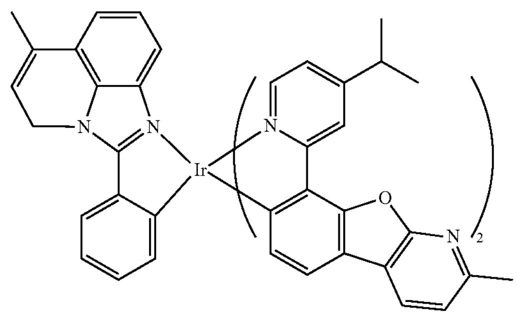

CPD 211
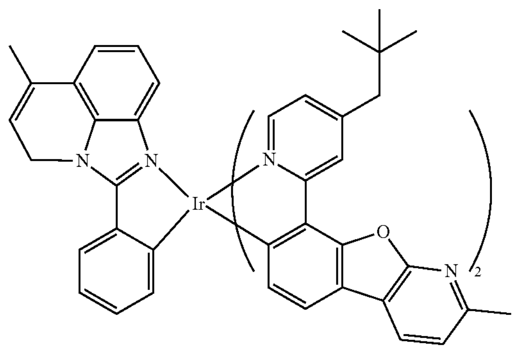
CPD 212
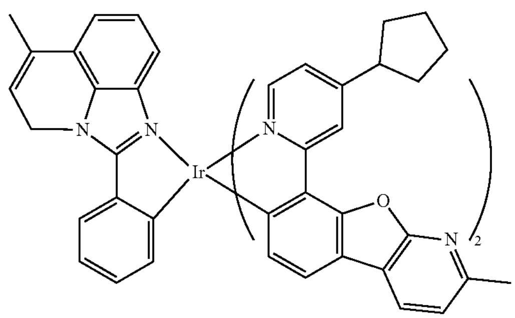
CPD 213
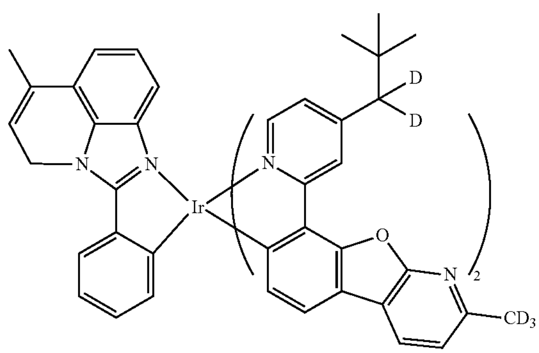
CPD 214
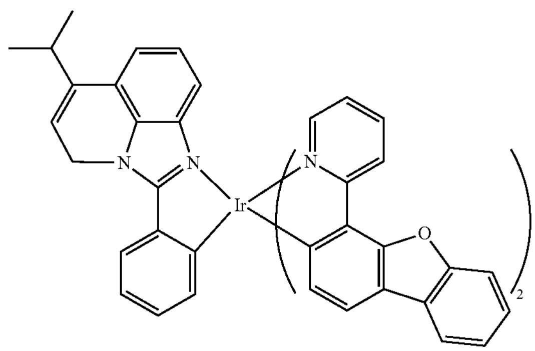
CPD 215
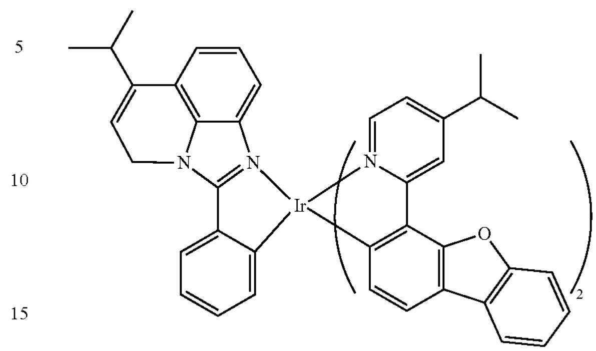
CPD 216
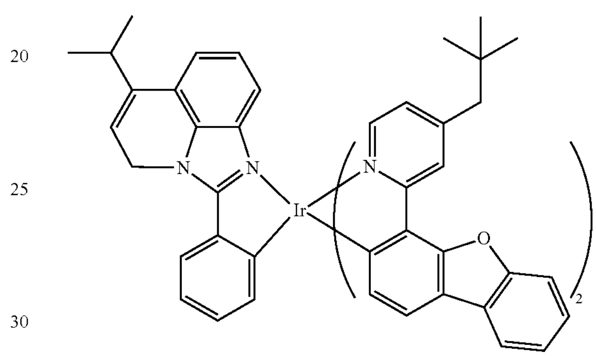
CPD 217
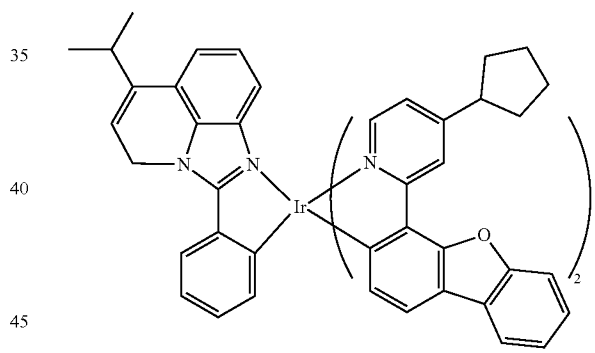
CPD 218
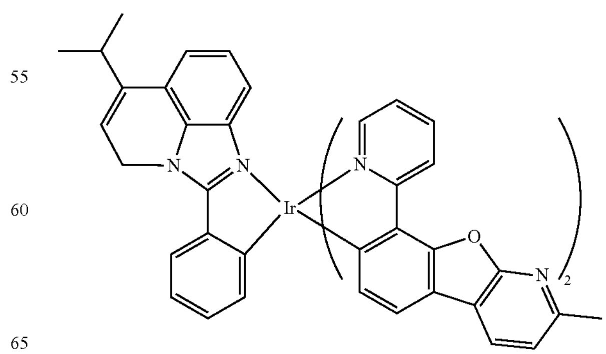

-continued
CPD 219
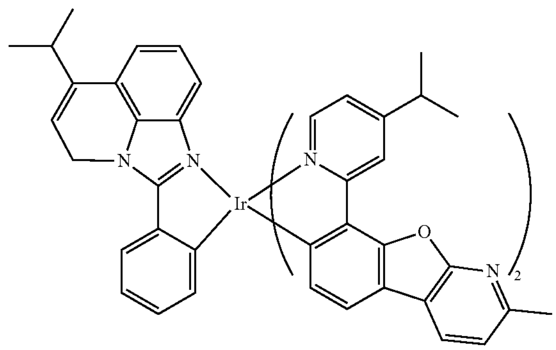
CPD 220
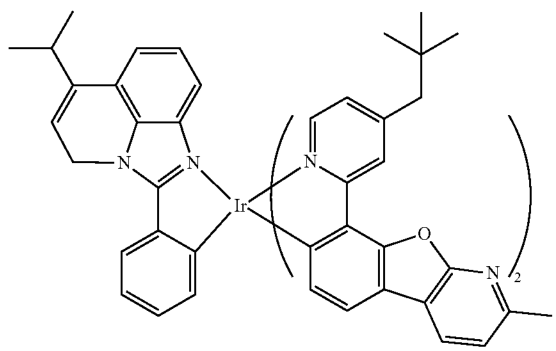
CPD 221
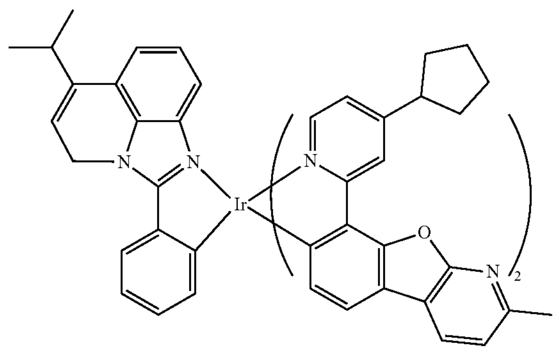
CPD 222
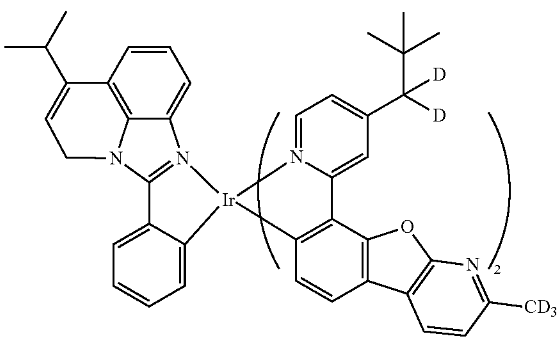
-continued
CPD 223
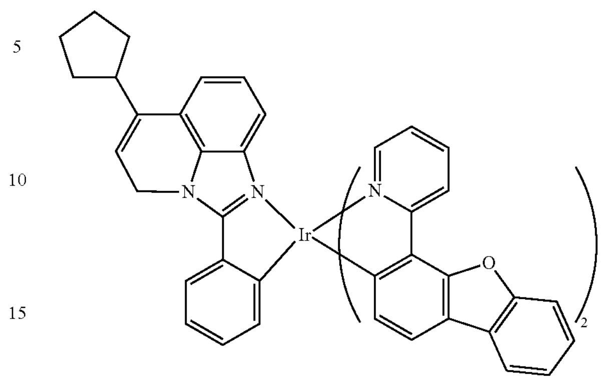
CPD 224
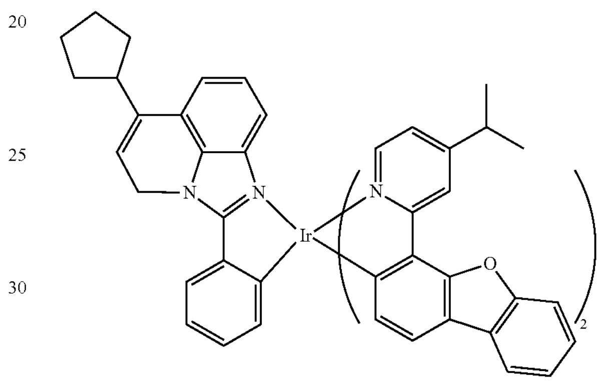
CPD 225
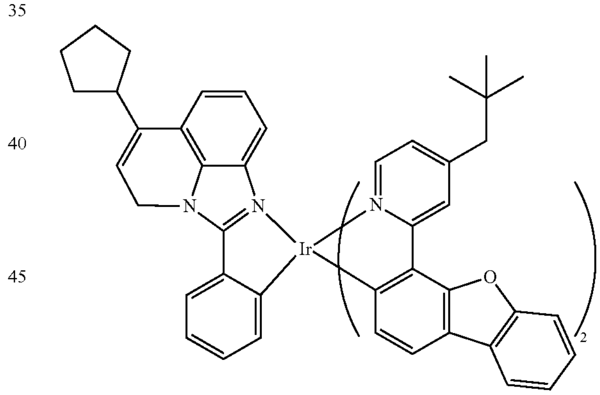
CPD 226
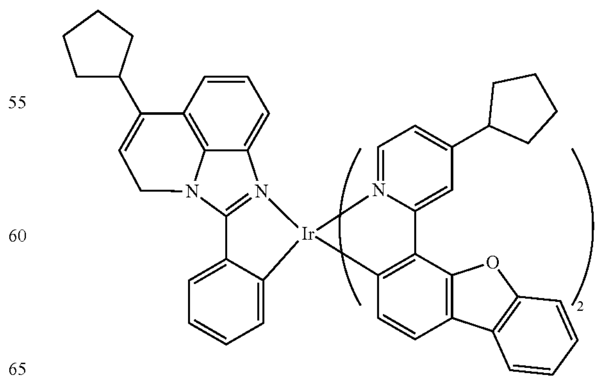

-continued
CPD 227
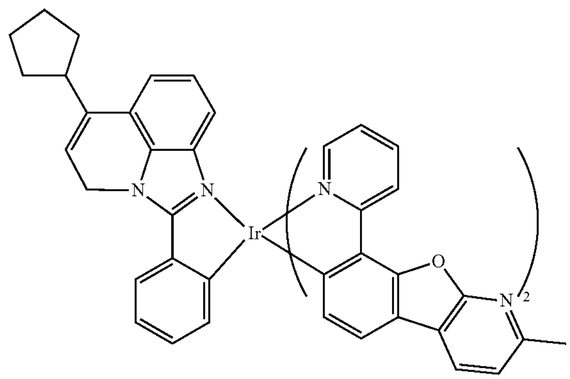
CPD 228
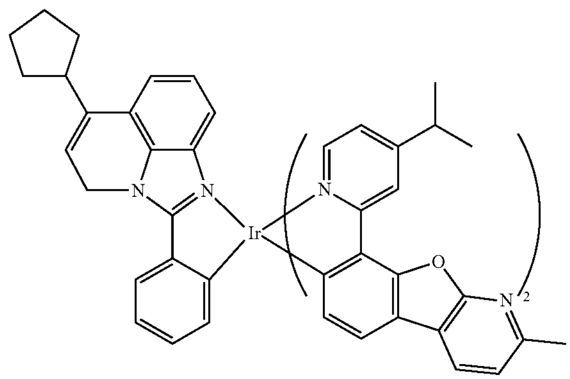
CPD 229
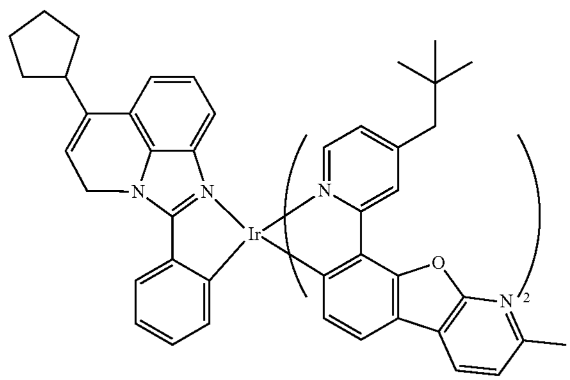
CPD 230
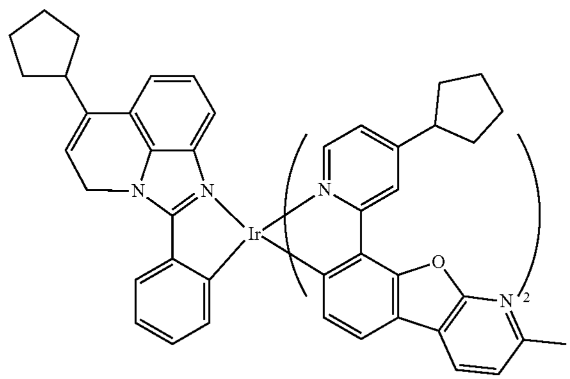
-continued
CPD 231
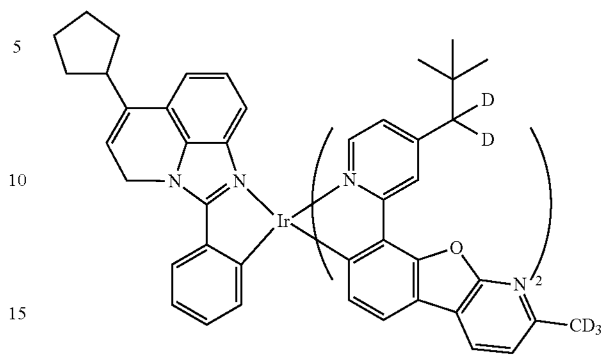
CPD 232
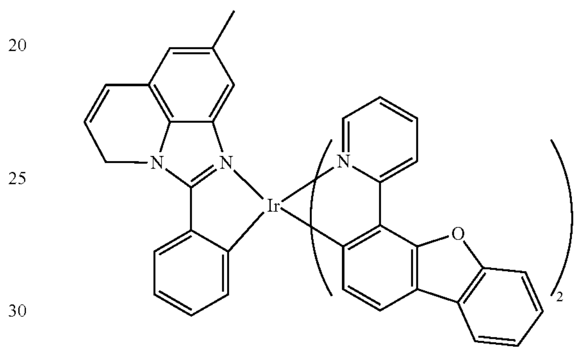
CPD 233
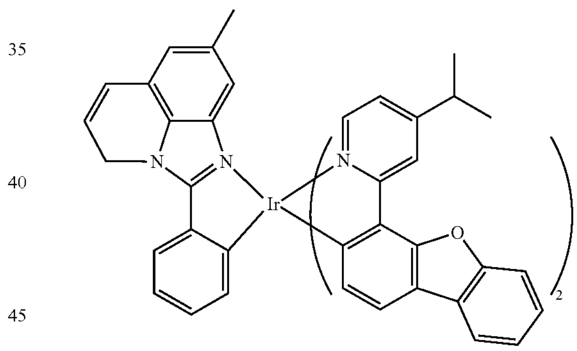
CPD 234
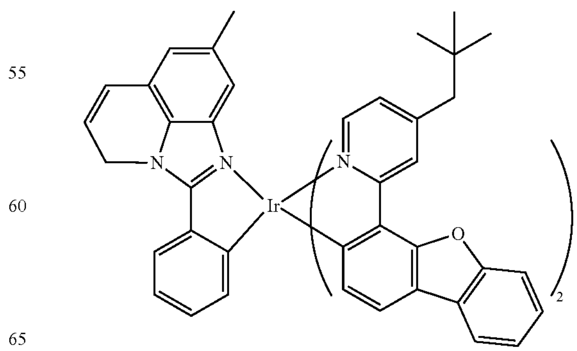

-continued
CPD 235
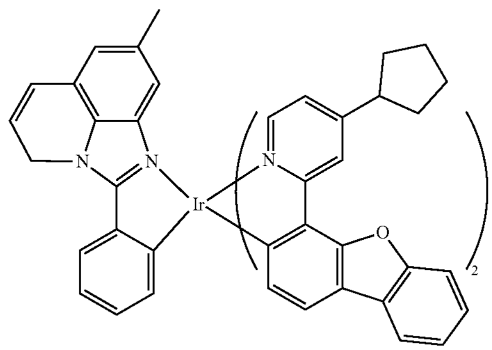
CPD 236
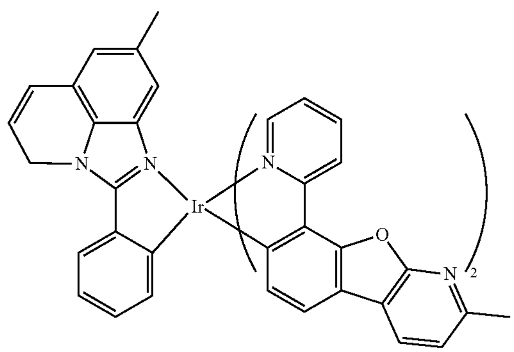
CPD 237
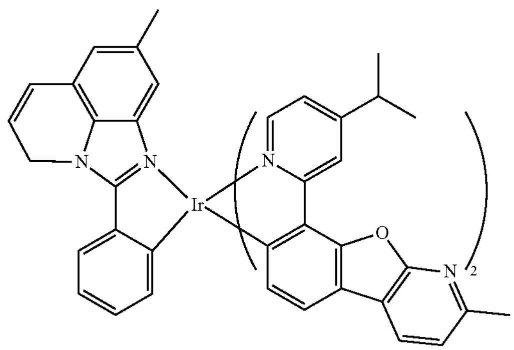
CPD 238
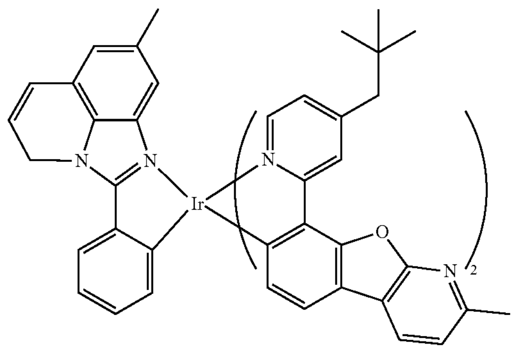
-continued
CPD 239
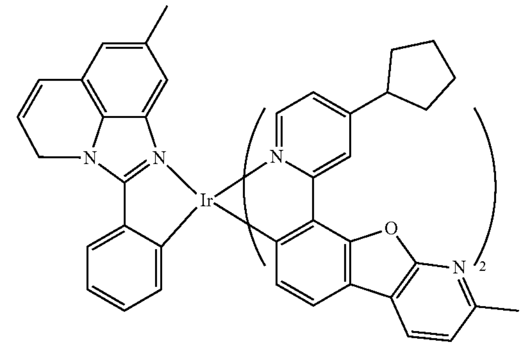
CPD 240
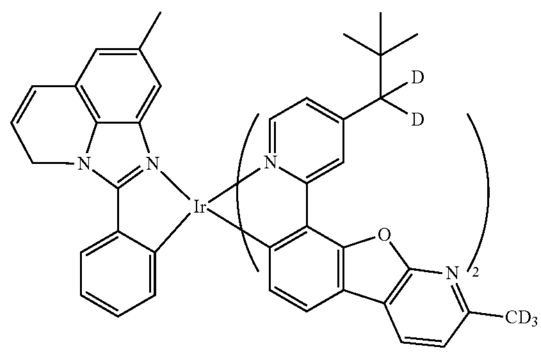
CPD 241
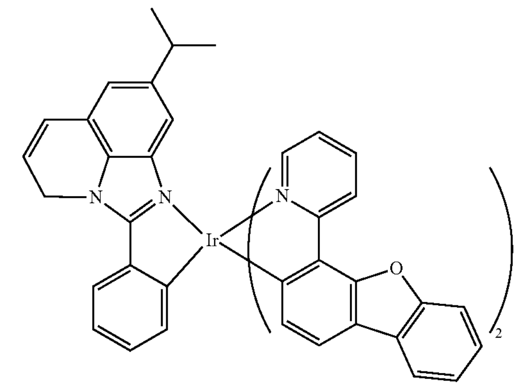
CPD 242
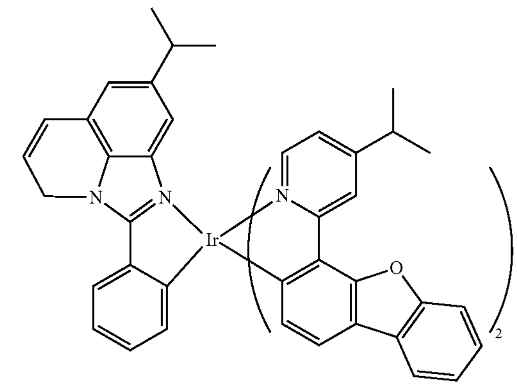

-continued
CPD 243
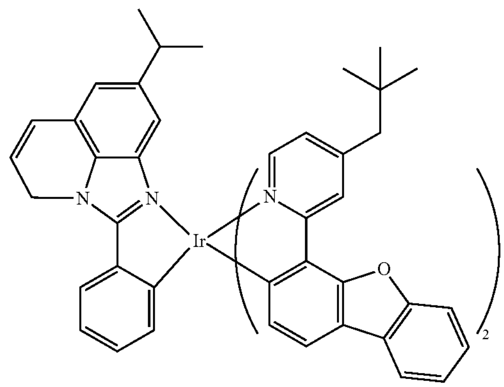
CPD 244
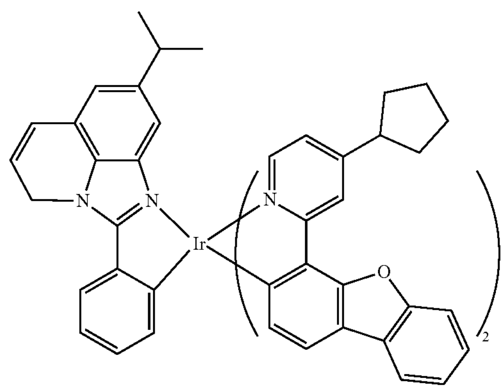
CPD 245
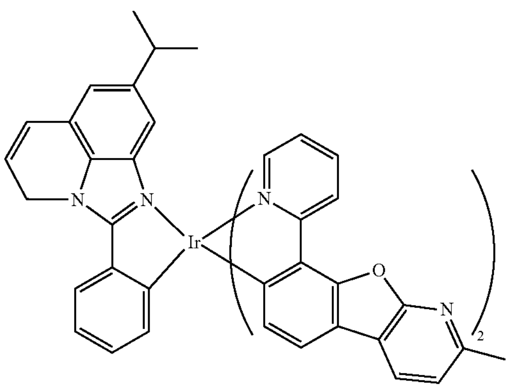
CPD 246
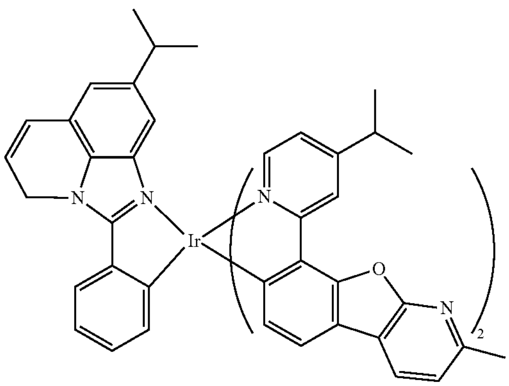
-continued
CPD 247
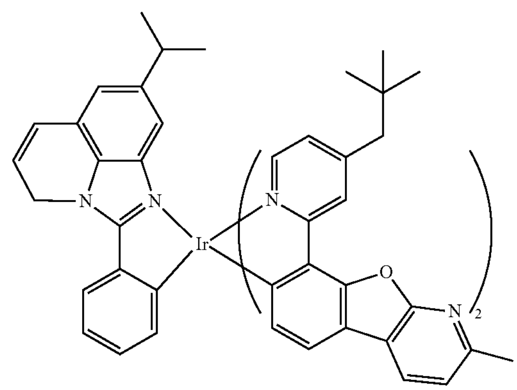
CPD 248
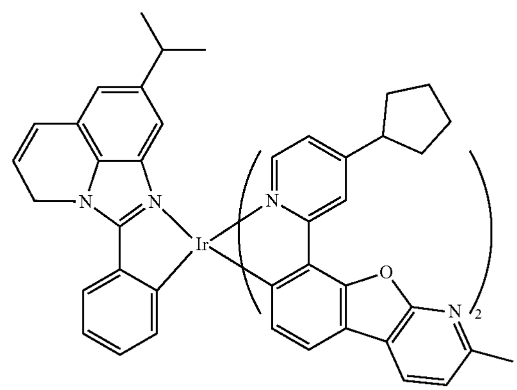
CPD 249
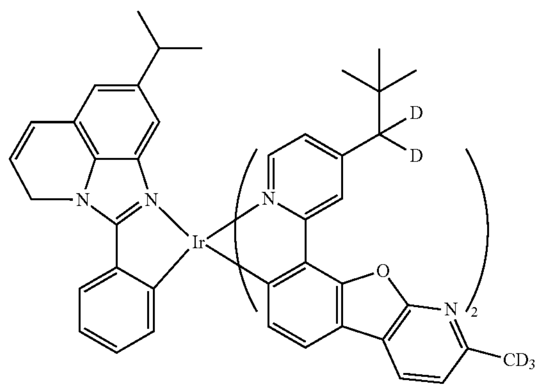
CPD 250
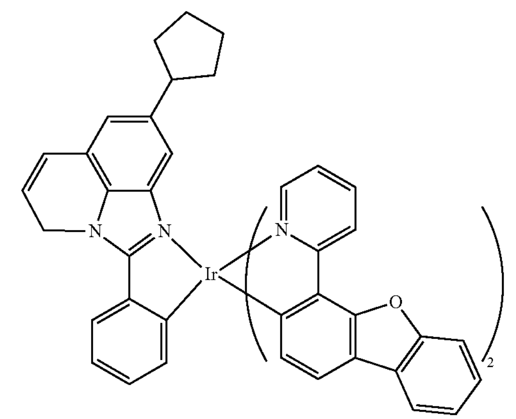

CPD 251
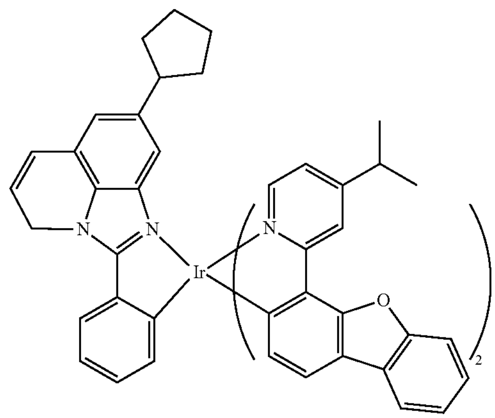
CPD 252
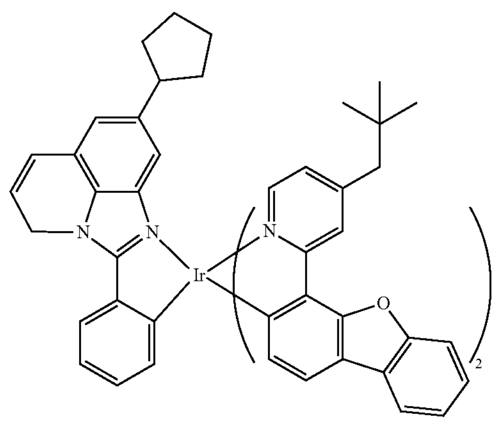
CPD 253
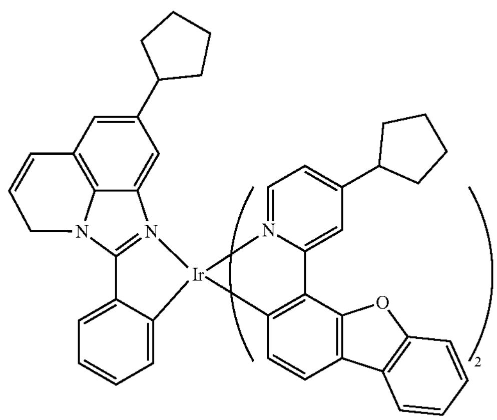
CPD 254
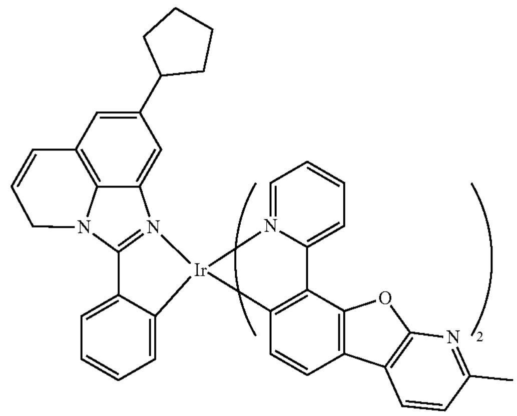
CPD 255
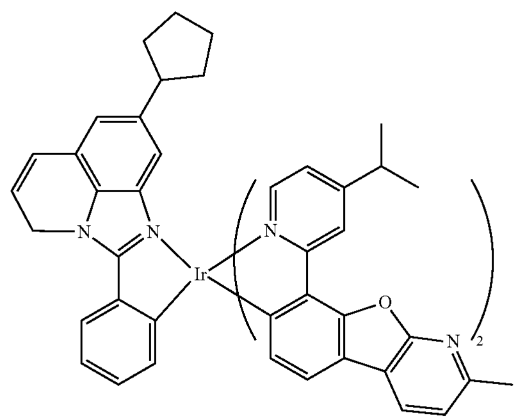
CPD 256
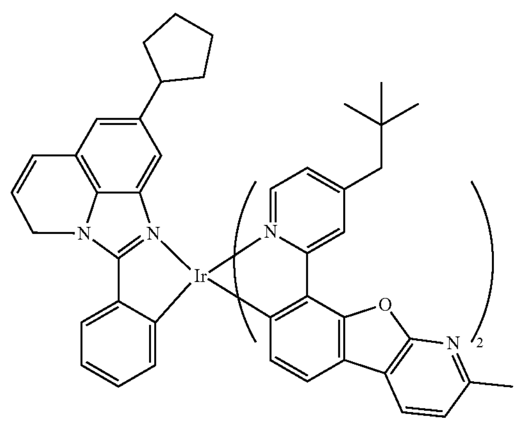

-continued
CPD 257
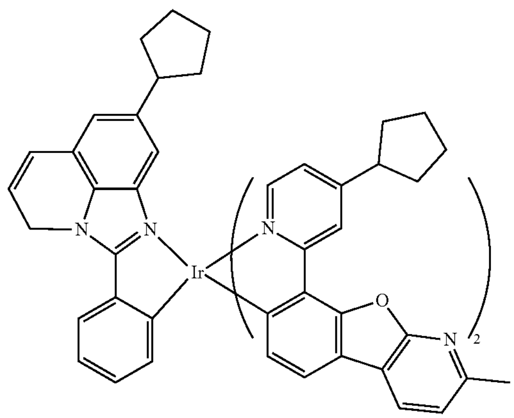
CPD 258
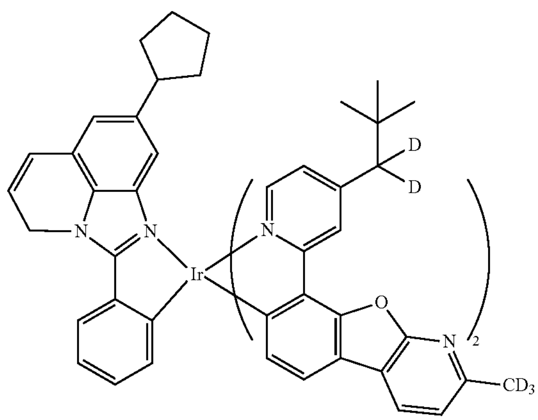
CPD 259
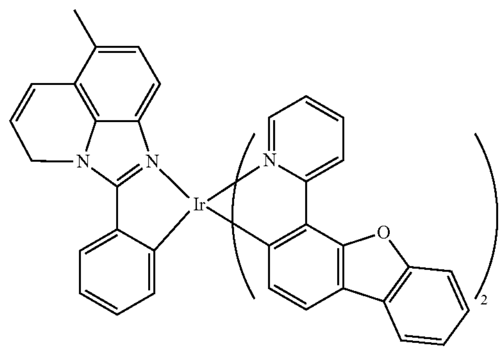
CPD 260
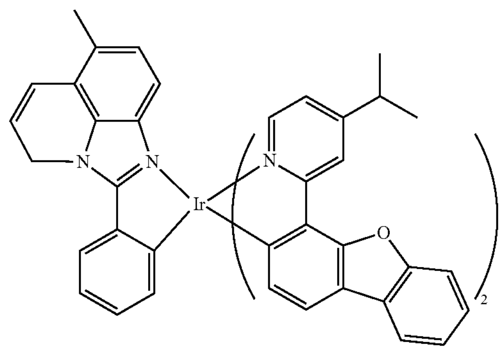
-continued
CPD 261
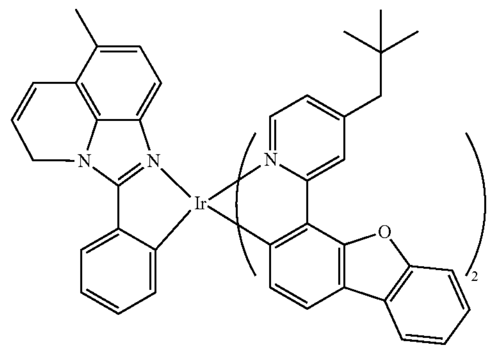
CPD 262
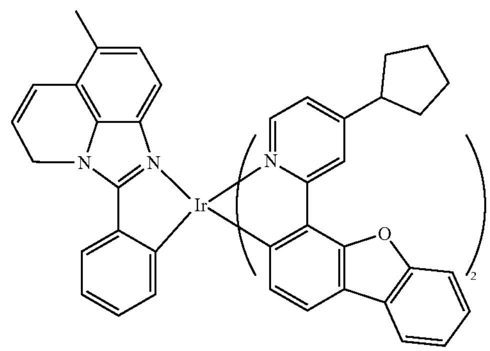
CPD 263
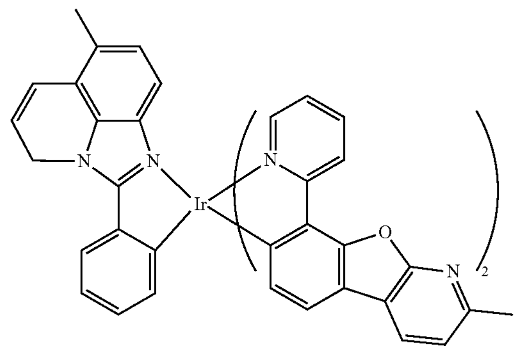
CPD 264
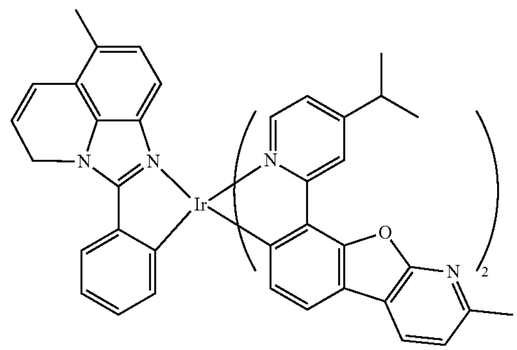

-continued
CPD 265
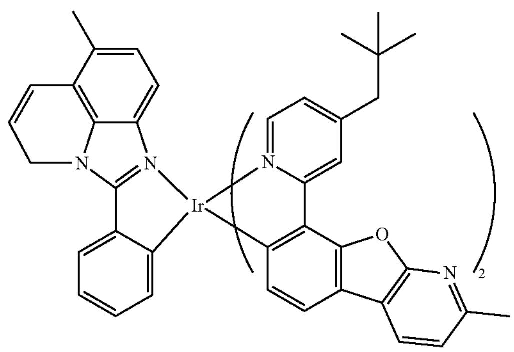
CPD 266
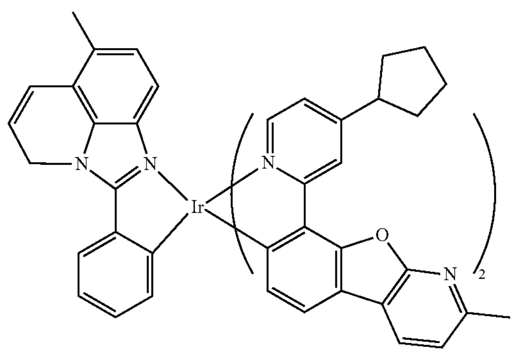
CPD 267
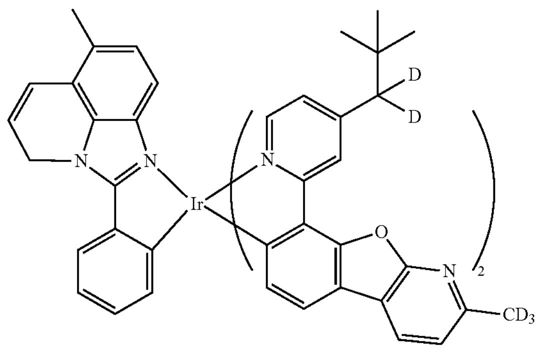
CPD 268
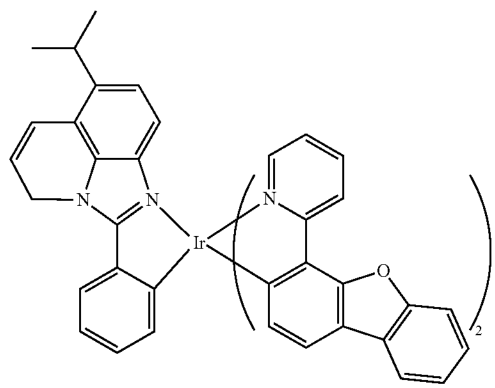
-continued
CPD 269
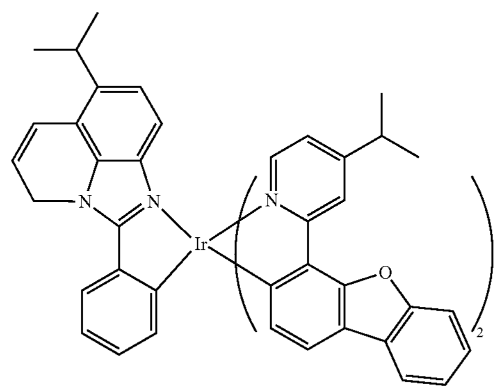
CPD 270
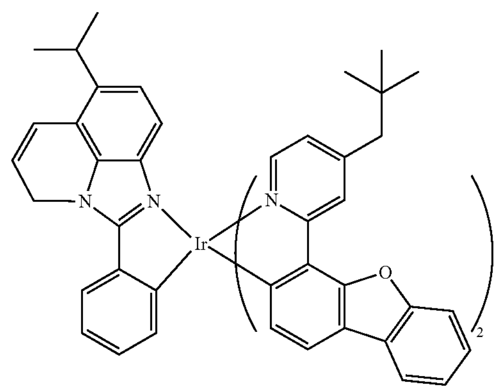
CPD 271
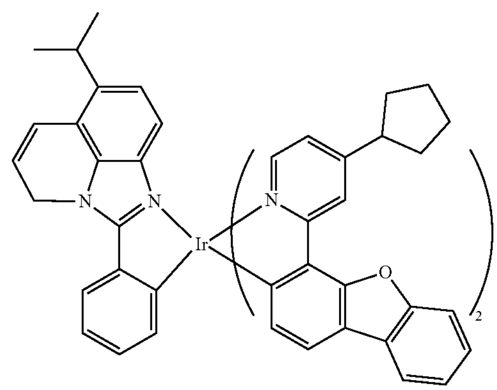
CPD 272
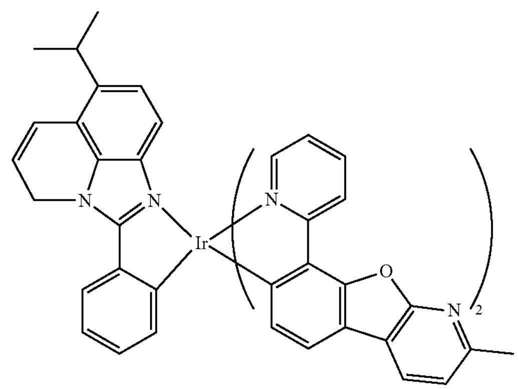

-continued
CPD 273
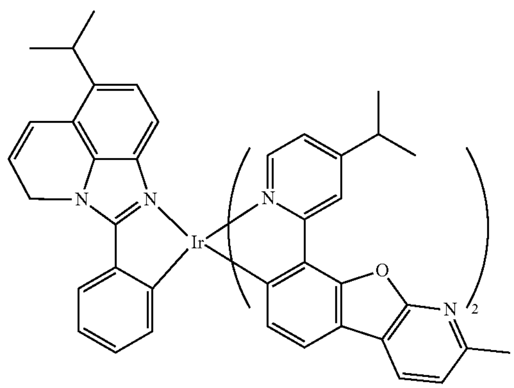
CPD 274
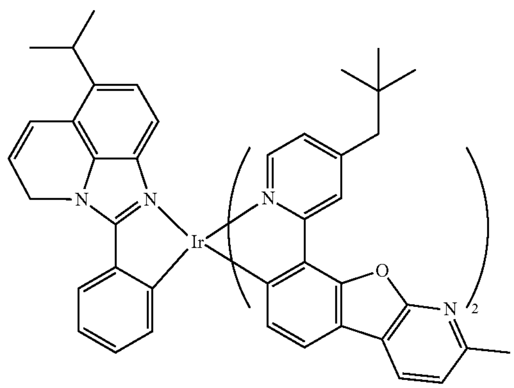
CPD 275
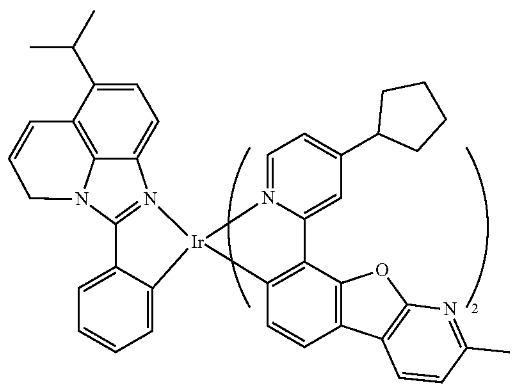
CPD 276
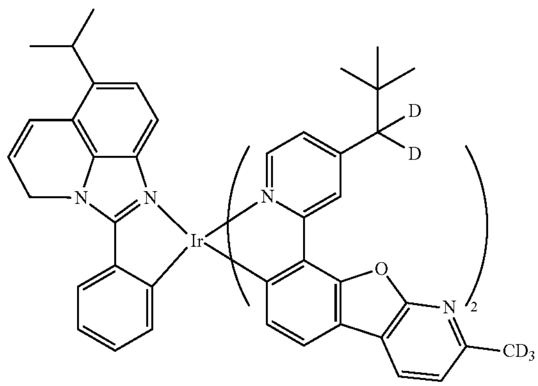
-continued
CPD 277
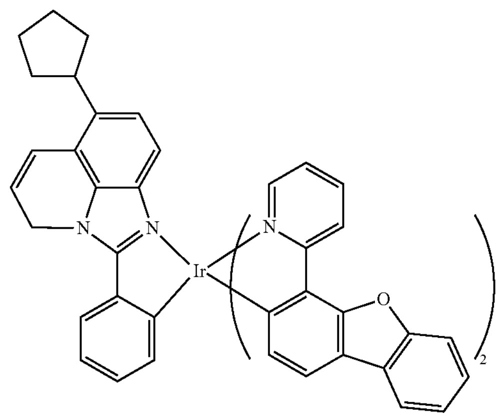
CPD 278
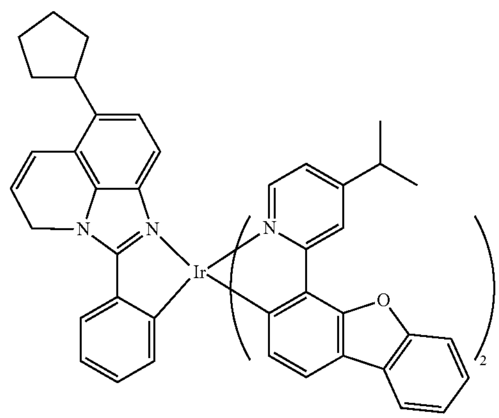
CPD 279
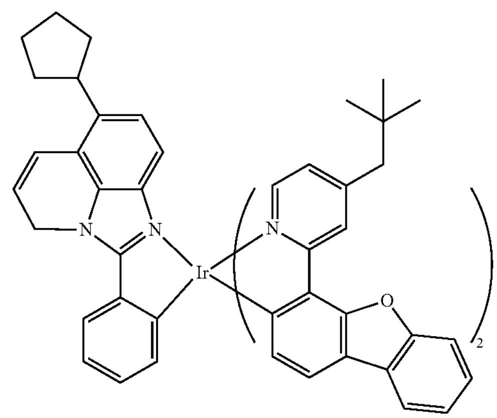

-continued
CPD 280
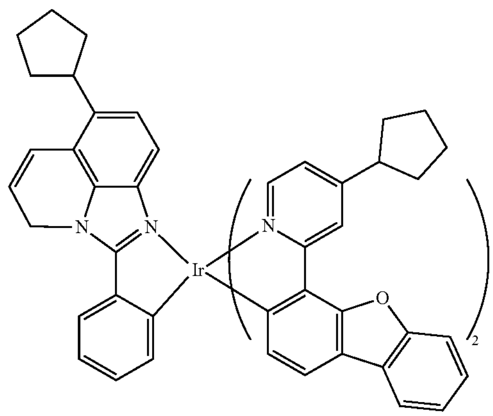
CPD 281
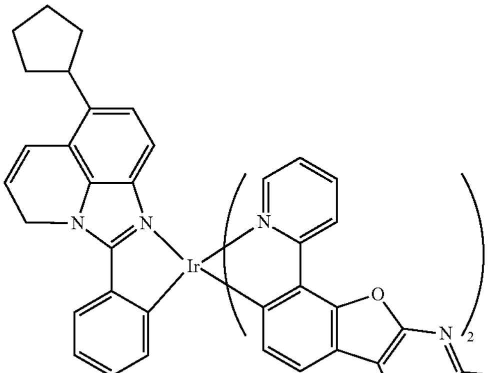
CPD 282
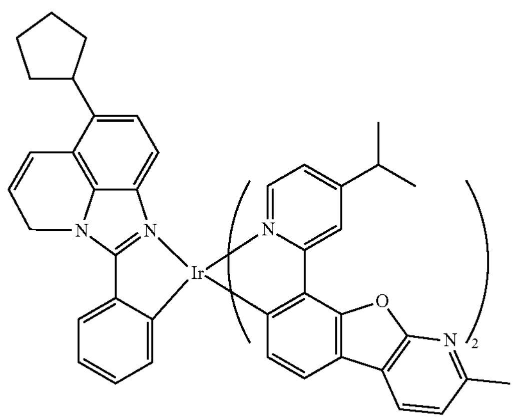
-continued
CPD 283
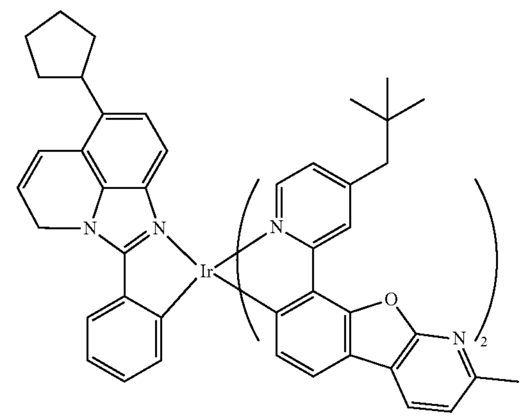
CPD 284
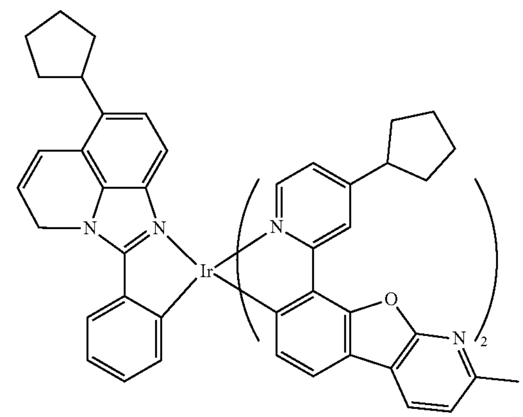
CPD 285
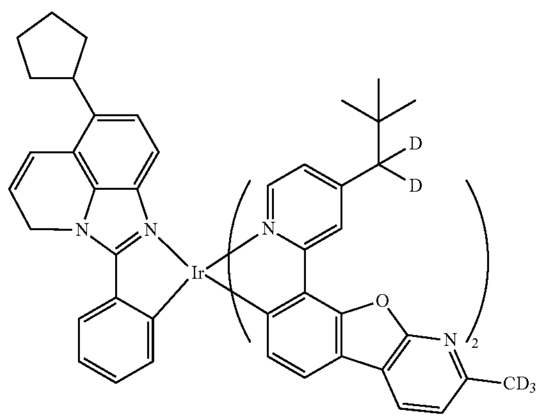
CPD 286
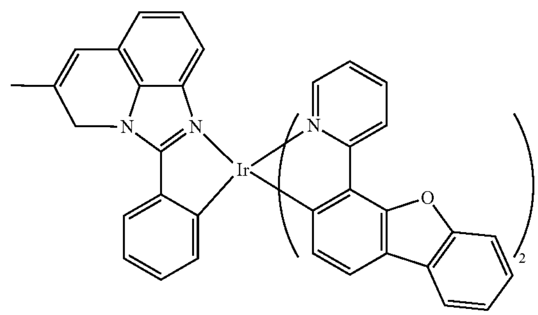

-continued
CPD 287
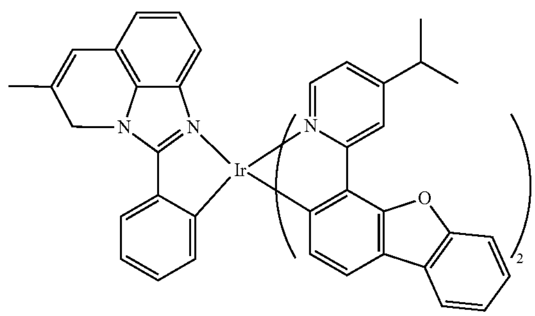
CPD 288
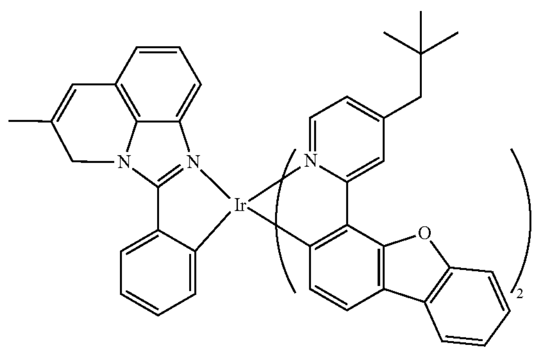
CPD 289
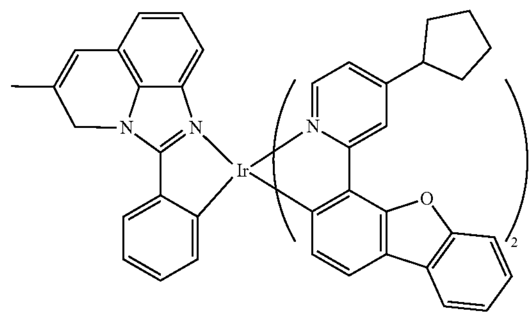
CPD 290
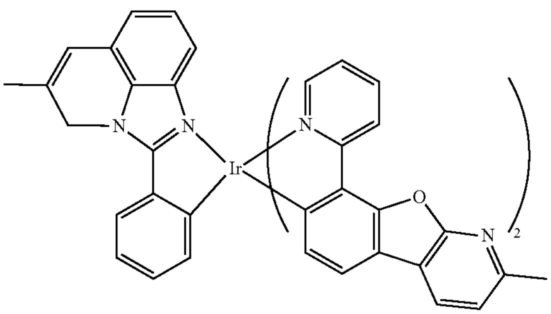
-continued
CPD 291
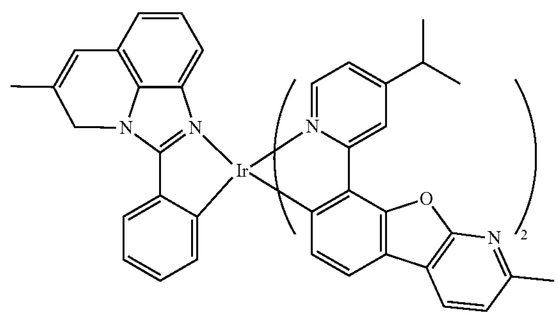
CPD 292
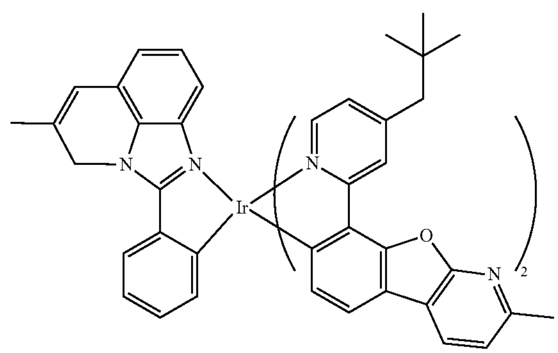
CPD 293
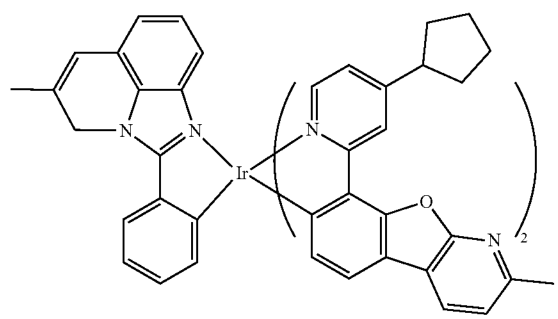
CPD 294
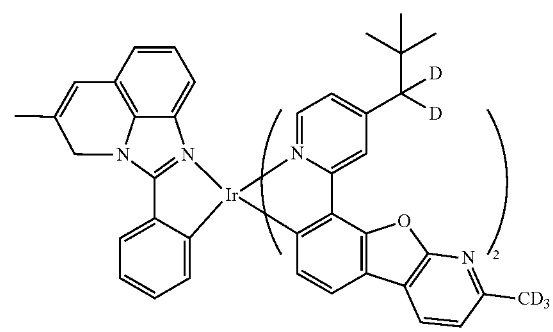

-continued
CPD 295
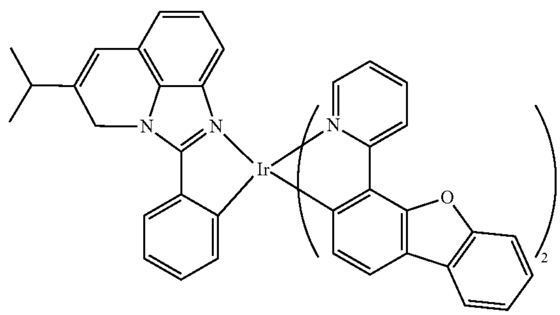
CPD 296
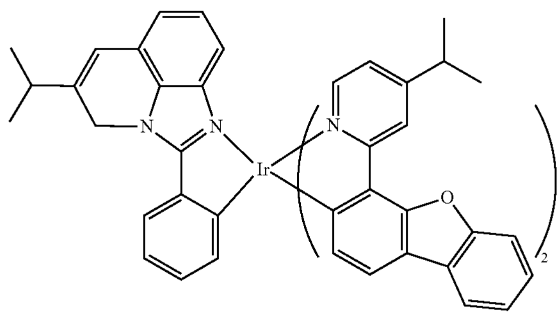
CPD 297
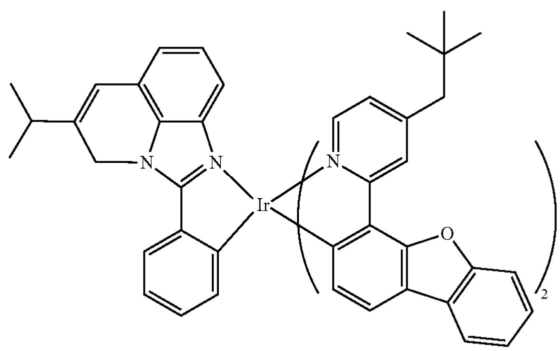
CPD 298
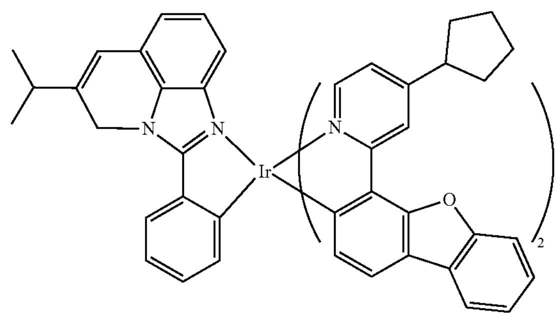
-continued
CPD 299
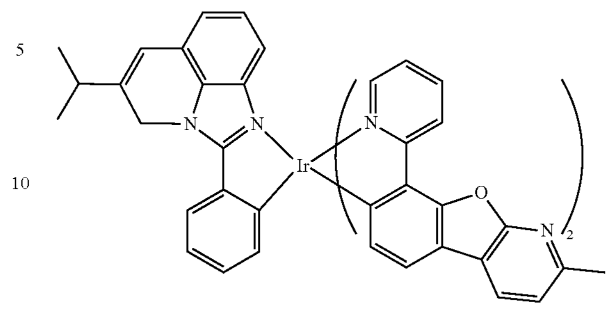
CPD 300
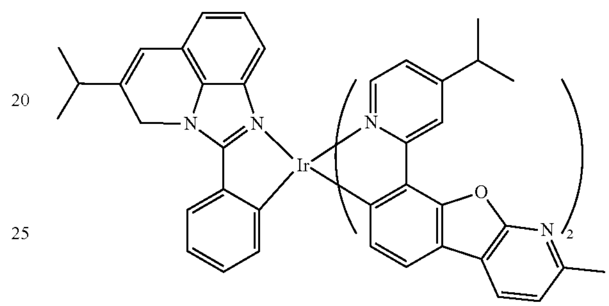
CPD 301
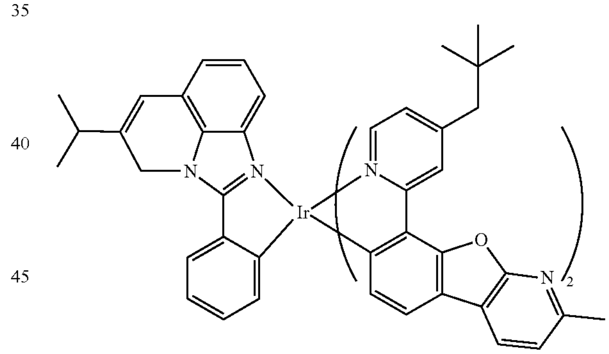
CPD 302
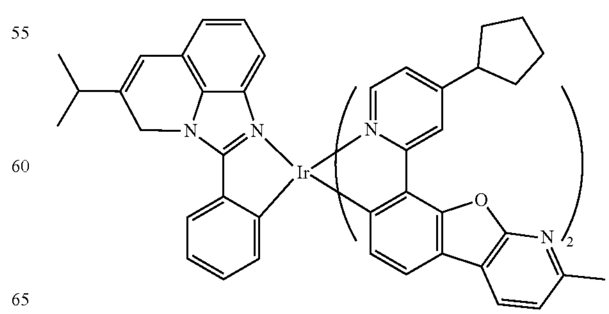

-continued
CPD 303
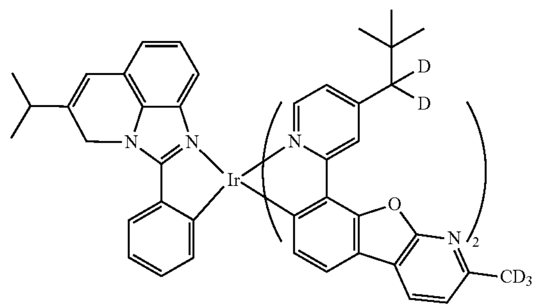
CPD 304
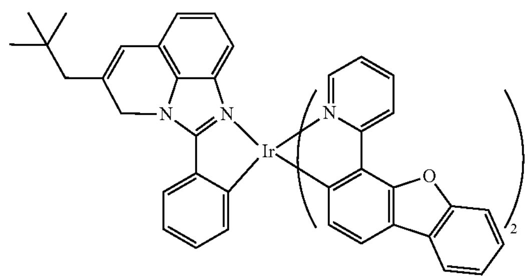
CPD 305
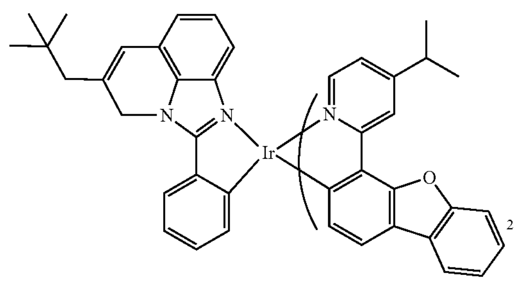
CPD 306
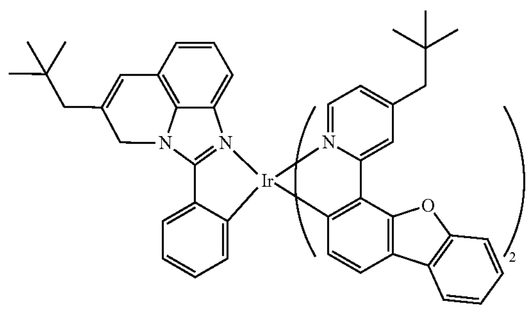
CPD 307
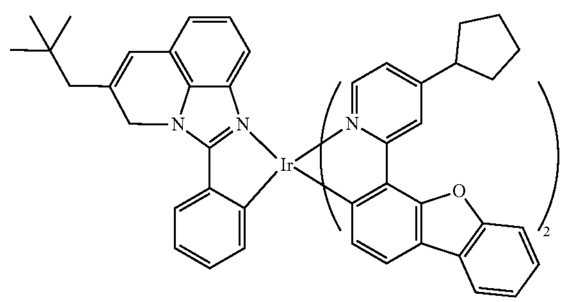
-continued
CPD 308
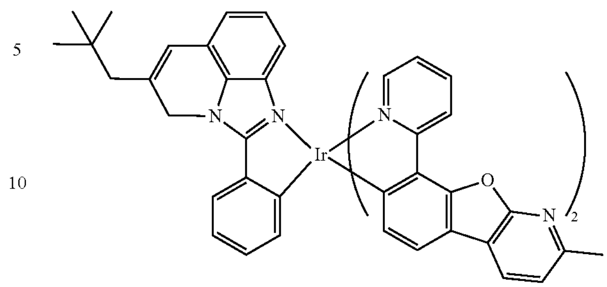
CPD 309
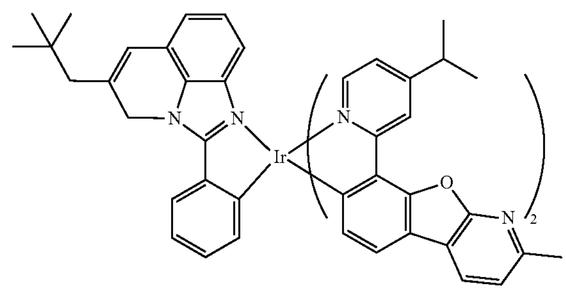
CPD 310
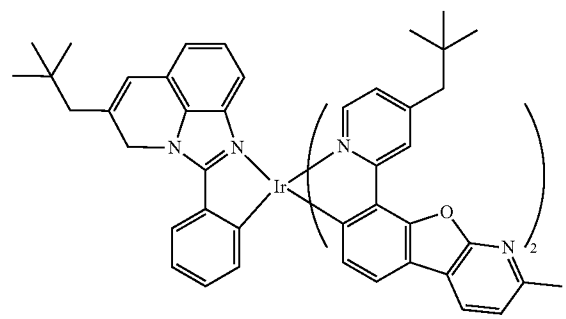
CPD 311
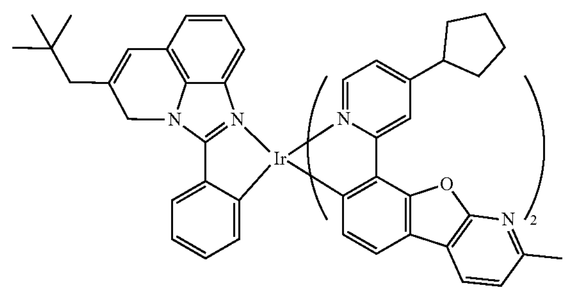
CPD 312
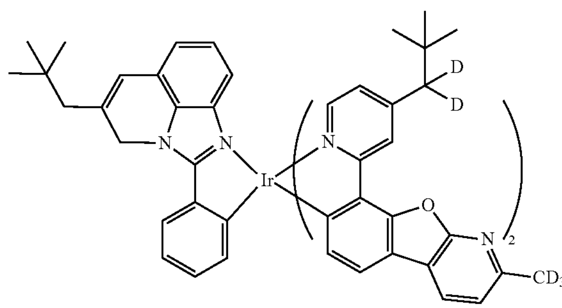

-continued

CPD 313

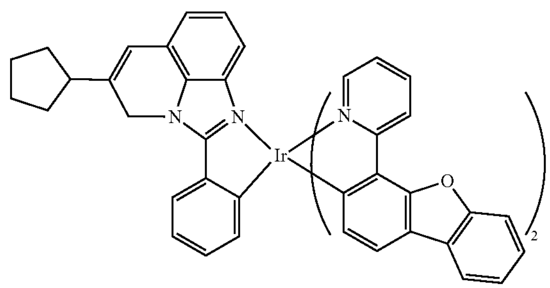

CPD 314

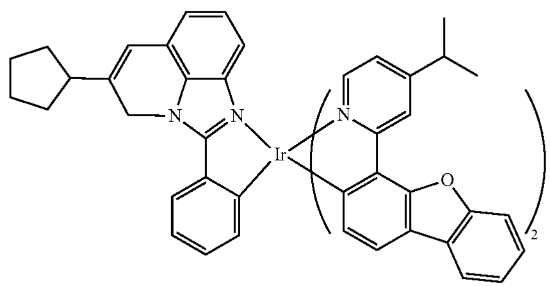

CPD 315

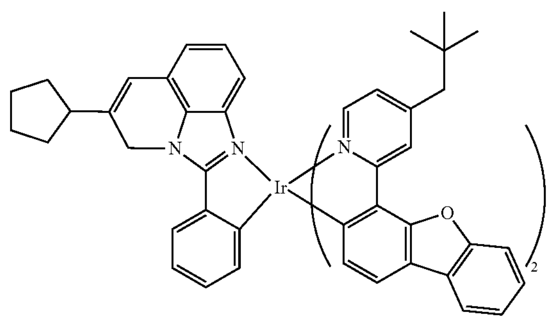

CPD 316

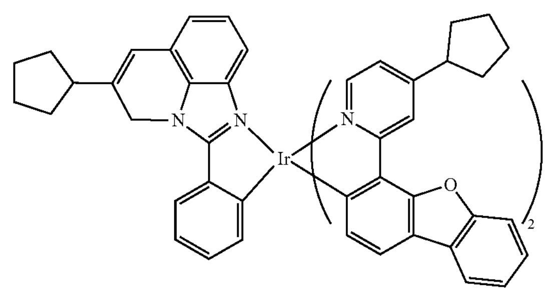

CPD 317

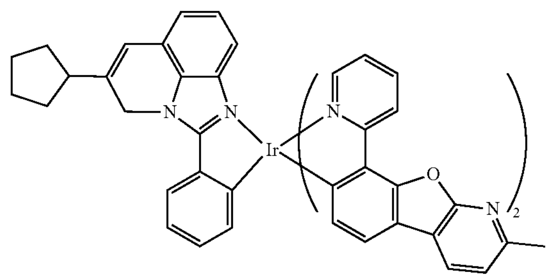

-continued

CPD 318

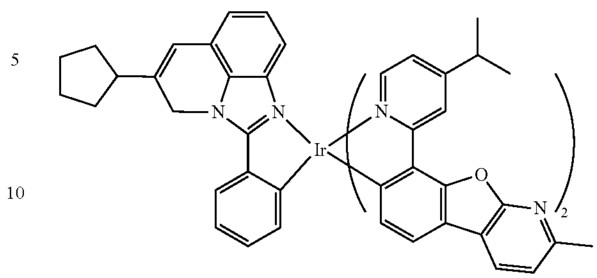

CPD 319

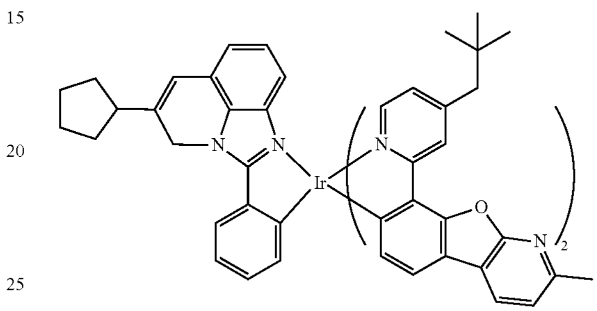

CPD 320

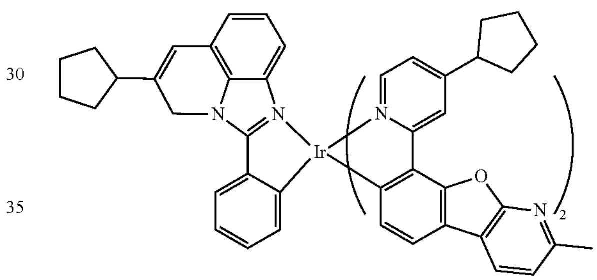

CPD 321

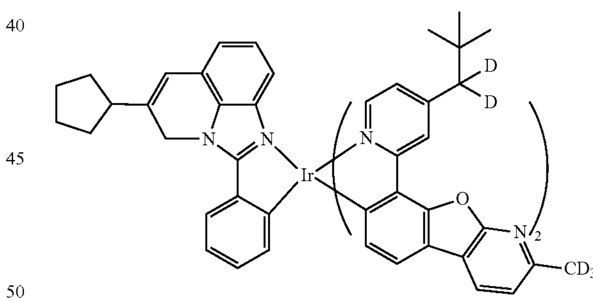

One of the purposes of the present disclosure is to provide a phosphorescent material containing the compound for an OLED.

One of the purposes of the present disclosure is to provide an OLED containing the compound.

The material of the present disclosure has the advantages of high optical and electrochemical stability, small half-peak width of emission spectrum, high color saturation, high luminous efficiency, and long device service life. As a phosphorescent material, the material of the present disclosure can convert a triplet state into light, so that the luminous efficiency of the OLED can be improved, and the energy consumption can be reduced. In particular, the compound has the potential for application in the AMOLED industry as a green light-emitting dopant.

DETAILED DESCRIPTION OF EMBODIMENTS

Figure 1:
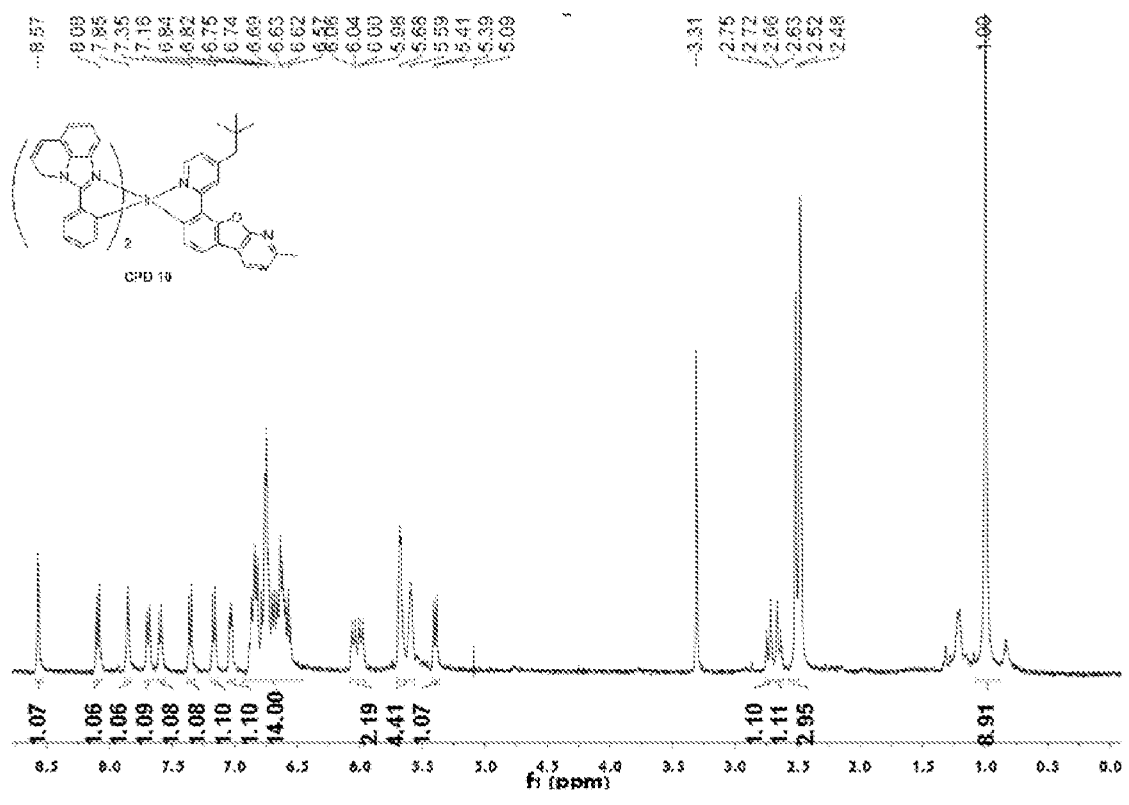
FIG. 1 is a diagram showing the 1HNMR spectrum of a compound CPD 10 of the present disclosure in a deuterated chloroform solution.
Figure 2:
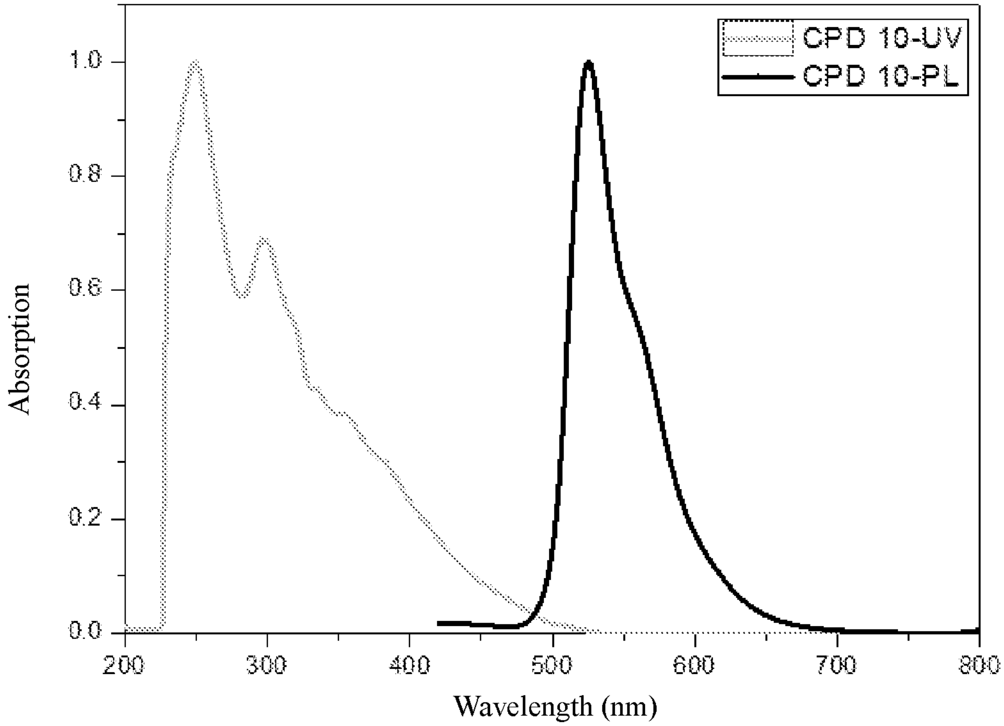
FIG. 2 shows the ultraviolet absorption spectrum and emission spectrum of the compound CPD 10 of the present disclosure in a dichloromethane solution.
Figure 3:
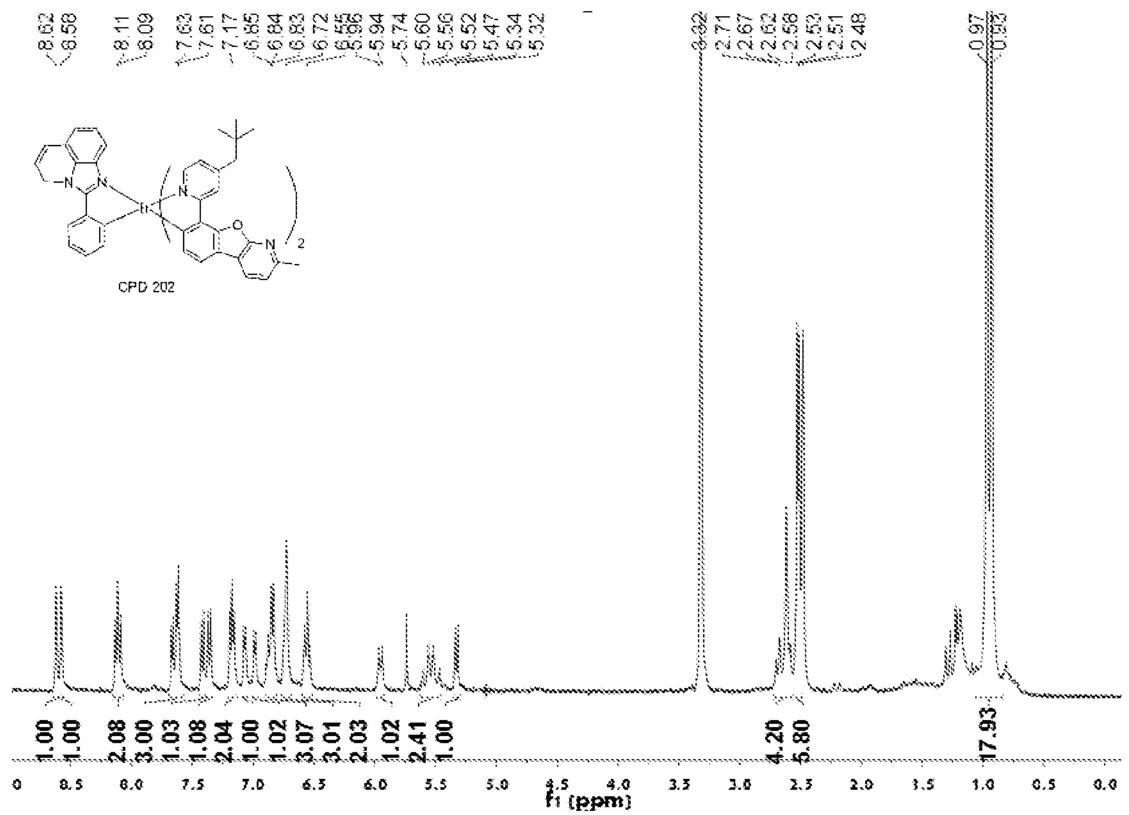
FIG. 3 is a diagram showing the 1HNMR spectrum of a compound CPD 202 of the present disclosure in a deuterated chloroform solution.
Figure 4:
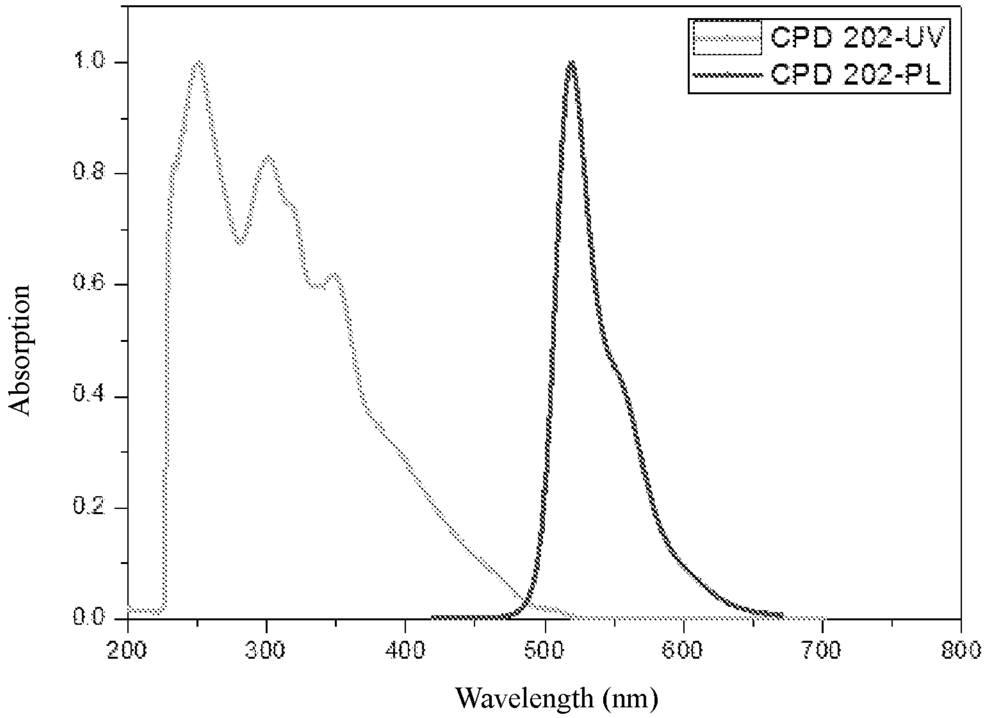
FIG. 4 shows the ultraviolet absorption spectrum and emission spectrum of the compound CPD 202 of the present disclosure in a dichloromethane solution.

A compound of the present disclosure has a structure formula as shown in the following formula (1):

(1)

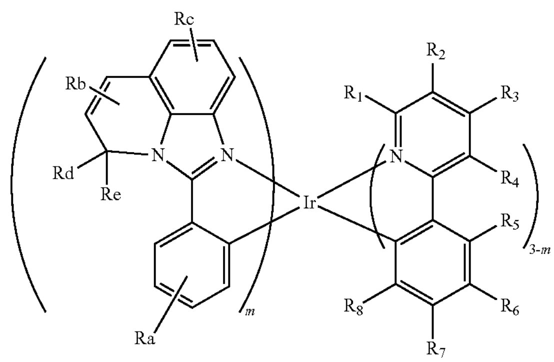

where

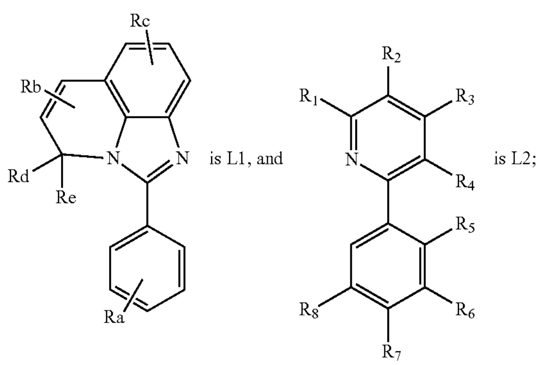

is L1, and is L2;

m is 1, 2, or 3, and when m is 1, the two L2 may be the same or different;

Ra, Rb and Rc independently indicates no substitution to maximum possible substitution;

Ra, Rb, Rc, Rd and Re are independently selected from hydrogen, deuterium, halogen, substituted or unsubstituted $C_1$-$C_{10}$ alkyl, substituted or unsubstituted $C_3$-$C_{20}$cycloalkyl, substituted or unsubstituted $C_6$-$C_{18}$ aryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl;

$R_1$-$R_8$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$heteroalkyl, substituted or unsubstituted $C_3$-$C_{20}$cycloalkyl, substituted or unsubstituted $C_2$-$C_{10}$ alkenyl, substituted or unsubstituted $C_2$-$C_{10}$alkynyl, substituted or unsubstituted $C_6$-$C_{18}$ aryl, substituted or unsubstituted $C_2$-$C_{17}$heteroaryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl;

two adjacent groups of $R_1$-$R_4$ and $R_5$-$R_8$ may be connected with each other to form an aliphatic ring structure or an aromatic ring structure;

the heteroalkyl is an alkyl at least containing one O, N or S heteroatom;

and the "substituted" refers to substitution with deuterium, F, Cl, Br, $C_1$-$C_6$ alkyl, $C_3$-$C_6$cycloalkyl, amino substituted with $C_1$-$C_6$ alkyl, nitrile, isonitrile, or phosphino, and the substitution ranges from a single substitution number to a maximum possible substitution number.

In the formula (1), when more than two Ra, Rb, or Rc exist, a plurality of the Ra, Rb, or Rc may be separately identical or different.

In the formula (1), when more than two substituents exist, a plurality of the substituents may be separately identical or different.

In the formula (1), at least one of the Rb and the Rc is deuterium, fluorine, substituted or unsubstituted $C_1$-$C_6$ alkyl, or substituted or unsubstituted $C_3$-$C_6$cycloalkyl, indicating that the Rb is selected from the above groups while the Rc is not selected from the above groups; the Rc is selected from the above groups while the Rb is not selected from the above groups; and the Rb and the Rc are selected from the above groups at the same time.

Examples of various groups of the compound as shown in the formula (1) are described below.

It should be noted that in the specification, "$C_a$-$C_b$" in the term "substituted or unsubstituted $C_a$-$C_b$ X group" refers to the number of carbons when the X group is unsubstituted, excluding the number of carbons of a substituent when the X group is substituted.

As a linear or branched alkyl, the $C_1$-$C_{10}$ alkyl specifically includes methyl, ethyl, propyl, isopropyl, n-butyl, isobutyl, sec-butyl, tert-butyl, n-pentyl and isomers thereof, n-hexyl and isomers thereof, n-heptyl and isomers thereof, n-octyl and isomers thereof, n-nonyl and isomers thereof, and n-decyl and isomers thereof, preferably includes methyl, ethyl, propyl, isopropyl, n-butyl, isobutyl, sec-butyl, and tert-butyl, and more preferably includes propyl, isopropyl, isobutyl, sec-butyl, and tert-butyl.

The $C_3$-$C_{20}$cycloalkyl may include cyclopropyl, cyclobutyl, cyclopentyl, cyclohexyl, 1-adamantyl, 2-adamantyl, 1-norbornyl, and 2-norbornyl, and preferably includes cyclopentyl and cyclohexyl.

The $C_2$-$C_{10}$ alkenyl may include vinyl, propenyl, allyl, 1-butadienyl, 2-butadienyl, 1-hexatrienyl, 2-hexatrienyl, and 3-hexatrienyl, and preferably includes propenyl and allyl.

As a linear or branched alkyl or cycloalkyl consisting of atoms other than carbon and hydrogen, the $C_1$-$C_{10}$heteroalkyl may include mercaptomethyl methyl, methoxymethyl, ethoxymethyl, tert-butoxyl methyl, N,N-dimethyl methyl, epoxy butyl, epoxy pentyl, and epoxy hexyl, and preferably includes methoxymethyl and epoxy pentyl.

Specific examples of the aryl include phenyl, naphthyl, anthracyl, phenanthryl, tetracenyl, pyrenyl, chrysenyl, benzo[c]phenanthryl, benzo[g]chrysenyl, fluorenyl, benzofluorenyl, dibenzofluorenyl, biphenyl, triphenyl, tetraphenyl, and fluoranthracyl, and preferably include phenyl and naphthyl.

Specific examples of the heteroaryl may include pyrrolyl, pyrazinyl, pyridyl, pyrimidinyl, triazinyl, indolyl, isoindolyl, imidazolyl, furyl, benzofuryl, isobenzofuryl, dibenzofuryl, dibenzothienyl, azodibenzofuryl, azodibenzothienyl, diazodibenzofuryl, diazodibenzothienyl, quinolyl, isoquinolyl, quinoxalinyl, carbazolyl, phenanthridinyl, acridinyl, phenanthrolinyl, phenazinyl, phenothiazinyl, phenoxazinyl, oxazolinyl, oxadiazolyl, furzanyl, thienyl, benzothienyl, dihydroacridinyl, azocarbazolyl, diazocarbazolyl, and quinazolinyl, and preferably include pyridyl, pyrimidinyl, triazinyl, dibenzofuryl, dibenzothienyl, azodibenzofuryl, azodibenzothienyl, di azodibenzofuryl, diazodibenzothienyl, carbazolyl, azocarbazolyl, and diazocarbazolyl.

The following embodiments are merely described to facilitate the understanding of the technical disclosure, and should not be considered as specific limitations of the present disclosure.

All raw materials, solvents and the like involved in the synthesis of compounds in the present disclosure are purchased from Alfa, Acros, and other suppliers known to persons skilled in the field.

Synthesis of a Common Intermediate L1-1

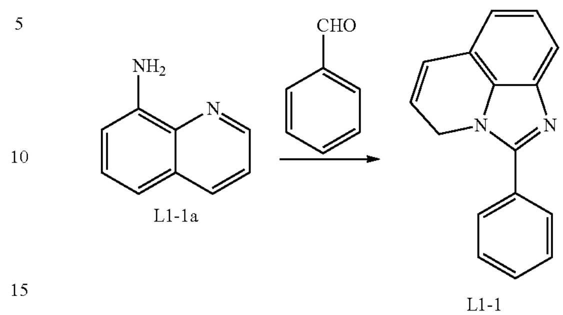

L1-1a

L1-1

Synthesis of a Compound L1-1

A compound L1-1a (32.0 g, 0.22 mol, 1.0 eq), benzaldehyde (28.2 g, 0.26 mol, 1.20 eq), acetic acid (19.9 g, 0.33 mol, 1.5 eq) and toluene (160 ml) were added to a 500 ml three-mouth flask, vacuumization was conducted for nitrogen replacement for 3 times, and stirring was conducted for reflux at 110° C. for 18 h under the protection of nitrogen. According to monitoring by TLC, the raw material L1-1a was completely reacted. Cooling was conducted to room temperature. 100 ml of deionized water was added for water washing and layering. An upper organic phase was collected and concentrated to remove an organic solvent, followed by spin-drying and separation by column chromatography (with an eluting agent including ethyl acetate and n-hexane at a ratio of 1:20). Then drying was conducted to obtain 30.26 g of a grayish white solid, namely a compound L1-1, with a yield of 58.7%. The mass spectrum was: 233.28 (M+H). $^1$H NMR (400 MHz, $CDCl_3$) δ 7.93-7.86 (m, 2H), 7.58-7.44 (m, 4H), 7.10 (dd, J=8.1, 7.3 Hz, 1H), 6.87 (d, J=7.1 Hz, 1H), 6.64 (dd, J=11.1, 3.5 Hz, 1H), 5.84 (dt, J=10.0, 3.4 Hz, 1H), 5.37-5.32 (m, 2H).

Synthesis of a Compound CPD 1

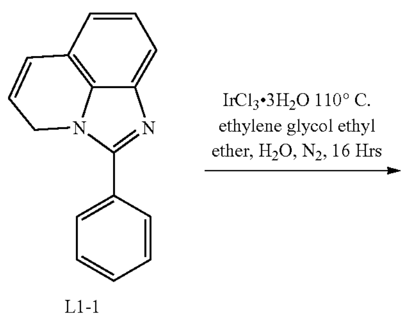

L1-1

-continued

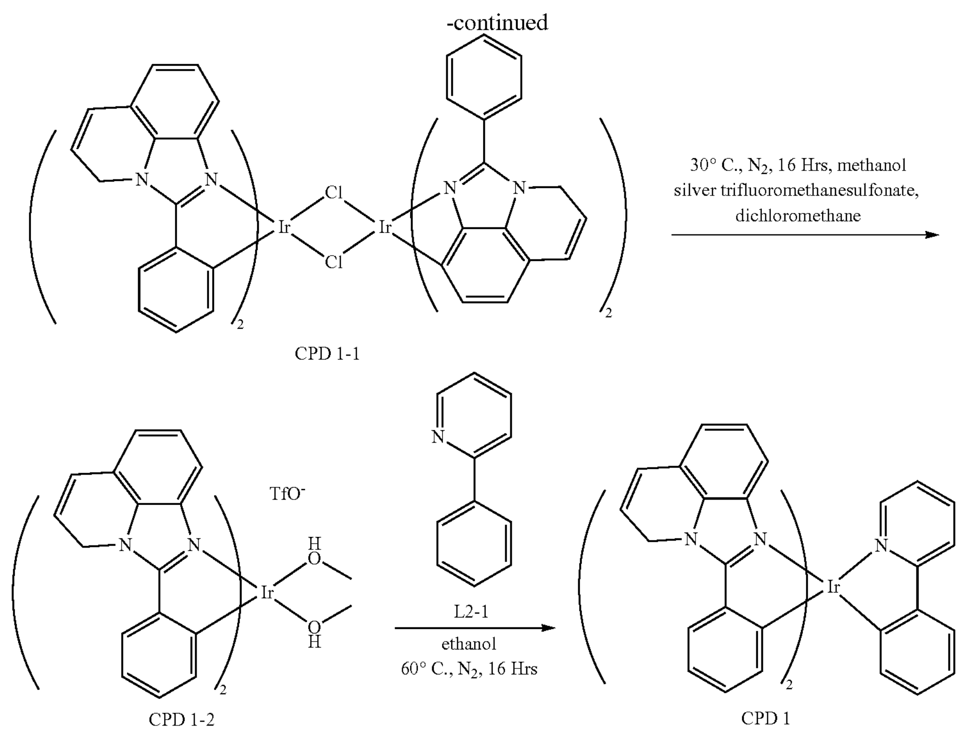

CPD 1-1

CPD 1-2

CPD 1

Synthesis of a Compound CPD 1-1

The compound L1-1 (30.0 g, 0.129 mol, 3.0 eq) and $IrCl_3 \cdot 3H_2O$ (15.18 g, 0.043 mol, 1.0 eq) were put into a 1 L one-mouth flask, and ethylene glycol ethyl ether (300 ml) and deionized water (100 ml) were added. Vacuum replacement was conducted for 3 times, and a mixture was stirred for reflux at 110° C. for 16 h under the protection of $N_2$. After cooling was conducted to room temperature, filtration was conducted. A filter residue was sequentially washed with methanol (100 ml*3) and n-hexane (100 ml*3), and then dried to obtain 25.46 g of a compound CPD 1-1 with a yield of 85.7%. The obtained compound was directly used in the next step without purification.

Synthesis of a Compound CPD 1-2

A dimer CPD 1-1 (15.1 g, 0.021 mol, 1.0 eq) and dichloromethane (1.5 L) were added to a 3 L three-mouth flask and stirred for dissolution. Silver trifluoromethanesulfonate (11.24 g, 0.043 mol, 2.0 eq) was dissolved in isopropanol (1.1 L) and then added to an original solution in the reaction flask. Vacuum replacement was conducted for 3 times, and a mixture was stirred at room temperature for 16 h under the protection of $N_2$. Then a reaction solution was filtered with diatomite, a filter residue was rinsed with dichloromethane (150 ml), and a filtrate was spin-dried to obtain 14.56 g of a compound CPD 1-2 with a yield of 76.7%. The obtained compound was directly used in the next step without purification.

Synthesis of a Compound CPD 1

The compound CPD 1-2 (7.06 g, 8.13 mmol, 1.0 eq) and a compound L2-1 (3.79 g, 24.4 mmol, 3.0 eq) were added to a 250 ml three-mouth flask, and ethanol (70 ml) was added. Vacuum replacement was conducted for 3 times, and a mixture was stirred for reflux for 16 h under the protection of $N_2$. After cooling was conducted to room temperature, filtration was conducted. A solid was collected, dissolved in dichloromethane (150 ml), and filtered with silica gel. A filter cake was rinsed with dichloromethane (50 ml). A filtrate was spin-dried, recrystallized for 2 times with tetrahydrofuran/methanol (at a ratio of a product to tetrahydrofuran to methanol was 1:5:5), and beaten for 1 time with n-hexane (80 ml). Then drying was conducted to obtain 4.33 g of a compound CPD 1 with a yield of 65.8%. 4.33 g of the crude product CPD 1 was sublimated and purified to obtain 2.87 g of a sublimated pure product CPD 1 with a yield of 66.2%. The mass spectrum was: 809.95 (M+H). $^1H$ NMR (400 MHz, $CDCl_3$) δ 8.37 (d, 1H), 8.16 (d, 1H), 7.77 (dd, 2H), 7.50 (m, 6H), 7.40 (m, J=20.0 Hz, 6H), 7.15 (m, J=15.0 Hz, 3H), 7.07 (dd, 2H), 6.90 (m, 1H), 6.56 (dd, 2H), 5.76 (m, 2H), 5.16 (dd, J=2.7 Hz, 2H), 5.01 (dd, J=2.7 Hz, 2H).

Synthesis of a Compound CPD 10

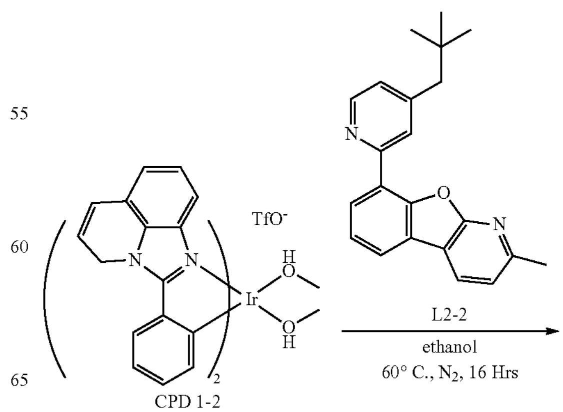

CPD 1-2

-continued

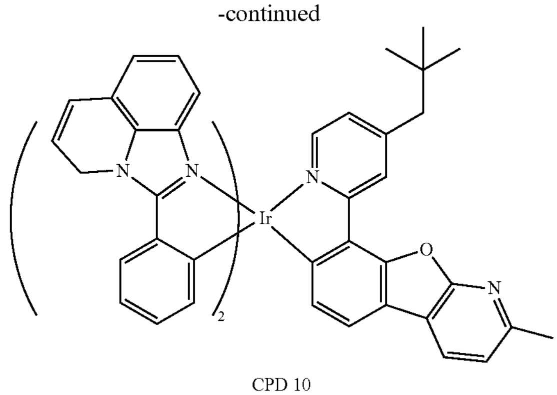

CPD 10

With reference to the synthesis and purification methods of the compound CPD 1, only the corresponding raw materials were required to be changed, and 4.21 g of a target compound CPD 10 with a yield of 71.2% was obtained. 4.21 g of the crude product CPD 10 was sublimated and purified to obtain 2.74 g of a sublimated pure product CPD 10 with a yield of 65.0%. The mass spectrum was: 985.2 (M+H). $^1$H NMR (400 MHz, DMSO) δ 8.57 (s, 1H), 8.09 (d, J=7.5 Hz, 1H), 7.86 (d, J=5.4 Hz, 1H), 7.69 (d, J=7.9 Hz, 1H), 7.59 (d, J=7.9 Hz, 1H), 7.36 (d, J=7.9 Hz, 1H), 7.17 (d, J=7.9 Hz, 1H), 7.03 (d, J=4.0 Hz, 1H), 6.93-6.46 (m, 14H), 6.02 (dd, J=23.2, 10.3 Hz, 2H), 5.64 (d, J=34.4 Hz, 4H), 5.40 (d, J=8.3 Hz, 1H), 2.73 (d, J=12.6 Hz, 1H), 2.65 (d, J=12.0 Hz, 1H), 2.52 (s, 3H), 1.00 (s, 9H).

Synthesis of a Common Intermediate L1-2

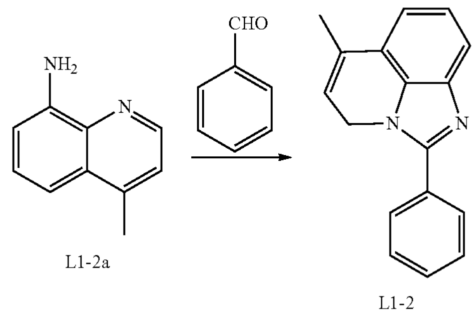

L1-2a

L1-2

Synthesis of a Compound L1-2

With reference to the synthesis and purification methods of the compound L1-1, only the corresponding raw materials were required to be changed, and 26.2 g of a target compound L1-2 with a yield of 54.2% was obtained. The mass spectrum was: 247.3 (M+H). $^1$H NMR (400 MHz, $CDCl_3$) δ 8.28 (m, 2H), 7.46 (m, 4H), 7.17 (t, 1H), 7.07 (dd, 1H), 5.54 (m, 1H), 5.08-4.89 (d, 2H), 1.97 (s, 3H).

Synthesis of a Compound CPD 15

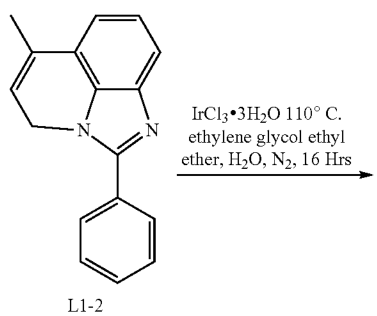

L1-2

-continued

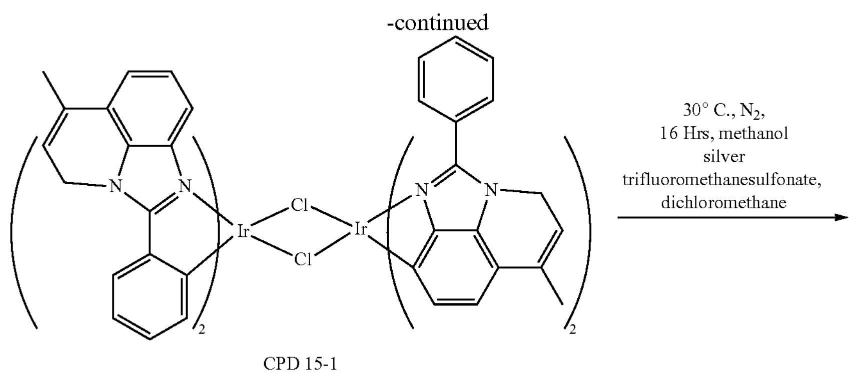

CPD 15-1

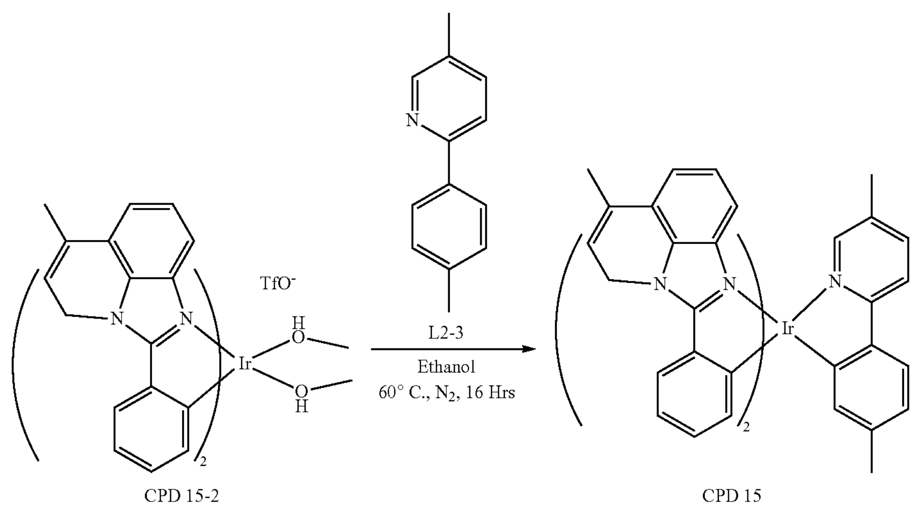

CPD 15-2 CPD 15

Synthesis of a Compound CPD 15-1

With reference to the synthesis and purification methods of the compound CPD 1-1, only the corresponding raw materials were required to be changed, and an obtained compound was directly used in the next step without purification.

Synthesis of a Compound CPD 15-2

With reference to the synthesis and purification methods of the compound CPD 1-2, only the corresponding raw materials were required to be changed, and an obtained compound was directly used in the next step without purification.

Synthesis of a Compound CPD 15

With reference to the synthesis and purification methods of the compound CPD 1, only the corresponding raw materials were required to be changed, and 3.84 g of a target compound CPD 15 with a yield of 66.7% was obtained. 3.84 g of the crude product CPD 15 was sublimated and purified to obtain 2.65 g of a sublimated pure product CPD 15 with a yield of 69.0%. The mass spectrum was: 866.3 (M+H). $^1H$ NMR (400 MHz, $CDCl_3$) δ 8.30 (d, 1H), 8.11 (d, 1H), 7.75 (m, J=20.0 Hz, 3H), 7.50 (m, 5H), 7.42 (m, 4H), 7.28 (dd, J=15.0 Hz, 2H), 7.17 (t, 2H), 7.07 (dd, 2H), 5.54 (m, 2H), 5.34 (dd, J=4.6 Hz, 2H), 4.88 (dd, J=4.6 Hz, 2H), 2.31 (s, J=5.0 Hz, 6H), 1.97 (d, 6H).

Synthesis of a Compound CPD 18

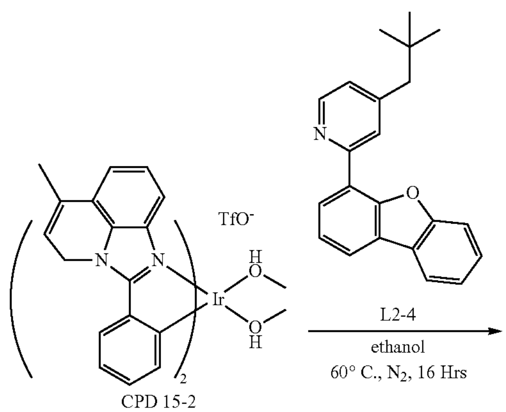

CPD 15-2

-continued

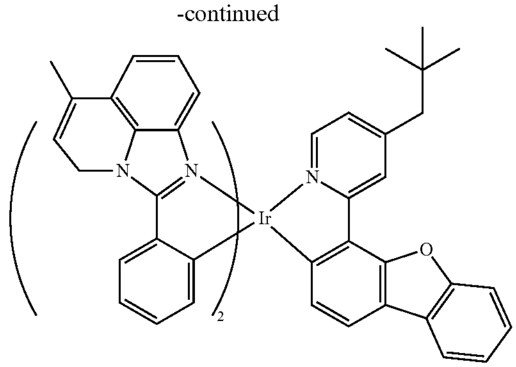

CPD 18

With reference to the synthesis and purification methods of the compound CPD 1, only the corresponding raw materials were required to be changed, and 3.79 g of a target compound CPD 18 with a yield of 68.1% was obtained. 3.79 g of the crude product CPD 18 was sublimated and purified to obtain 2.45 g of a sublimated pure product CPD 18 with a yield of 64.6%. The mass spectrum was: 998.3 (M+H). $^1$H NMR (400 MHz, $CDCl_3$) δ 8.50 (d, 1H), 7.98 (dd, 1H), 7.84 (d, 1H), 7.77 (dd, 2H), 7.69 (s, 1H), 7.52 (m, J=20.0 Hz, 6H), 7.40 (m, J=15.0 Hz, 5H), 7.31 (m, 1H), 7.17 (t, 2H), 7.06 (m, J=10.0 Hz, 3H), 5.54 (t, 2H), 5.11 (d, 2H), 4.73 (d, 2H), 3.21 (s, 2H), 1.97 (s, 6H), 0.85 (s, 9H).

Synthesis of a Compound CPD 22

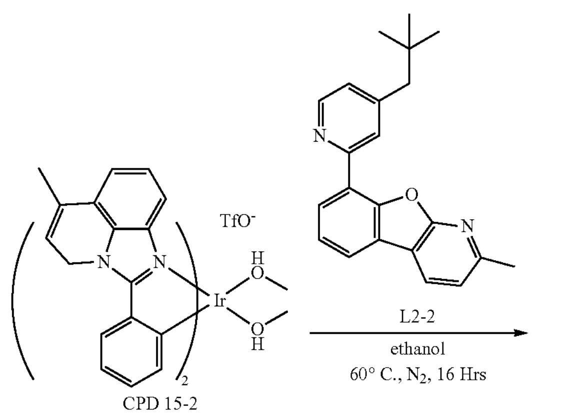

CPD 15-2

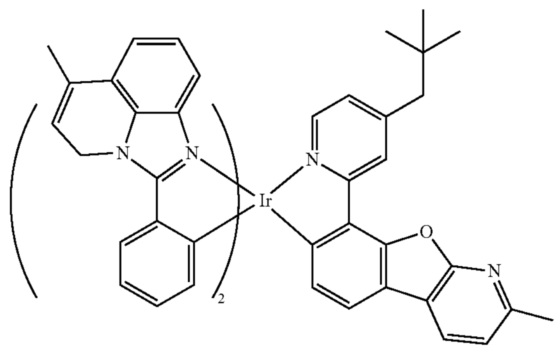

CPD 22

With reference to the synthesis and purification methods of the compound CPD 1, only the corresponding raw materials were required to be changed, and 3.37 g of a target compound CPD 22 with a yield of 62.4% was obtained. 3.37 g of the crude product CPD 22 was sublimated and purified to obtain 2.14 g of a sublimated pure product CPD 22 with a yield of 63.5%. The mass spectrum was: 1013.3 (M+H). $^1$H NMR (400 MHz, $CDCl_3$) δ 8.50 (d, 1H), 8.41 (d, 1H), 7.84 (d, 1H), 7.77 (dd, 2H), 7.69 (s, 1H), 7.50 (m, 5H), 7.42 (m, 4H), 7.17 (t, 2H), 7.11-6.97 (m, 4H), 5.65 (d, 2H), 5.54 (m, 2H), 5.09 (d, 2H), 3.21 (s, 2H), 2.68 (s, 3H), 1.97 (d, 6H), 0.85 (s, 9H).

Synthesis of a Compound CPD 24

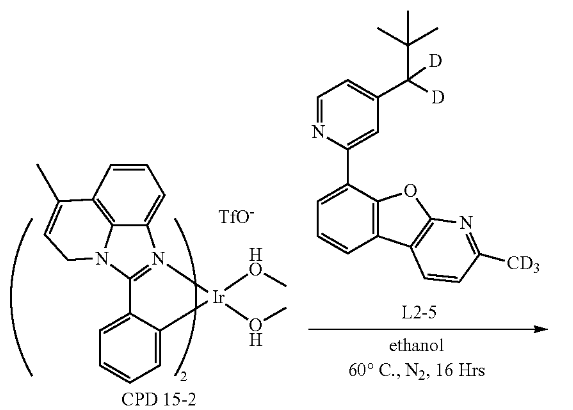

CPD 15-2

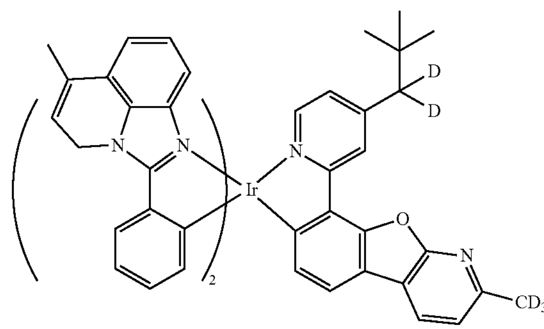

CPD 24

With reference to the synthesis and purification methods of the compound CPD 1, only the corresponding raw materials were required to be changed, and 3.42 g of a target compound CPD 24 with a yield of 65.4% was obtained. 3.42 g of the crude product CPD 24 was sublimated and purified to obtain 2.35 g of a sublimated pure product CPD 24 with a yield of 68.7%. The mass spectrum was: 1018.4 (M+H). $^1$H NMR (400 MHz, $CDCl_3$) δ 8.61 (dd, J=15.0, 2.9 Hz, 1H), 8.50 (d, J=15.0 Hz, 1H), 8.42 (dd, J=15.0, 2.9 Hz, 1H), 7.86-7.67 (m, 4H), 7.50 (t, J=14.8 Hz, 4H), 7.42 (m, J=15.0, 3.3, 1.9 Hz, 4H), 7.22 (dt, J=44.0, 14.9 Hz, 3H), 7.06 (ddd, J=15.0, 9.0, 3.1 Hz, 3H), 5.60-5.50 (m, 2H), 5.44 (t, J=12.0 Hz, 2H), 4.78 (t, J=12.1 Hz, 2H), 1.97 (d, J=2.0 Hz, 6H), 1.32 (s, 9H).

Synthesis of a Common Intermediate L1-3

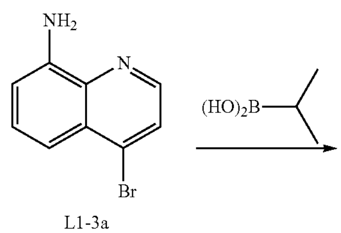

L1-3a

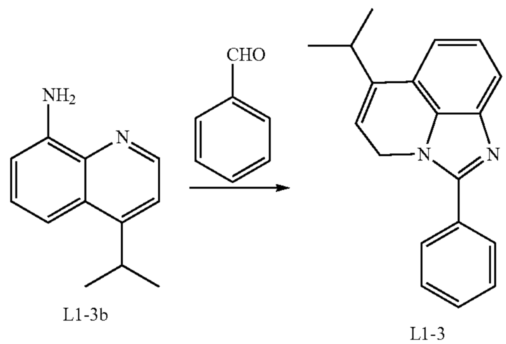

L1-3b

L1-3

Synthesis of a Compound L1-3b

A compound L1-3a (32 g, 143.4 mmol, 1.0 eq), isopropylboronic acid (15.13 g, 172.1 mmol, 1.2 eq), dichlorodi-tert-butyl-(4-dimethylaminophenyl)phosphopalladium (II) (2.03 g, 2.87 mmol, 0.02 eq), $K_3PO_4$ (60.9 g, 286.9 mmol, 2.0 eq), and toluene (320 ml) were sequentially added into a 1 L three-mouth flask. Vacuumization was conducted for nitrogen replacement for 3 times. A mixture obtained was heated to about 70° C. in an oil bath, stirred for 16 h, and then sampled. According to monitoring by TLC, the raw material L1-3a was basically reacted completely. Cooling was conducted to room temperature. Deionized water was added for water washing for 3 times (150 ml/time). After liquid separation, an organic phase was concentrated under reduced pressure to obtain a solid. A crude product was separated by column chromatography (with a mixture of EA and Hex at a ratio of 1:20) to obtain a product. The product obtained was dried to obtain 19.26 g of a white-like solid compound L1-3b with a yield of 72.1%. The mass spectrum was: 187.2 (M+H).

Synthesis of a Compound L1-3

With reference to the synthesis and purification methods of the compound L1-1, only the corresponding raw materials were required to be changed, and 18.44 g of a target compound L1-3 with a yield of 65.2% was obtained. The mass spectrum was: 275.3 (M+H). $^1$H NMR (400 MHz, $CDCl_3$) δ 8.28 (m, 2H), 7.46 (m, 4H), 7.17 (t, 1H), 7.07 (dd, 1H), 5.54 (d, 1H), 4.99 (dd, J=19.2 Hz, 2H), 3.00 (m, 1H), 1.04 (d, 6H).

Synthesis of a Compound CPD 30

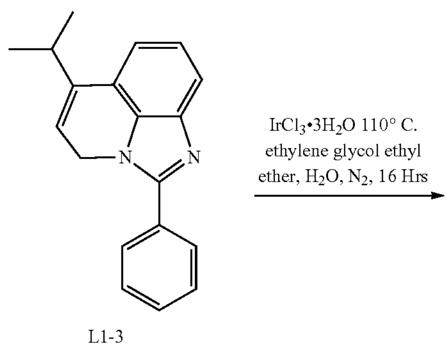

L1-3

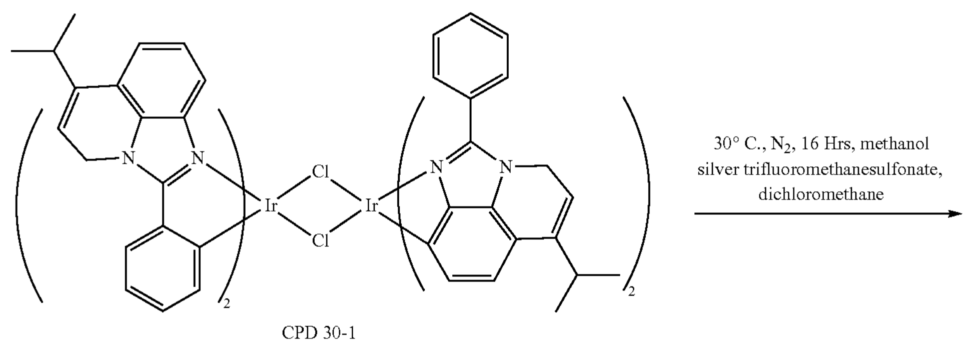

CPD 30-1

-continued

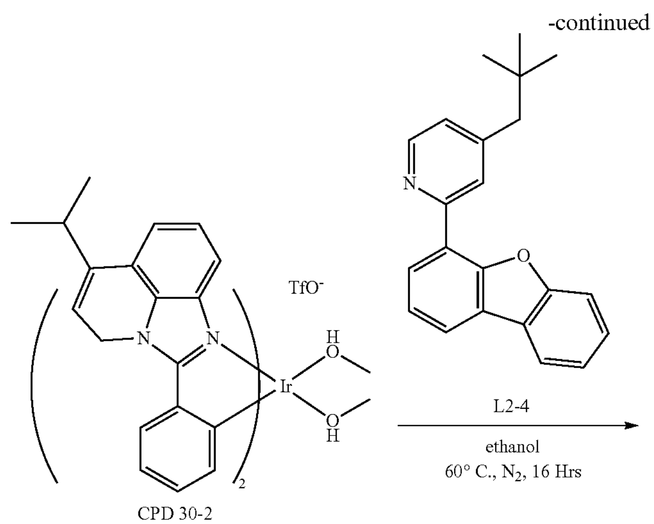

CPD 30-2

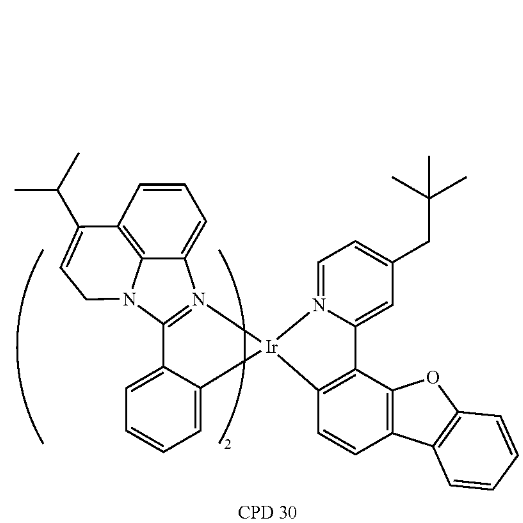

CPD 30

Synthesis of a Compound CPD 30-1

With reference to the synthesis and purification methods of the compound CPD 1-1, only the corresponding raw materials were required to be changed, and an obtained compound was directly used in the next step without purification.

Synthesis of a Compound CPD 30-2

With reference to the synthesis and purification methods of the compound CPD 1-2, only the corresponding raw materials were required to be changed, and an obtained compound was directly used in the next step without purification.

Synthesis of a Compound CPD 30

With reference to the synthesis and purification methods of the compound CPD 1, only the corresponding raw materials were required to be changed, and 3.27 g of a target compound CPD 30 with a yield of 63.1% was obtained. 3.27 g of the crude product CPD 30 was sublimated and purified to obtain 2.21 g of a sublimated pure product CPD 30 with a yield of 67.5%. The mass spectrum was: 1054.4 (M+H). $^1$H NMR (400 MHz, $CDCl_3$) δ 8.50 (d, J=15.0 Hz, 1H), 7.98 (dd, J=14.6, 3.4 Hz, 1H), 7.87-7.67 (m, 4H), 7.58-7.45 (m, 7H), 7.45-7.25 (m, 6H), 7.17 (t, J=14.8 Hz, 2H), 7.06 (ddd, J=15.0, 9.0, 3.1 Hz, 3H), 5.67 (d, J=12.4 Hz, 2H), 5.54 (td, J=12.4, 2.0 Hz, 2H), 5.01 (d, J=12.4 Hz, 2H), 3.21 (s, 2H), 2.88 (m, J=12.7, 1.9 Hz, 2H), 1.04 (d, J=12.8 Hz, 12H), 0.85 (s, 9H).

Synthesis of a Compound CPD 36

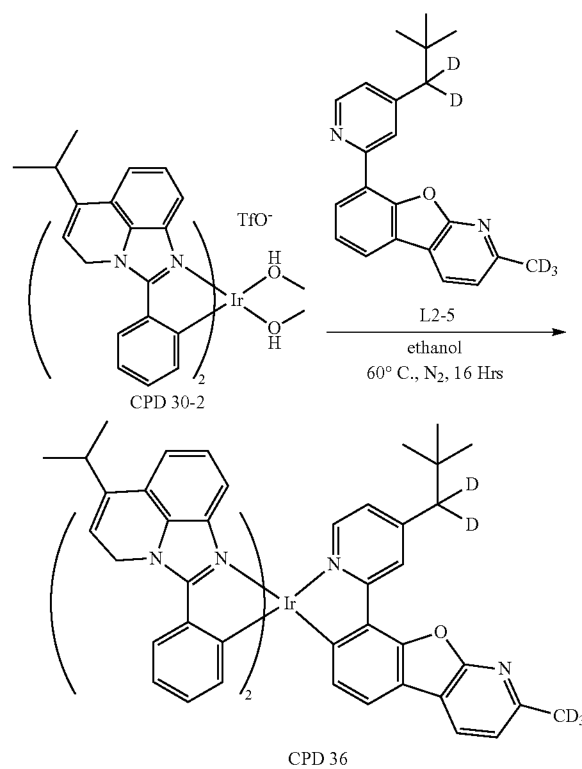

CPD 30-2

CPD 36

With reference to the synthesis and purification methods of the compound CPD 1, only the corresponding raw materials were required to be changed, and 3.34 g of a target compound CPD 36 with a yield of 62.7% was obtained. 3.34 g of the crude product CPD 36 was sublimated and purified to obtain 2.17 g of a sublimated pure product CPD 36 with a yield of 64.3%. The mass spectrum was: 1074.4 (M+H). $^1$H NMR (400 MHz, $CDCl_3$) δ 8.61 (dd, J=15.0, 2.9 Hz, 1H), 8.54-8.38 (m, 2H), 7.88-7.66 (m, 4H), 7.50 (m, J=14.8 Hz, 4H), 7.42 (m, J=15.0, 3.3, 1.9 Hz, 4H), 7.22 (dt, J=44.0, 14.9 Hz, 3H), 7.06 (m, J=15.0, 9.0, 3.1 Hz, 3H), 5.61-5.45

(m, 4H), 5.07-4.93 (m, 2H), 2.75 (m J=12.8, 1.8 Hz, 2H), 1.32 (s, 9H), 1.04 (d, J=12.8 Hz, 12H).

Synthesis of a Common Intermediate L1-4

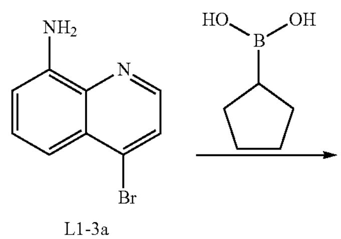

L1-3a

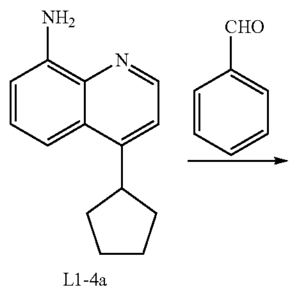

L1-4a

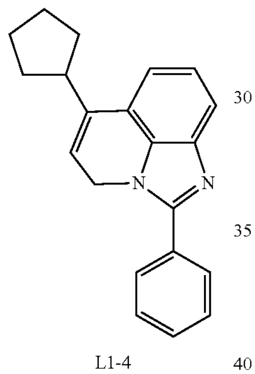

L1-4

Synthesis of a Compound L1-4a

With reference to the synthesis and purification methods of the compound L1-3b, only the corresponding raw materials were required to be changed. The mass spectrum was: 213.3 (M+H).

Synthesis of a Compound L1-4

With reference to the synthesis and purification methods of the compound L1-1, only the corresponding raw materials were required to be changed, and 20.4 g of a target compound L1-4 with a yield of 57.9% was obtained. The mass spectrum was: 301.4 (M+H). $^1$H NMR (400 MHz, $CDCl_3$) δ 8.28 (m, 2H), 7.46 (m, 4H), 7.17 (t, 1H), 7.07 (dd, 1H), 5.54 (t, 1H), 5.08-4.93 (d, 2H), 2.79 (m, 1H), 1.66 (m, J=52.5 Hz, 6H), 1.30 (m, 2H).

Synthesis of a Compound CPD 42

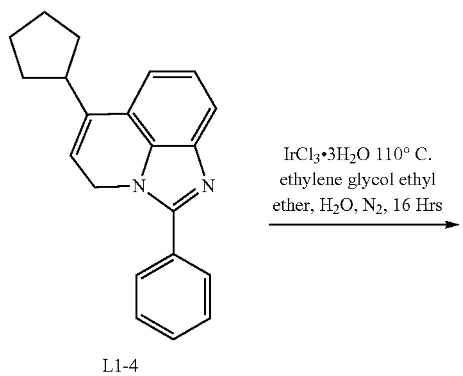

L1-4

-continued

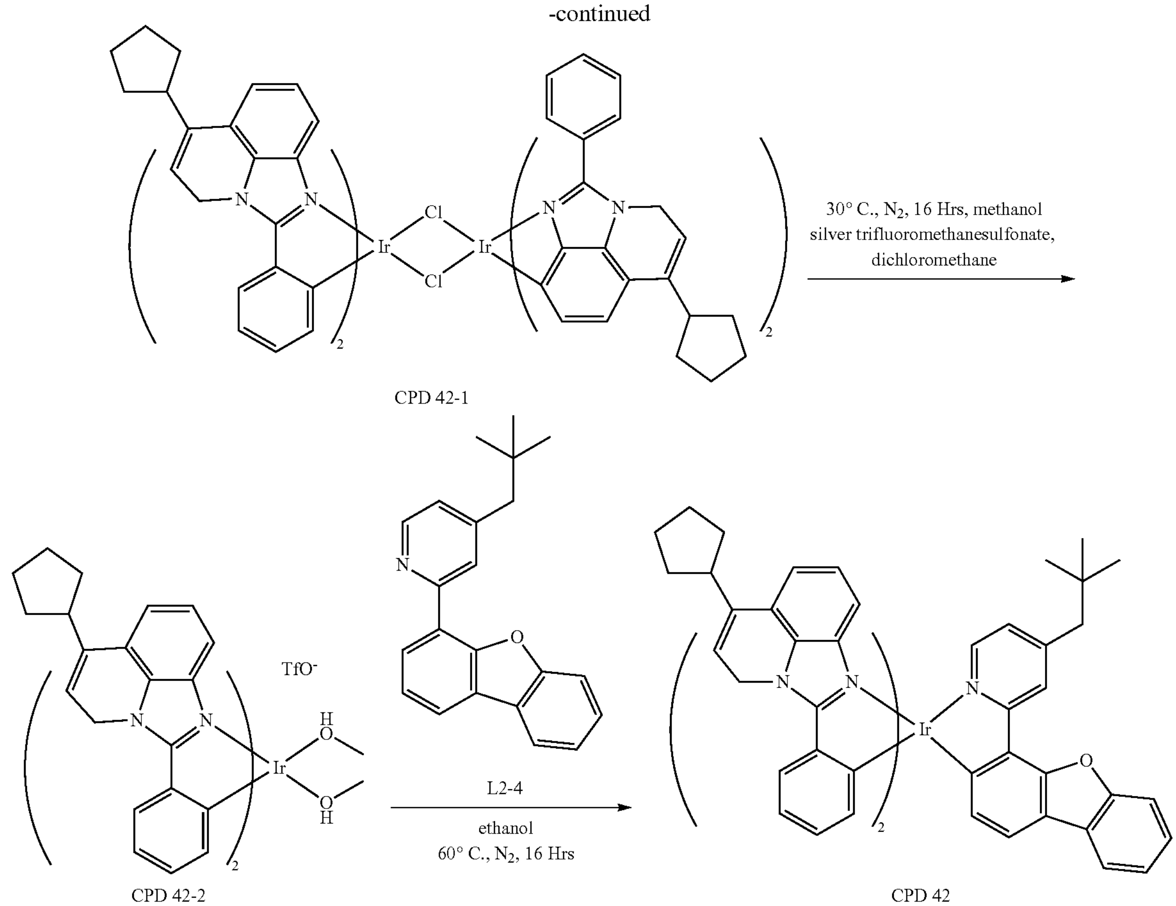

CPD 42-1

L2-4

CPD 42-2

CPD 42

Synthesis of a Compound CPD 42-1

With reference to the synthesis and purification methods of the compound CPD 1-1, only the corresponding raw materials were required to be changed, and an obtained compound was directly used in the next step without purification.

Synthesis of a Compound CPD 42-2

With reference to the synthesis and purification methods of the compound CPD 1-2, only the corresponding raw materials were required to be changed, and an obtained compound was directly used in the next step without purification.

Synthesis of a Compound CPD 42

With reference to the synthesis and purification methods of the compound CPD 1, only the corresponding raw materials were required to be changed, and 2.96 g of a target compound CPD 42 with a yield of 57.6% was obtained. 2.96 g of the crude product CPD 42 was sublimated and purified to obtain 1.86 g of a sublimated pure product CPD 42 with a yield of 62.8%. The mass spectrum was: 1106.4 (M+H). $^1$H NMR (400 MHz, $CDCl_3$) δ 8.50 (d, 1H), 7.98 (dd, 1H), 7.87-7.65 (m, 4H), 7.52 (m, J=20.0 Hz, 6H), 7.40 (m, J=15.0 Hz, 5H), 7.31 (m, 1H), 7.17 (t, 2H), 7.06 (m, J=10.0 Hz, 3H), 5.76 (d, 2H), 5.54 (t, 2H), 5.12 (d, 2H), 3.21 (s, 2H), 2.74 (m, 2H), 1.76 (m, 4H), 1.66 (m, 4H), 1.55 (m, 4H), 1.30 (m, 4H), 0.85 (s, 9H).

Synthesis of a Common Intermediate L1-5

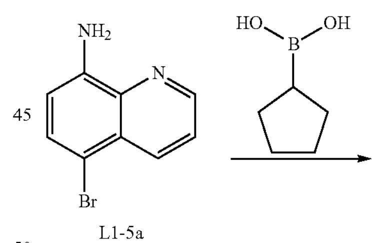

L1-5a

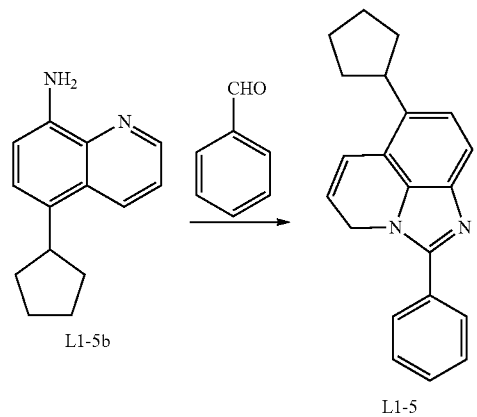

L1-5b

L1-5

Synthesis of a Compound L1-5b

With reference to the synthesis and purification methods of the compound L1-3b, only the corresponding raw materials were required to be changed. The mass spectrum was: 213.3 (M+H).

Synthesis of a Compound L1-5

With reference to the synthesis and purification methods of the compound L1-1, only the corresponding raw materials were required to be changed, and 24.1 g of a target compound L1-5 with a yield of 64.2% was obtained. The mass spectrum was: 301.4 (M+H). $^{1}H$ NMR (400 MHz, $CDCl_3$) δ 8.34-8.19 (m, 2H), 7.65 (d, J=15.0 Hz, 1H), 7.56-7.41 (m, 3H), 7.05 (d, J=14.8 Hz, 1H), 6.58 (d, J=21.8, 2.0 Hz, 1H), 5.92 (dt, J=21.8, 12.4 Hz, 1H), 4.96 (dd, J=12.2, 8.3, 1.9 Hz, 2H), 3.05-2.81 (m, 1H), 2.11-1.89 (m, 2H), 1.89-1.53 (m, 6H).

Synthesis of a Compound CPD 78

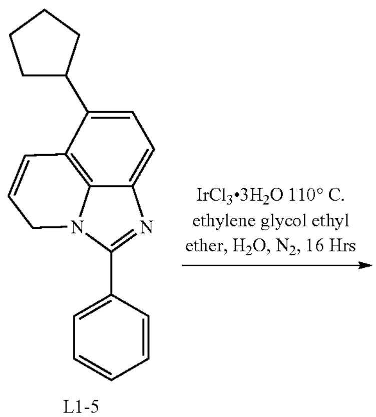

L1-5

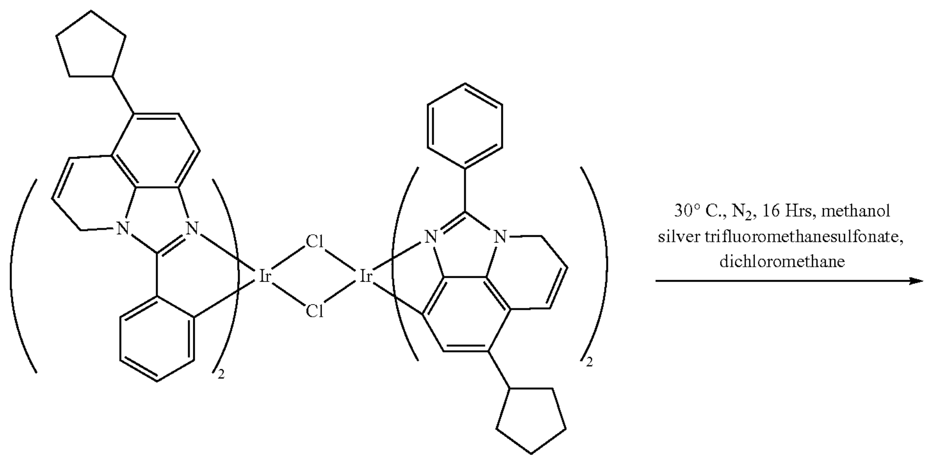

CPD 78-1

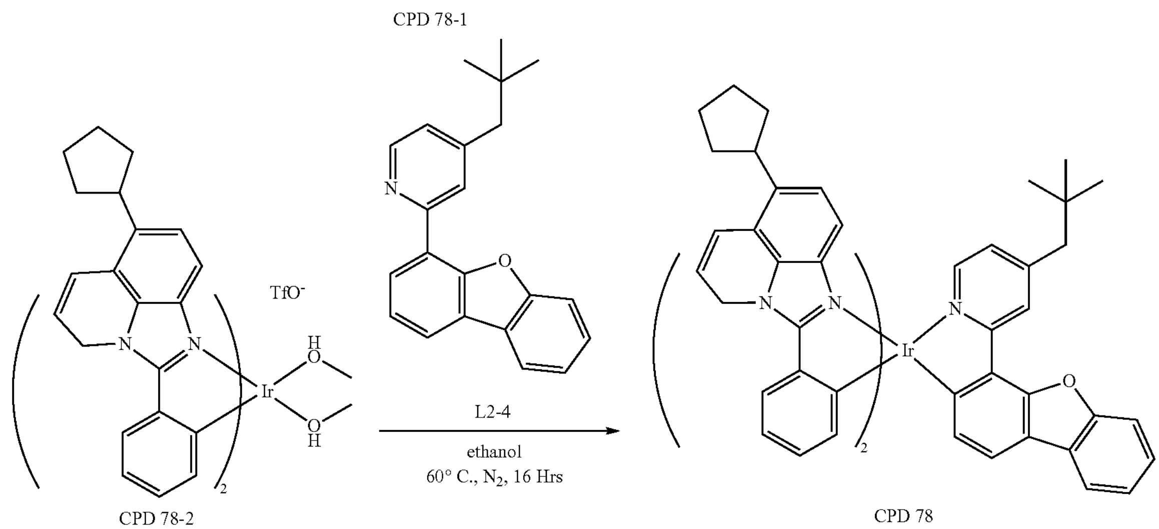

CPD 78-2

CPD 78

Synthesis of a Compound CPD 78-1

With reference to the synthesis and purification methods of the compound CPD 1-1, only the corresponding raw materials were required to be changed, and an obtained compound was directly used in the next step without purification.

Synthesis of a Compound CPD 78-2

With reference to the synthesis and purification methods of the compound CPD 1-2, only the corresponding raw materials were required to be changed, and an obtained compound was directly used in the next step without purification.

Synthesis of a Compound CPD 78

With reference to the synthesis and purification methods of the compound CPD 1, only the corresponding raw materials were required to be changed, and 3.11 g of a target compound CPD 78 with a yield of 60.4% was obtained. 3.11 g of the crude product CPD 78 was sublimated and purified to obtain 1.88 g of a sublimated pure product CPD 78 with a yield of 60.4%. The mass spectrum was: 1106.4 (M+H). $^1$H NMR (400 MHz, $CDCl_3$) δ 8.50 (d, 1H), 7.98 (dd, 1H), 7.81 (m, J=35.0 Hz, 3H), 7.67 (t, J=20.0 Hz, 3H), 7.52 (m, J=20.0 Hz, 6H), 7.40 (m, J=15.0 Hz, 3H), 7.31 (m, 1H), 7.05 (d, 3H), 6.39 (d, 2H), 5.92 (m, 2H), 4.74 (dd, J=46.8 Hz, 4H), 3.21 (s, 2H), 2.90 (m, 2H), 1.99 (m, 4H), 1.84-1.60 (m, 12H), 0.85 (s, 9H).

Synthesis of a Common Intermediate L1-6

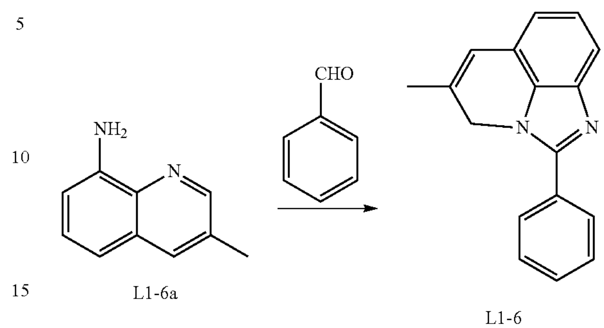

L1-6a

L1-6

Synthesis of a Compound L1-6

With reference to the synthesis and purification methods of the compound L1-1, only the corresponding raw materials were required to be changed, and 17.3 g of a target compound L1-6 with a yield of 53.2% was obtained. The mass spectrum was: 247.3 (M+H). $^1$H NMR (400 MHz, $CDCl_3$) δ 8.28 (m, 2H), 7.46 (m, 3H), 7.42 (dd, 1H), 7.17 (t, 1H), 7.07 (d, 1H), 6.85 (d, 1H), 4.80 (s, 2H), 1.66 (s, 3H).

Synthesis of a Compound CPD 93

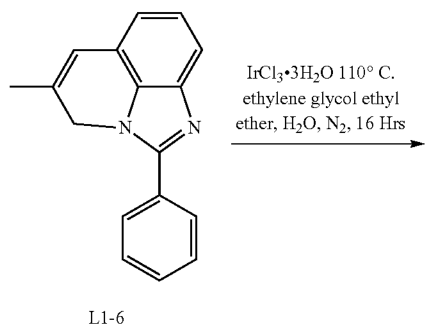

L1-6

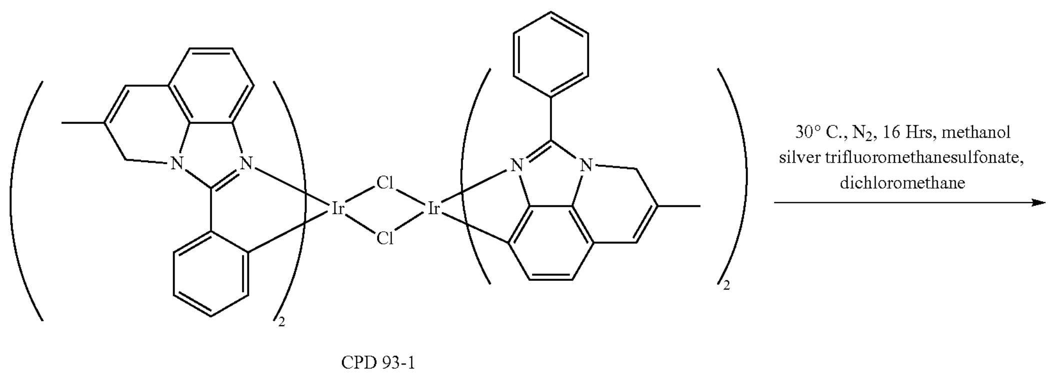

CPD 93-1

-continued

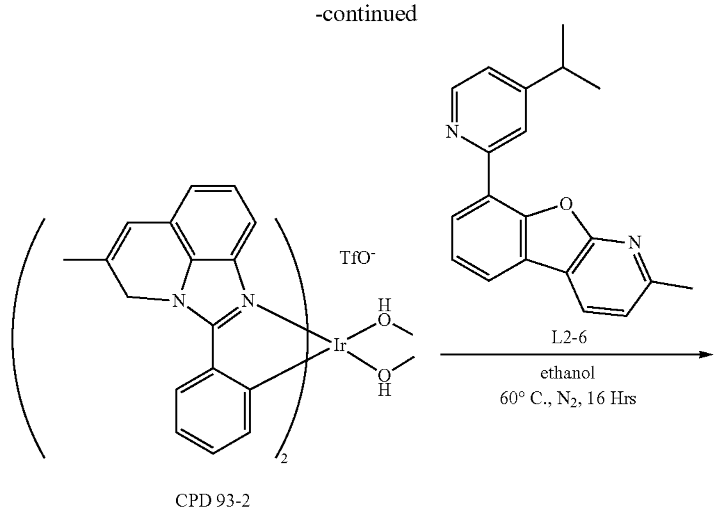

L2-6

CPD 93-2

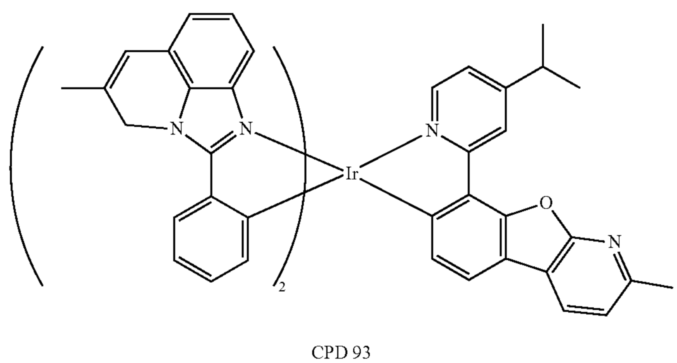

CPD 93

Synthesis of a Compound CPD 93-1

With reference to the synthesis and purification methods of the compound CPD 1-1, only the corresponding raw materials were required to be changed, and an obtained compound was directly used in the next step without purification.

Synthesis of a Compound CPD 93-2

With reference to the synthesis and purification methods of the compound CPD 1-2, only the corresponding raw materials were required to be changed, and an obtained compound was directly used in the next step without purification.

Synthesis of a Compound CPD 93

With reference to the synthesis and purification methods of the compound CPD 1, only the corresponding raw materials were required to be changed, and 2.87 g of a target compound CPD 93 with a yield of 56.7% was obtained. 2.87 g of the crude product CPD 93 was sublimated and purified to obtain 1.76 g of a sublimated pure product CPD 93 with a yield of 61.3%. The mass spectrum was: 985.2 (M+H). $^1H$ NMR (400 MHz, $CDCl_3$) δ 8.46 (dd, J=38.7, 14.9 Hz, 2H), 7.87-7.66 (m, 4H), 7.56-7.38 (m, 9H), 7.17 (t, J=14.8 Hz, 2H), 7.12-6.97 (m, 4H), 6.90-6.81 (m, 2H), 5.28 (dd, J=7.9, 2.0 Hz, 2H), 4.77 (dd, J=8.1, 2.0 Hz, 2H), 2.96-2.78 (m, 1H), 2.68 (s, 3H), 1.66 (d, J=2.0 Hz, 6H), 1.20 (d, J=12.8 Hz, 6H).

Synthesis of a Common Intermediate L1-7

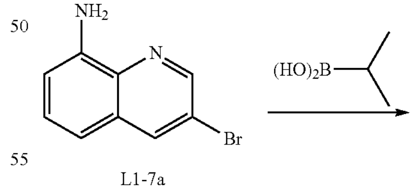

L1-7a

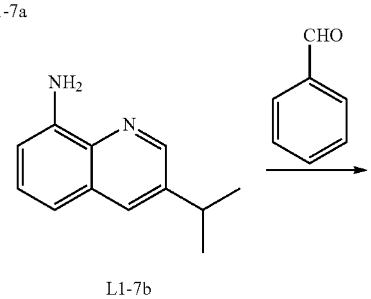

L1-7b

-continued

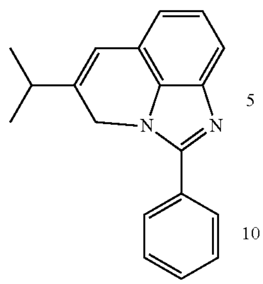

L1-7

Synthesis of a Compound L1-7b

With reference to the synthesis and purification methods of the compound L1-3b, only the corresponding raw materials were required to be changed. The mass spectrum was: 187.3 (M+H).

Synthesis of a Compound L1-7

With reference to the synthesis and purification methods of the compound L1-1, only the corresponding raw materials were required to be changed, and 24.1 g of a target compound L1-7 with a yield of 64.2% was obtained. The mass spectrum was: 275.4 (M+H). $^1$H NMR (400 MHz, $CDCl_3$) δ 8.28 (m, 2H), 7.50 (dd, 3H), 7.42 (dd, 1H), 7.17 (t, 1H), 7.07 (dd, 1H), 6.85 (s, 1H), 4.98 (s, 2H), 2.09 (m, 1H), 1.04 (d, 6H).

Synthesis of a Compound CPD 98

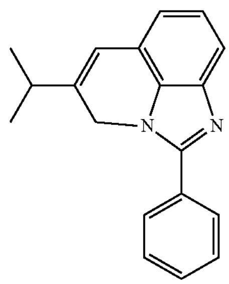

L1-7

$IrCl_3$•$3H_2O$ 110° C.
ethylene glycol ethyl ether, $H_2O$, $N_2$, 16 Hrs

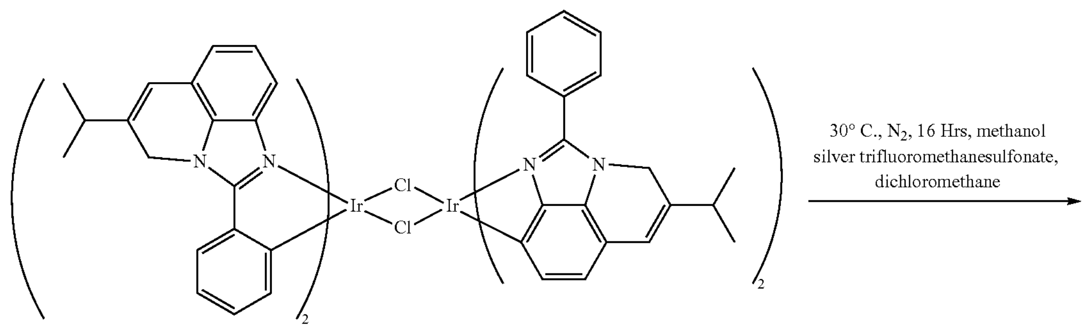

CPD 98-1

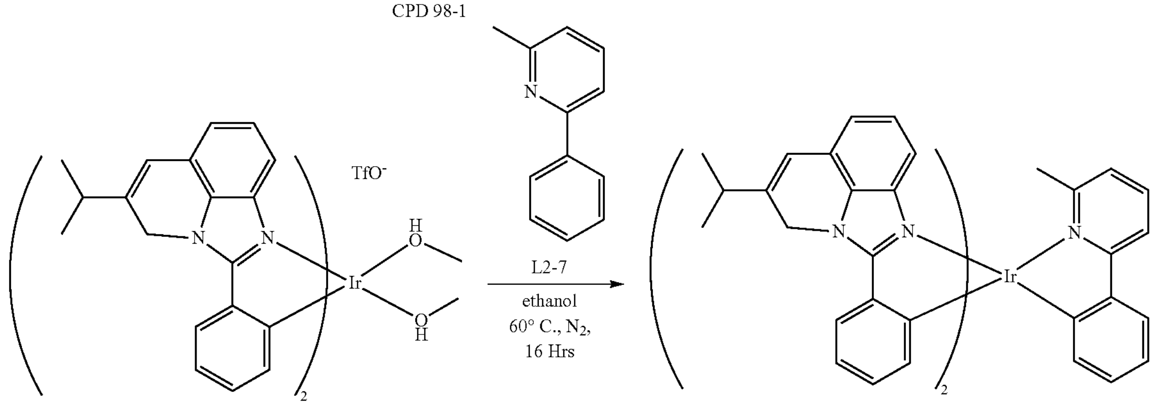

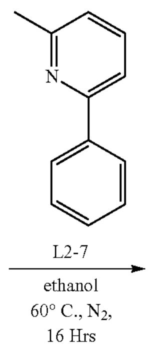

L2-7

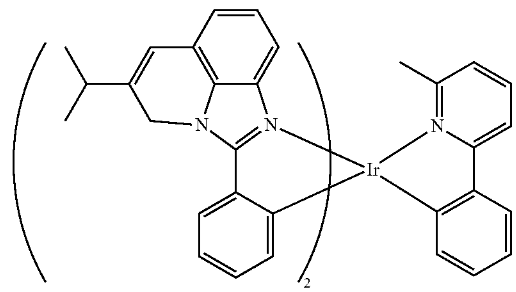

CPD 98-2

CPD 98

Synthesis of a Compound CPD 98-1

With reference to the synthesis and purification methods of the compound CPD 1-1, only the corresponding raw materials were required to be changed, and an obtained compound was directly used in the next step without purification.

Synthesis of a Compound CPD 98-2

With reference to the synthesis and purification methods of the compound CPD 1-2, only the corresponding raw materials were required to be changed, and an obtained compound was directly used in the next step without purification.

Synthesis of a Compound CPD 98

With reference to the synthesis and purification methods of the compound CPD 1, only the corresponding raw materials were required to be changed, and 3.21 g of a target compound CPD 98 with a yield of 61.7% was obtained. 3.21 g of the crude product CPD 98 was sublimated and purified to obtain 1.84 g of a sublimated pure product CPD 98 with a yield of 57.3%. The mass spectrum was: 908.3 (M+H). $^1$H NMR (400 MHz, $CDCl_3$) δ 8.16 (d, 1H), 7.77 (d, 2H), 7.46 (m, J=40.0 Hz, 11H), 7.29 (t, 1H), 7.17 (t, 2H), 7.07 (dd, 2H), 6.98 (dd, 1H), 6.85 (dd, 2H), 6.61 (s, 1H), 5.44 (s, 2H), 4.95 (s, 2H), 2.76 (s, 3H), 2.26 (m, 2H), 1.04 (s, 12H).

Synthesis of a Common Intermediate L1-8

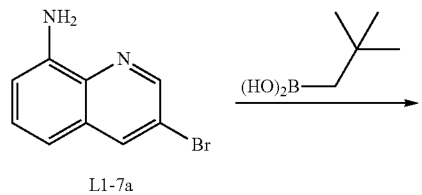

L1-7a

-continued

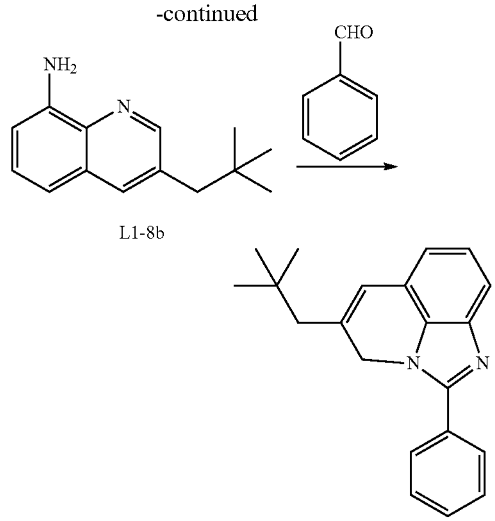

L1-8b

L1-8

Synthesis of a Compound L1-8b

With reference to the synthesis and purification methods of the compound L1-3b, only the corresponding raw materials were required to be changed. The mass spectrum was: 215.3 (M+H).

Synthesis of a Compound L1-8

With reference to the synthesis and purification methods of the compound L1-1, only the corresponding raw materials were required to be changed, and 22.7 g of a target compound L1-8 with a yield of 57.9% was obtained. The mass spectrum was: 303.4 (M+H). $^1$H NMR (400 MHz, $CDCl_3$) δ 8.28 (m, 2H), 7.50 (dd, 3H), 7.42 (dd, 1H), 7.17 (t, 1H), 7.07 (dd, 1H), 6.85 (s, 1H), 4.85 (s, 2H), 2.27 (s, 2H), 1.01 (s, 9H).

Synthesis of a Compound CPD 119

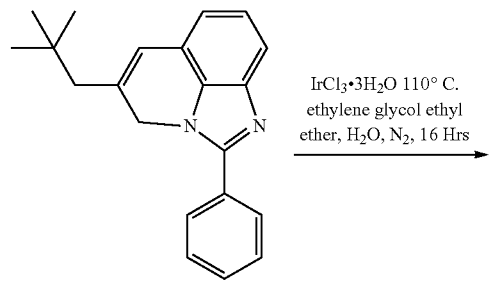

L1-8

-continued

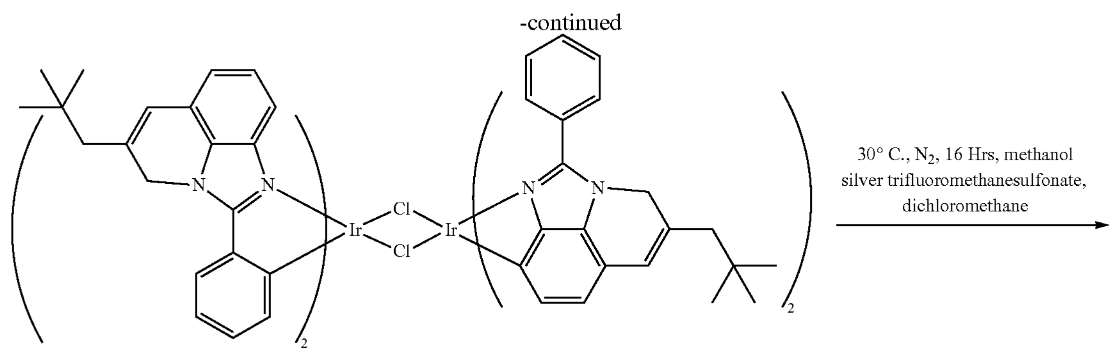

CPD 119-1

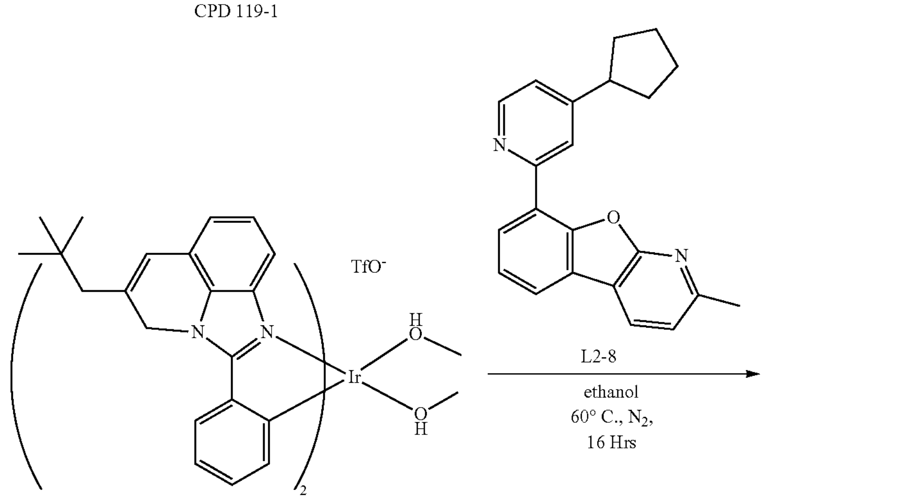

CPD 119-2

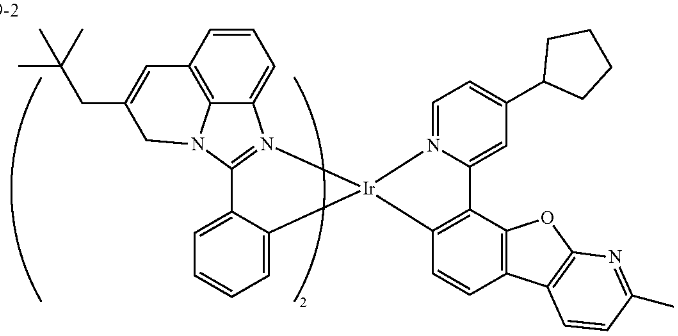

CPD 119

Synthesis of a Compound CPD 119-1

With reference to the synthesis and purification methods of the compound CPD 1-1, only the corresponding raw materials were required to be changed, and an obtained compound was directly used in the next step without purification.

Synthesis of a Compound CPD 119-2

With reference to the synthesis and purification methods of the compound CPD 1-2, only the corresponding raw materials were required to be changed, and an obtained compound was directly used in the next step without purification.

Synthesis of a Compound CPD 119

With reference to the synthesis and purification methods of the compound CPD 1, only the corresponding raw materials were required to be changed, and 2.87 g of a target compound CPD 119 with a yield of 56.9% was obtained. 2.87 g of the crude product CPD 119 was sublimated and purified to obtain 1.68 g of a sublimated pure product CPD 119 with a yield of 58.5%. The mass spectrum was: 1109.4 (M+H). $^1$H NMR (400 MHz, $CDCl_3$) δ 8.50 (d, 1H), 8.29 (d, 1H), 7.87-7.67 (m, 4H), 7.46 (m, J=40.0 Hz, 9H), 7.17 (t, 2H), 7.10-6.99 (m, 4H), 6.85 (s, 2H), 5.19 (s, 2H), 4.81 (s, 2H), 2.68 (s, 3H), 2.55 (m, 1H), 2.14 (s, 4H), 2.01 (m, 2H), 1.87-1.57 (m, 6H), 1.01 (s, 18H).

Synthesis of a Common Intermediate L1-9

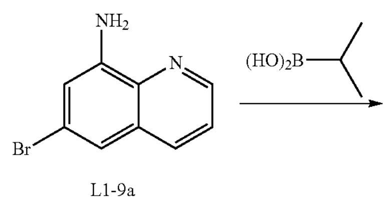

L1-9a

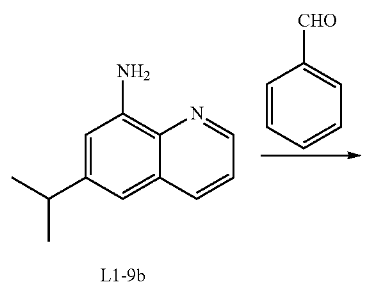

L1-9b

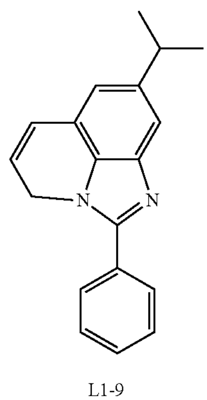

L1-9

Synthesis of a Compound L1-9b

With reference to the synthesis and purification methods of the compound L1-3b, only the corresponding raw materials were required to be changed. The mass spectrum was: 187.3 (M+H).

Synthesis of a Compound L1-9

With reference to the synthesis and purification methods of the compound L1-1, only the corresponding raw materials were required to be changed, and 21.0 g of a target compound L1-7 with a yield of 57.7% was obtained. The mass spectrum was: 275.4 (M+H). $^1$H NMR (400 MHz, $CDCl_3$) δ 8.28 (m, 2H), 7.50 (m, 3H), 7.39 (d, J=50.0 Hz, 2H), 6.56 (d, 1H), 5.76 (m, 1H), 4.98 (d, J=16.5 Hz, 2H), 2.87 (m, 1H), 1.20 (s, 6H).

Synthesis of a Compound CPD 155

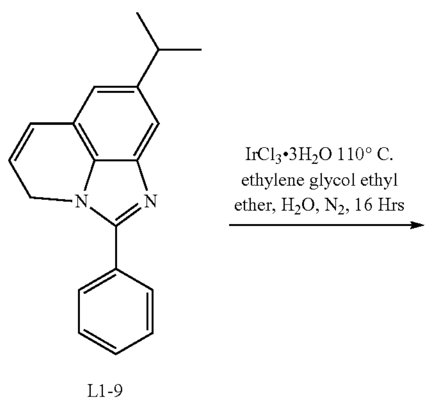

L1-9

-continued

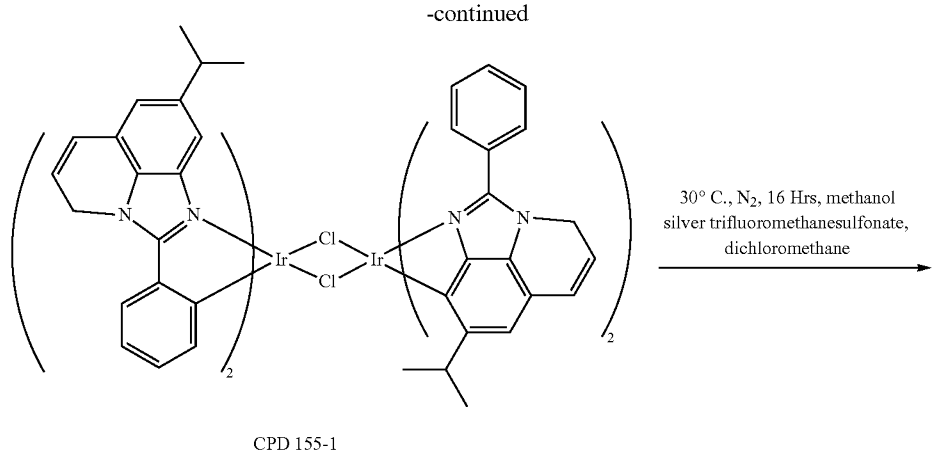

CPD 155-1

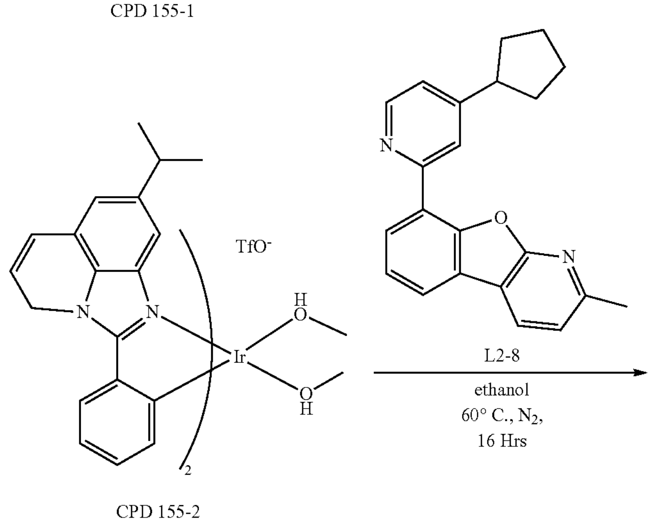

CPD 155-2

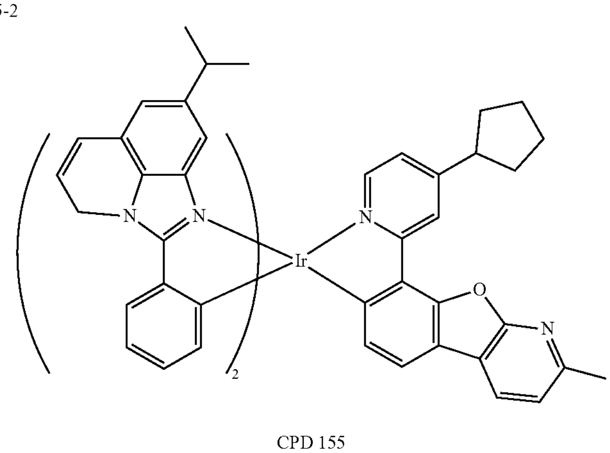

CPD 155

Synthesis of a Compound CPD 155-1

With reference to the synthesis and purification methods of the compound CPD 1-1, only the corresponding raw materials were required to be changed, and an obtained compound was directly used in the next step without purification.

Synthesis of a Compound CPD 155-2

With reference to the synthesis and purification methods of the compound CPD 1-2, only the corresponding raw materials were required to be changed, and an obtained compound was directly used in the next step without purification.

Synthesis of a Compound CPD 155

With reference to the synthesis and purification methods of the compound CPD 1, only the corresponding raw materials were required to be changed, and 2.63 g of a target compound CPD 155 with a yield of 54.7% was obtained. 2.63 g of the crude product CPD 155 was sublimated and purified to obtain 1.59 g of a sublimated pure product CPD 155 with a yield of 60.4%. The mass spectrum was: 1067.4 (M+H). $^1$H NMR (400 MHz, $CDCl_3$) δ 8.50 (d, J=7.5 Hz, 1H), 8.31 (d, J=7.5 Hz, 1H), 7.88-7.65 (m, 4H), 7.55-7.30 (m, 11H), 7.08-6.95 (m, 2H), 6.49 (d, J=10.8 Hz, 2H), 5.76 (dt, J=11.0, 6.2 Hz, 2H), 5.45 (dd, J=6.1, 0.8 Hz, 2H), 5.08 (dd, J=6.2, 0.6 Hz, 2H), 2.94-2.76 (m, 3H), 2.68 (s, 3H), 2.08-1.94 (m, 2H), 1.84-1.60 (m, 6H), 1.20 (d, J=6.3 Hz, 12H).

Synthesis of a Common Intermediate L1-10

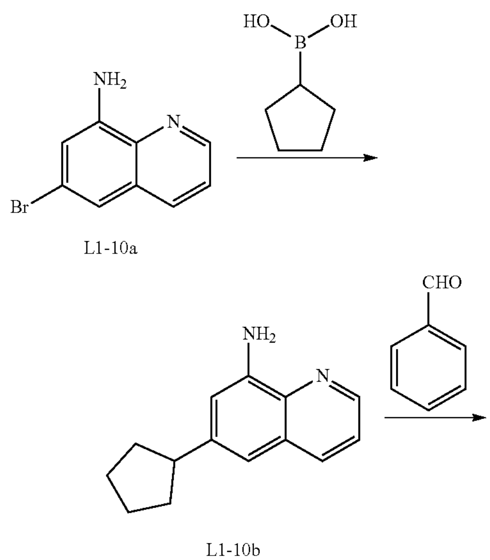

L1-10a

L1-10b

-continued

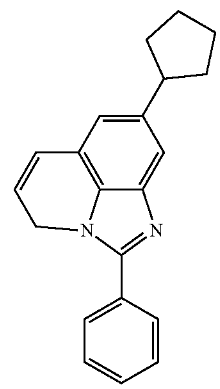

L1-10

Synthesis of a Compound L1-10b

With reference to the synthesis and purification methods of the compound L1-3b, only the corresponding raw materials were required to be changed. The mass spectrum was: 213.3 (M+H).

Synthesis of a Compound L1-9

With reference to the synthesis and purification methods of the compound L1-1, only the corresponding raw materials were required to be changed, and 18.40 g of a target compound L1-7 with a yield of 55.4% was obtained. The mass spectrum was: 301.4 (M+H). $^1$H NMR (400 MHz, $CDCl_3$) δ 8.28 (m, 2H), 7.50 (m, 3H), 7.39 (dd, J=50.0 Hz, 2H), 6.56 (d, 1H), 5.76 (m, 1H), 4.98 (d, J=2.4 Hz, 2H), 2.80 (m, 1H), 2.00 (m, 2H), 1.71 (m, J=25.0 Hz, 6H).

Synthesis of a Compound CPD 163

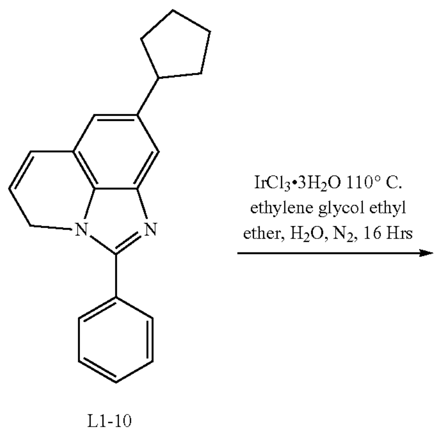

L1-10

-continued

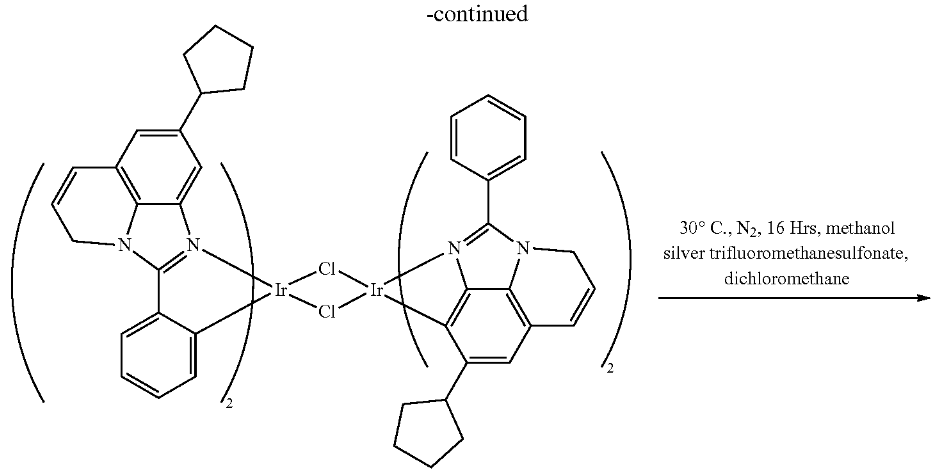

CPD 163-1

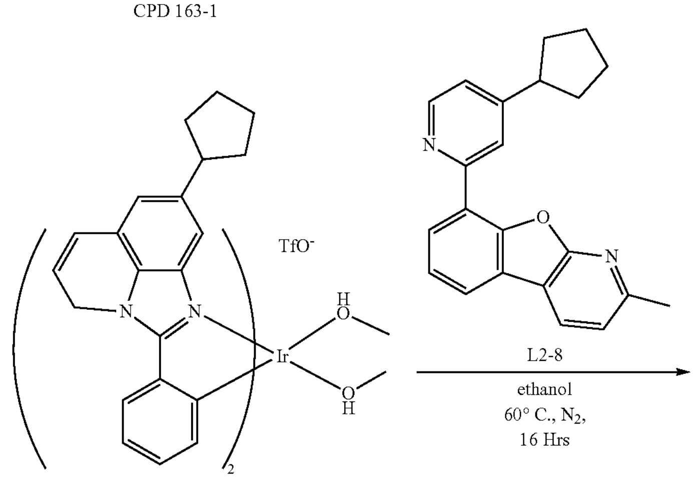

CPD 163-2

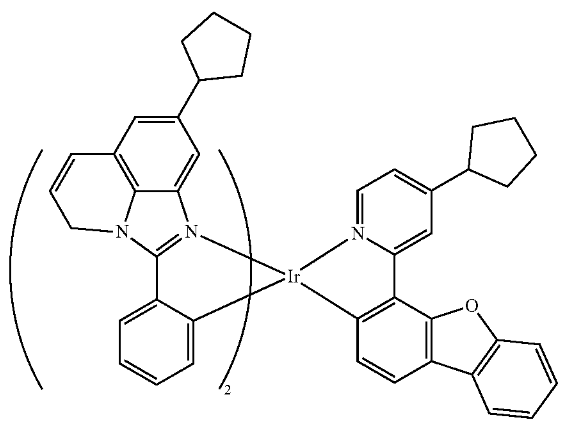

CPD 163

Synthesis of a Compound CPD 163-1

With reference to the synthesis and purification methods of the compound CPD 1-1, only the corresponding raw materials were required to be changed, and an obtained compound was directly used in the next step without purification.

Synthesis of a Compound CPD 163-2

With reference to the synthesis and purification methods of the compound CPD 1-2, only the corresponding raw materials were required to be changed, and an obtained compound was directly used in the next step without purification.

Synthesis of a Compound CPD 163

With reference to the synthesis and purification methods of the compound CPD 1, only the corresponding raw materials were required to be changed, and 3.1 g of a target compound CPD 163 with a yield of 61.4% was obtained. 3.1 g of the crude product CPD 163 was sublimated and purified to obtain 1.97 g of a sublimated pure product CPD 163 with a yield of 63.5%. The mass spectrum was: 1104.4 (M+H). $^1$H NMR (400 MHz, $CDCl_3$) δ 8.50 (d, J=7.5 Hz, 1H), 7.98 (dd, J=7.4, 1.5 Hz, 1H), 7.87-7.67 (m, 4H), 7.59-7.47 (m, 6H), 7.47-7.36 (m, 5H), 7.36-7.26 (m, 3H), 7.05 (dd, J=7.5, 1.4 Hz, 1H), 6.67-6.54 (m, 2H), 5.80-5.69 (m, 4H), 5.37-5.27 (m, 2H), 2.65-2.52 (m, 1H), 2.49-2.38 (m, 2H), 2.09-1.91 (m, 6H), 1.84-1.56 (m, 18H).

Synthesis of a Compound CPD 168

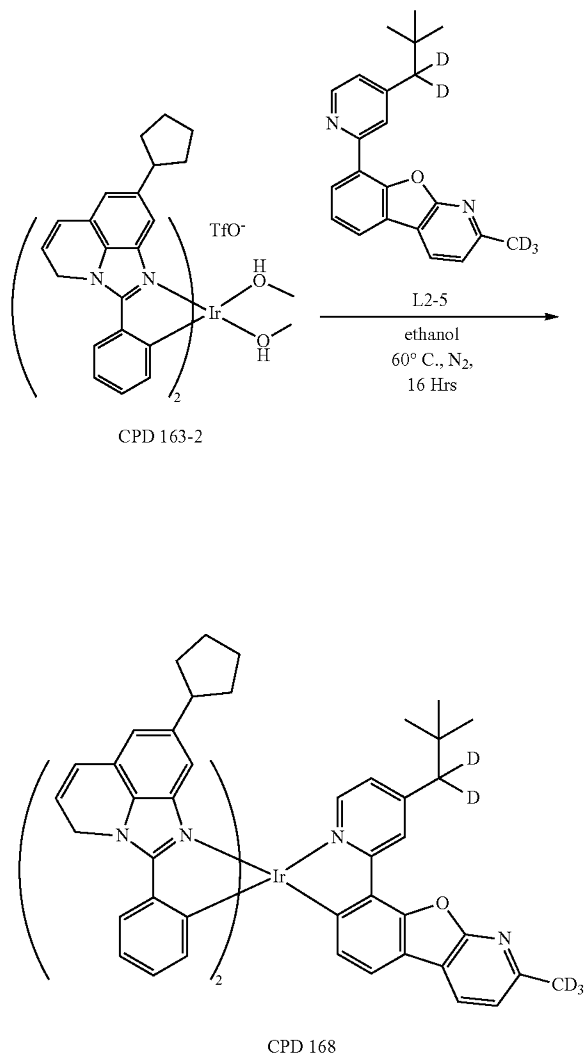

CPD 163-2

CPD 168

With reference to the synthesis and purification methods of the compound CPD 1, only the corresponding raw materials were required to be changed, and 2.45 g of a target compound CPD 168 with a yield of 53.7% was obtained. 2.45 g of the crude product CPD 168 was sublimated and purified to obtain 1.65 g of a sublimated pure product CPD 168 with a yield of 67.3%. The mass spectrum was: 1126.5 (M+H). $^1$H NMR (400 MHz, $CDCl_3$) δ 8.61 (d, 1H), 8.46 (dd, J=40.0 Hz, 2H), 7.88-7.66 (m, 4H), 7.45 (m, J=20.0 Hz, 8H), 7.30 (m, J=40.0 Hz, 3H), 7.05 (dd, 1H), 6.44 (d, 2H), 5.76 (m, 2H), 5.64 (d, 2H), 5.02 (d, 2H), 2.38 (m, 2H), 1.98 (m, 4H), 1.83-1.59 (m, 12H), 1.32 (s, 9H).

Synthesis of a Compound CPD 169

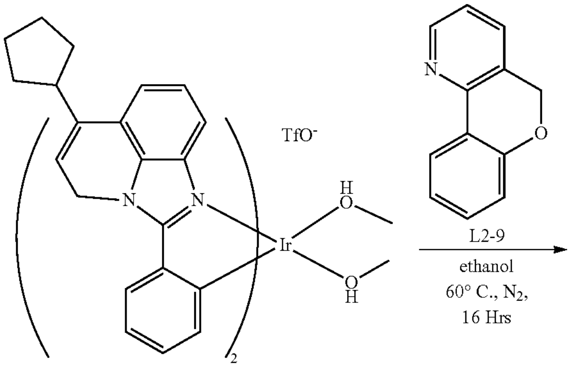

CPD 42-2

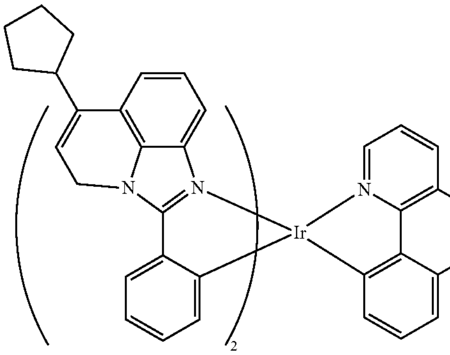

CPD 169

With reference to the synthesis and purification methods of the compound CPD 1, only the corresponding raw materials were required to be changed, and 2.76 g of a target compound CPD 169 with a yield of 57.8% was obtained. 2.76 g of the crude product CPD 169 was sublimated and purified to obtain 1.66 g of a sublimated pure product CPD 169 with a yield of 60.1%. The mass spectrum was: 974.3 (M+H). $^1$H NMR (400 MHz, $CDCl_3$) δ 8.33 (dd, J=7.4, 1.5 Hz, 1H), 7.77 (dd, J=7.4, 1.5 Hz, 2H), 7.54-7.36 (m, 11H), 7.21-7.02 (m, 5H), 6.80 (t, J=7.4 Hz, 1H), 5.52 (m, J=44.9, 25.3, 3.4 Hz, 4H), 5.20 (s, 2H), 4.91 (d, J=6.2 Hz, 2H), 2.88 (dq, J=16.6, 8.3 Hz, 2H), 1.84-1.71 (m, 4H), 1.71-1.60 (m, 4H), 1.61-1.49 (m, 4H), 1.37-1.23 (m, 4H).

Synthesis of a Compound CPD 179

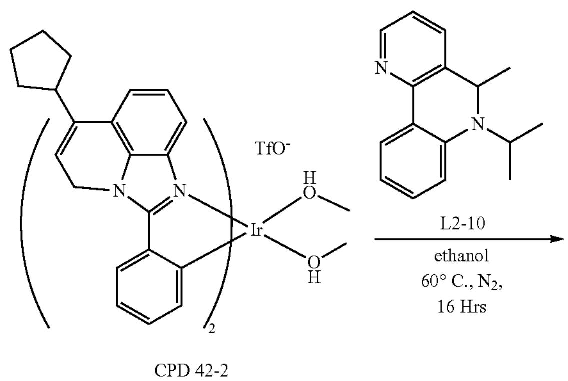

CPD 42-2

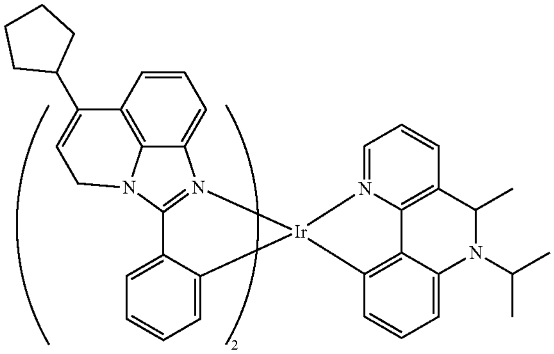

CPD 179

With reference to the synthesis and purification methods of the compound CPD 1, only the corresponding raw materials were required to be changed, and 2.65 g of a target compound CPD 179 with a yield of 62.4% was obtained. 2.65 g of the crude product CPD 179 was sublimated and purified to obtain 1.55 g of a sublimated pure product CPD 179 with a yield of 58.4%. The mass spectrum was: 1029.4 (M+H). $^1$H NMR (400 MHz, $CDCl_3$) δ 8.37 (dd, 1H), 7.77 (dd, 2H), 7.54-7.37 (m, 11H), 7.20 (dt, J=35.0 Hz, 3H), 7.07 (dd, 2H), 6.92 (d, 1H), 6.80 (t, 1H), 5.51 (dt, J=32.8 Hz, 4H), 4.96 (d, 2H), 4.31 (m, 1H), 4.02 (m, 1H), 2.76 (m, 2H), 1.76 (m, 4H), 1.66 (m, 4H), 1.55 (m, 4H), 1.40 (d, 3H), 1.30 (m, 4H), 1.19 (d, 6H).

Synthesis of a Compound CPD 195

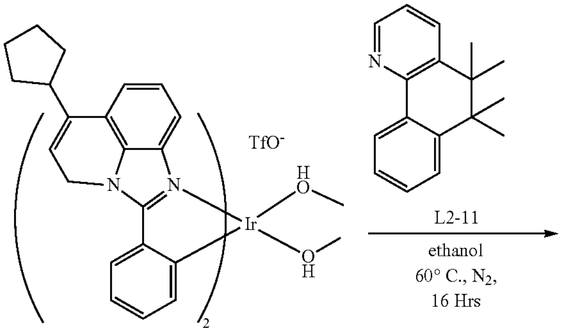

CPD 42-2

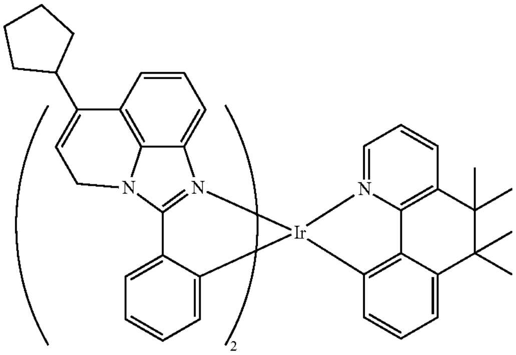

CPD 195

With reference to the synthesis and purification methods of the compound CPD 1, only the corresponding raw materials were required to be changed, and 2.71 g of a target compound CPD 195 with a yield of 58.9% was obtained. 2.65 g of the crude product CPD 195 was sublimated and purified to obtain 1.79 g of a sublimated pure product CPD 195 with a yield of 66.0%. The mass spectrum was: 1028.4 (M+H). $^1$H NMR (400 MHz, $CDCl_3$) δ 8.35 (dd, J=14.9, 3.0 Hz, 1H), 7.77 (dd, J=14.7, 3.3 Hz, 2H), 7.60-7.38 (m, 10H), 7.37-7.25 (m, 2H), 7.23-7.03 (m, 4H), 6.67 (t, J=14.9 Hz, 1H), 5.54 (td, J=12.4, 2.0 Hz, 2H), 5.23 (dd, J=14.3, 12.5 Hz, 2H), 4.72 (dd, J=14.3, 12.3 Hz, 2H), 2.62 (m J=16.9, 2.0 Hz, 2H), 1.84-1.72 (m, 3H), 1.73-1.60 (m, 5H), 1.54 (m, J=24.4, 16.6, 9.7, 2.6 Hz, 4H), 1.42-1.21 (m, 16H).

Synthesis of a Compound CPD 202

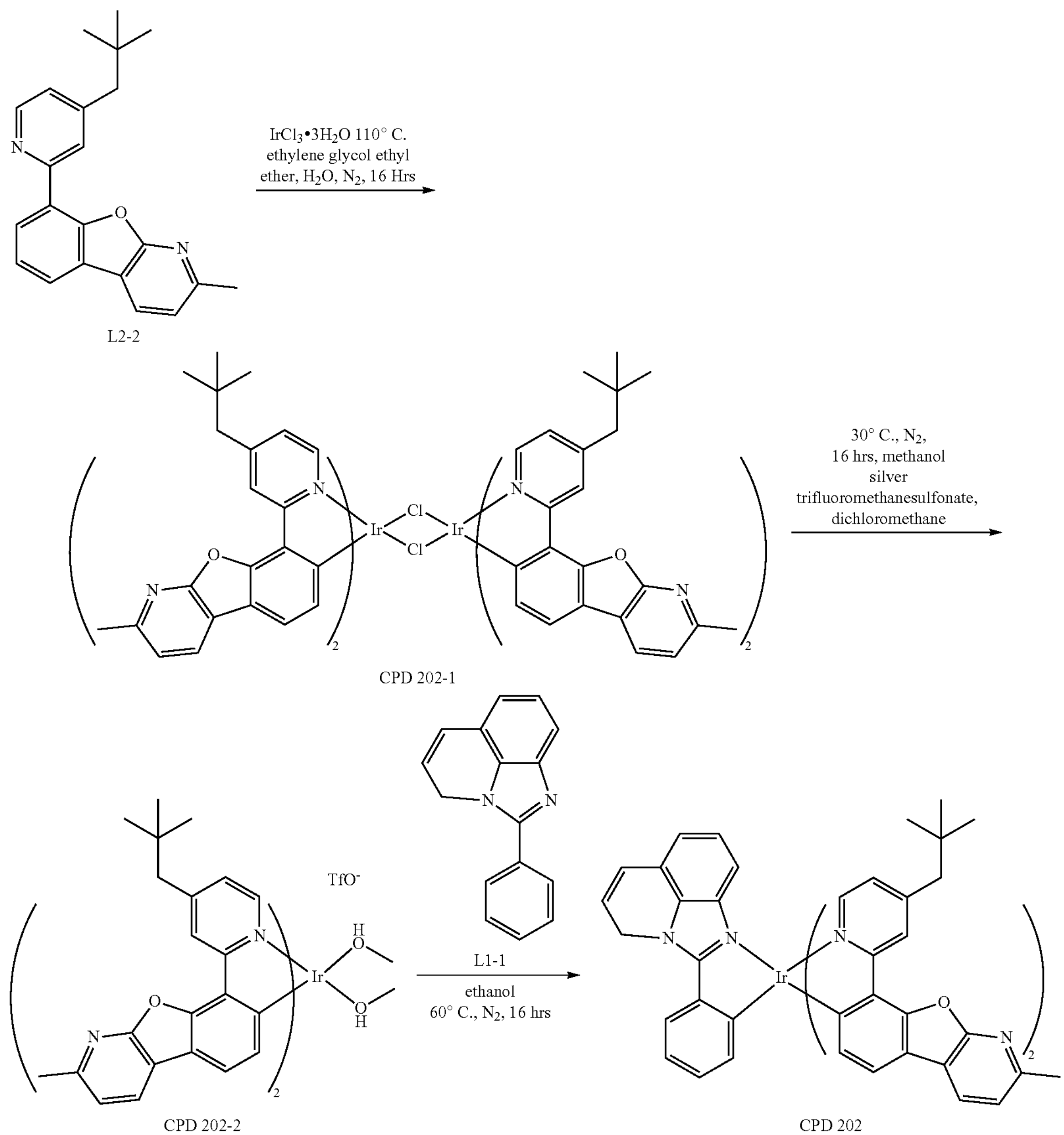

L2-2

CPD 202-1

CPD 202-2

CPD 202

Synthesis of a Compound CPD 202-1

With reference to the synthesis and purification methods of the compound CPD 1-1, only the corresponding raw materials were required to be changed, and an obtained compound was directly used in the next step without purification.

Synthesis of a Compound CPD 202-2

With reference to the synthesis and purification methods of the compound CPD 1-2, only the corresponding raw materials were required to be changed, and an obtained compound was directly used in the next step without purification.

Synthesis of a Compound CPD 202

With reference to the synthesis and purification methods of the compound CPD 1, only the corresponding raw materials were required to be changed, and 3.41 g of a target compound CPD 202 with a yield of 63.7% was obtained. 3.1 g of the crude product CPD 202 was sublimated and purified to obtain 2.2 g of a sublimated pure product CPD 202 with a yield of 64.5%. The mass spectrum was: 1083.4 (M+H). $^1H$ NMR (400 MHz, $CDCl_3$) δ 8.50 (d, 1H), 8.39 (d, 1H), 7.88-7.67 (m, 4H), 7.46 (m, J=40.0 Hz, 9H), 7.17 (t, 2H), 7.11-6.98 (m, 4H), 6.58 (d, 2H), 5.76 (m, 2H), 4.91 (dd, J=68.8 Hz, 4H), 3.21 (s, 2H), 2.68 (s, 3H), 0.85 (s, 9H).

Synthesis of a Compound CPD 204
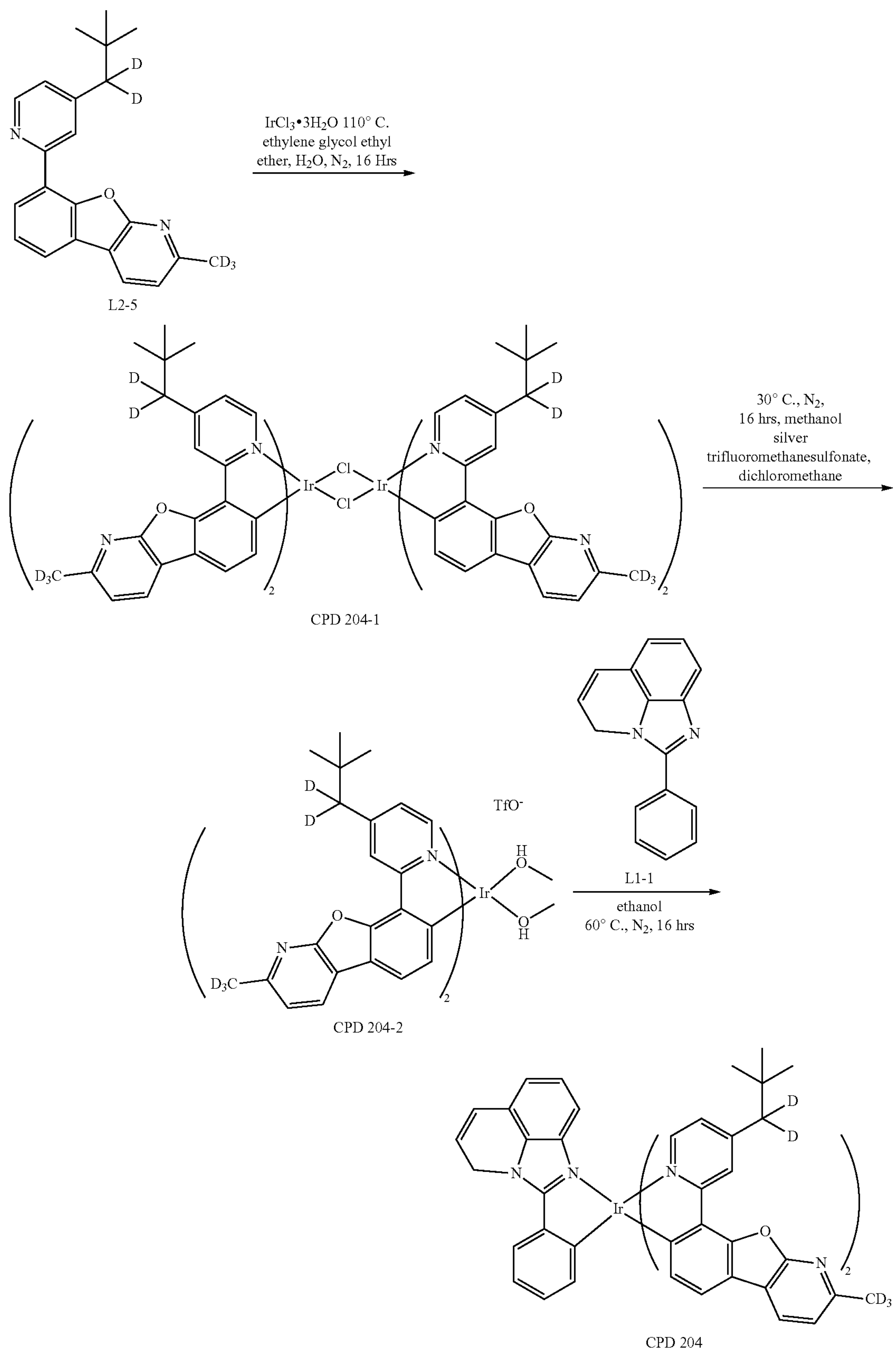
L2-5
CPD 204-1
L1-1
CPD 204-2
CPD 204

Synthesis of a Compound CPD 204-1

With reference to the synthesis and purification methods of the compound CPD 1-1, only the corresponding raw materials were required to be changed, and an obtained compound was directly used in the next step without purification.

Synthesis of a Compound CPD 204-2

With reference to the synthesis and purification methods of the compound CPD 1-2, only the corresponding raw materials were required to be changed, and an obtained compound was directly used in the next step without purification.

Synthesis of a Compound CPD 204

With reference to the synthesis and purification methods of the compound CPD 1, only the corresponding raw materials were required to be changed, and 3.02 g of a target compound CPD 204 with a yield of 65.8% was obtained. 3.02 g of the crude product CPD 204 was sublimated and purified to obtain 2.18 g of a sublimated pure product CPD 204 with a yield of 70.7%. The mass spectrum was: 1093.4 (M+H). $^1$H NMR (400 MHz, $CDCl_3$) δ 8.61 (dd, J=15.0, 2.9 Hz, 1H), 8.54-8.38 (m, 2H), 7.88-7.64 (m, 4H), 7.58-7.37 (m, 8H), 7.22 (dt, J=44.0, 14.9 Hz, 3H), 7.06 (m, J=15.0, 9.0, 3.1 Hz, 3H), 6.53 (dt, J=21.8, 1.9 Hz, 2H), 5.76 (dt, J=21.6, 12.4 Hz, 2H), 5.59 (m, J=15.7, 12.5, 1.8 Hz, 2H), 4.98 (m, J=15.7, 12.4, 2.0 Hz, 2H), 1.32 (s, 9H).

Other compounds can be synthesized and sublimated by using corresponding materials according to same or similar methods.

Application Example: Manufacture of an Organic Electroluminescent Device

A glass substrate with a size of 50 mm*50 mm*1.0 mm including an ITO (100 nm) transparent electrode was ultrasonically cleaned in ethanol for 10 min, dried at 150° C., and then treated with $N_2$ plasma for 30 min. The washed glass substrate was installed on a substrate support of a vacuum evaporation device. At first, a compound HATCN for covering the transparent electrode was evaporated on the surface of the side having a transparent electrode line to form a thin film with a thickness of 5 nm. Next, a layer of HTM1 was evaporated to form a thin film with a thickness of 60 nm. Then, a layer of HTM2 was evaporated on the HTM1 thin film to form a thin film with a thickness of 10 nm. After that, a main material 1, a main material 2 and a doping compound (including reference compounds X and CPD X) were co-evaporated on the HTM2 film layer to obtain a film with a thickness of 30 nm, where a ratio of the main material 1 to the main material 2 to the doping material was 45%:45%:10%. Then, an electron transport layer (ETL) and an electron injection layer (EIL) were evaporated on a light-emitting layer in sequence to form a film with a thickness of 35 nm, where the ratio of the ETL to the EIL was 50%:50%. Finally, a layer of metal Al (100 nm) was evaporated to serve as an electrode.

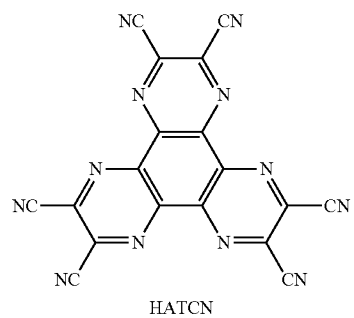

HATCN

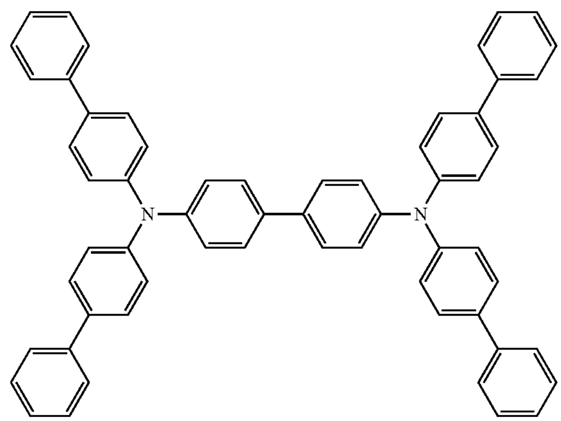

HTM 1

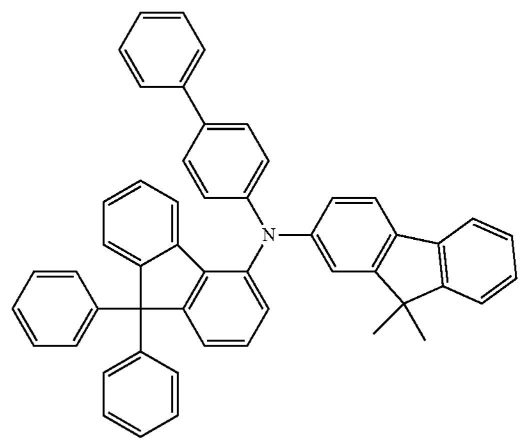

HTM 2

-continued
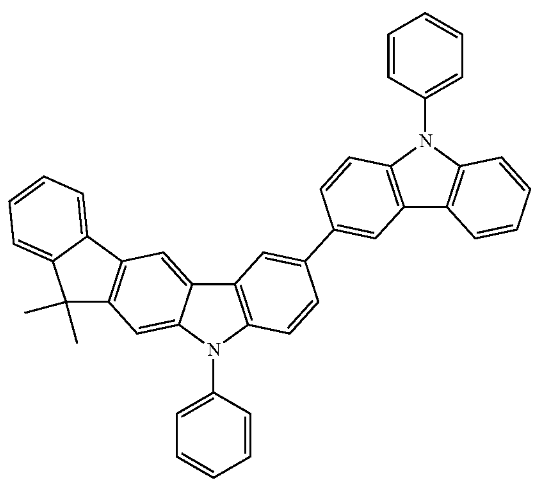
Main material 1
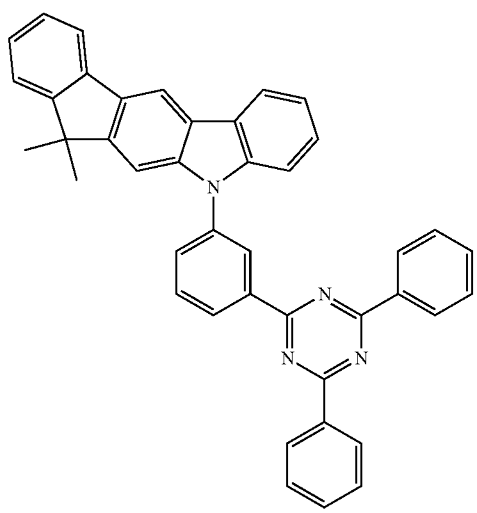
Main material 2
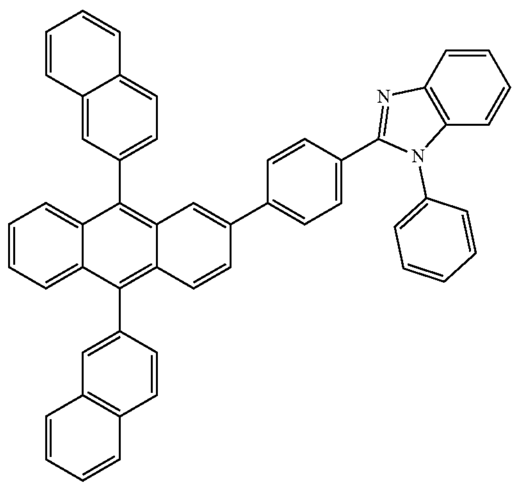
ETL
-continued
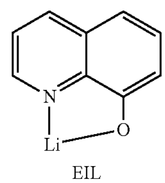
EIL
Reference compound 1
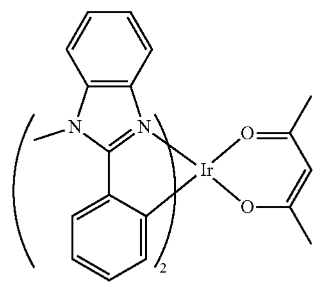
Reference compound 2
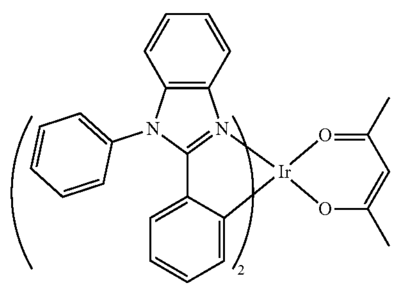
Reference compound 3
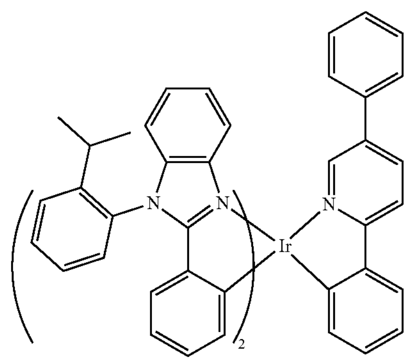
Reference compound 4
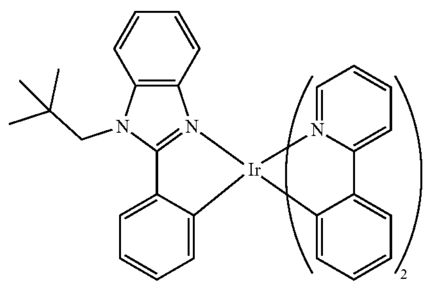

-continued

Reference compound 5

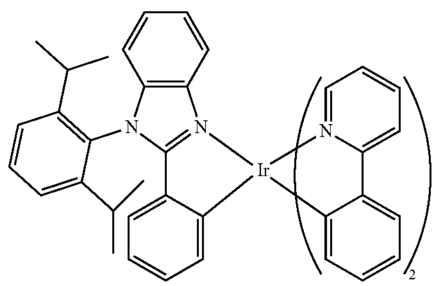

Reference compound 6

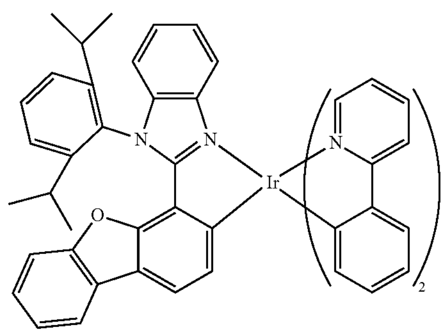

Reference compound 7

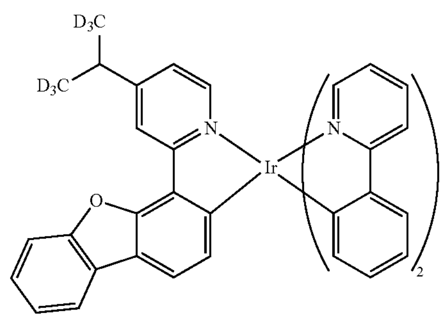

Evaluation: Properties of a device obtained above were tested. In various examples and comparative examples, a constant-current power supply (Keithley 2400) was used, a current at a fixed density was used for flowing through light-emitting elements, and a spectroradiometer (CS 2000) was used for testing the light-emitting spectrum. Meanwhile, the voltage value was measured, and the time (LT95) when the brightness was reduced to 95% of an initial brightness was tested. Results are shown as follows.

| | Doping material | Peak wavelength nm | FWHM nm | Starting voltage V | Current efficiency Cd/A | LT95@10000 nits |
|---|---|---|---|---|---|---|
| Example 1 | CPD 1 | 520 | 52 | 4.52 | 79 | 230 |
| Example 2 | CPD 10 | 526 | 53 | 4.46 | 81 | 260 |
| Example 3 | CPD 13 | 526 | 55 | 4.43 | 80 | 285 |
| Example 4 | CPD 15 | 521 | 53 | 4.50 | 80 | 234 |
| Example 5 | CPD 18 | 525 | 53 | 4.48 | 82 | 265 |
| Example 6 | CPD 22 | 526 | 54 | 4.45 | 81 | 278 |
| Example 7 | CPD 24 | 526 | 54 | 4.44 | 81 | 310 |
| Example 8 | CPD 30 | 525 | 53 | 4.46 | 83 | 279 |
| Example 9 | CPD 36 | 526 | 52 | 4.42 | 82 | 330 |
| Example 10 | CPD 42 | 526 | 51 | 4.45 | 84 | 278 |
| Example 11 | CPD 78 | 523 | 52 | 4.41 | 83 | 296 |
| Example 12 | CPD 93 | 522 | 54 | 4.50 | 81 | 269 |

-continued

| | Doping material | Peak wavelength nm | FWHM nm | Starting voltage V | Current efficiency Cd/A | LT95@10000 nits |
|---|---|---|---|---|---|---|
| Example 13 | CPD 98 | 523 | 55 | 4.51 | 79 | 236 |
| Example 14 | CPD 119 | 526 | 56 | 4.48 | 82 | 295 |
| Example 15 | CPD 155 | 525 | 54 | 4.47 | 81 | 286 |
| Example 16 | CPD 163 | 526 | 55 | 4.45 | 81 | 278 |
| Example 17 | CPD 168 | 527 | 53 | 4.42 | 83 | 369 |
| Example 18 | CPD 169 | 525 | 49 | 4.52 | 80 | 320 |
| Example 19 | CPD 179 | 526 | 52 | 4.53 | 81 | 283 |
| Example 20 | CPD 195 | 523 | 51 | 4.51 | 80 | 299 |
| Example 21 | CPD 202 | 519 | 36 | 4.53 | 83 | 317 |
| Example 22 | CPD 204 | 519 | 35 | 4.52 | 83 | 400 |
| Comparative Example 1 | Reference compound 1 | 509 | 73 | 5.01 | 53 | 60 |
| Comparative Example 2 | Reference compound 2 | 530 | 76 | 5.11 | 77 | 152 |
| Comparative Example 3 | Reference compound 3 | 549 | 69 | 4.86 | 76 | 183 |
| Comparative Example 4 | Reference compound 4 | 523 | 75 | 5.06 | 52 | 98 |
| Comparative Example 5 | Reference compound 5 | 519 | 72 | 4.82 | 54 | 121 |
| Comparative Example 6 | Reference compound 6 | 528 | 66 | 4.76 | 72 | 130 |
| Comparative Example 7 | Reference compound 7 | 524 | 68 | 4.92 | 71 | 200 |

Through comparison of the data in the above table, it can be seen that compared with reference compounds, the compound of the present disclosure used as a dopant in an organic electroluminescent device has more excellent properties, such as driving voltage, luminous efficiency, and device service life.

According to the above results, it is indicated that the compound of the present disclosure has the advantages of high optical and electrochemical stability, small half-peak width of emission spectrum, high color saturation, high luminous efficiency and long device service life, and can be used in organic electroluminescent devices. In particular, the compound has the potential for application in the OLED industry as a green light-emitting dopant.

The invention claimed is:

1. An organometallic compound, having a structure formula as shown in the following formula (1):

(1)

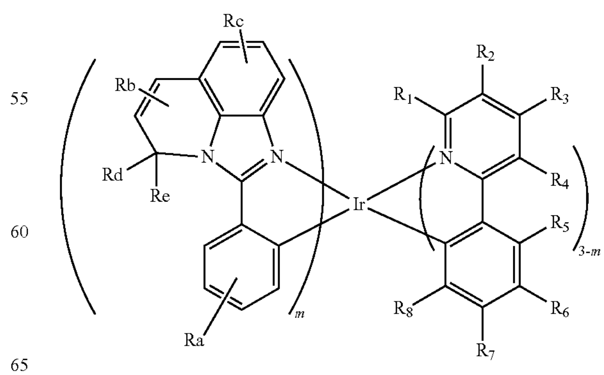

wherein

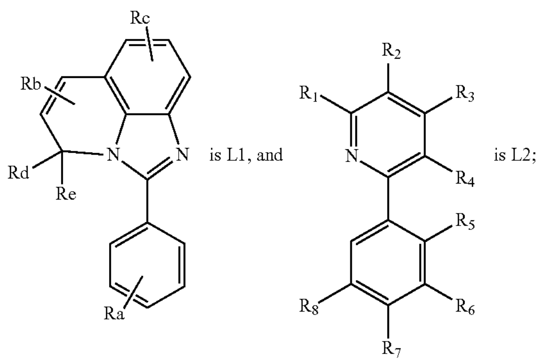

is L1, and is L2;

m is 1, 2, or 3, and when m is 1, the two L2 are the same or different;

the number of Ra, Rb and Rc is from 1 to a maximum substitution number;

Ra, Rb, Rc, Rd and Re are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_6$-$C_{18}$ aryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl;

$R_1$-$R_8$ are independently selected from hydrogen, deuterium, halogen, hydroxyl, sulfhydryl, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, and substituted or unsubstituted di-$C_1$-$C_{10}$ alkyl mono-$C_6$-$C_{30}$ aryl silyl, or two adjacent groups of $R_1$-$R_8$ may be connected with each other to form an aliphatic ring structure or an aromatic ring structure;

the heteroalkyl and the heteroaryl at least contain one O, N or S heteroatom;

and the "substituted" refers to substitution with deuterium, F, Cl, Br, $C_1$-$C_6$ alkyl, $C_3$-$C_6$ cycloalkyl, amino substituted with $C_1$-$C_6$ alkyl, nitrile, isonitrile, or phosphino, and the substitution ranges from a single substitution number to a maximum substitution number.

2. The organometallic compound according to claim 1, wherein when the m is 1 or 2, the two L1 or the two L2 are the same.

3. The organometallic compound according to claim 2, wherein the Ra, the Rd and the Re are hydrogen.

4. The organometallic compound according to claim 3, wherein at least one of the $R_1$-$R_4$ is not hydrogen.

5. The organometallic compound according to claim 3, wherein at least one of the $R_5$-$R_8$ is not hydrogen.

6. The organometallic compound according to claim 3, wherein at least one of the $R_1$-$R_4$ is not hydrogen, and at least one of the $R_5$-$R_8$ is not hydrogen.

7. The organometallic compound according to claim 6, wherein one of the $R_1$-$R_4$ is deuterium, $C_1$-$C_5$ alkyl substituted or unsubstituted with deuterium, or $C_3$-$C_5$ cycloalkyl substituted or unsubstituted with deuterium, one of the $R_5$-$R_8$ is deuterium, $C_1$-$C_5$ alkyl substituted or unsubstituted with deuterium, or $C_3$-$C_5$ cycloalkyl substituted or unsubstituted with deuterium, and the other of $R_1$-$R_8$ are hydrogen.

8. The organometallic compound according to claim 6, wherein the $R_5$ and the $R_6$, the $R_6$ and the $R_7$, or the $R_7$ and the $R_8$ are connected with each other to form a parallel ring structure as shown in a formula (2):

(2)

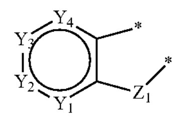

wherein * indicates a connecting position;

$Y_1$-$Y_4$ are independently $CR_0$ or N;

$Z_1$ is selected from O or S;

$R_0$ is independently hydrogen, deuterium, F, cyano, substituted or unsubstituted $C_1$-$C_{10}$ alkyl, substituted or unsubstituted $C_3$-$C_{20}$ cycloalkyl, substituted or unsubstituted $C_2$-$C_{30}$ alkenyl, substituted or unsubstituted $C_2$-$C_{30}$ alkynyl, substituted or unsubstituted $C_6$-$C_{30}$ aryl, substituted or unsubstituted $C_1$-$C_{30}$ heteroaryl, substituted or unsubstituted tri-$C_1$-$C_{10}$ alkyl silyl, substituted or unsubstituted tri-$C_6$-$C_{30}$ aryl silyl, or substituted or unsubstituted di-$C_1$-$C_{10}$ alkyl mono-$C_6$-$C_{30}$ aryl silyl;

and the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, nitrile, isonitrile, or phosphino.

9. The organometallic compound according to claim 6, wherein the $R_4$ and the $R_5$ are connected with each other to form an aliphatic ring structure as shown in a formula (3):

(3)

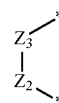

wherein * indicates a connecting position;

$Z_2$ and $Z_3$ are independently selected from O, S, N ($R_0$) and $C(R_0)_2$, and at least one of the $Z_2$ and $Z_3$ is $C(R_0)_2$;

$R_0$ is independently hydrogen, deuterium, F, cyano, substituted or unsubstituted $C_1$-$C_{10}$ alkyl, substituted or unsubstituted $C_3$-$C_{20}$ cycloalkyl, substituted or unsubstituted $C_2$-$C_{30}$ alkenyl, substituted or unsubstituted $C_2$-$C_{30}$ alkynyl, substituted or unsubstituted $C_6$-$C_{30}$ aryl, substituted or unsubstituted $C_1$-$C_{30}$ heteroaryl, substituted or unsubstituted tri-$C_1$-$C_{10}$ alkyl silyl, substituted or unsubstituted tri-$C_6$-$C_{30}$ aryl silyl, or substituted or unsubstituted di-$C_1$-$C_{10}$ alkyl mono-$C_6$-$C_{30}$ aryl silyl;

and the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, nitrile, isonitrile, or phosphino.

10. The organometallic compound according to claim 1, wherein at least one of the Rb and the Rc is not hydrogen.

11. The organometallic compound according to claim 10, wherein at least one of the Rb and the Rc is substituted or unsubstituted $C_1$-$C_6$ alkyl, or substituted or unsubstituted $C_3$-$C_6$ cycloalkyl.

12. The organometallic compound according to claim 11, wherein at least one of the Rb and the Rc is substituted or unsubstituted $C_1$-$C_6$ alkyl, or substituted or unsubstituted $C_3$-$C_6$ cycloalkyl, and the other group is hydrogen.

13. The organometallic compound according to claim 3, wherein the L1 has one of the following structural formulas, or is partially or completely deuterated or fluorinated correspondingly,

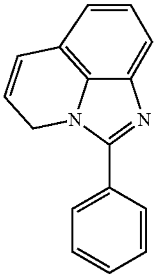
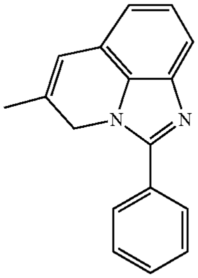
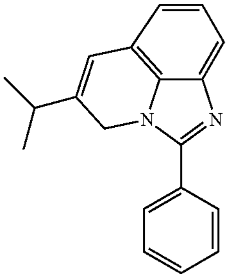
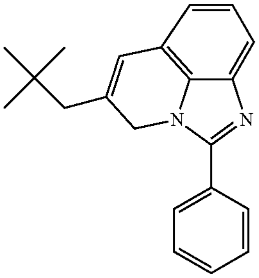
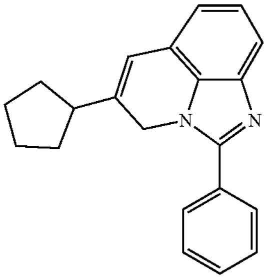
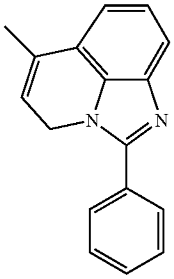
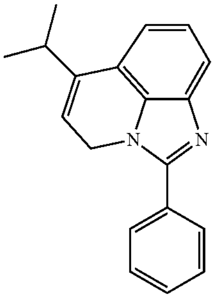
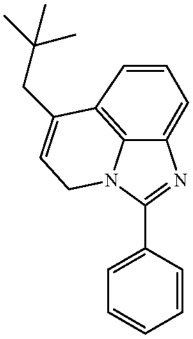

-continued

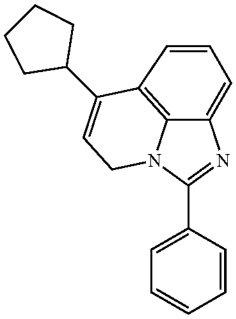
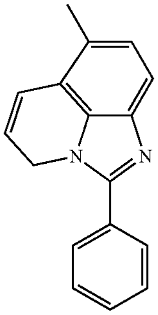
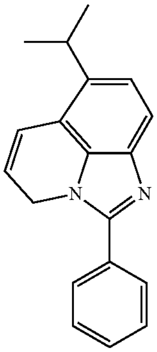
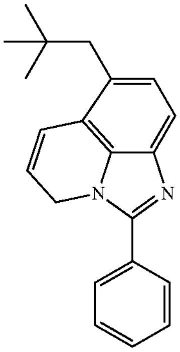
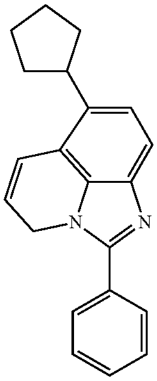
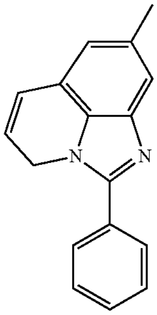
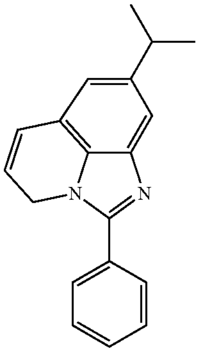
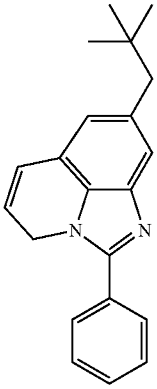
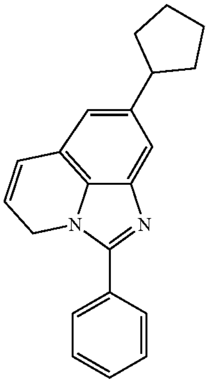

14. The organometallic compound according to claim 3, wherein the L2 preferably has one of the following structural formulas, or is partially or completely deuterated or fluorinated correspondingly, -continued
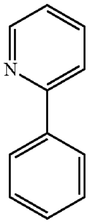
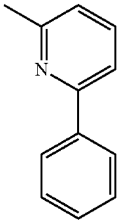
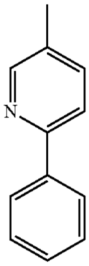
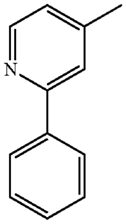
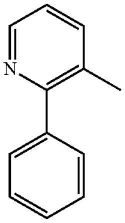
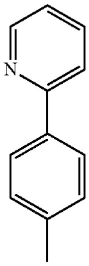
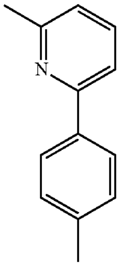
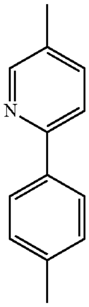
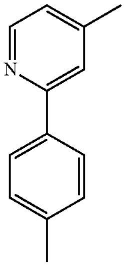
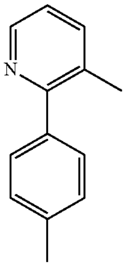
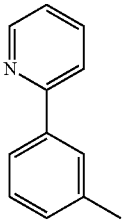
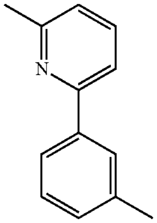
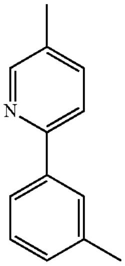
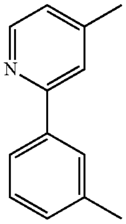
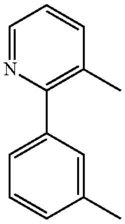
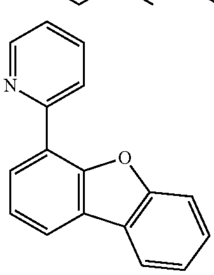
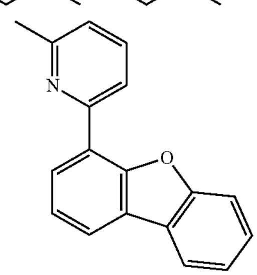
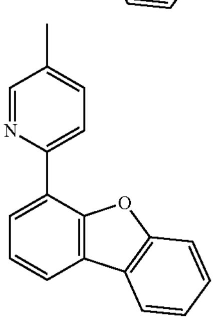
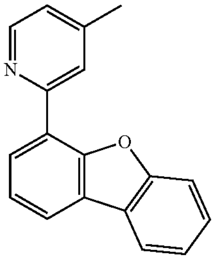
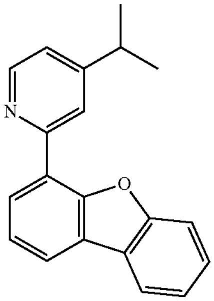
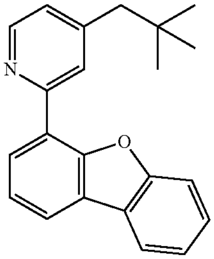
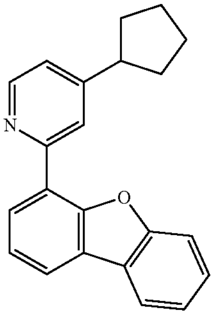
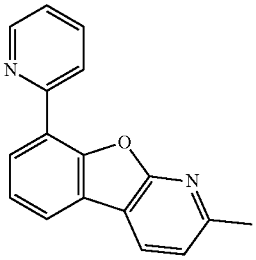
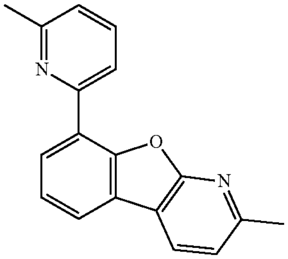
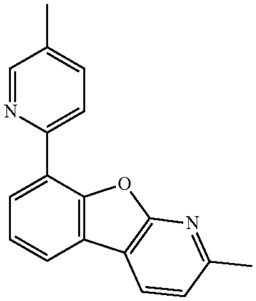
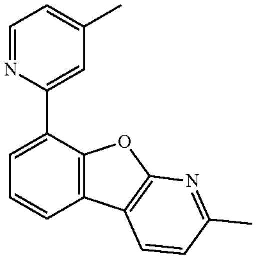
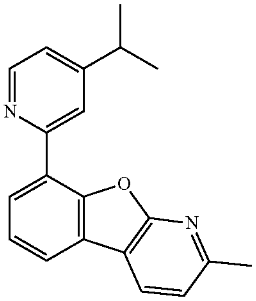
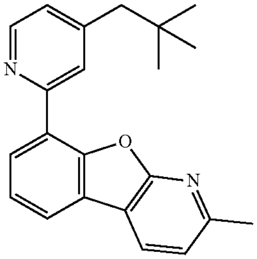
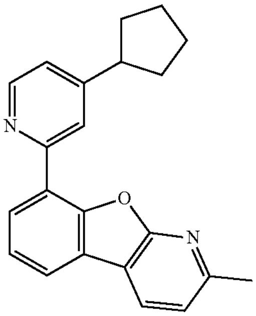

-continued
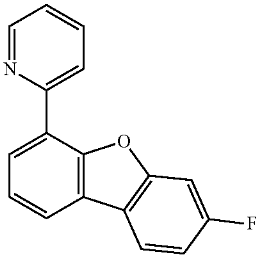
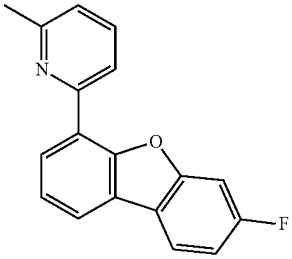
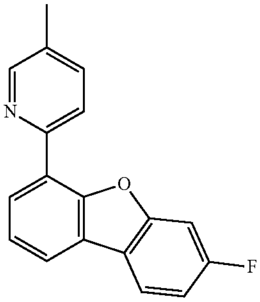
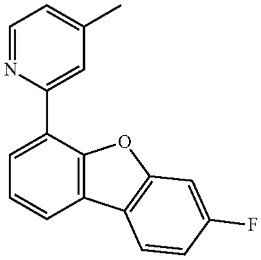
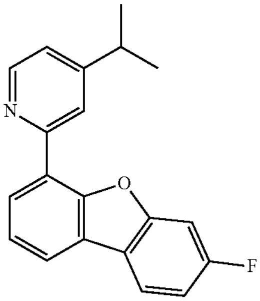
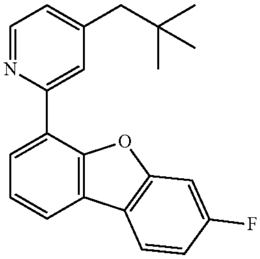
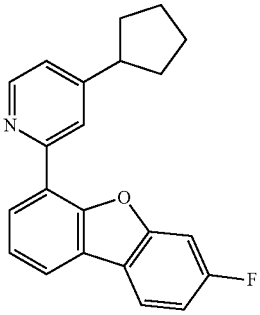
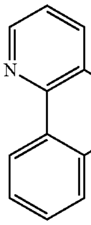
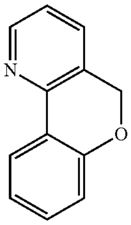
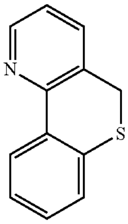
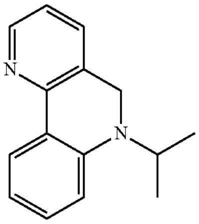
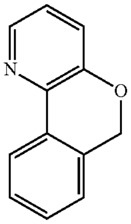
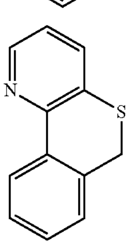
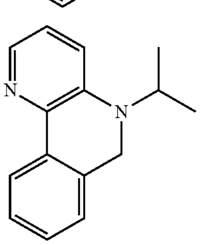
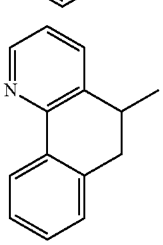
-continued
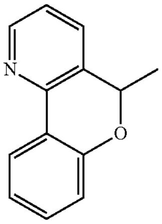
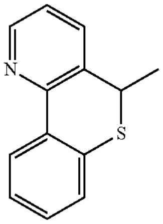
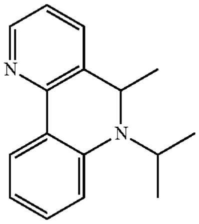
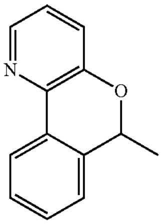
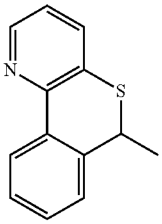
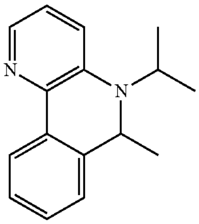
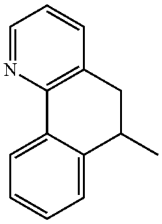
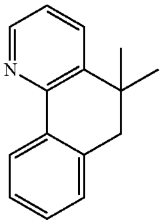
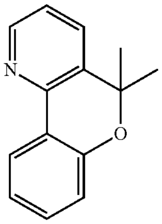
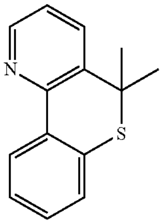
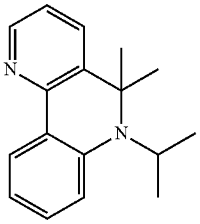
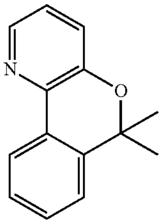
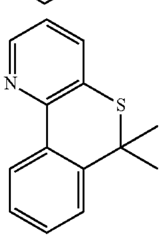
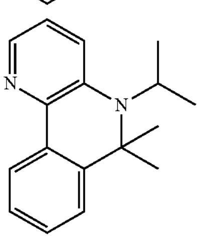
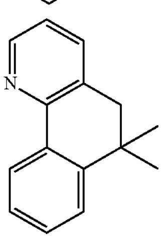
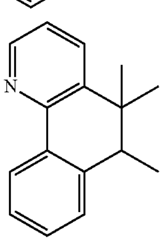
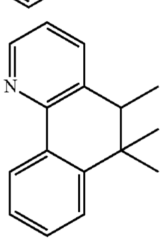
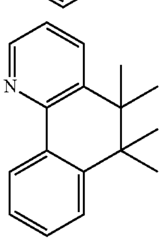
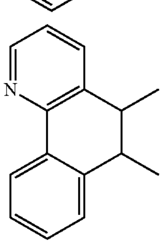
15. The organometallic compound according to claim 1, wherein the compound as shown in the formula (1) has one of the following structural formulas, or is partially or completely deuterated or fluorinated correspondingly, CPD1
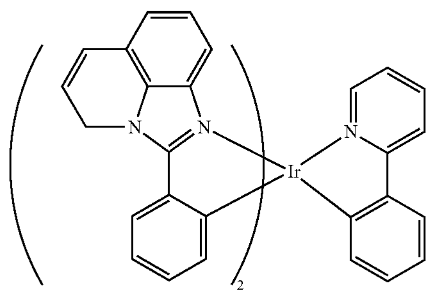
CPD 2
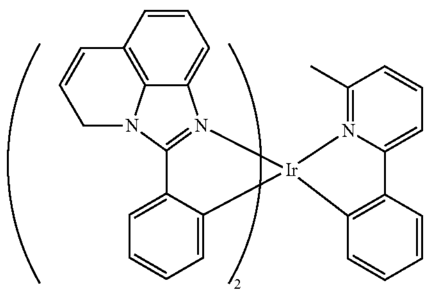
CPD 3
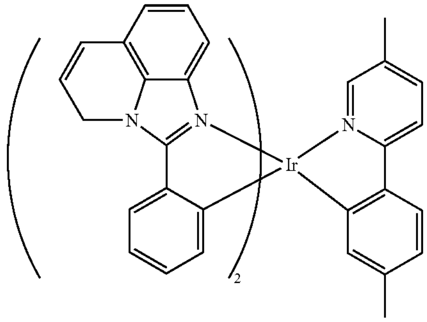
CPD4
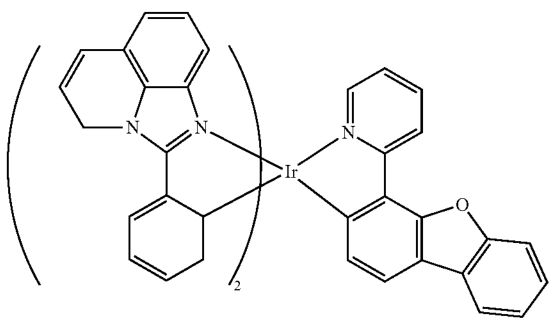
CPD5
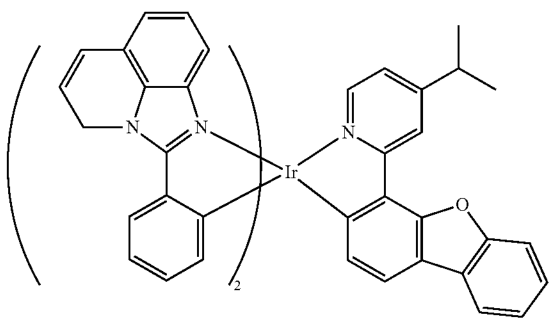
-continued
CPD 6
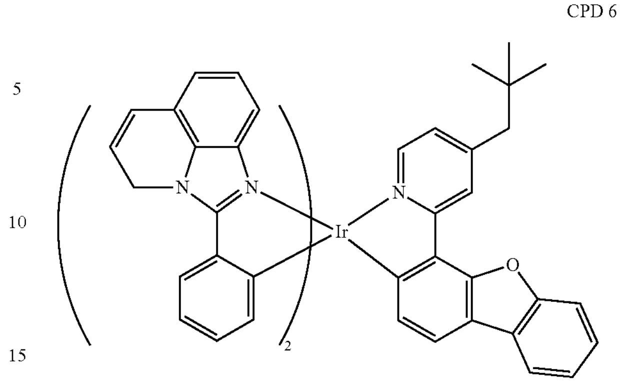
CPD 7
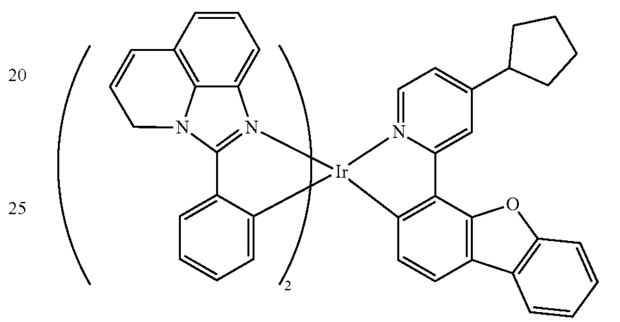
CPD 8
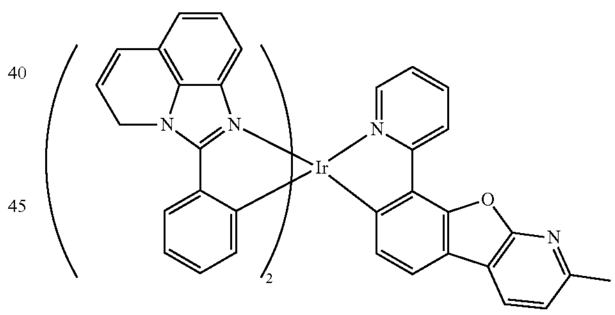
CPD 9
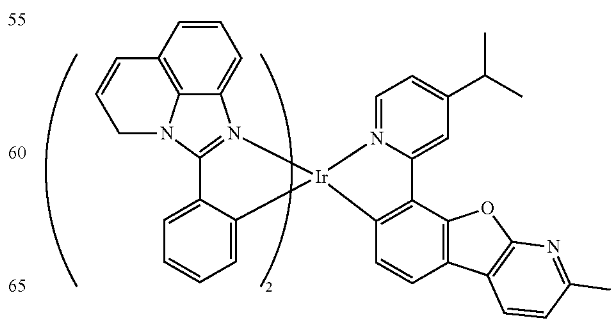

-continued
CPD 10
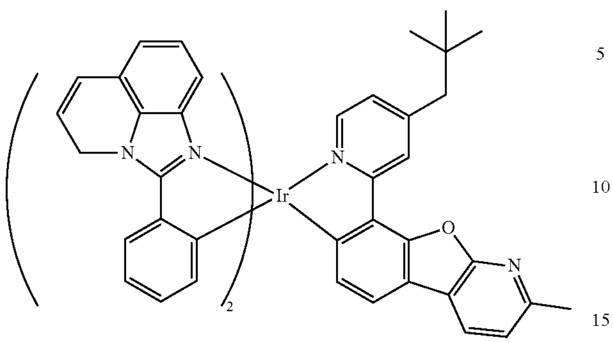
CPD 11
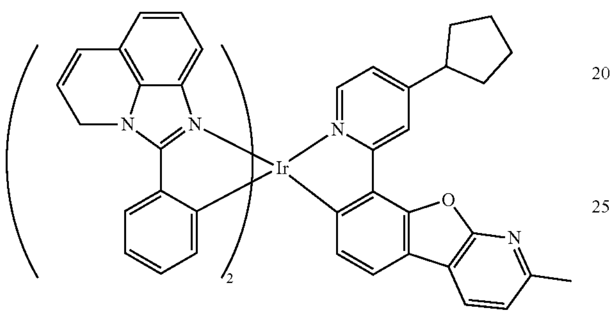
CPD 12
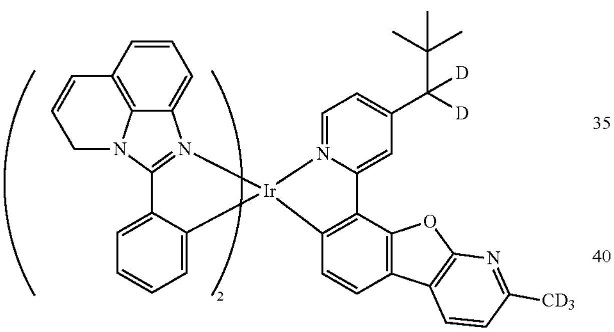
CPD 13
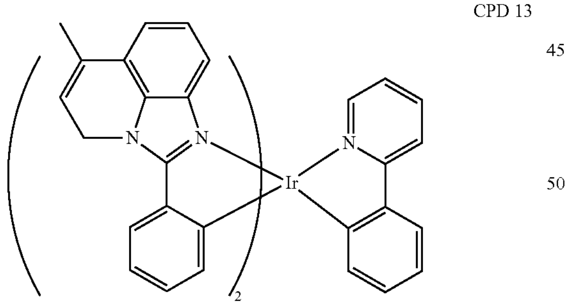
CPD 14
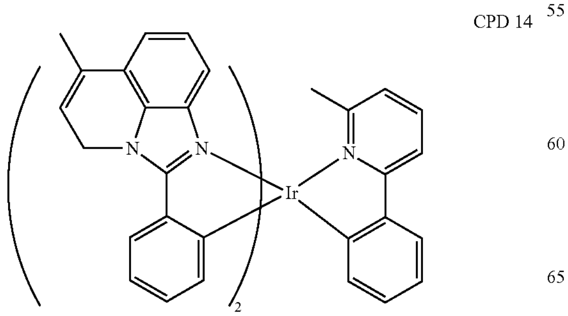
-continued
CPD 15
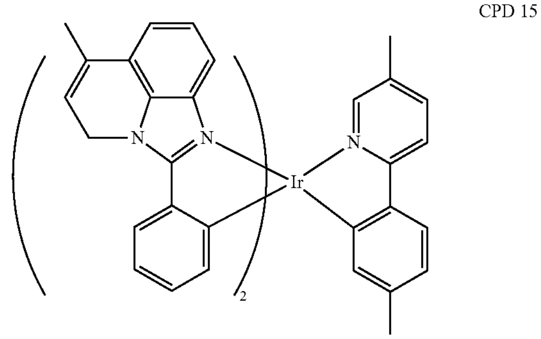
CPD 16
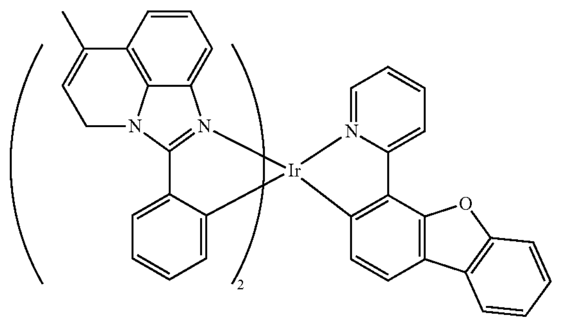
CPD 17
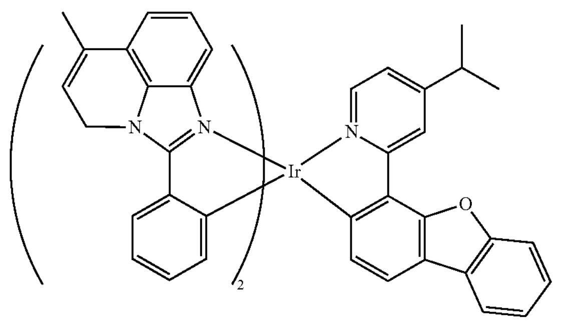
CPD 18
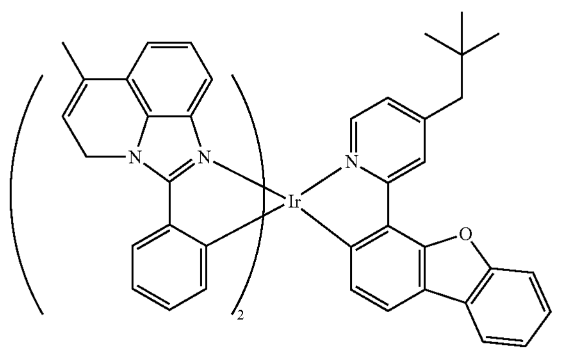

-continued
CPD 19
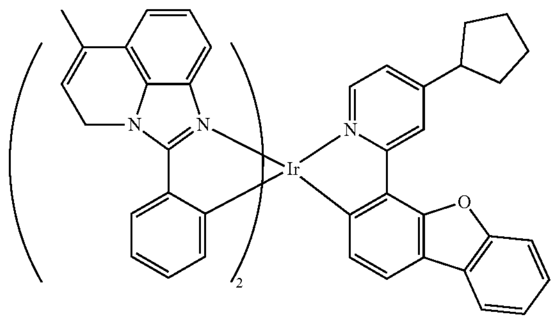
CPD 20
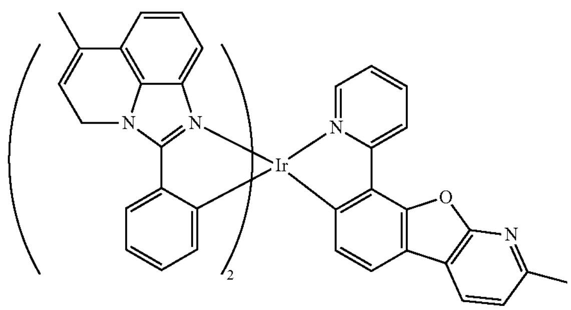
CPD 21
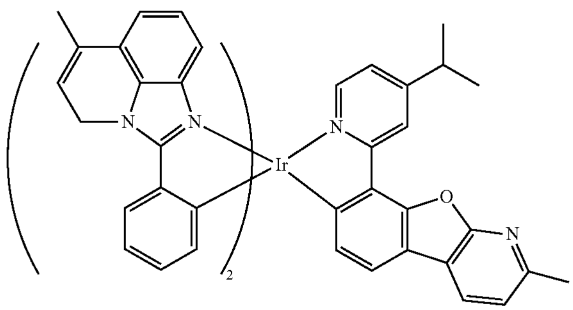
CPD 22
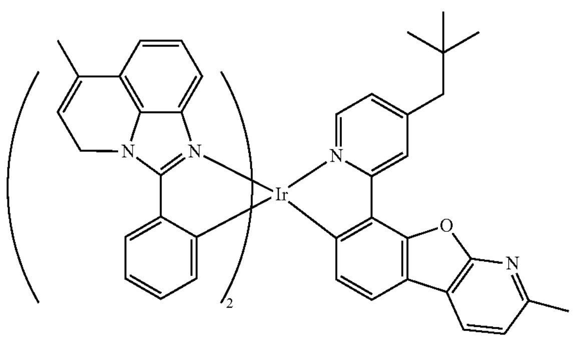
-continued
CPD 23
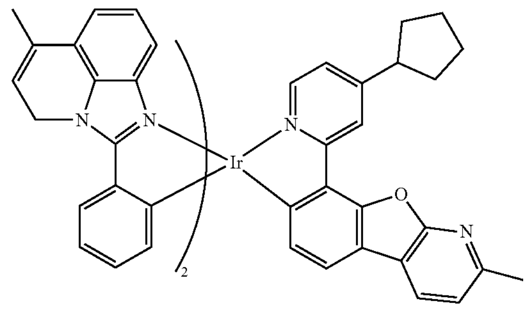
CPD 24
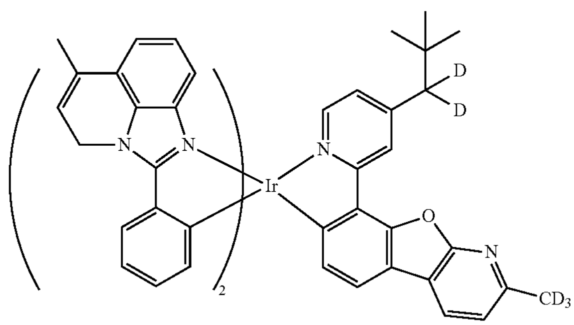
CPD 25
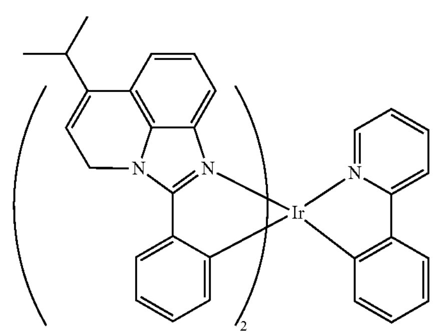
CPD 26
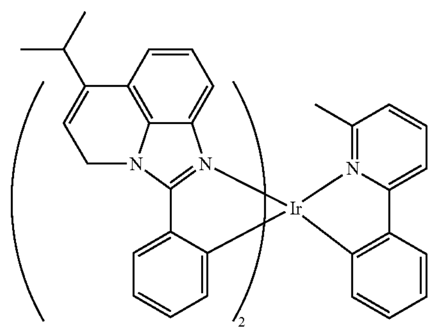

-continued
CPD 27
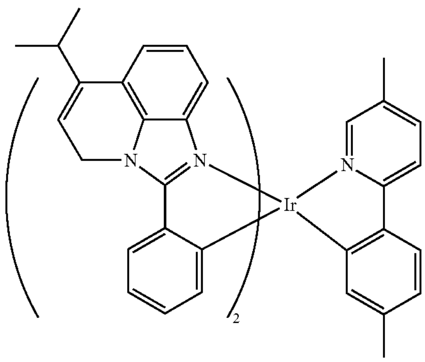
CPD 28
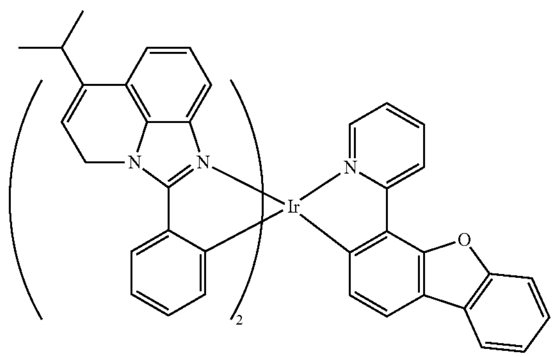
CPD 29
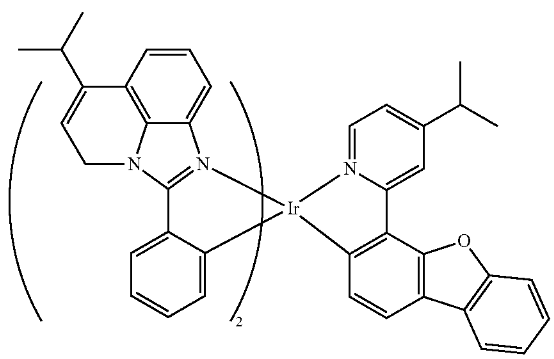
CPD 30
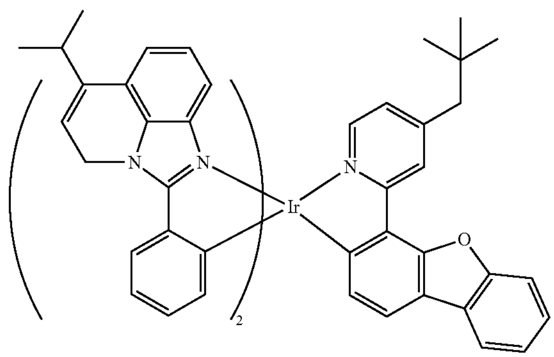
-continued
CPD 31
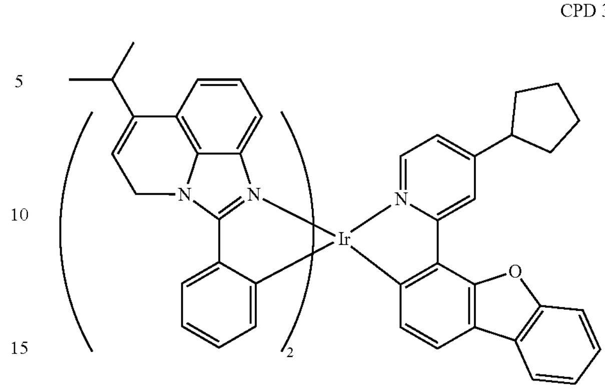
CPD 32
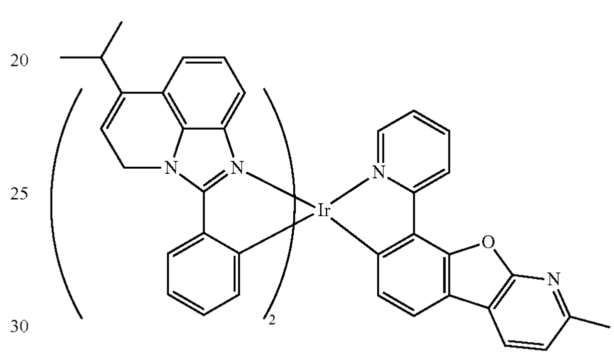
CPD 33
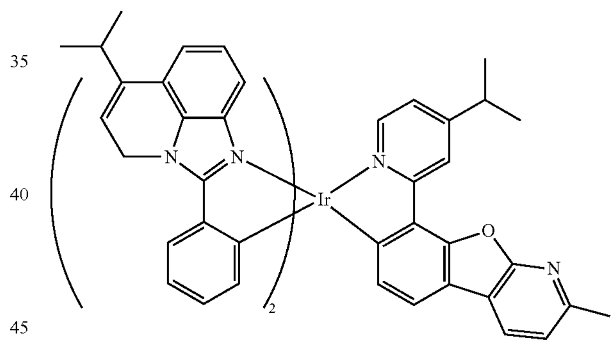
CPD 34
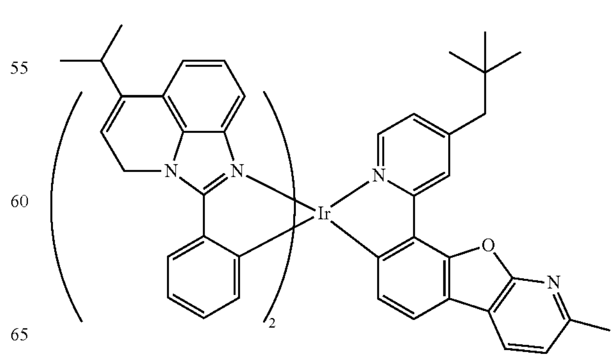

-continued
CPD 35
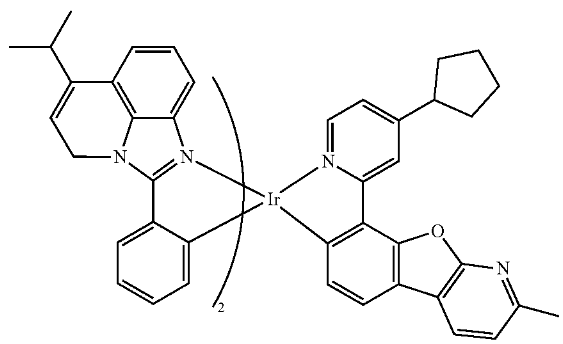
CPD 36
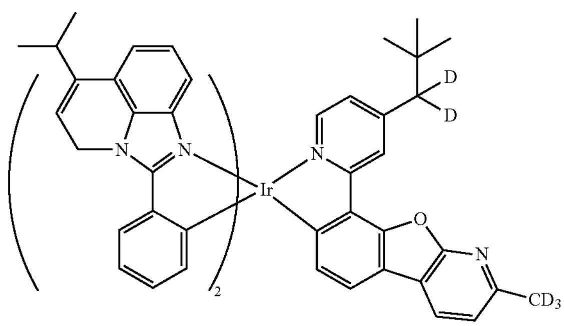
CPD 37
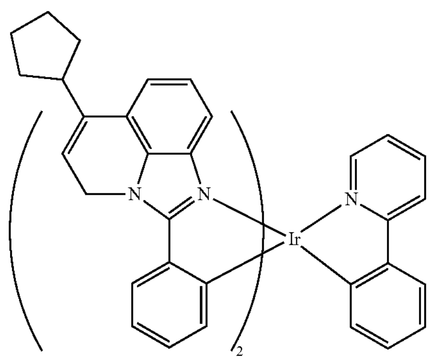
CPD 38
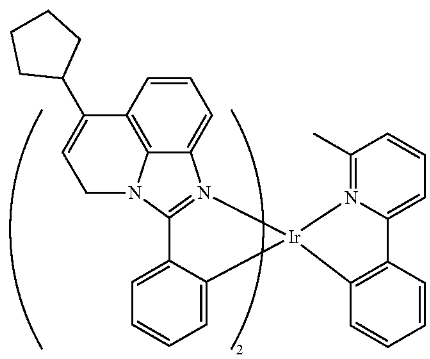
-continued
CPD 39
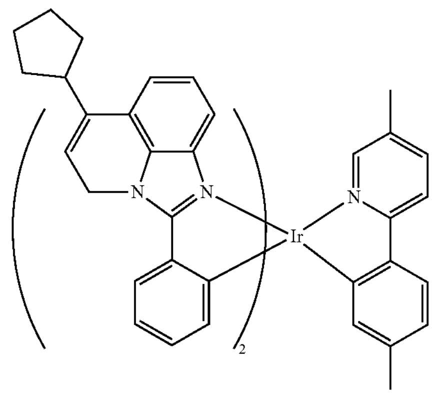
CPD 40
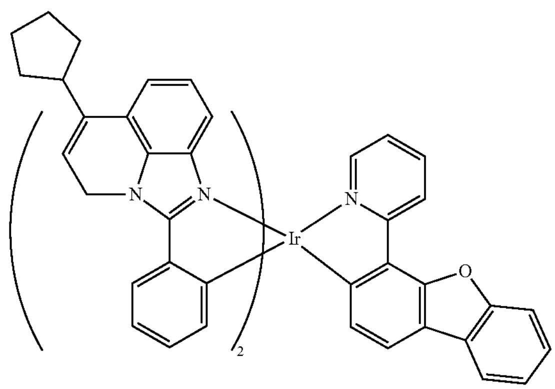
CPD 41
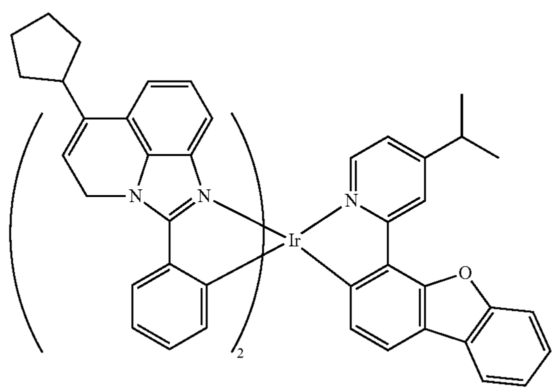
CPD 42
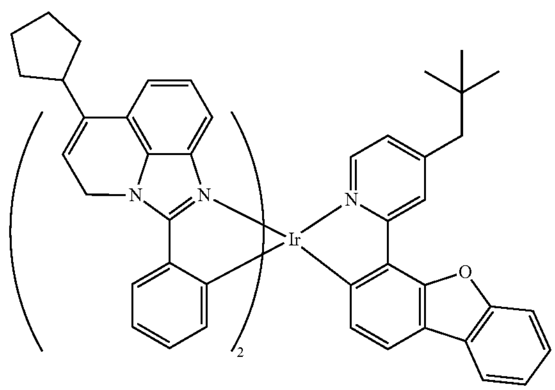

-continued
CPD 43
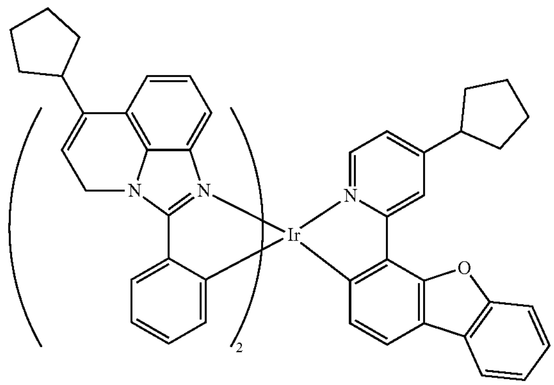
CPD 44
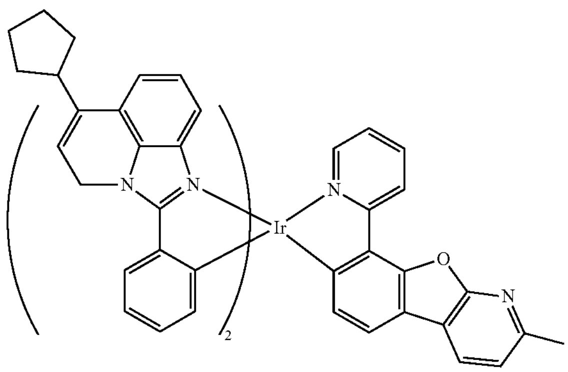
CPD 45
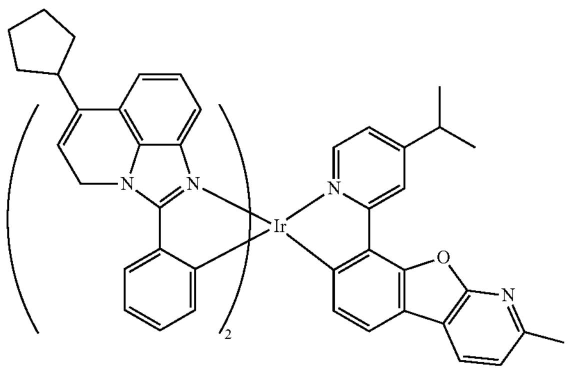
CPD 46
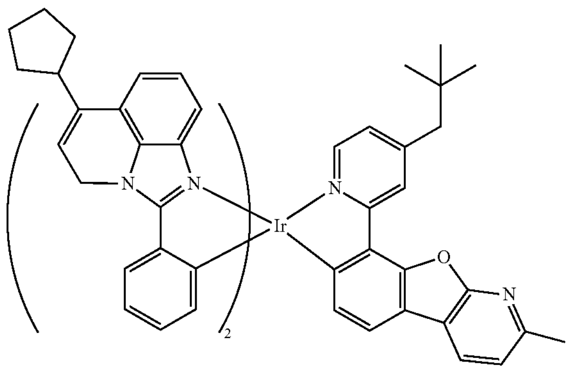
-continued
CPD 47
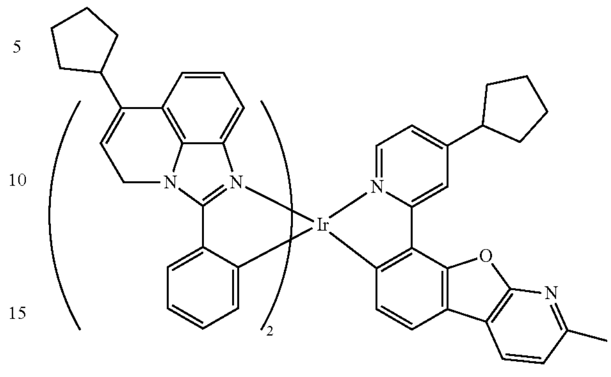
CPD 48
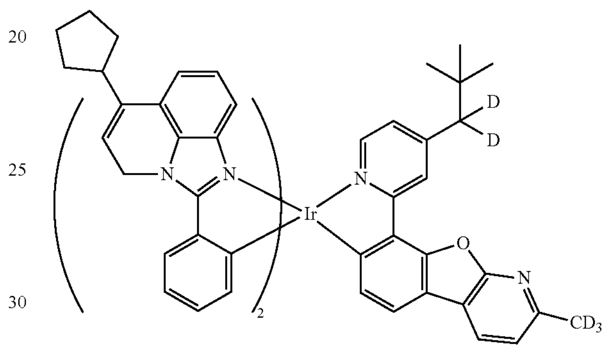
CPD 49
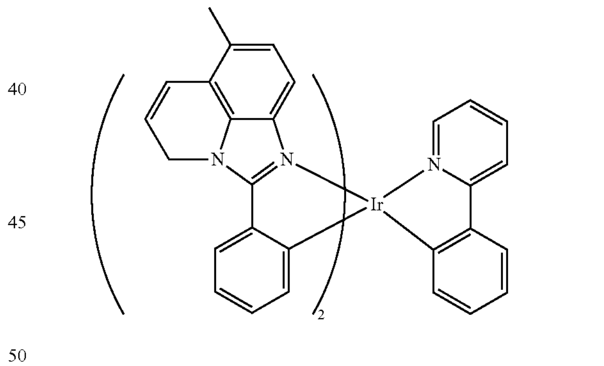
CPD 50
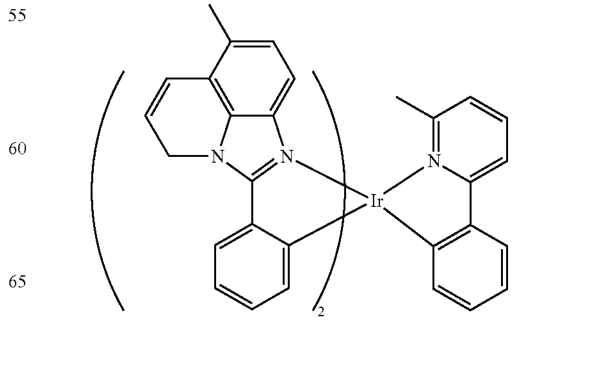

-continued
CPD 51
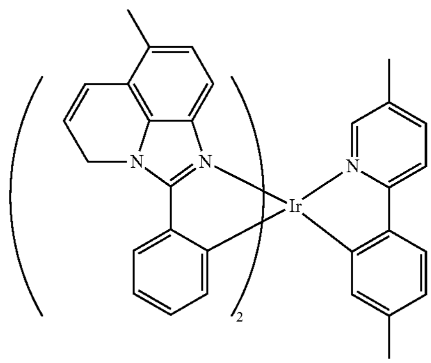
CPD 52
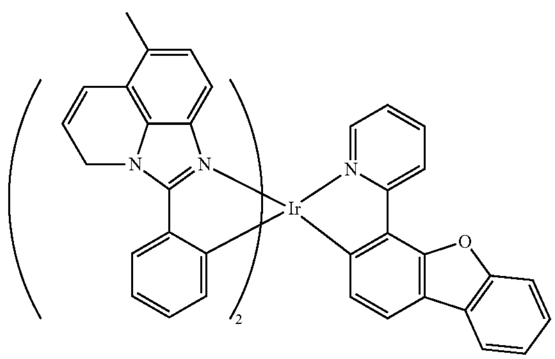
CPD 53
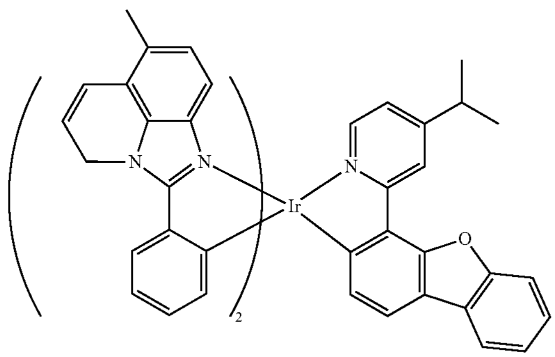
CPD 54
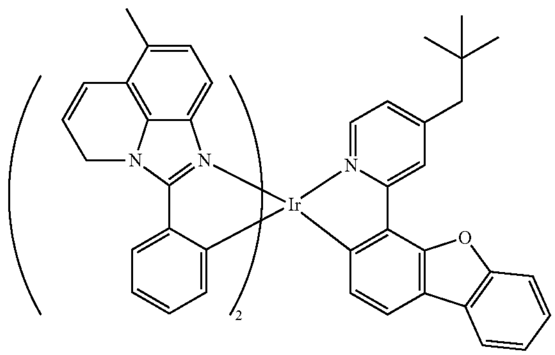
-continued
CPD 55
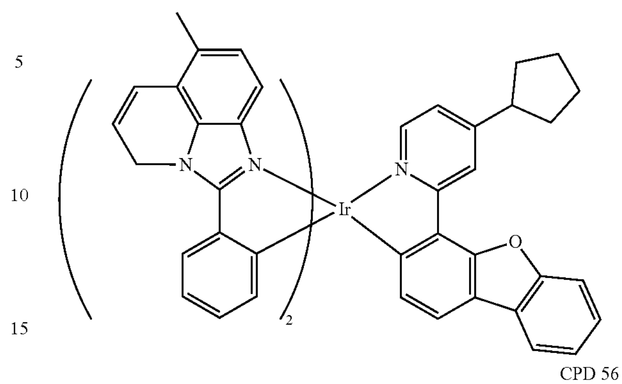
CPD 56
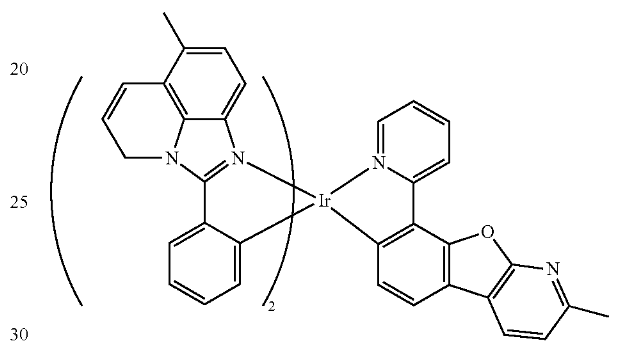
CPD 57
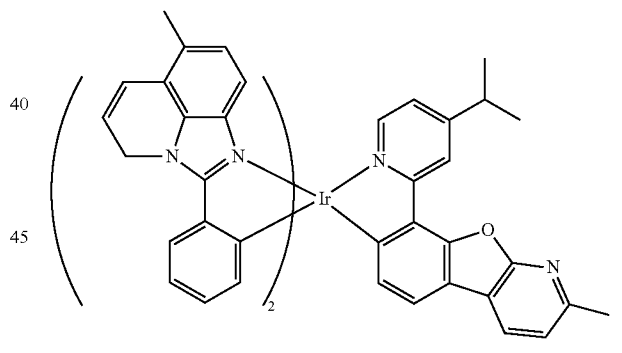
CPD 58
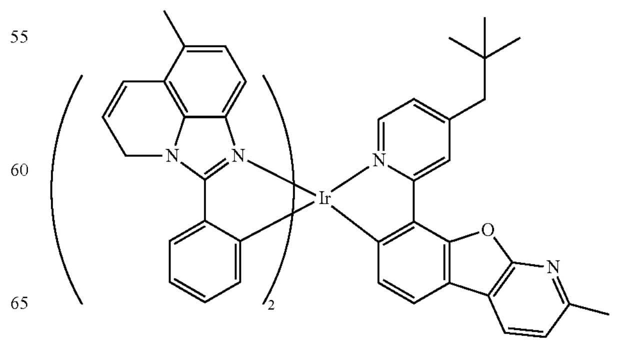

-continued
CPD 59
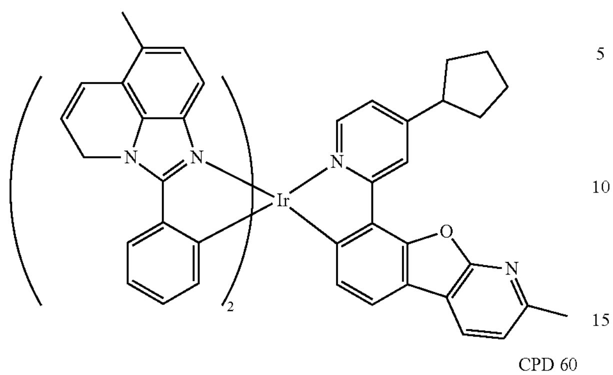
CPD 60
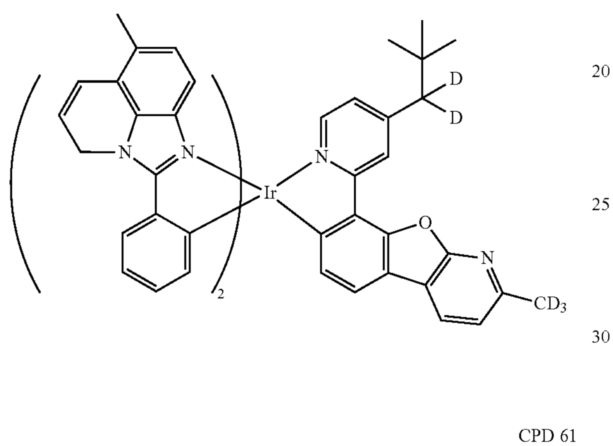
CPD 61
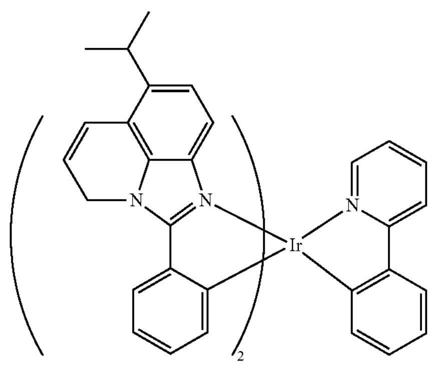
CPD 62
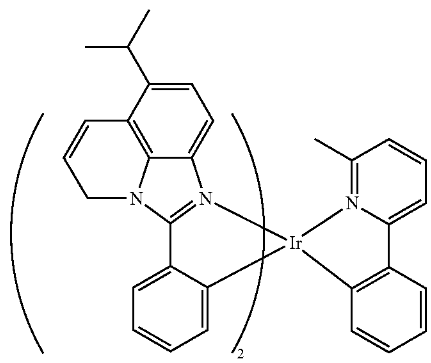
-continued
CPD 63
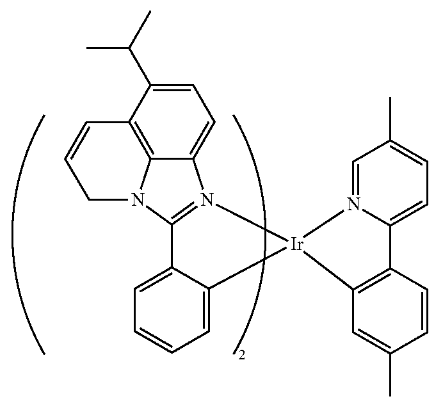
CPD 64
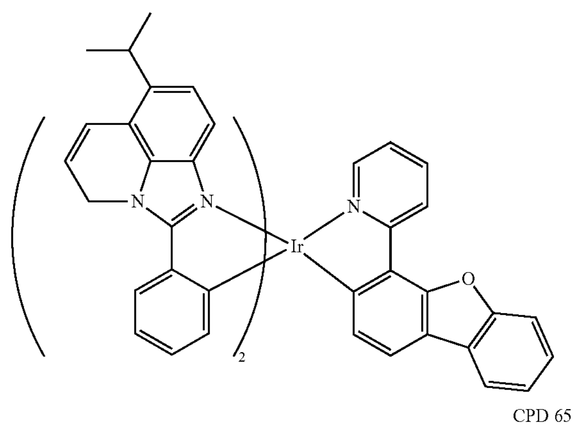
CPD 65
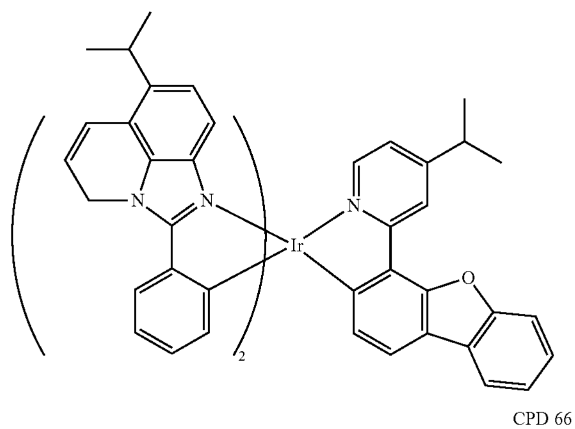
CPD 66
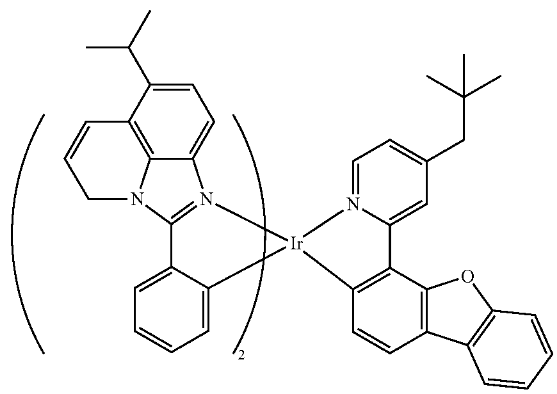

-continued
CPD 67
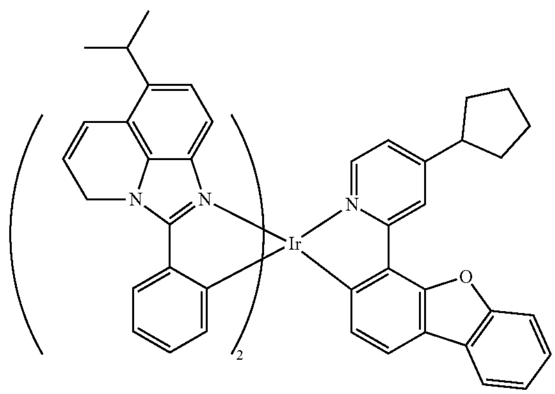
CPD 68
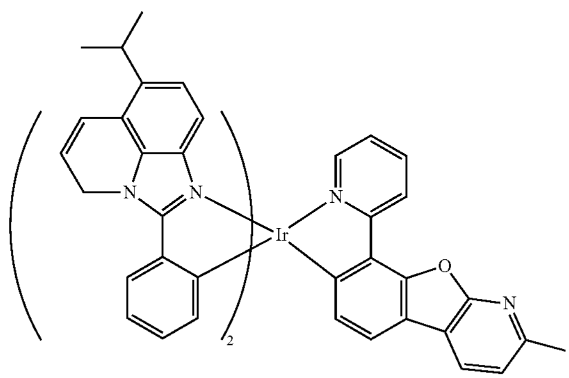
CPD 69
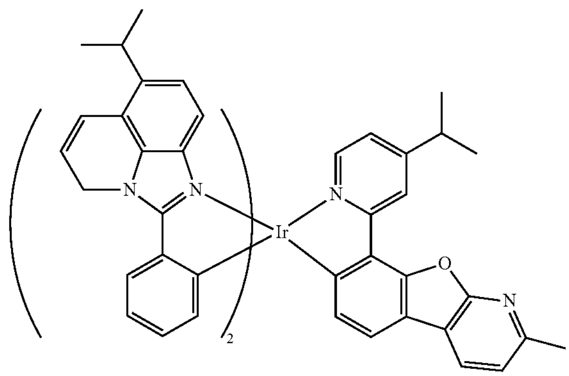
CPD 70
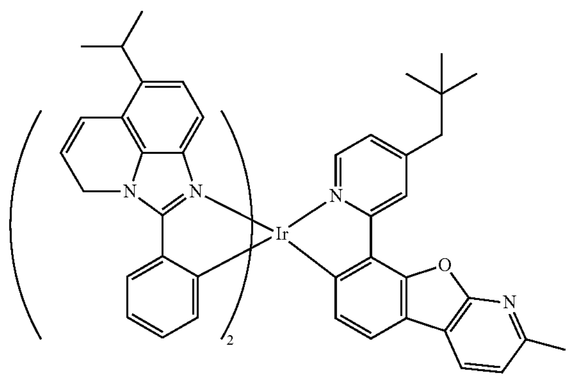
-continued
CPD 71
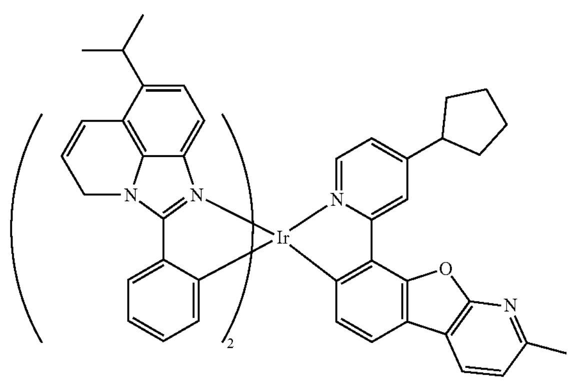
CPD 72
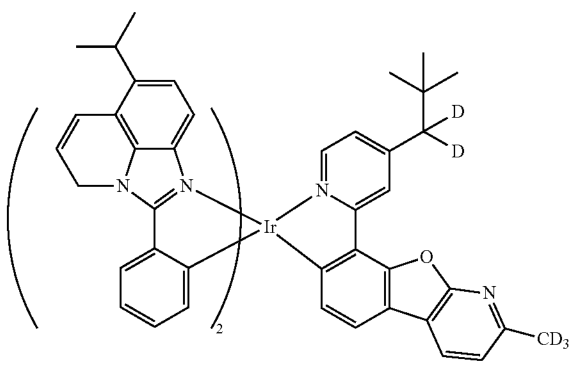
CPD 73
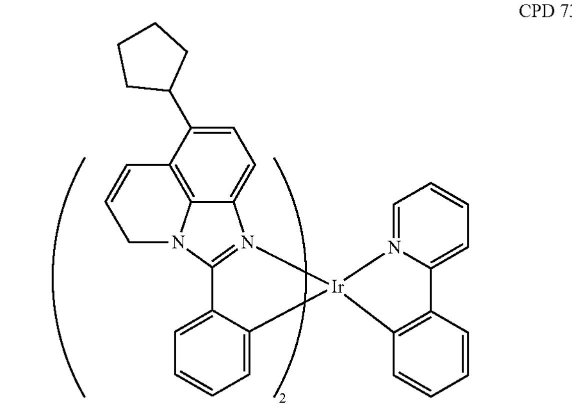
CPD 74
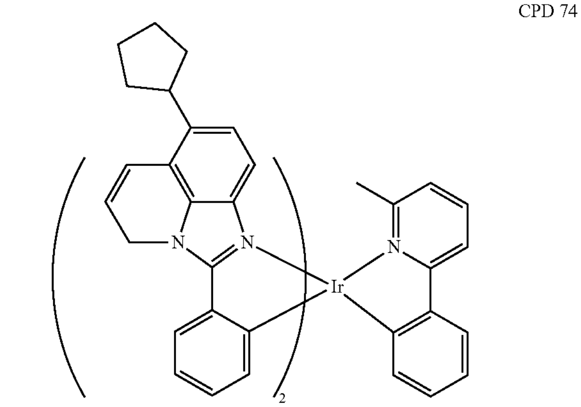

-continued
CPD 75
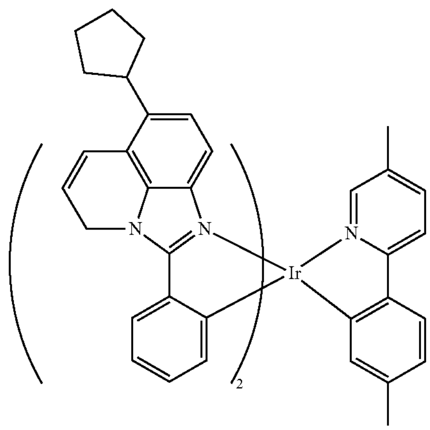
CPD 78
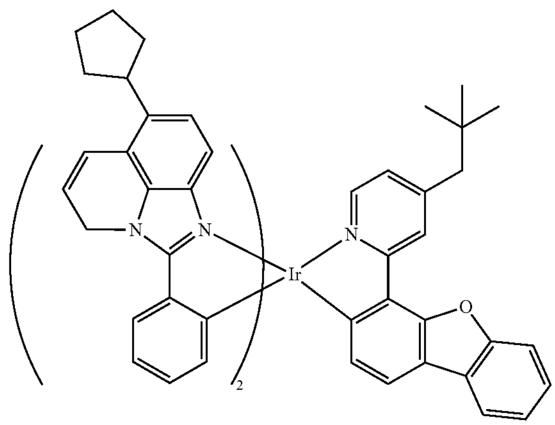
CPD 76
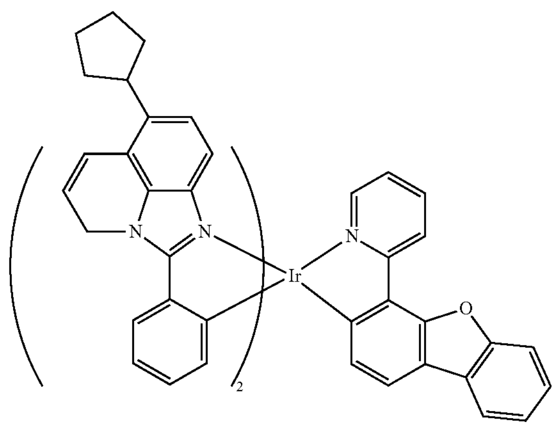
CPD 79
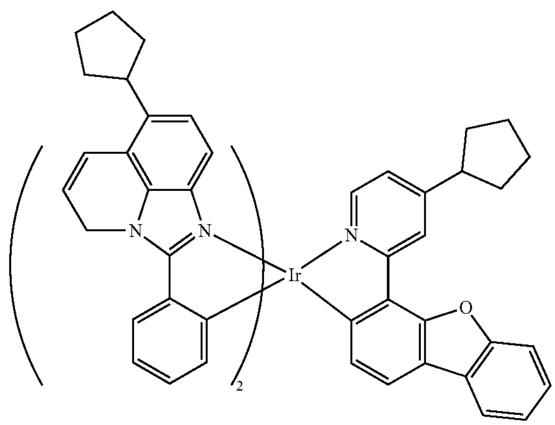
CPD 77
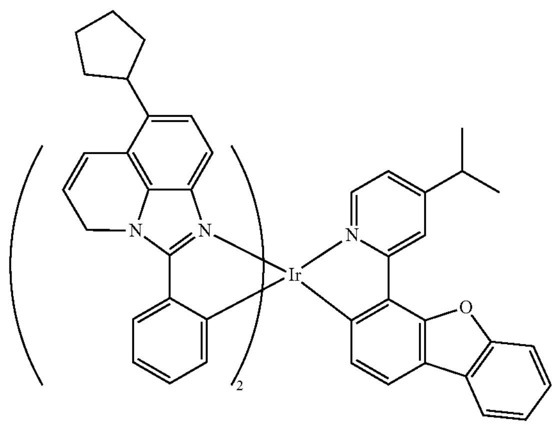
CPD 80
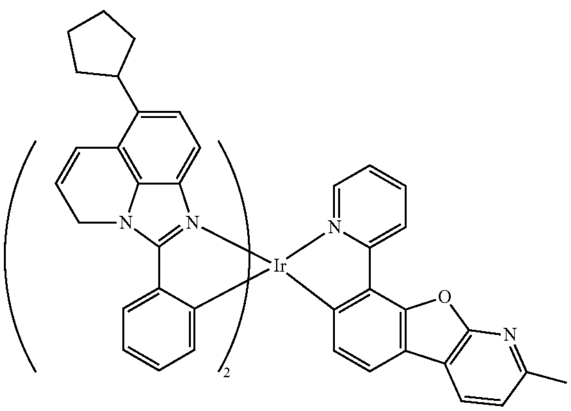

-continued
CPD 81
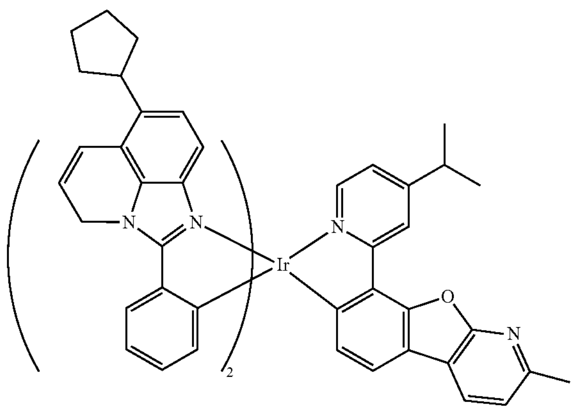
CPD 82
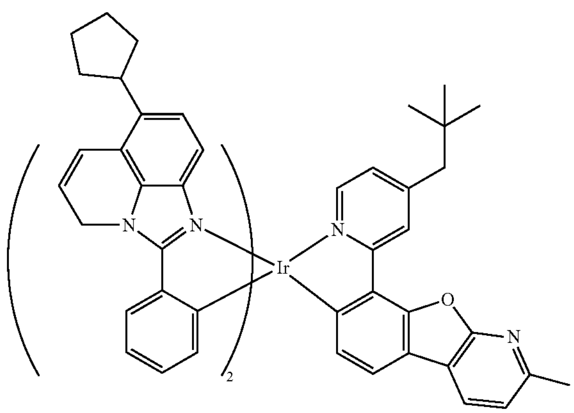
CPD 83
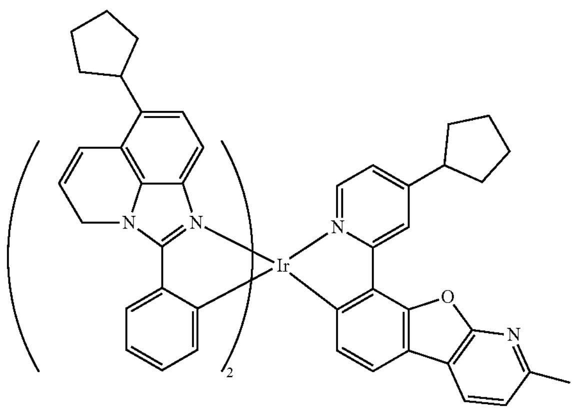
-continued
CPD 84
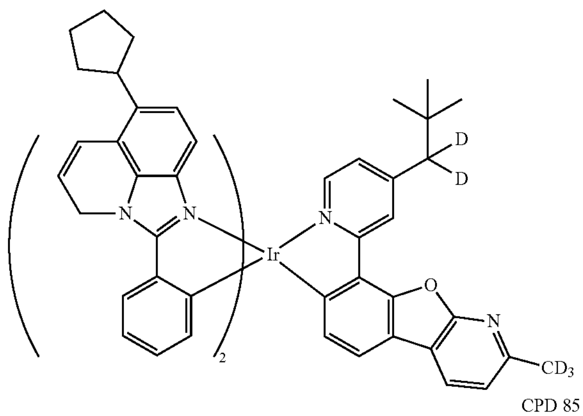
CPD 85
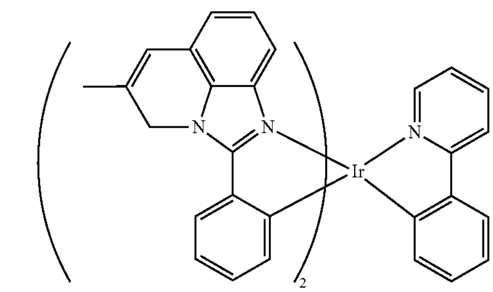
CPD 86
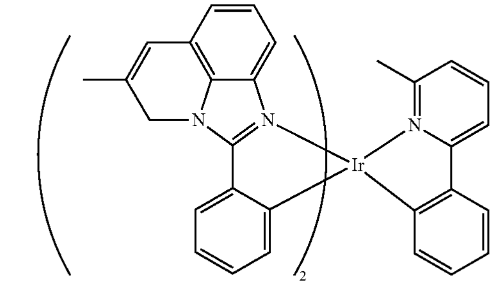
CPD 87
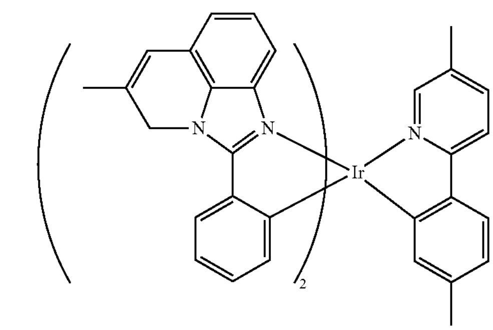
CPD 88
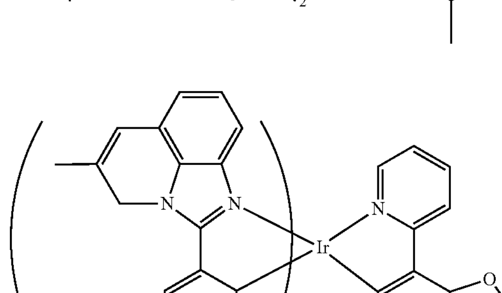
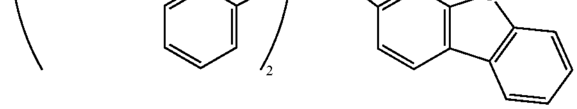

-continued
CPD 89
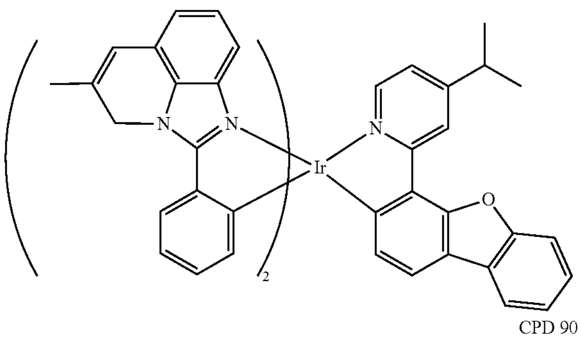
CPD 90
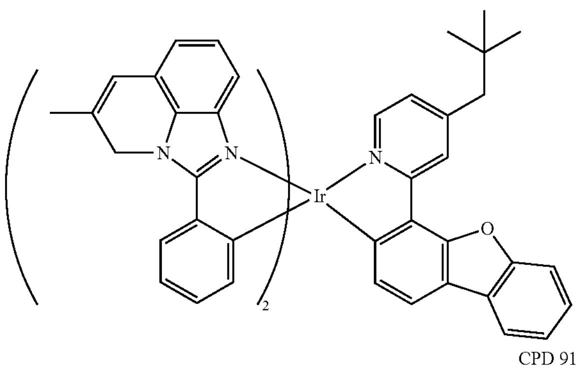
CPD 91
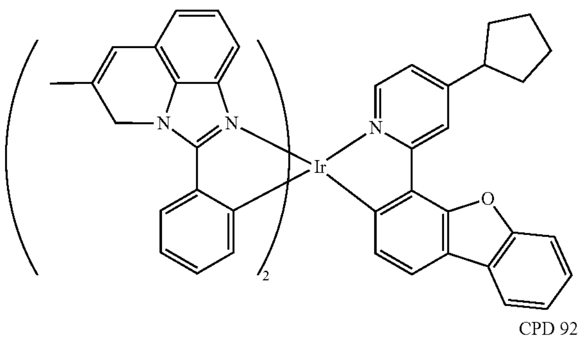
CPD 92
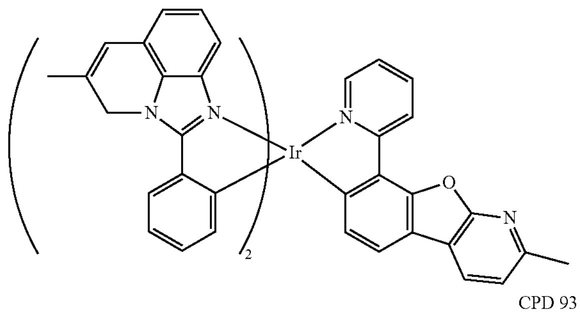
CPD 93
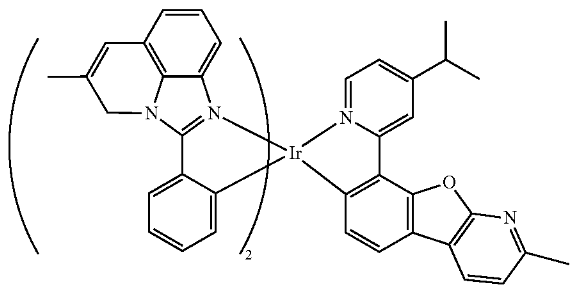
-continued
CPD 94
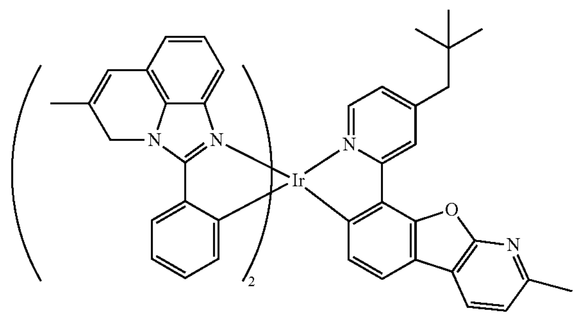
CPD 95
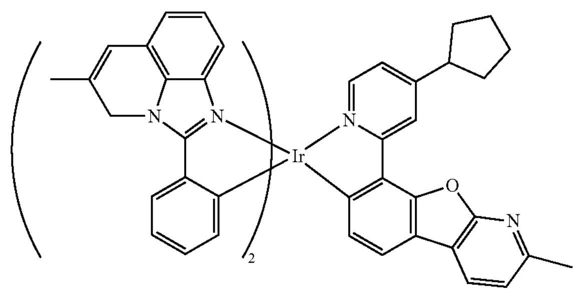
CPD 96
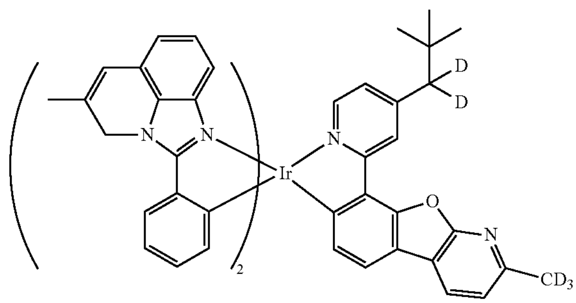
CPD 97
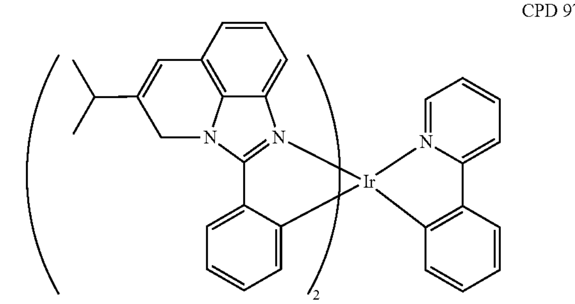
CPD 98
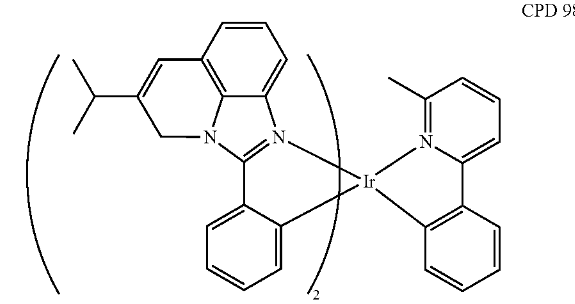

-continued
CPD 99
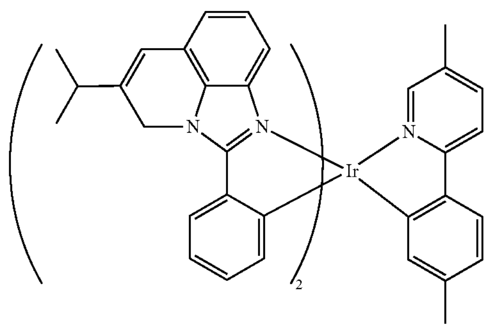
CPD 100
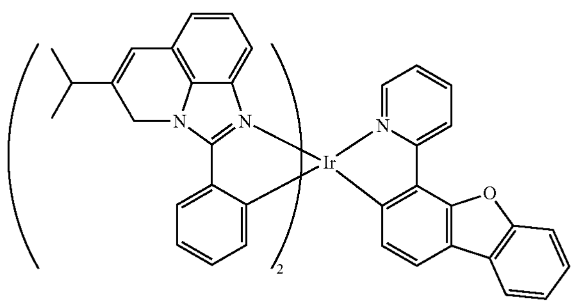
CPD 101
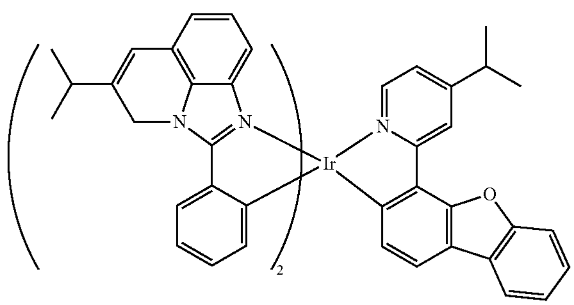
CPD 102
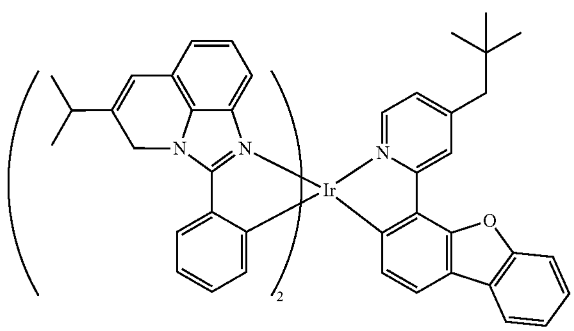
CPD 103
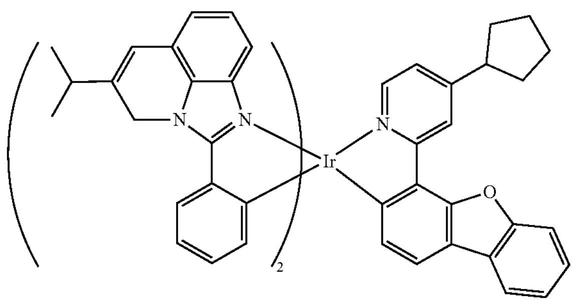
-continued
CPD 104
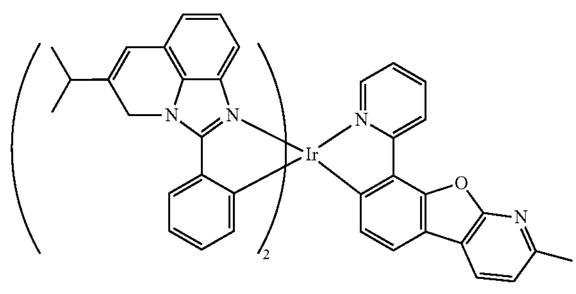
CPD 105
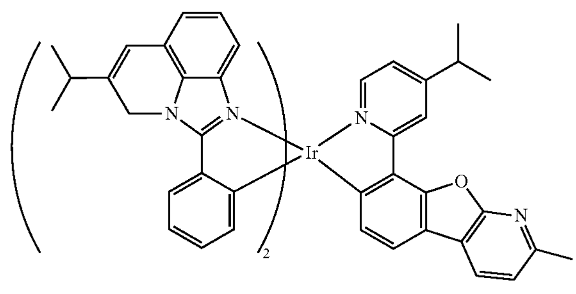
CPD 106
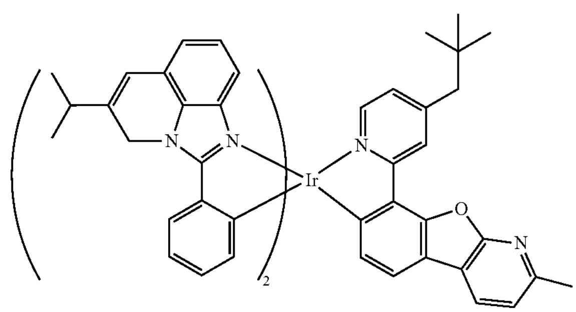
CPD 107
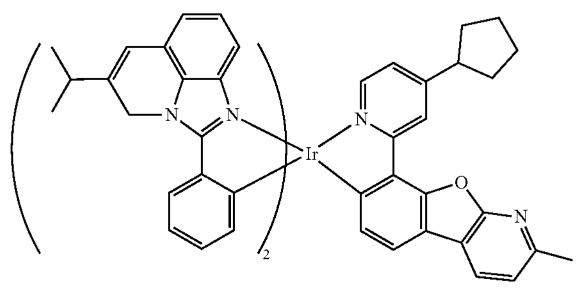
CPD 108
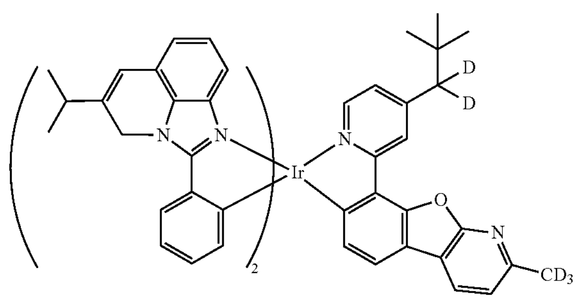

-continued
CPD 109
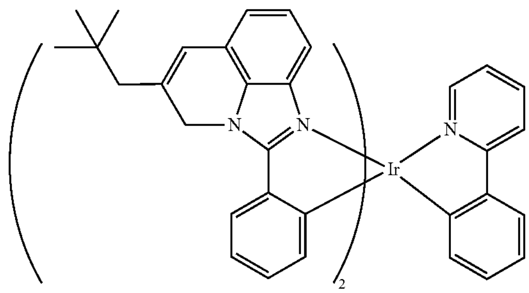
CPD 110
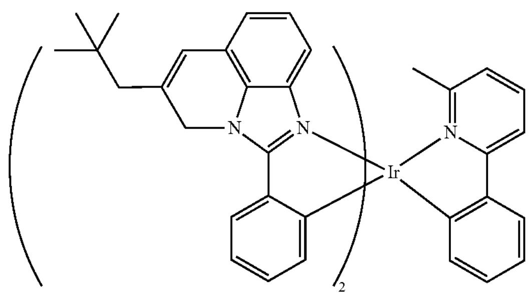
CPD 111
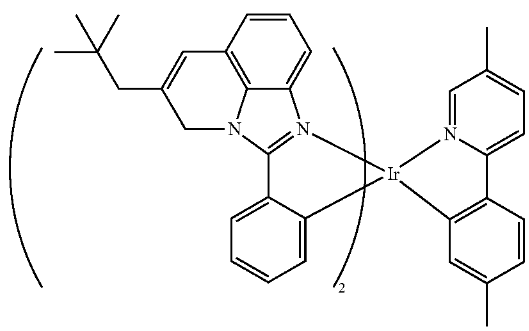
CPD 112
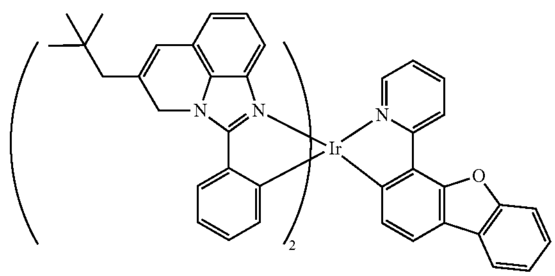
CPD 113
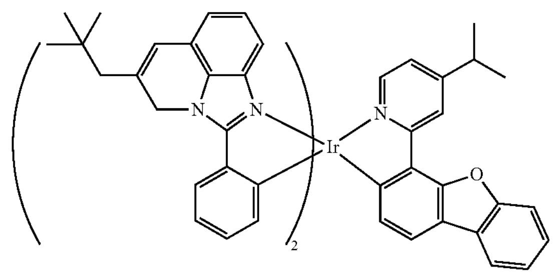
-continued
CPD 114
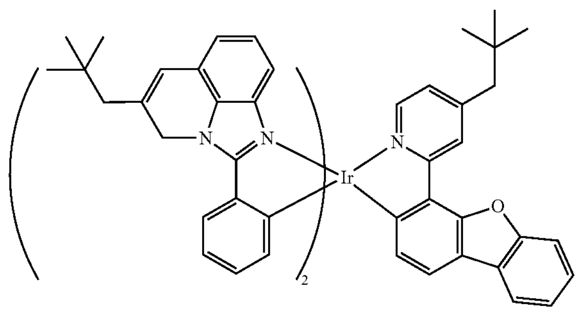
CPD 115
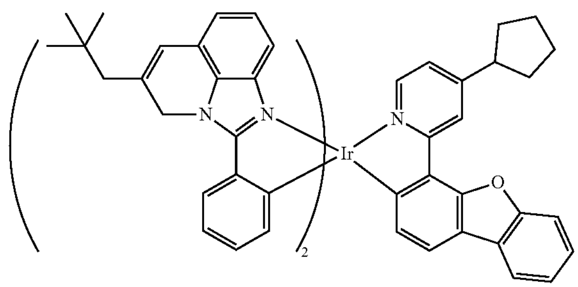
CPD 116
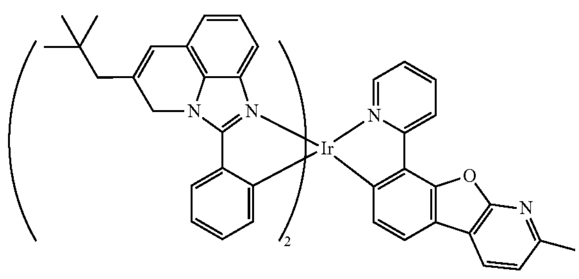
CPD 117
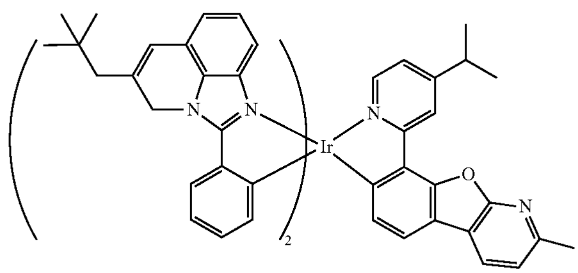
CPD 118
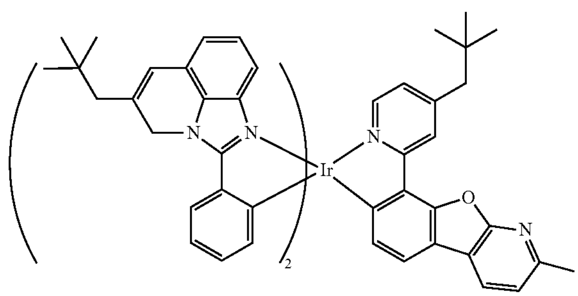

-continued
CPD 119
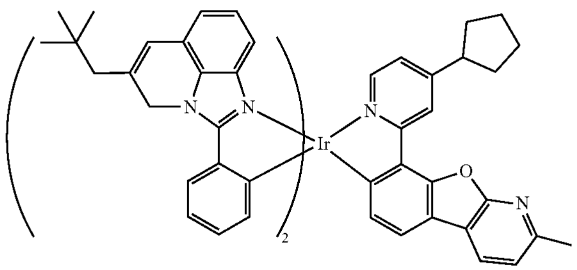
CPD 120
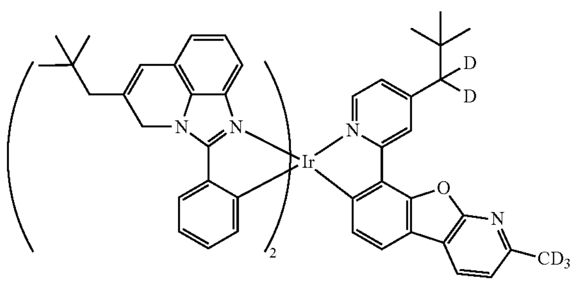
CPD 121
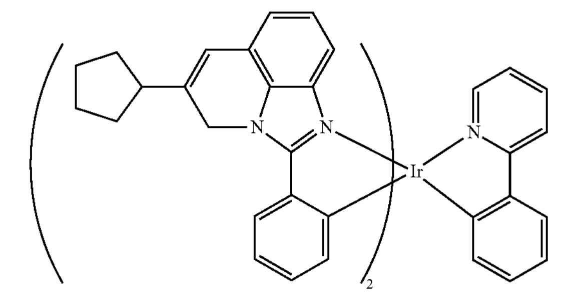
CPD 122
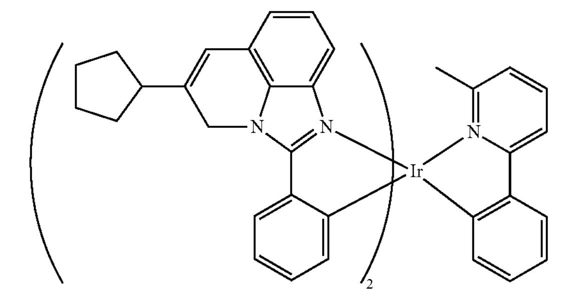
CPD 123
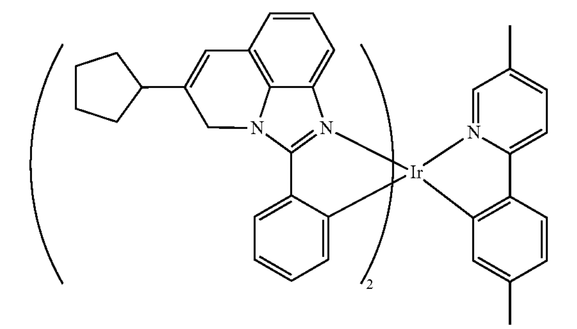
-continued
CPD 124
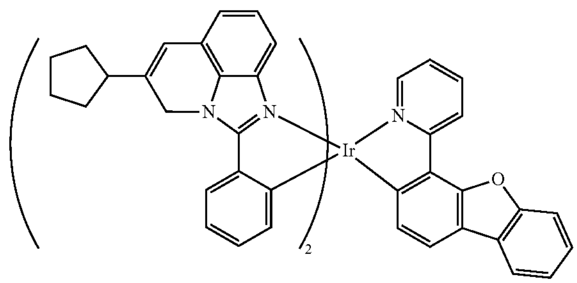
CPD 125
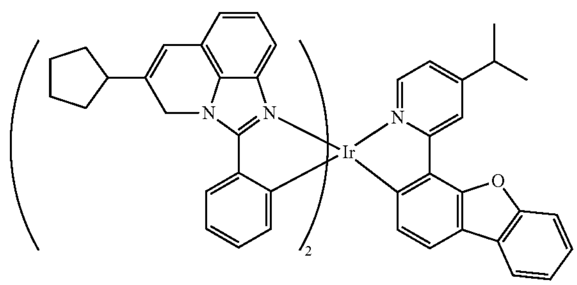
CPD 126
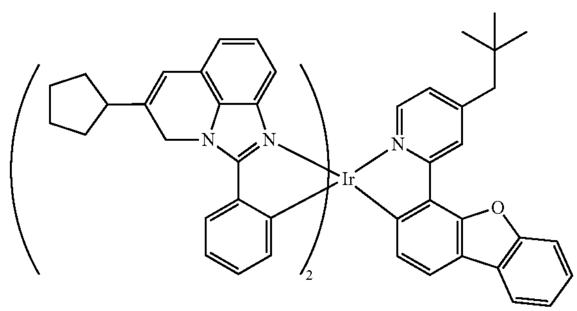
CPD 127
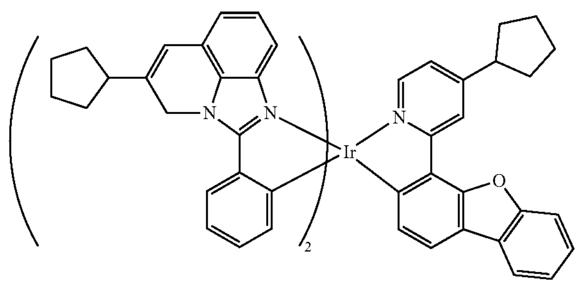
CPD 128
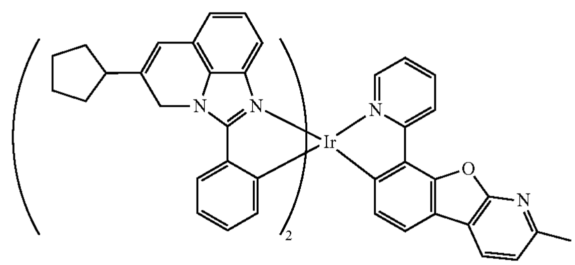

-continued
CPD 129
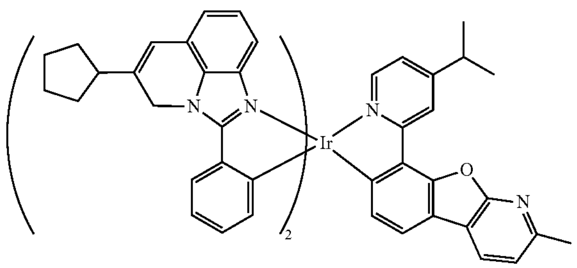
CPD 130
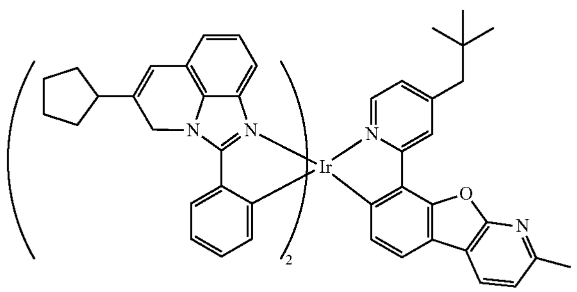
CPD 131
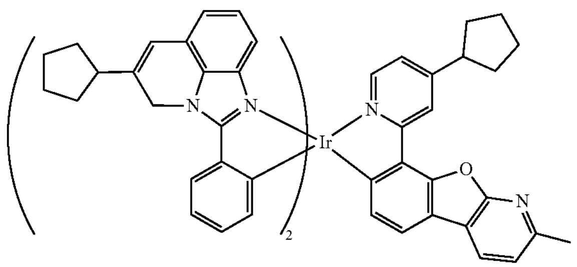
CPD 132
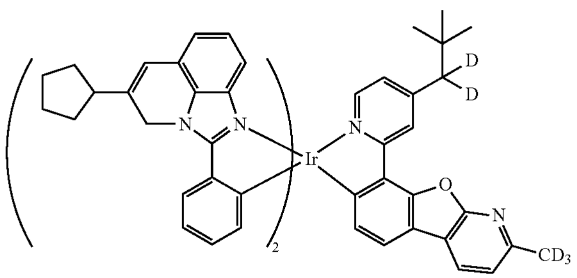
CPD 133
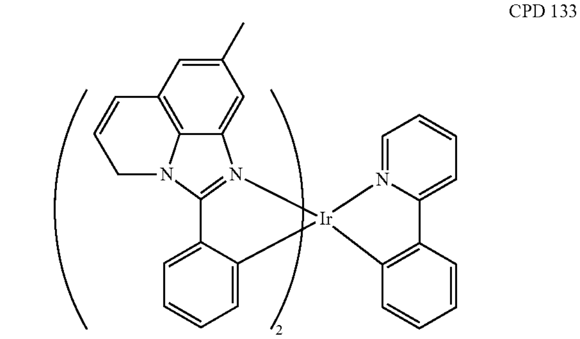
-continued
CPD 134
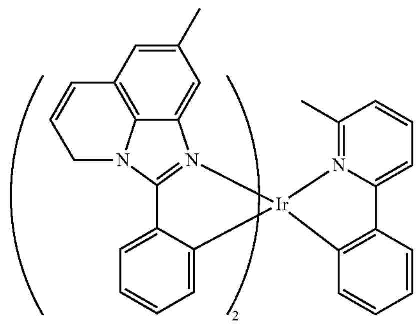
CPD 135
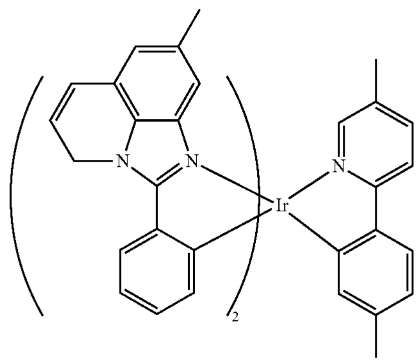
CPD 136
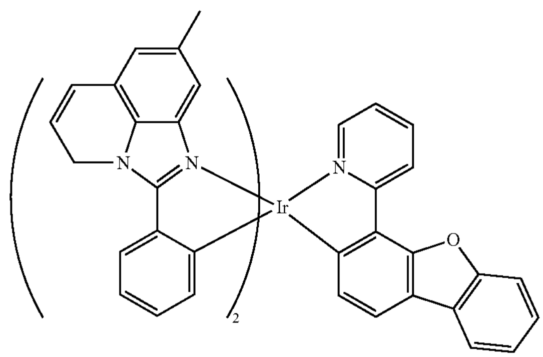
CPD 137
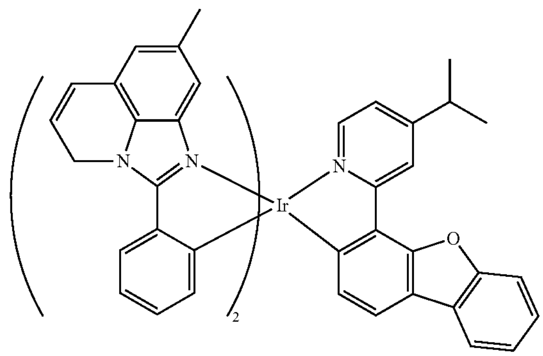

-continued
CPD 138
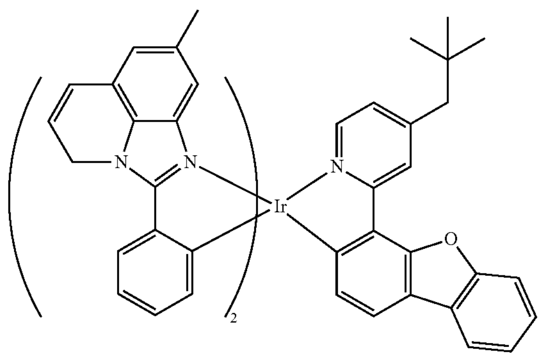
CPD 139
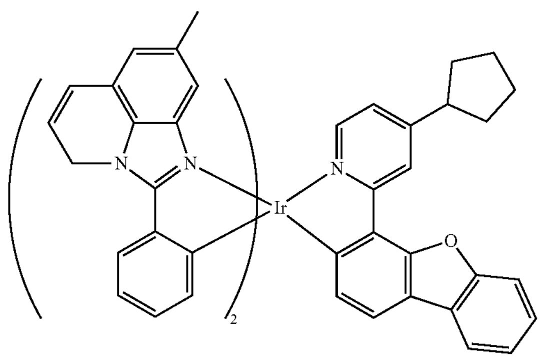
CPD 140
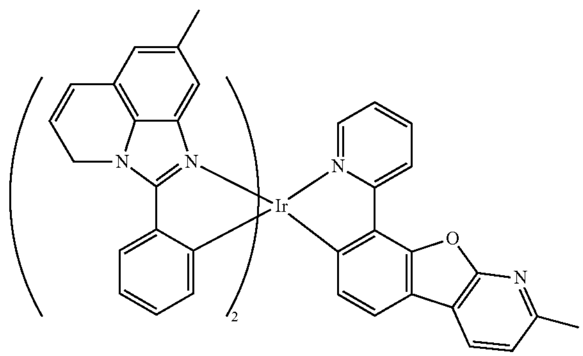
CPD 141
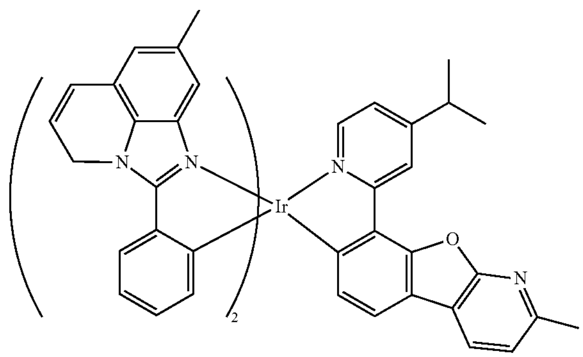
-continued
CPD 142
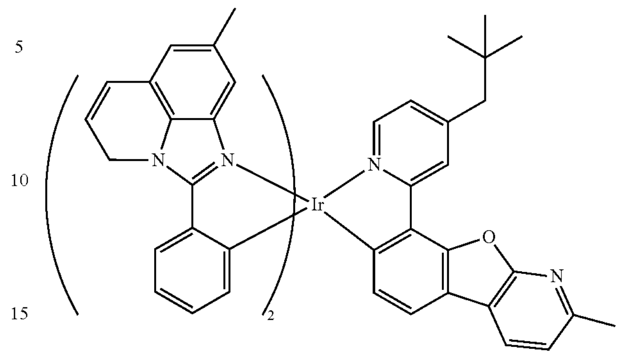
CPD 143
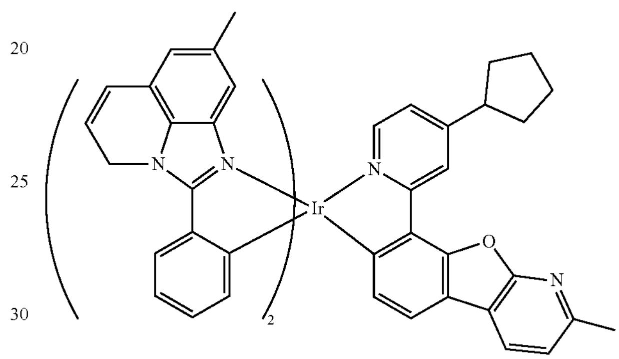
CPD 144
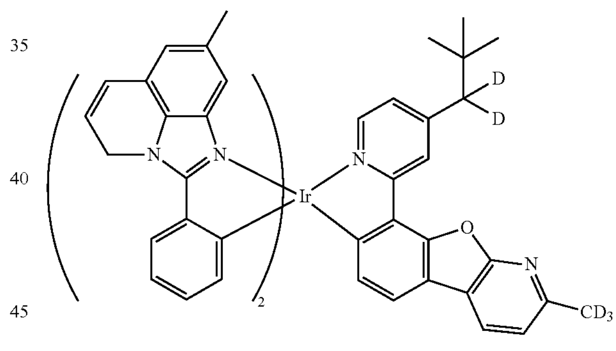
CPD 145
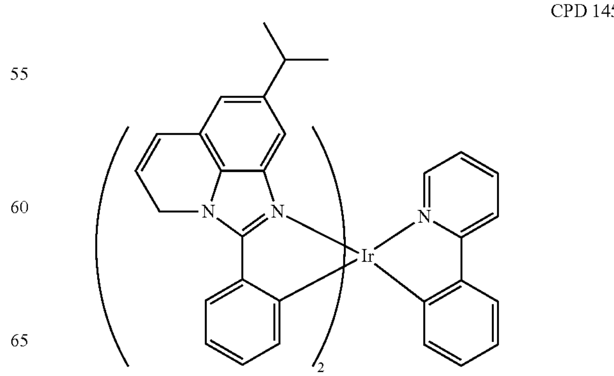

-continued
CPD 146
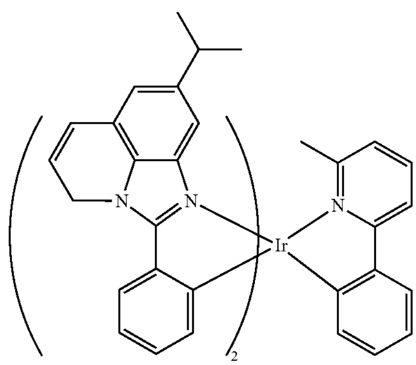
CPD 147
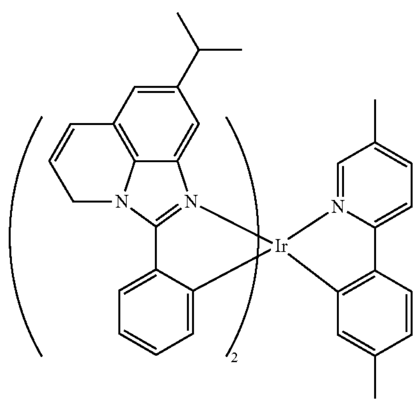
CPD 148
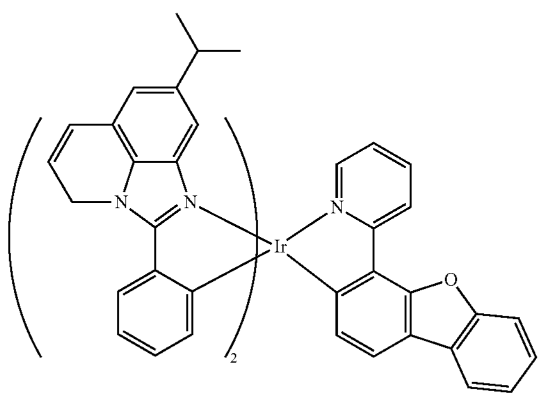
CPD 149
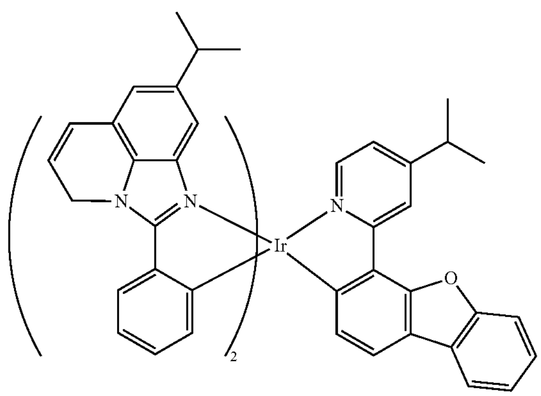
-continued
CPD 150
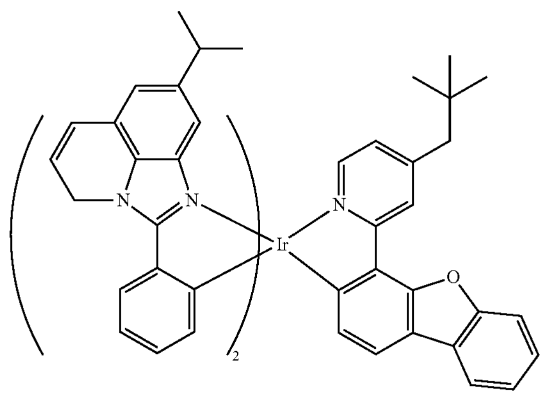
CPD 151
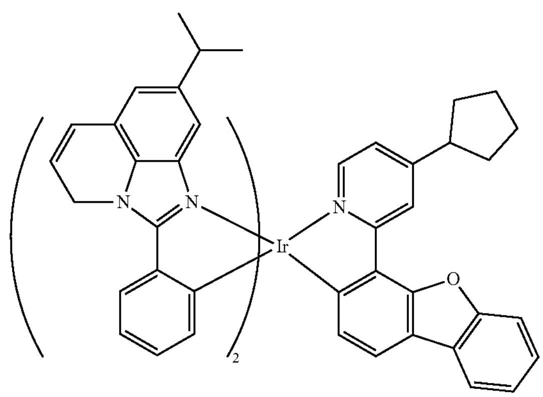
CPD 152
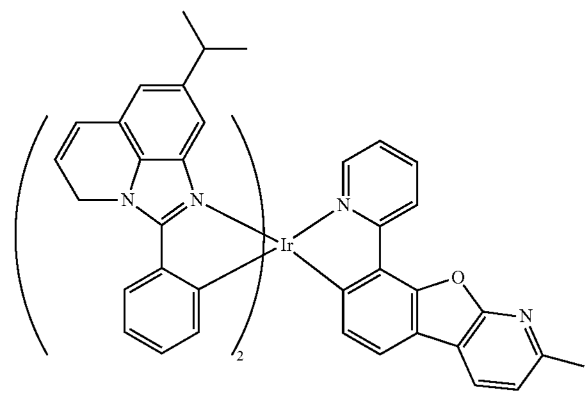
CPD 153
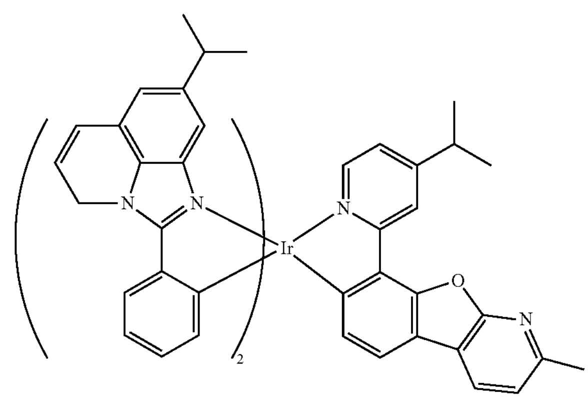

-continued
CPD 154
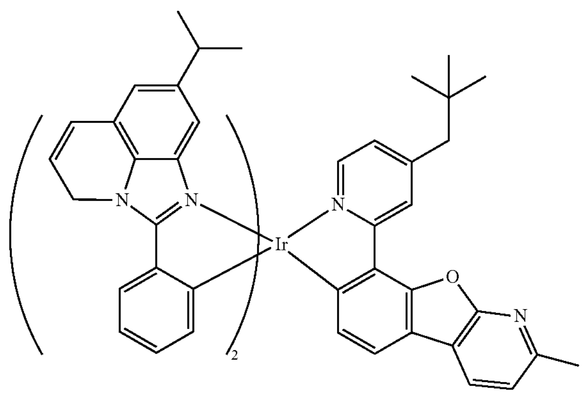
CPD 155
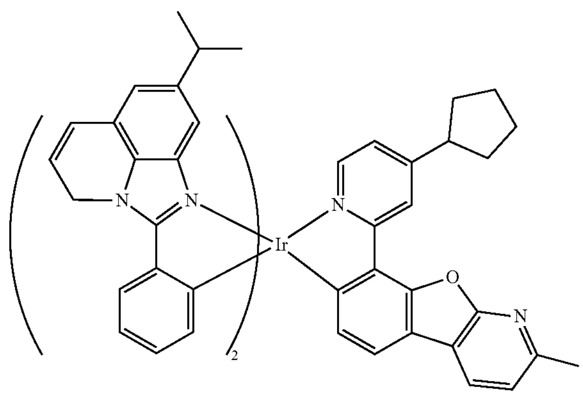
CPD 156
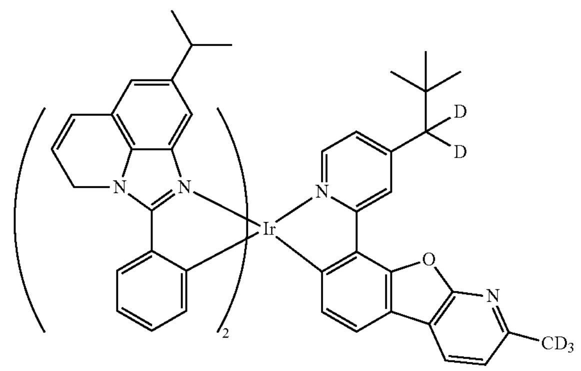
CPD 157
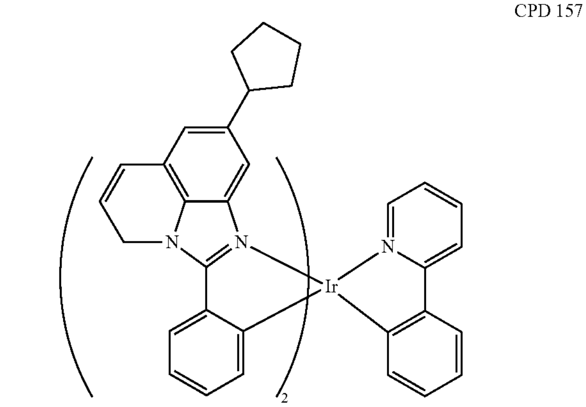
-continued
CPD 158
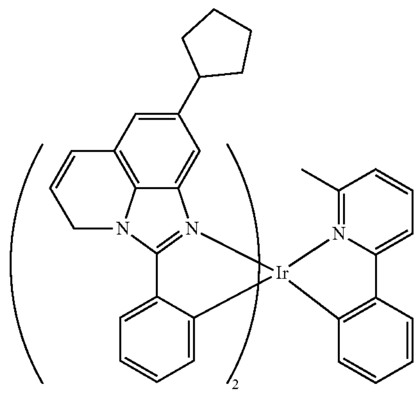
CPD 159
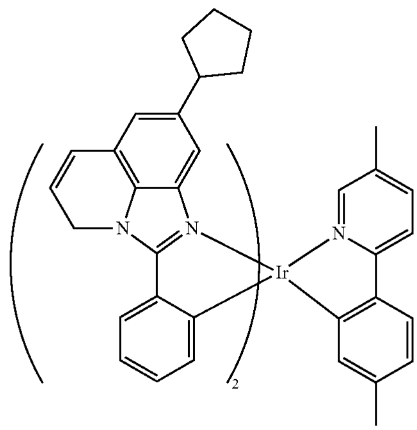
CPD 160
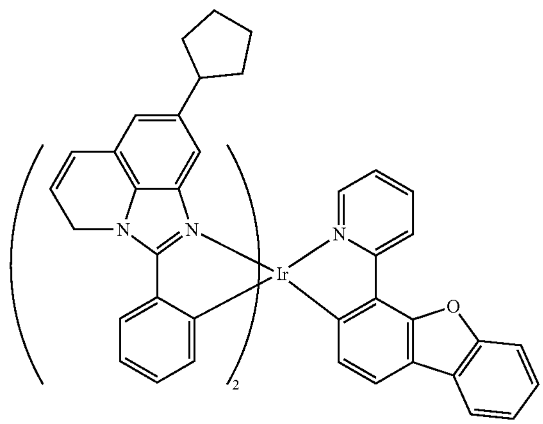

-continued
CPD 161
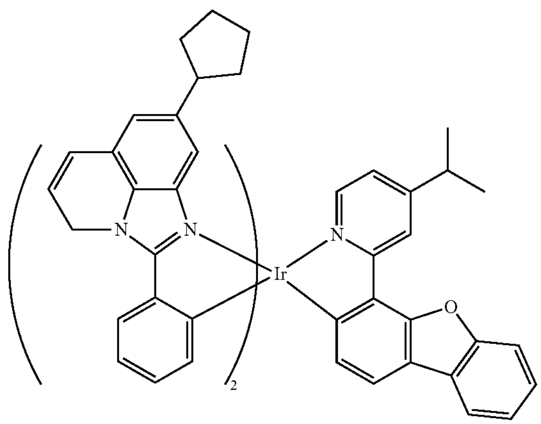
CPD 162
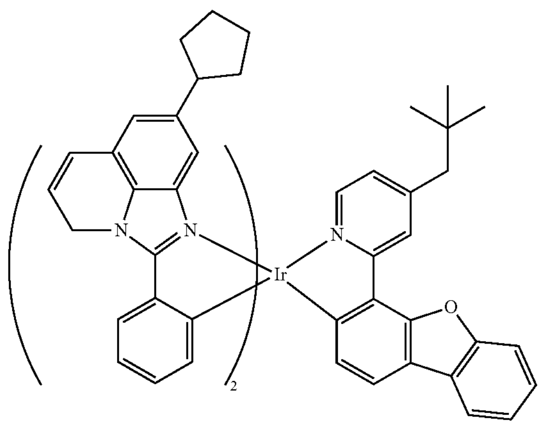
CPD 163
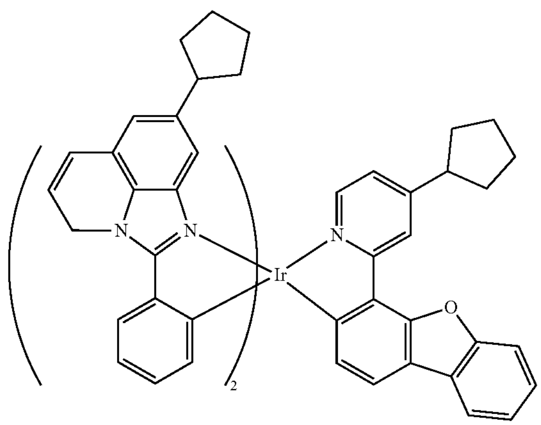
-continued
CPD 164
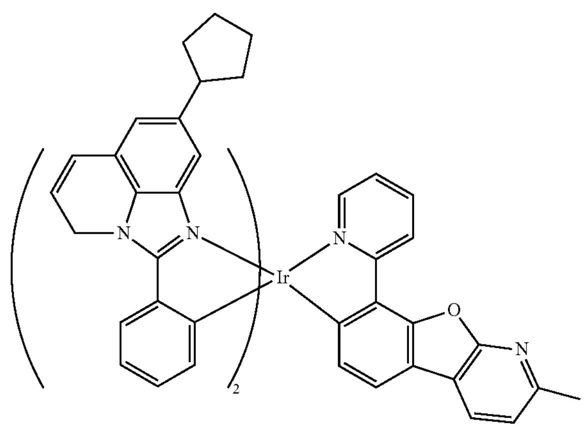
CPD 165
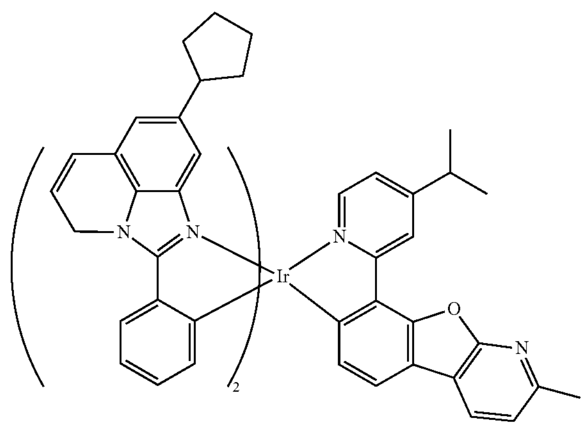
CPD 166
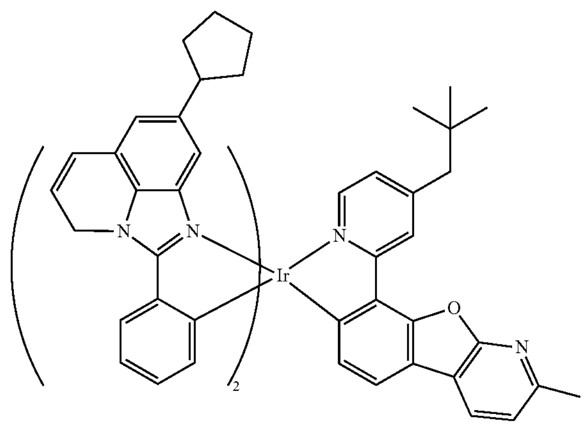

-continued
CPD 167
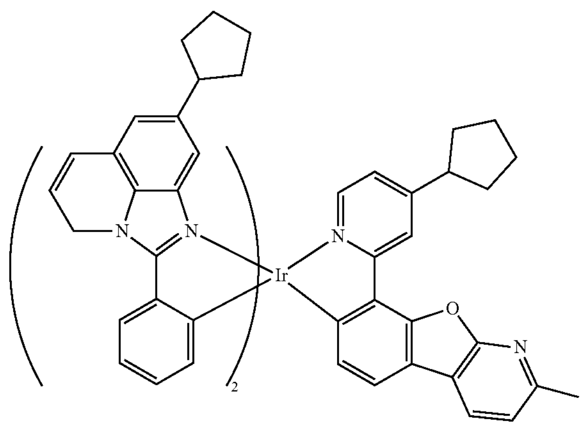
CPD 168
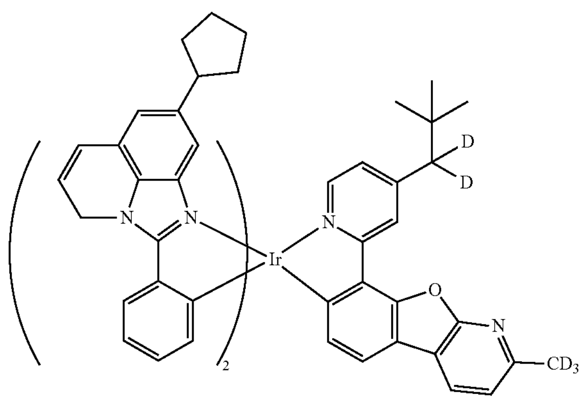
CPD 169
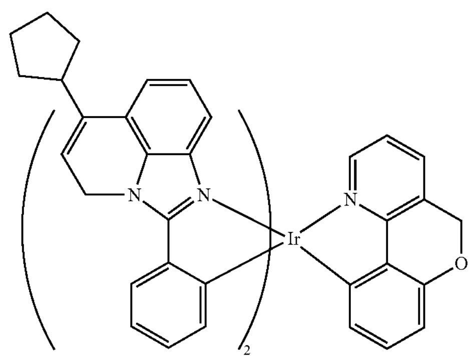
CPD 170
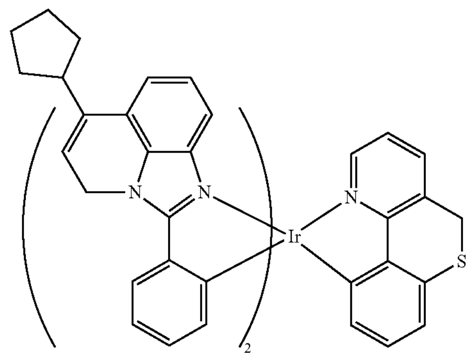
-continued
CPD 171
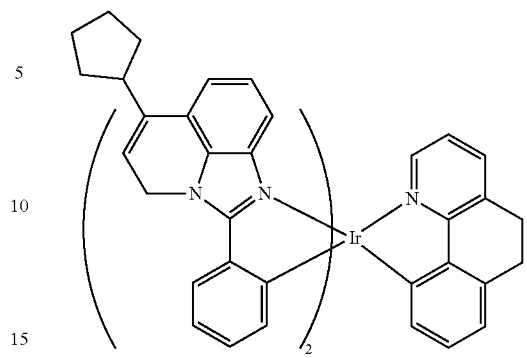
CPD 172
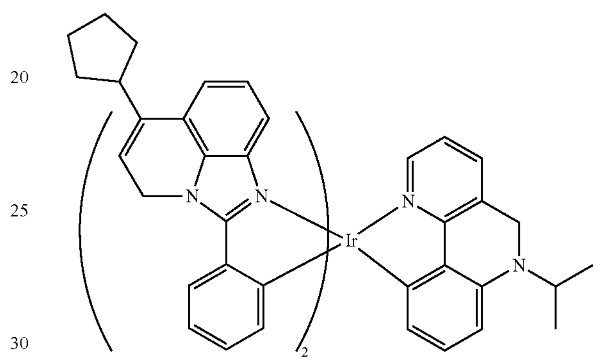
CPD 173
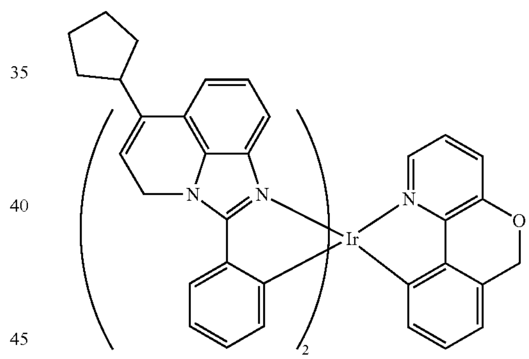
CPD 174
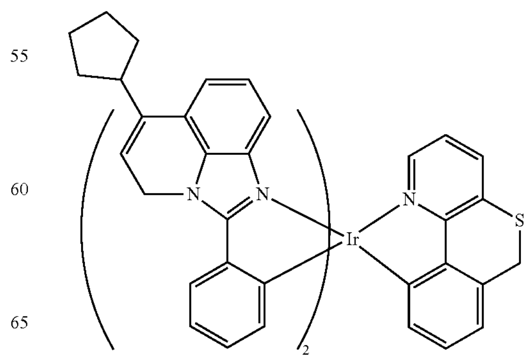

-continued
CPD 175
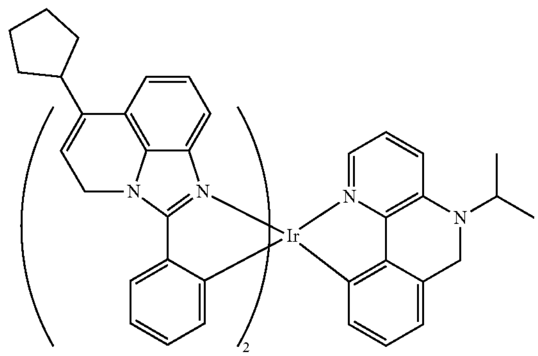
CPD 176
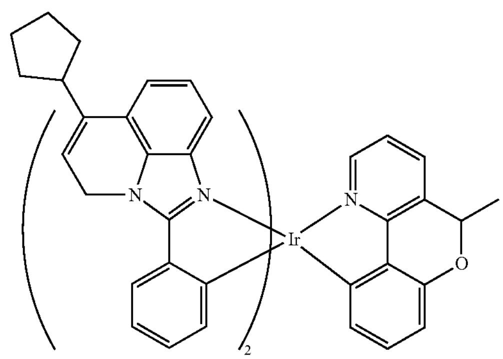
CPD 177
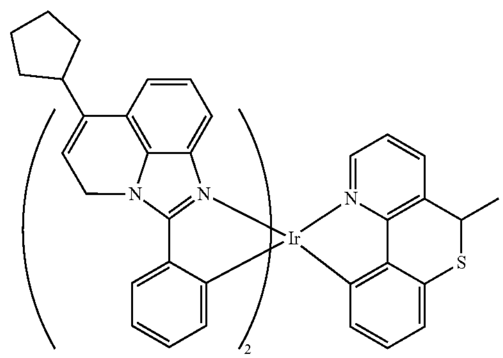
CPD 178
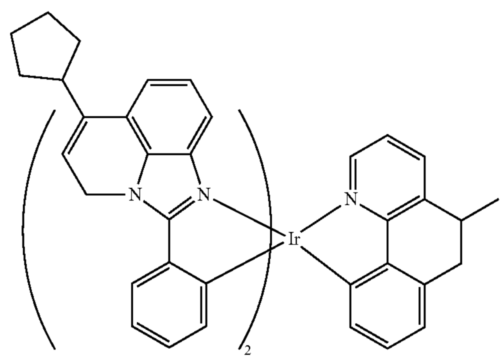
-continued
CPD 179
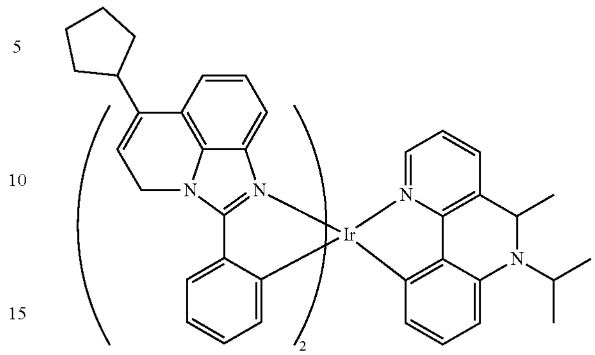
CPD 180
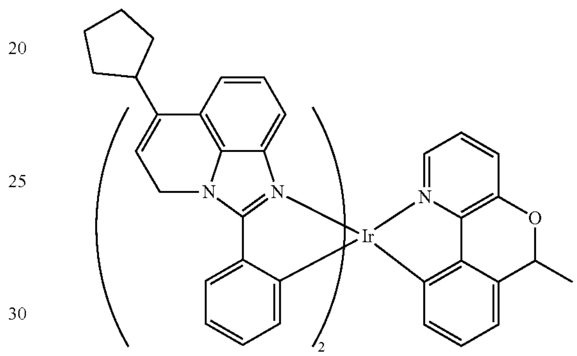
CPD 181
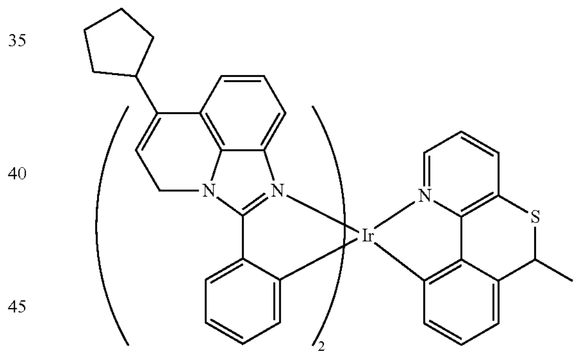
CPD 182
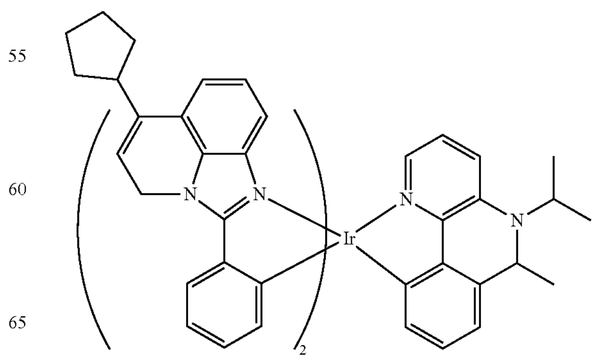

-continued
CPD 183
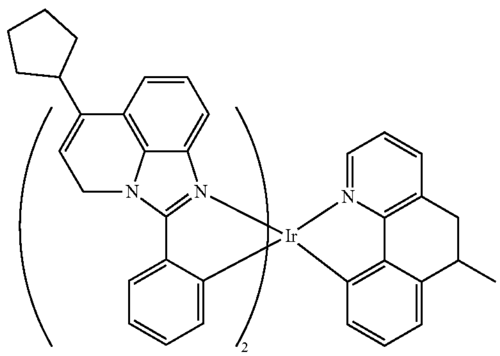
CPD 184
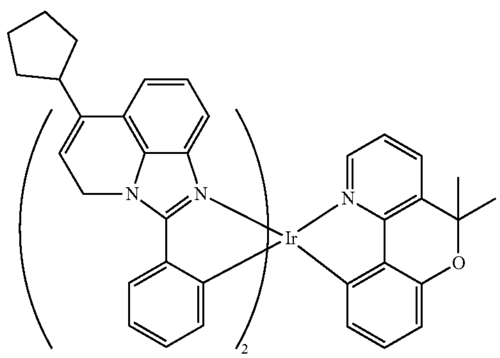
CPD 185
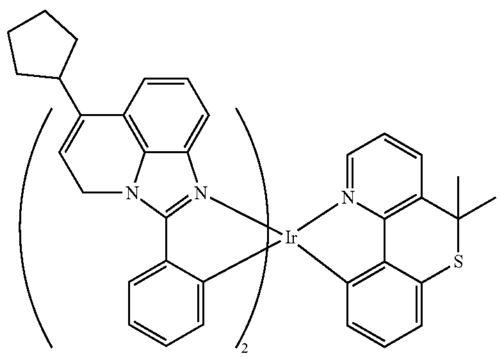
CPD 186
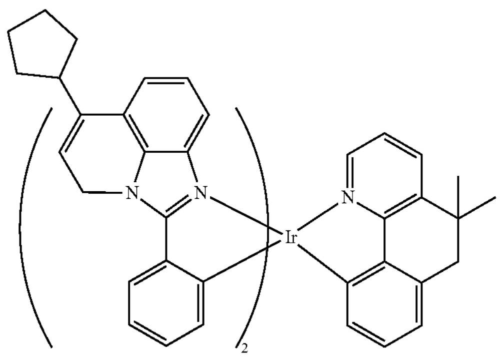
-continued
CPD 187
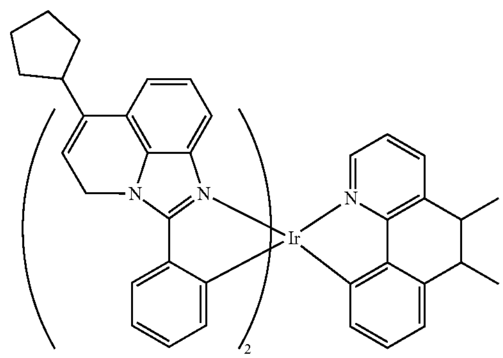
CPD 188
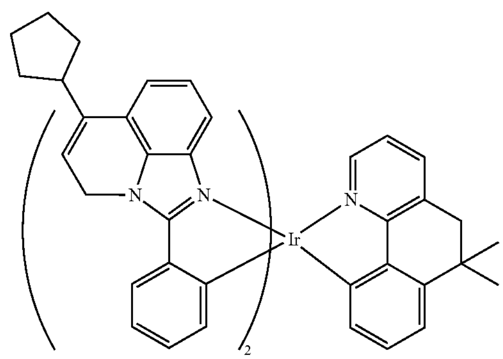
CPD 189
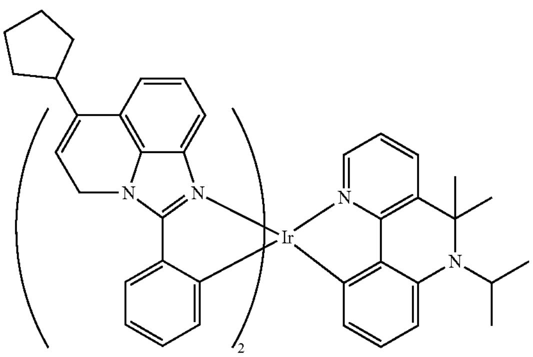
CPD 190
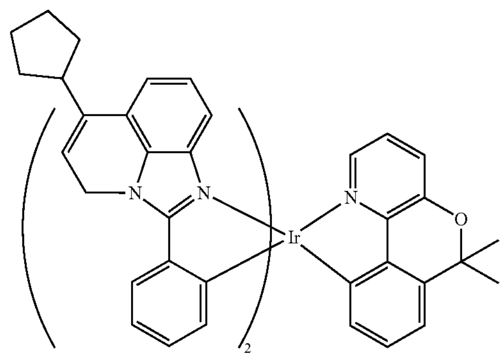

-continued
CPD 191
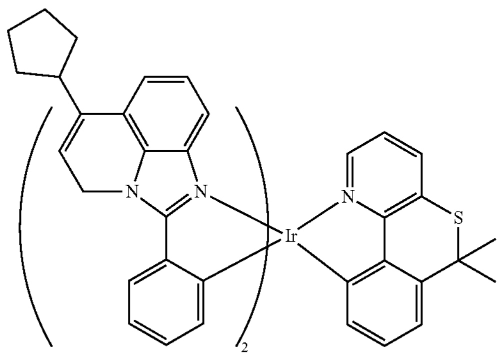
CPD 192
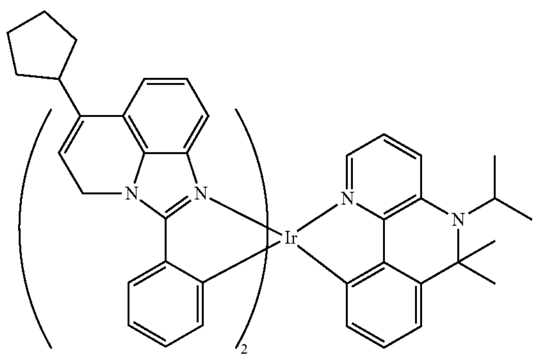
CPD 193
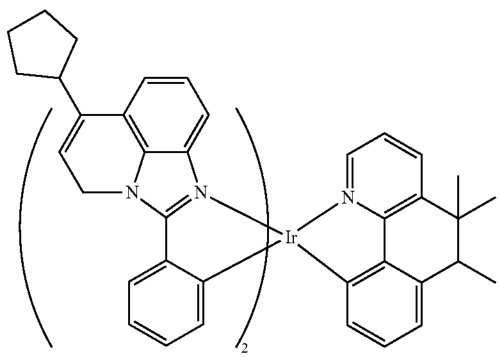
CPD 194
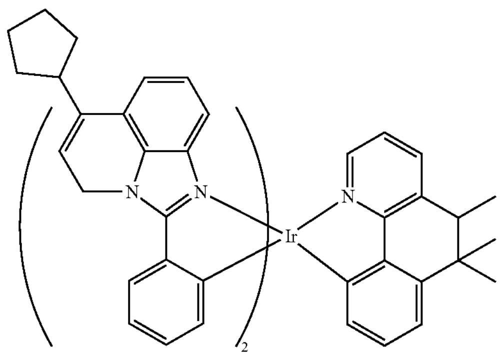
-continued
CPD 195
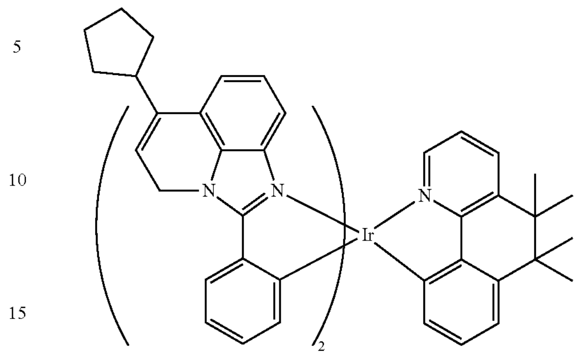
CPD 196
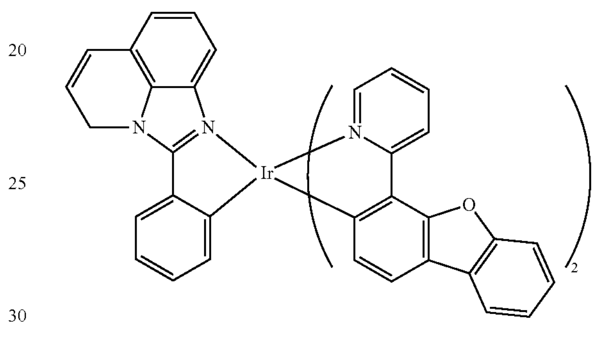
CPD 197
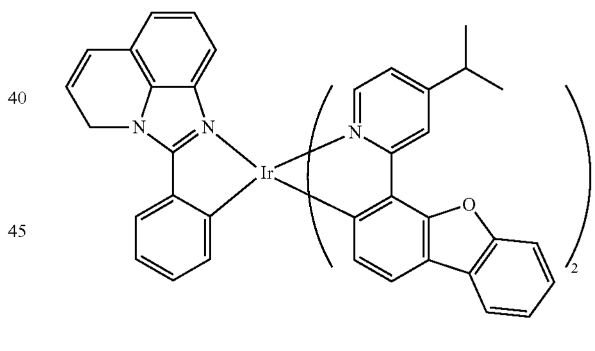
CPD 198
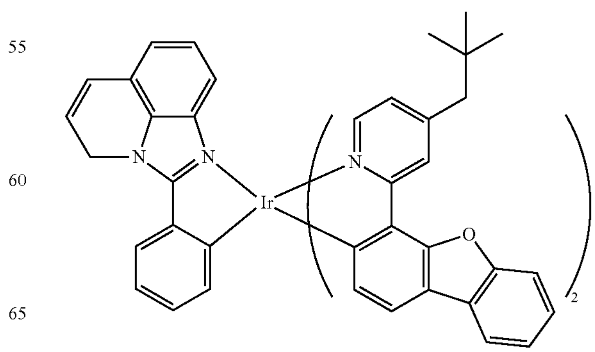

-continued
CPD 199
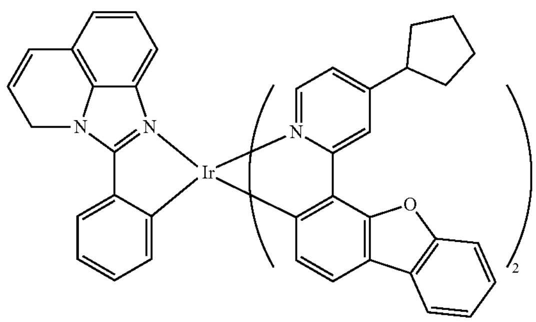
CPD 200
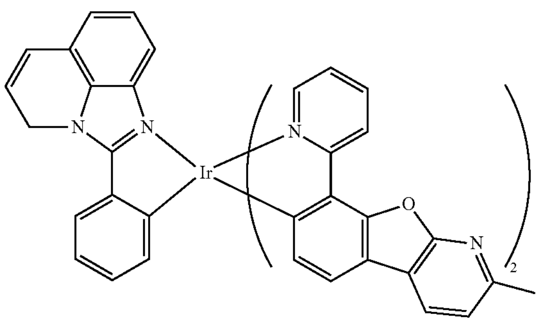
CPD 201
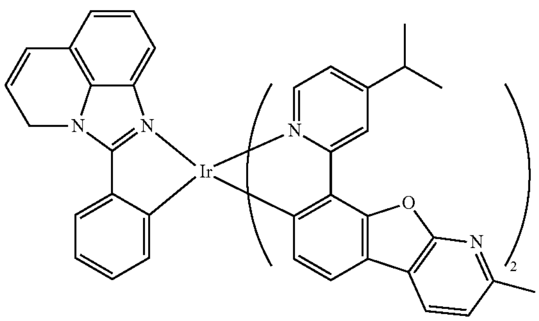
CPD 202
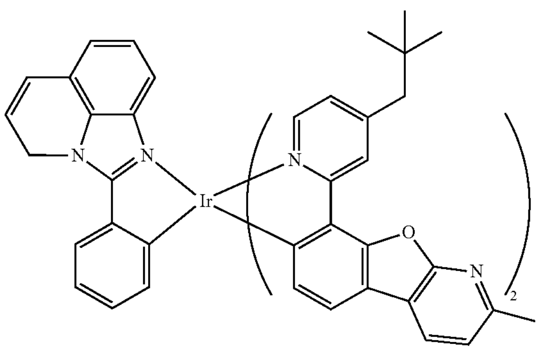
-continued
CPD 203
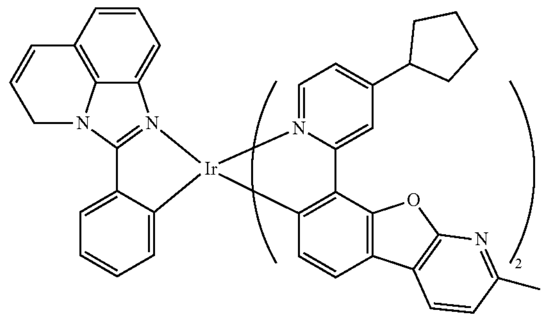
CPD 204
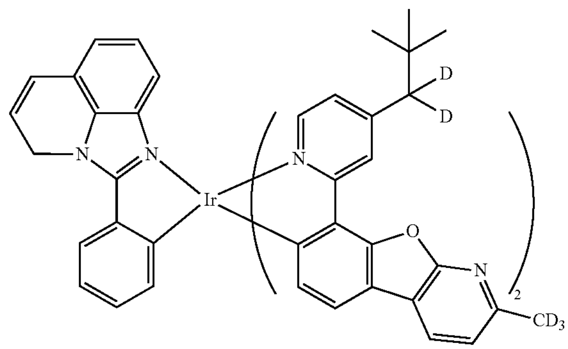
CPD 205
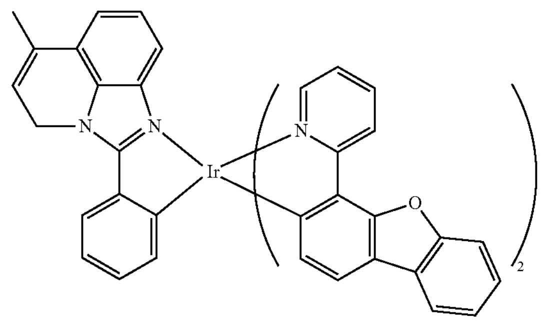
CPD 206
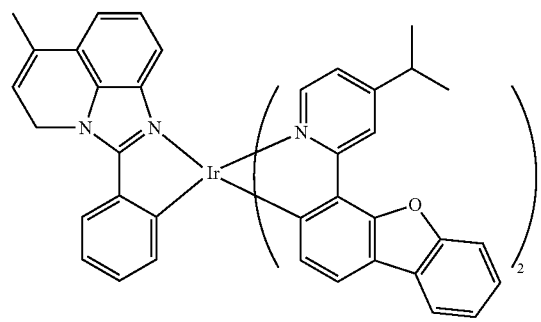

-continued
CPD 207
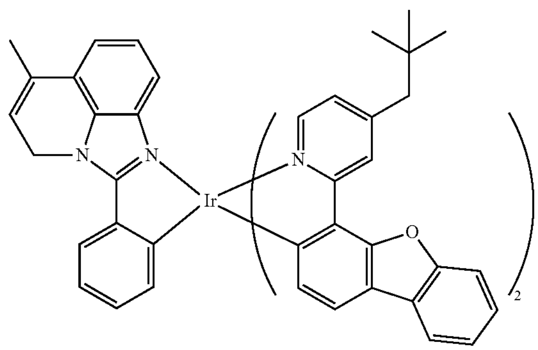
CPD 208
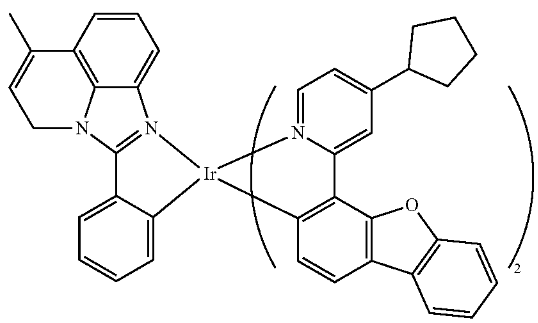
CPD 209
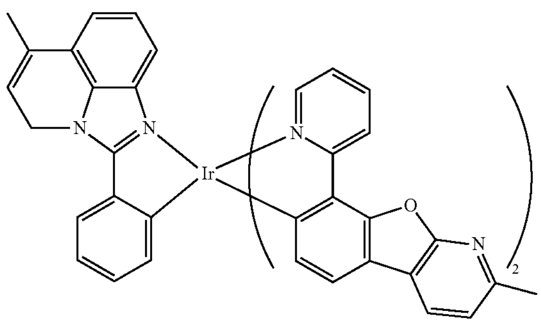
CPD 210
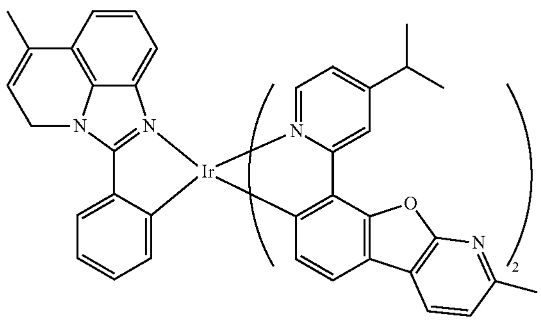
-continued
CPD 211
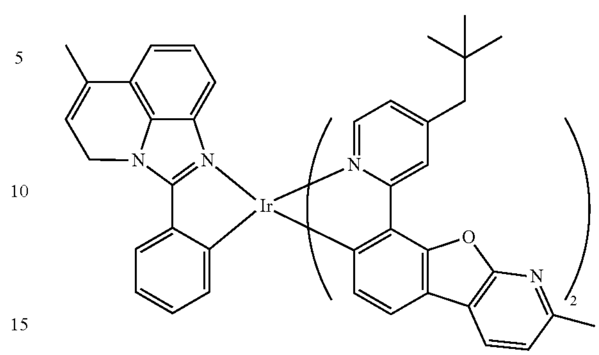
CPD 212
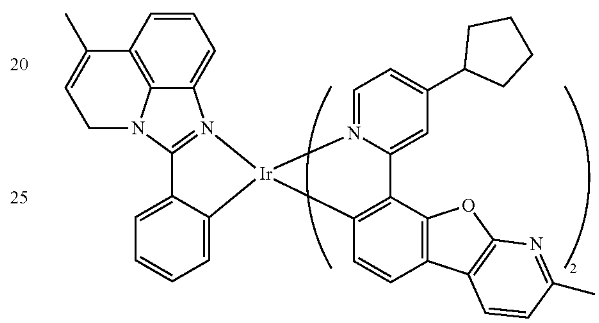
CPD 213
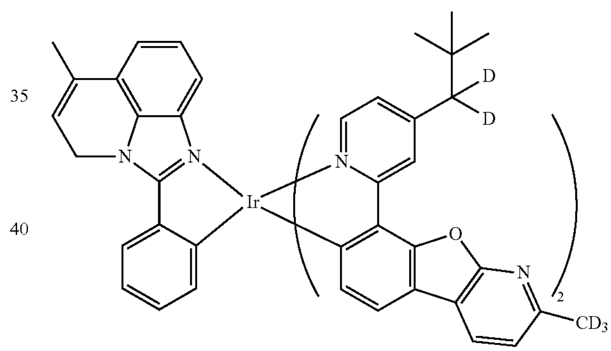
CPD 214
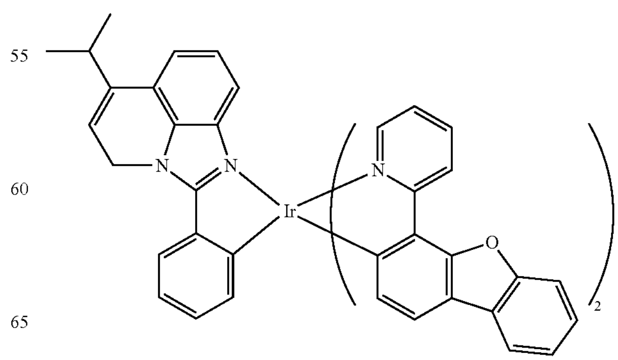

CPD 215
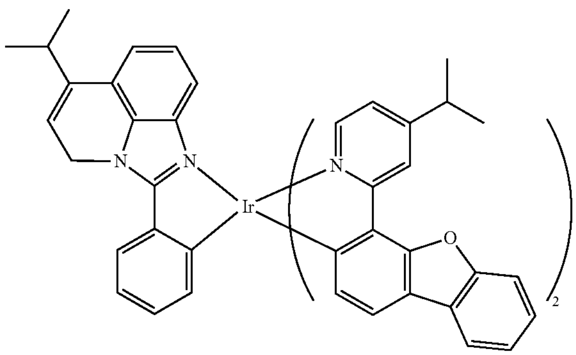
CPD 216
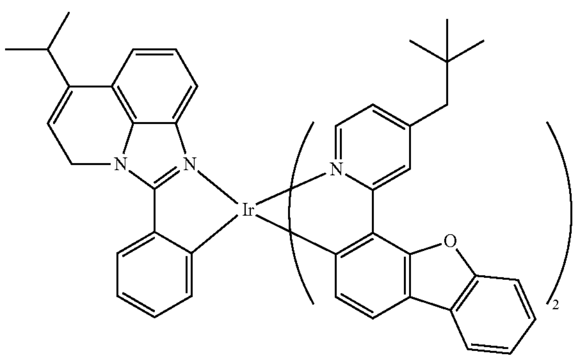
CPD 217
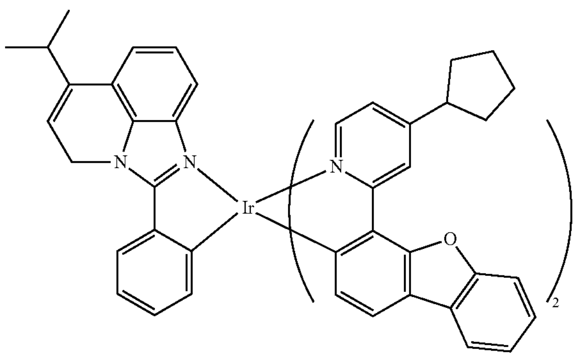
CPD 218
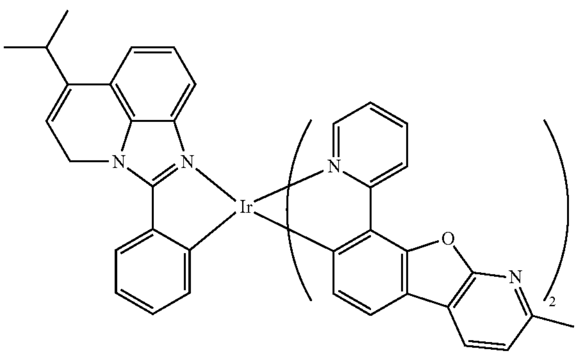
CPD 219
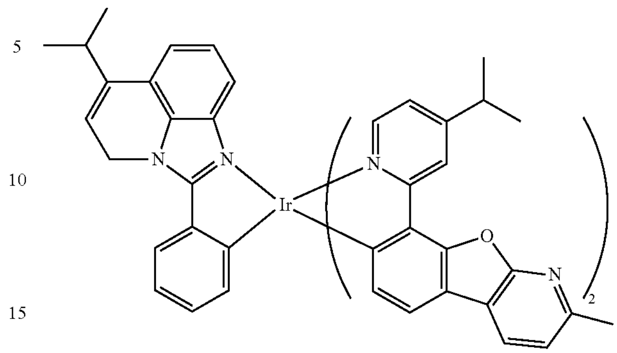
CPD 220
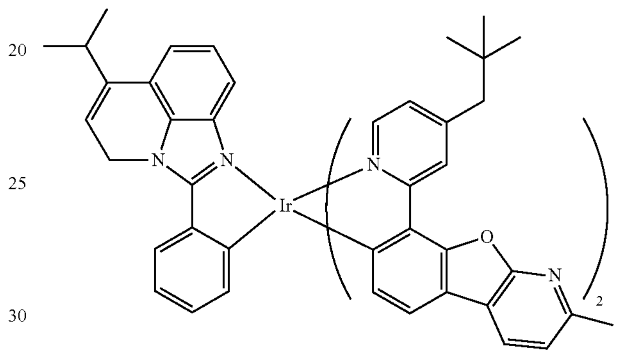
CPD 221
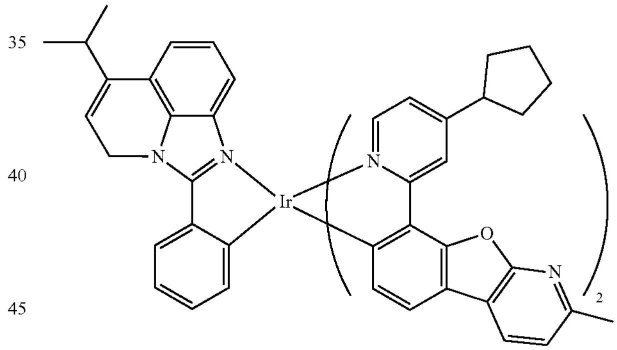
CPD 222
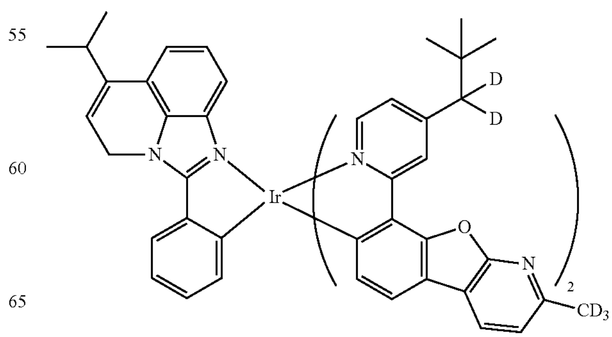

-continued
CPD 223
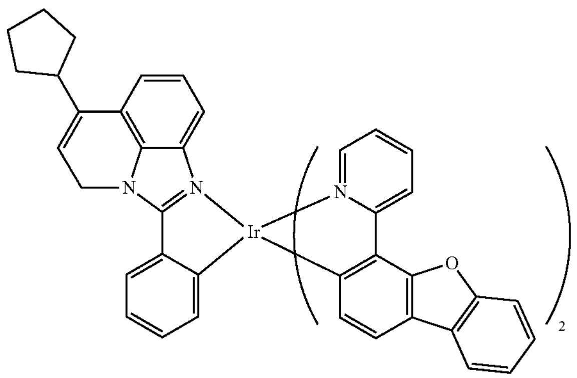
CPD 224
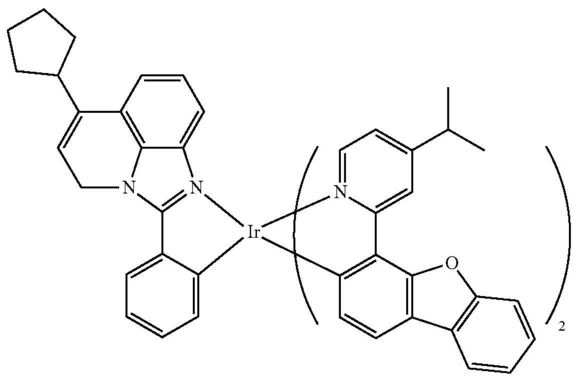
CPD 225
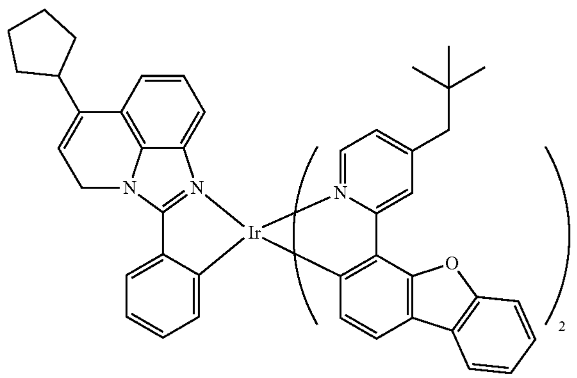
CPD 226
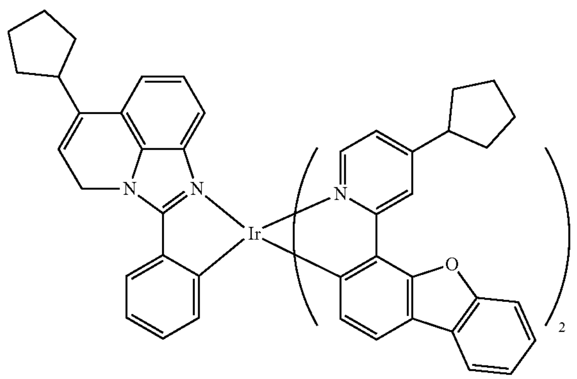
-continued
CPD 227
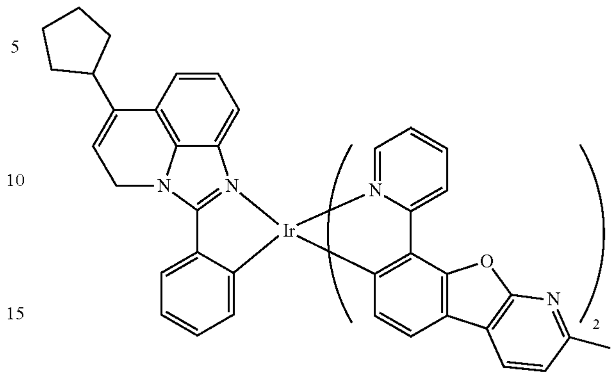
CPD 228
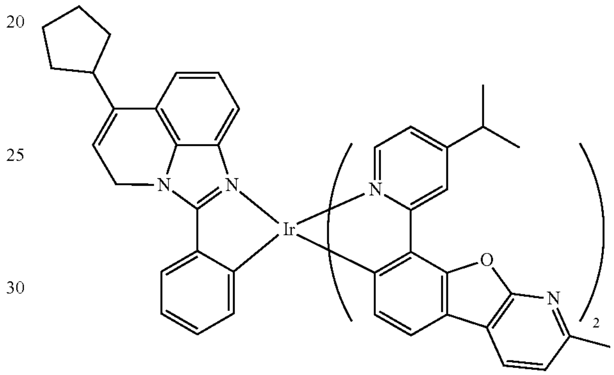
CPD 229
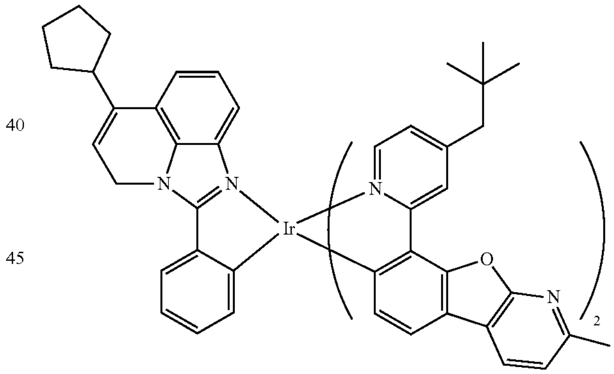
CPD 230
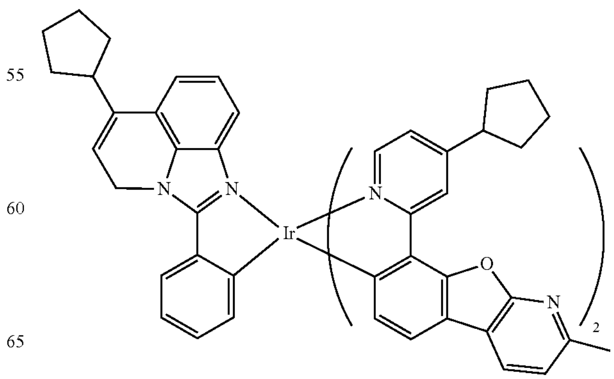

-continued
CPD 231
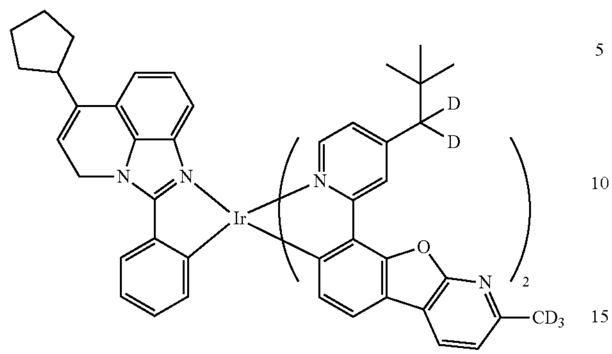
CPD 232
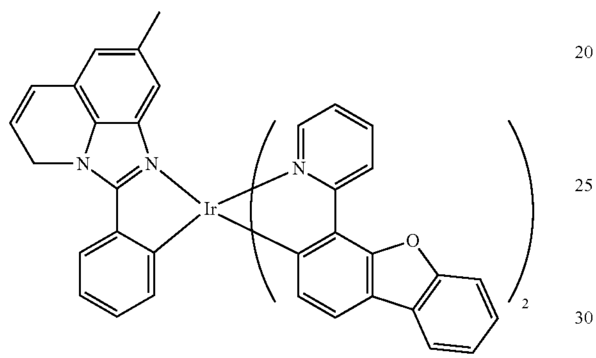
CPD 233
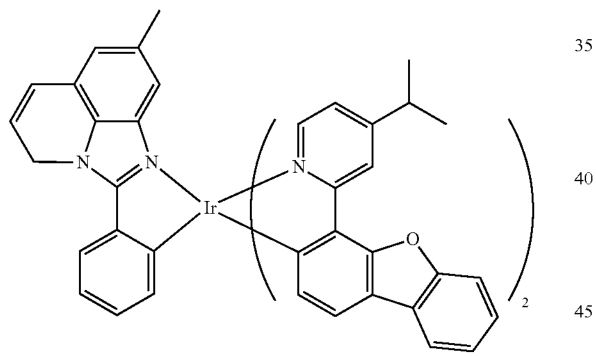
CPD 234
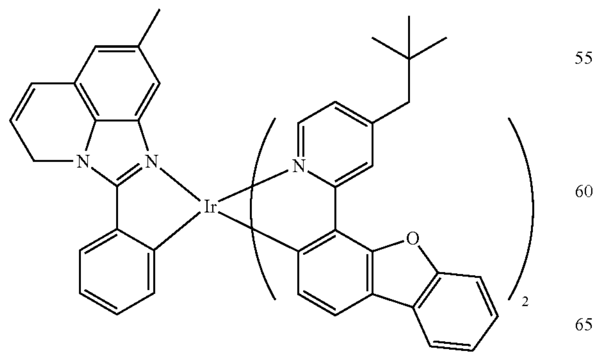
-continued
CPD 235
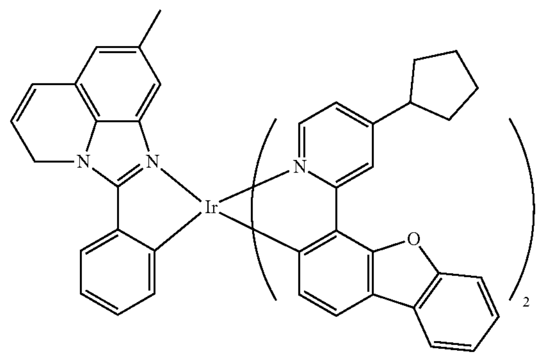
CPD 236
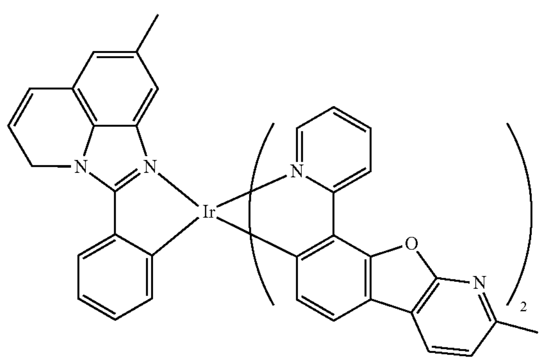
CPD 237
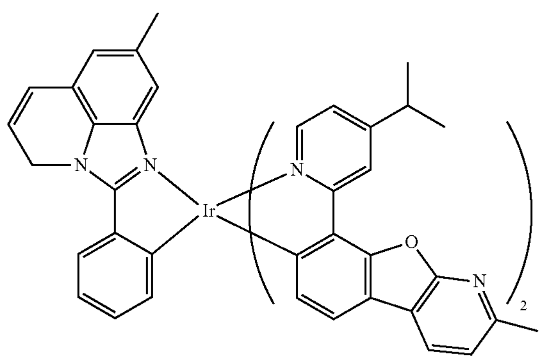
CPD 238
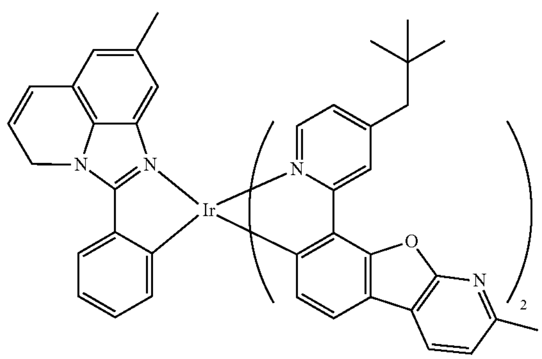

-continued
CPD 239
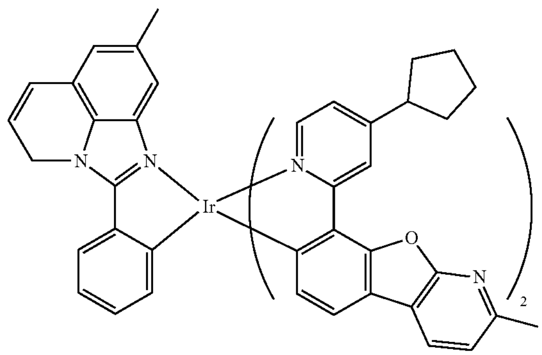
CPD 240
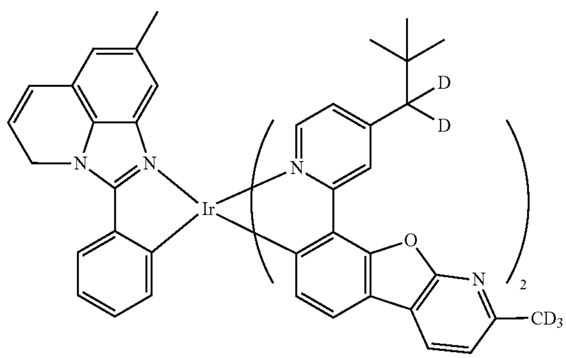
CPD 241
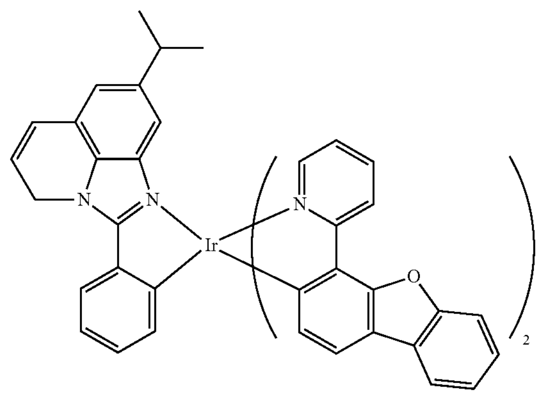
CPD 242
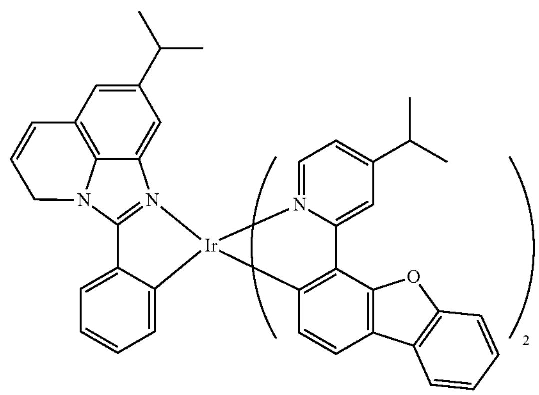
-continued
CPD 243
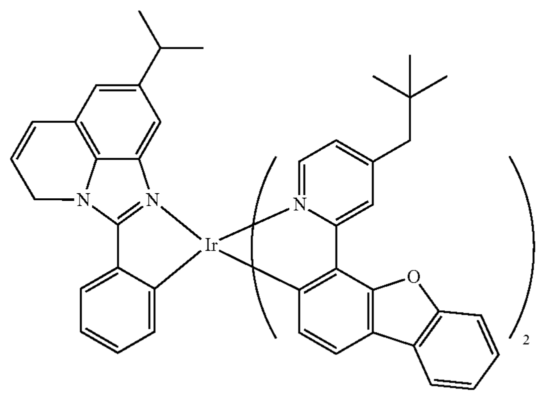
CPD 244
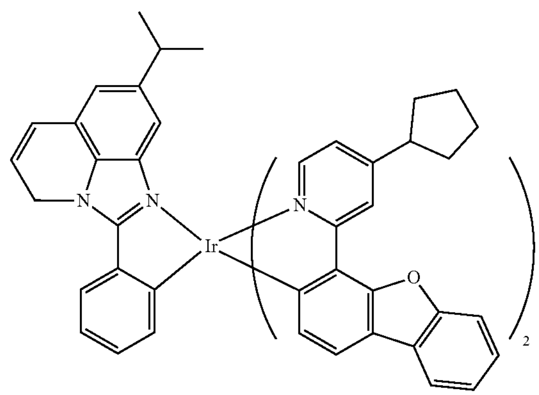
CPD 245
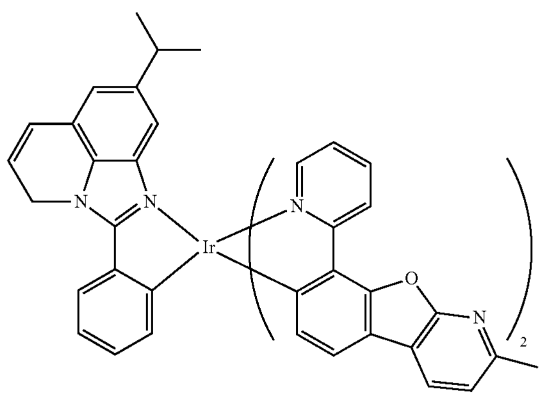
CPD 246
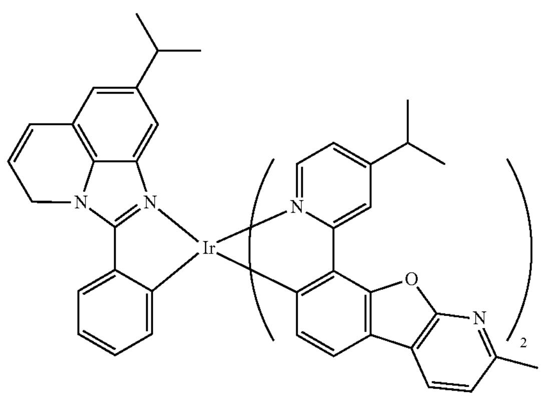

CPD 247
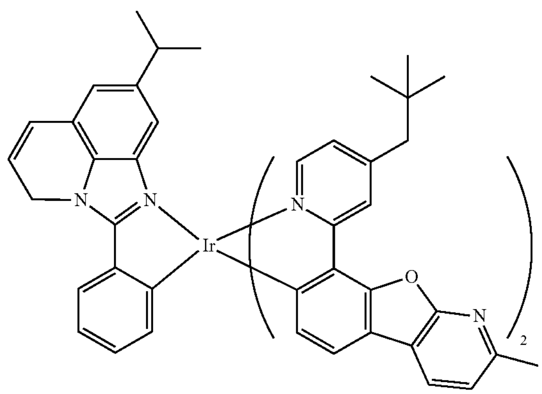
CPD 248
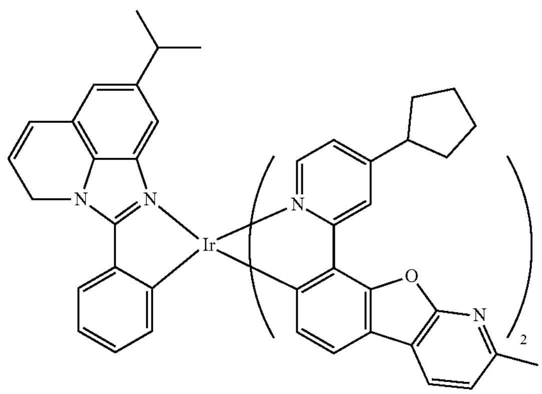
CPD 249
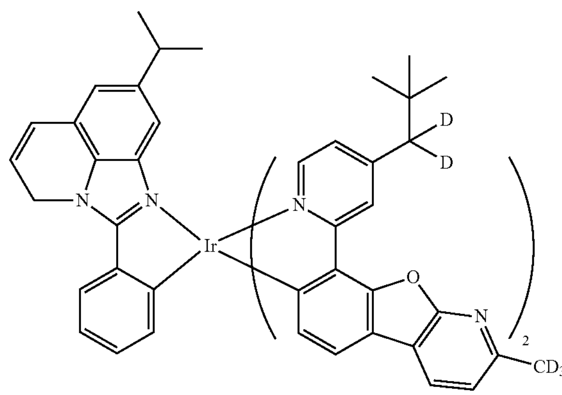
CPD 250
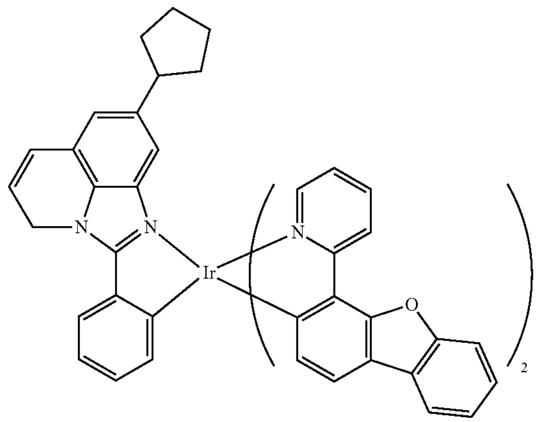
CPD 251
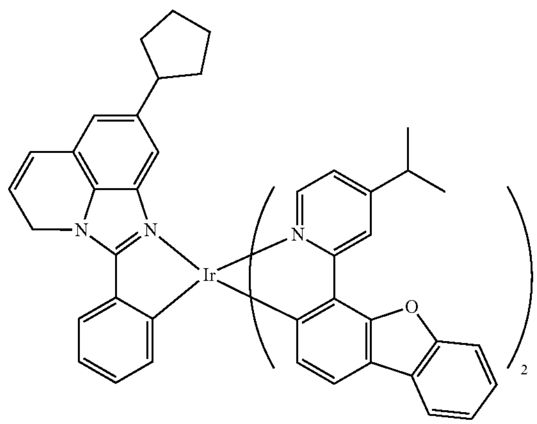
CPD 252
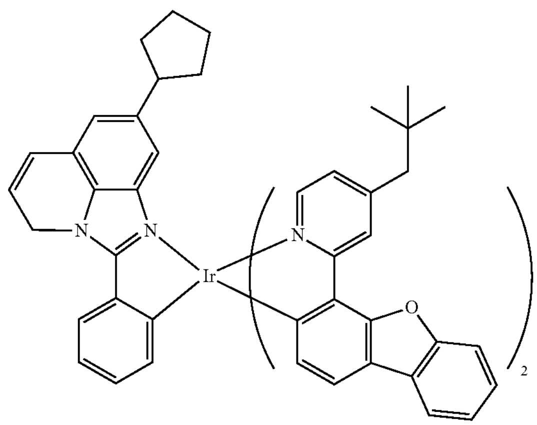

CPD 253
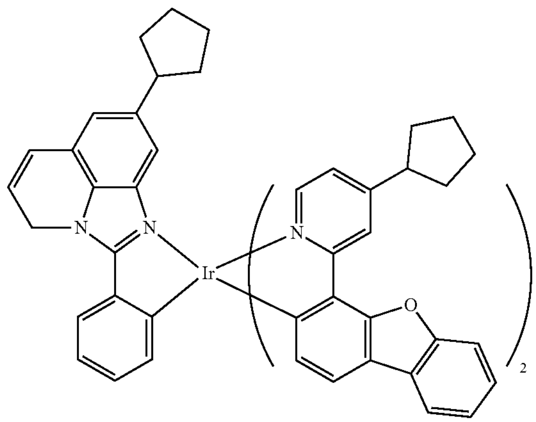
CPD 254
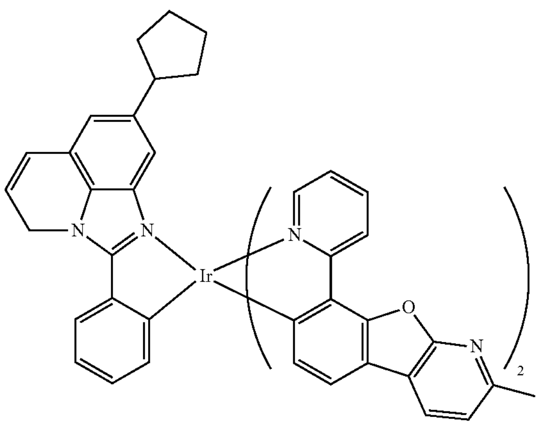
CPD 255
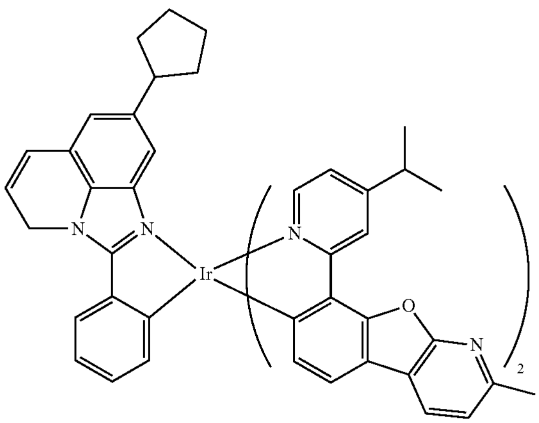
CPD 256
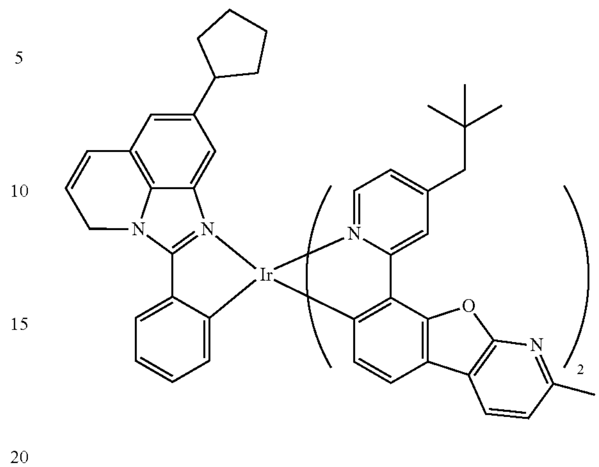
CPD 257
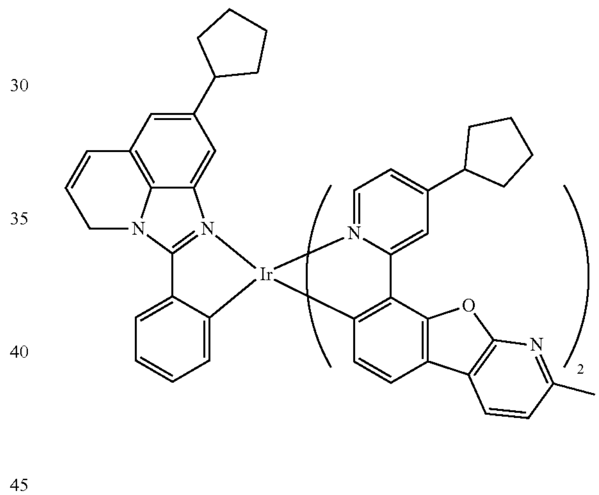
CPD 258
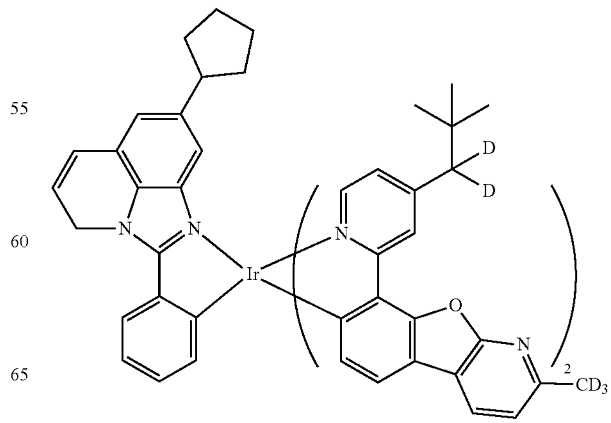

-continued
CPD 259
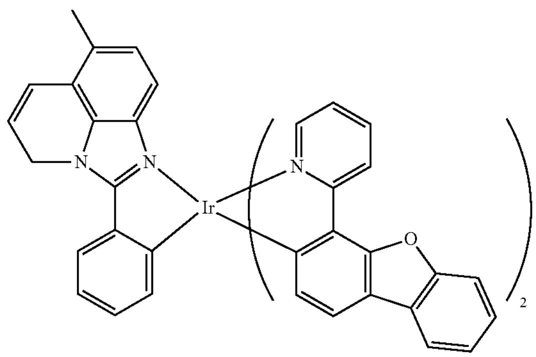
CPD 260
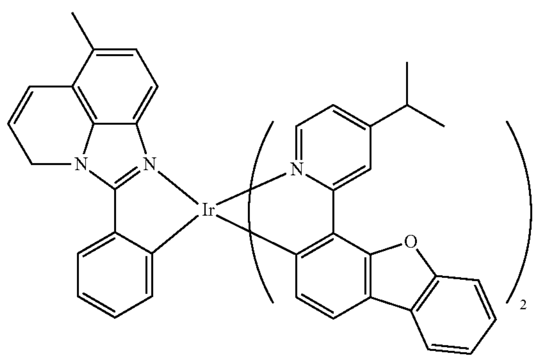
CPD 261
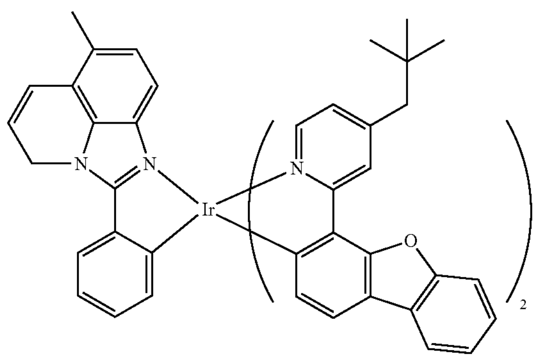
CPD 262
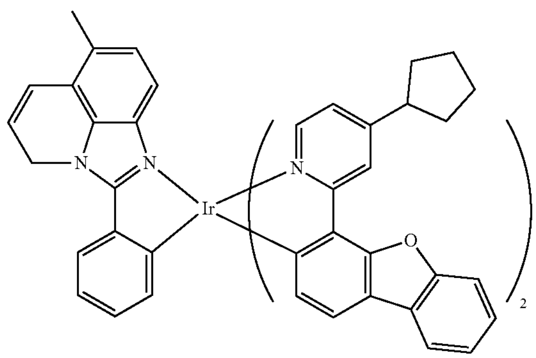
-continued
CPD 263
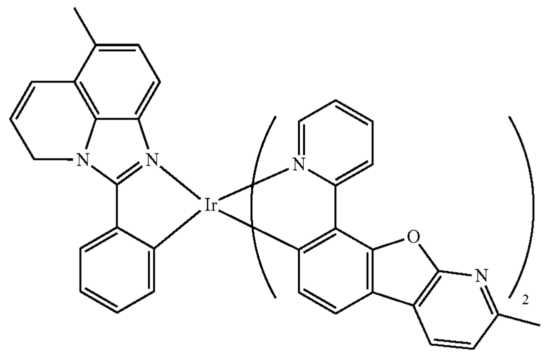
CPD 264
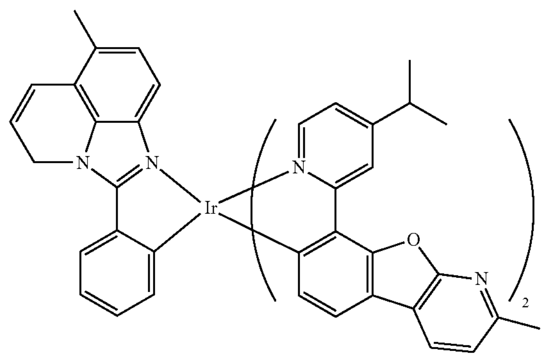
CPD 265
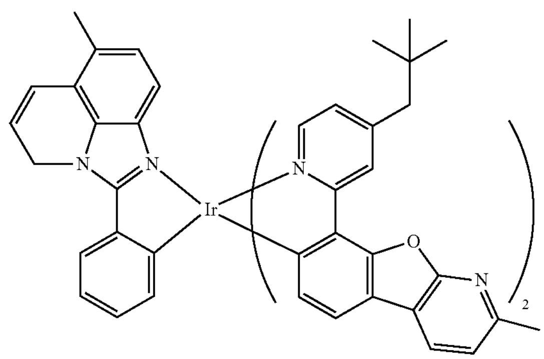
CPD 266
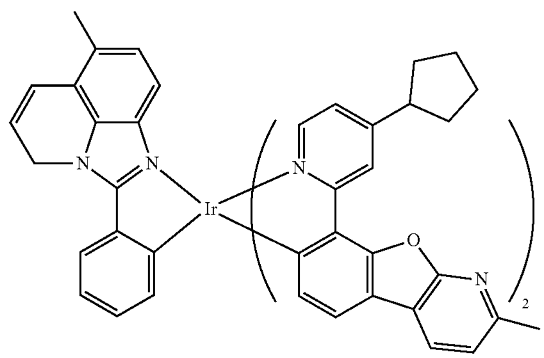

-continued
CPD 267
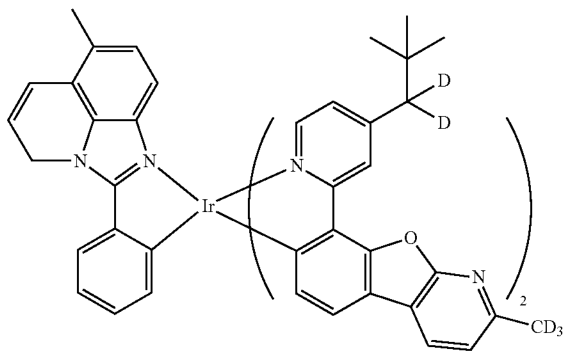
CPD 268
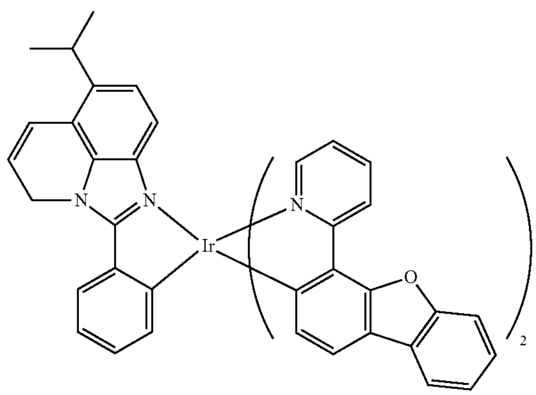
CPD 269
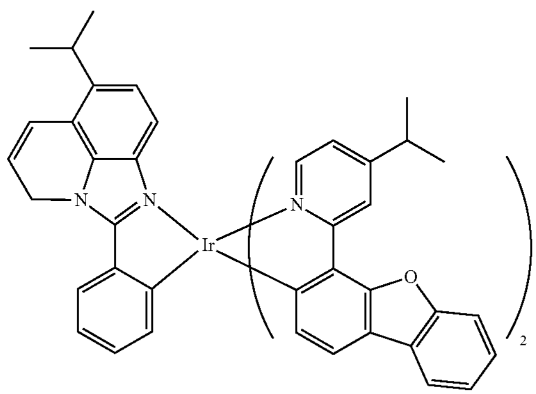
CPD 270
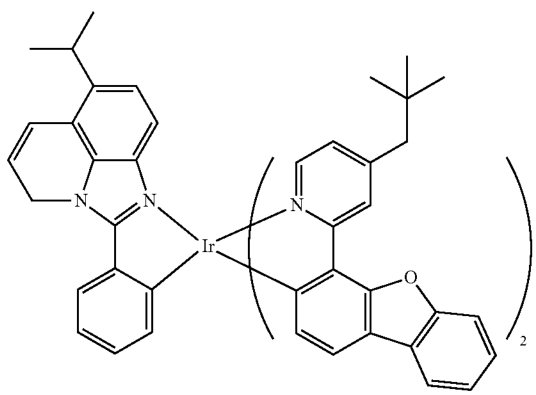
-continued
CPD 271
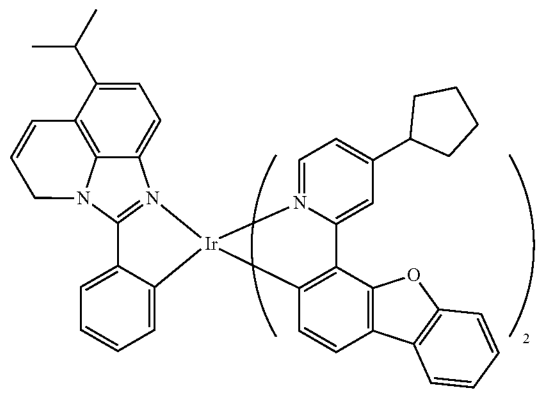
CPD 272
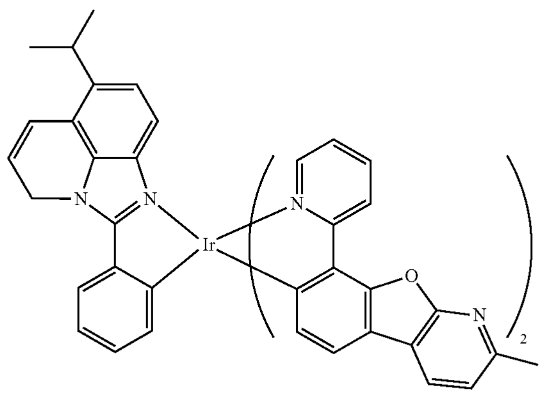
CPD 273
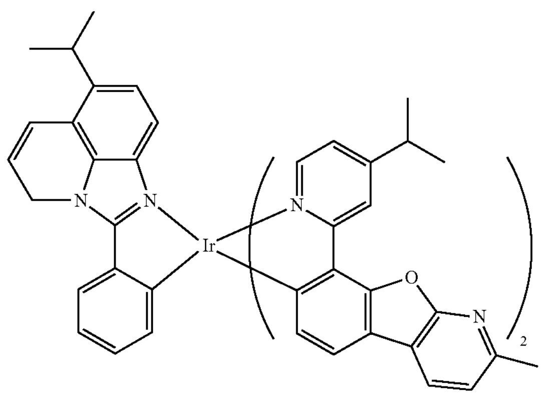
CPD 274
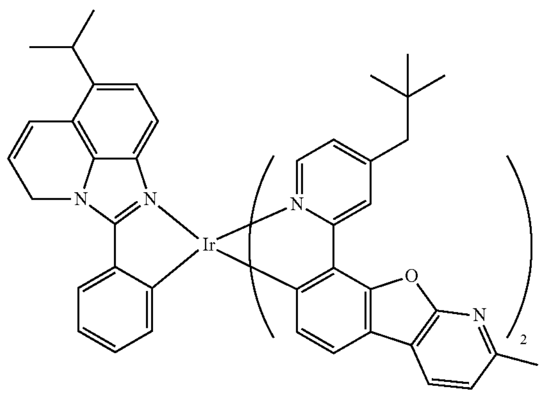

-continued
CPD 275
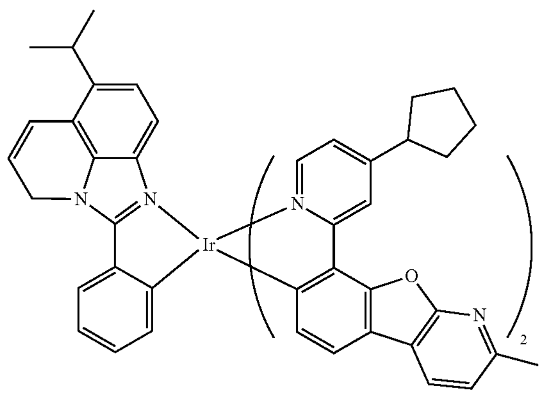
CPD 276
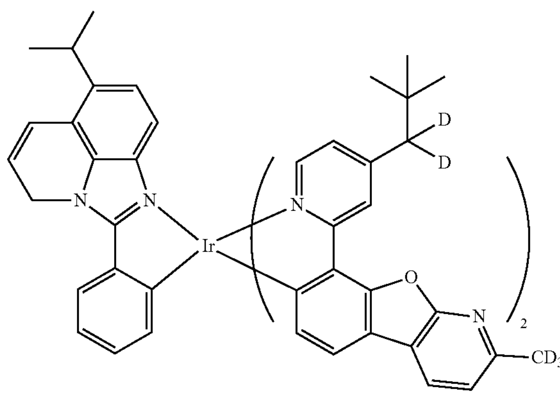
CPD 277
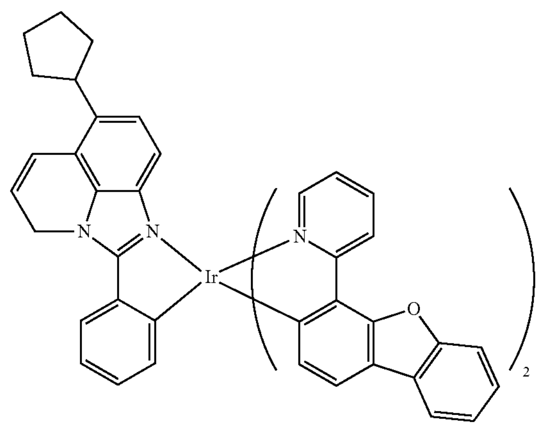
-continued
CPD 278
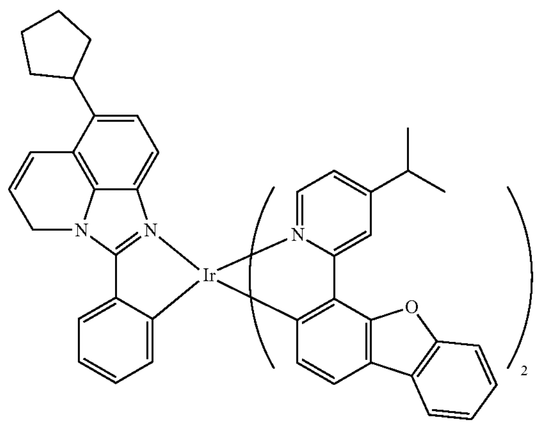
CPD 279
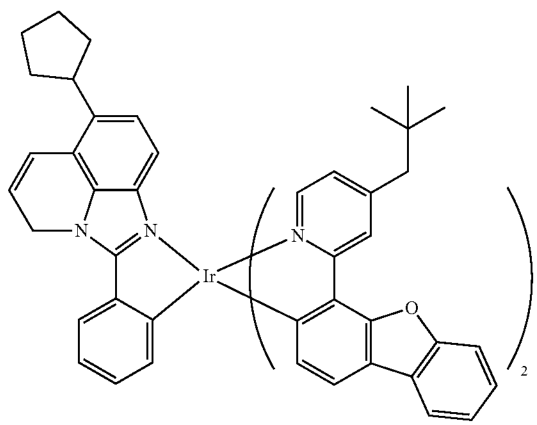
CPD 280
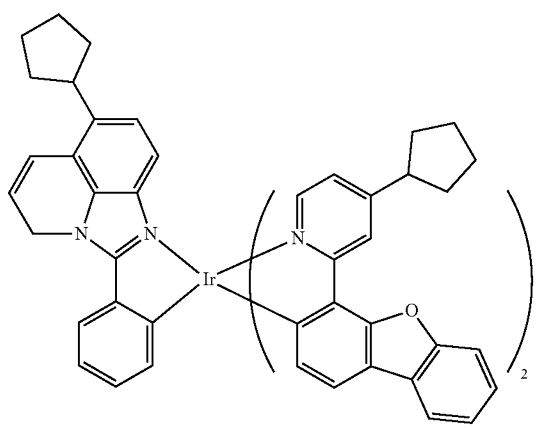

-continued
CPD 281
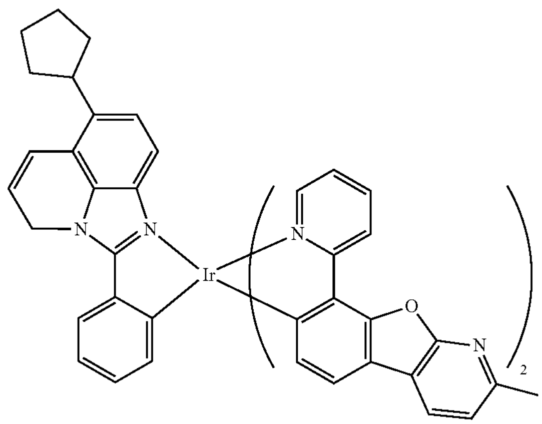
CPD 282
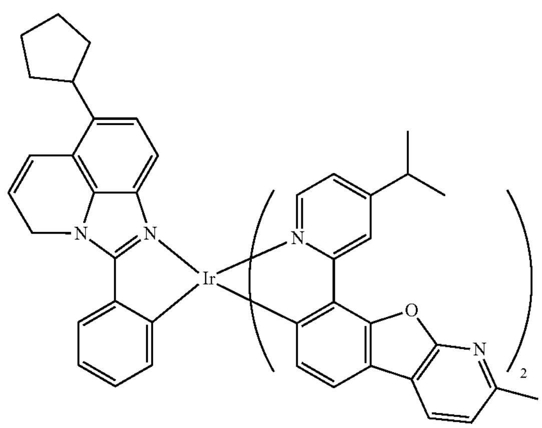
CPD 283
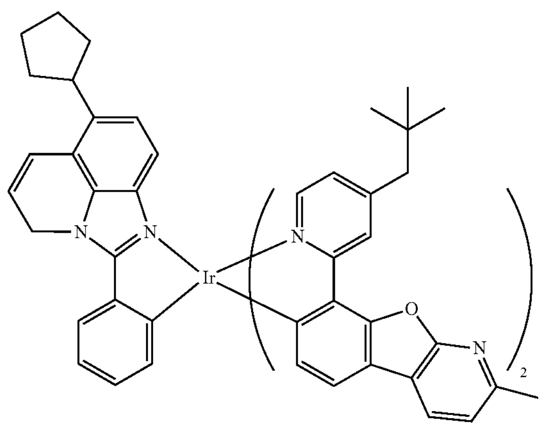
-continued
CPD 284
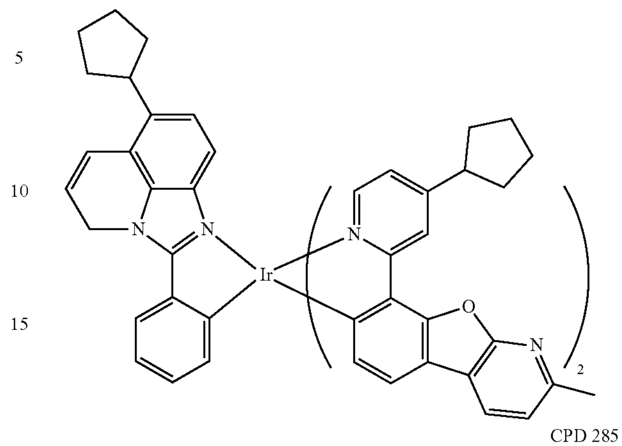
CPD 285
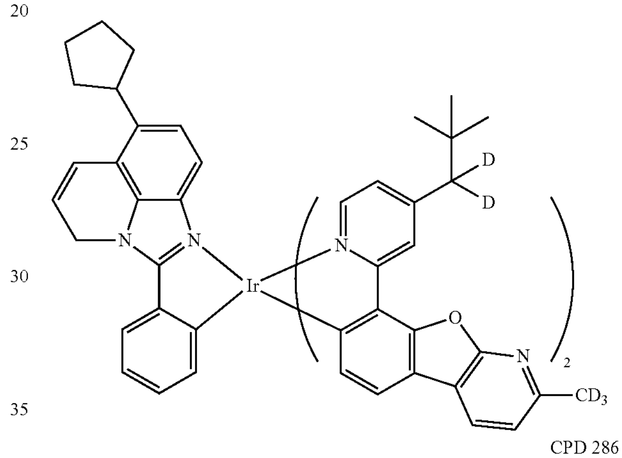
CPD 286
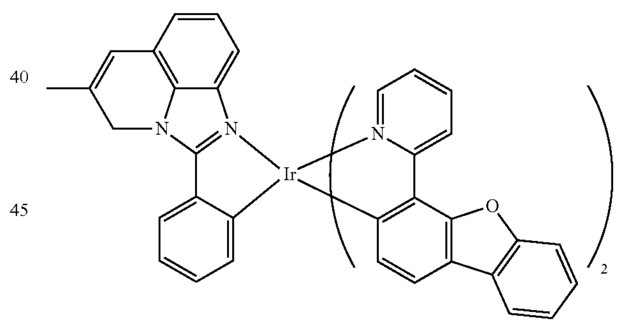
CPD 287
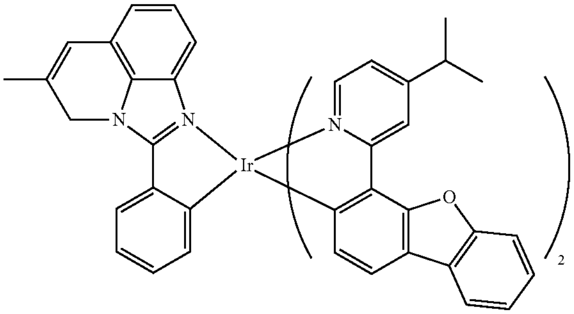

-continued
CPD 288
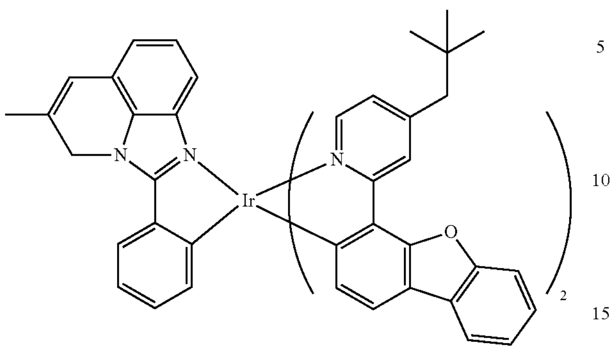
CPD 289
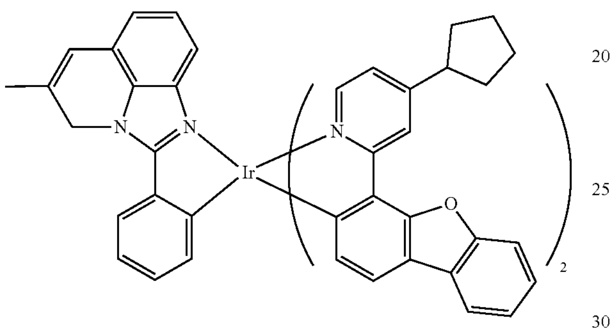
CPD 290
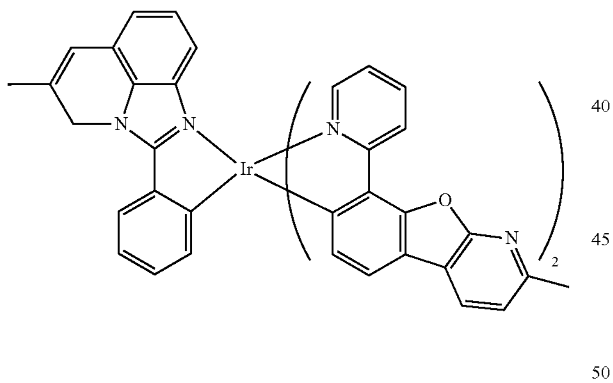
CPD 291
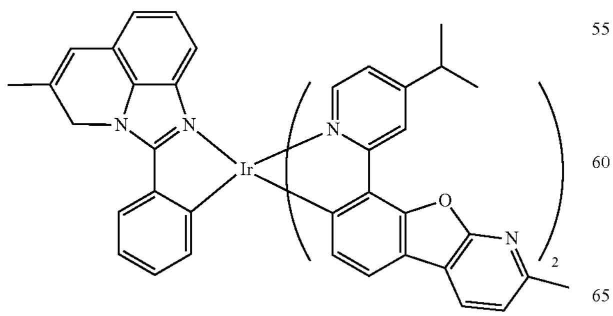
-continued
CPD 292
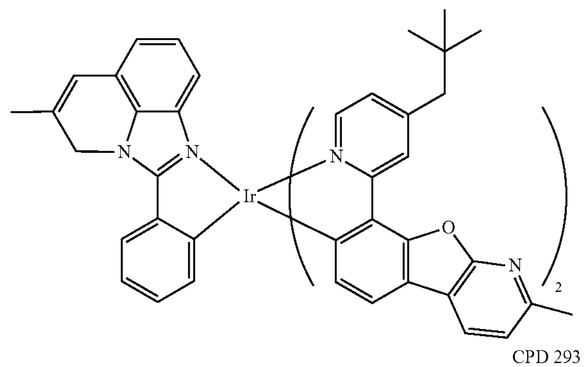
CPD 293
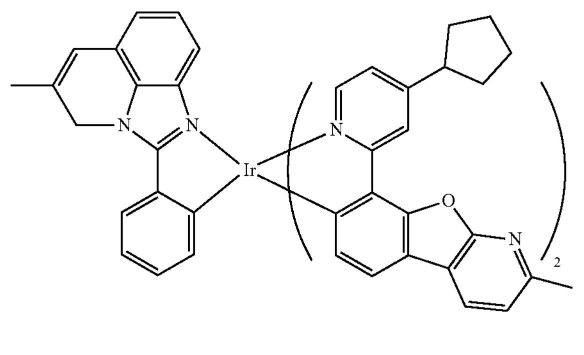
CPD 294
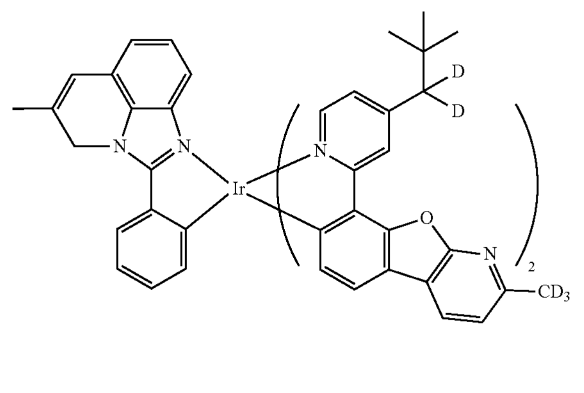
CPD 295
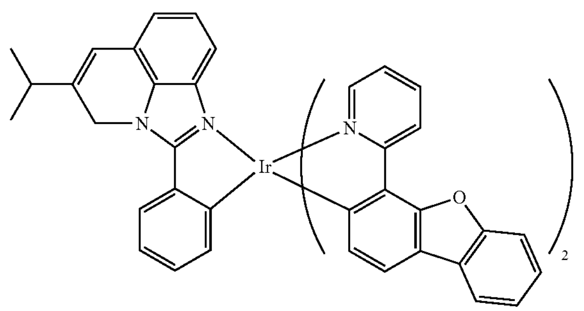

-continued
CPD 296
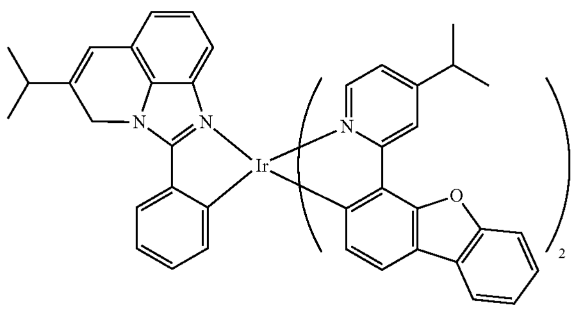
CPD 297
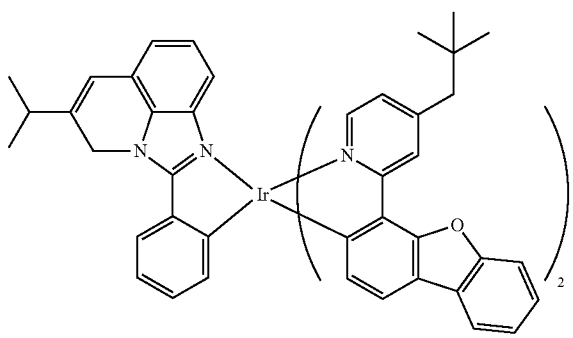
CPD 298
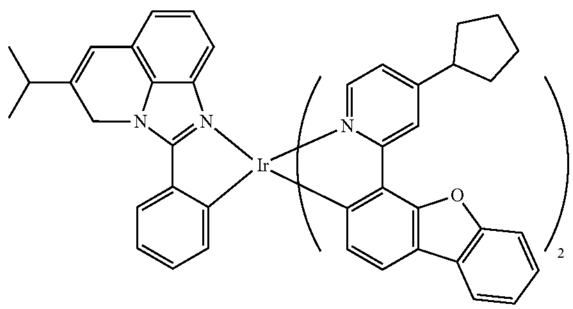
CPD 299
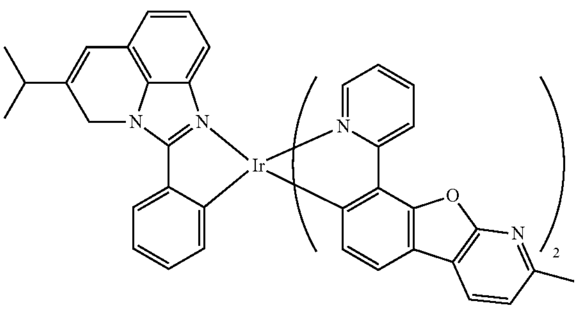
-continued
CPD 300
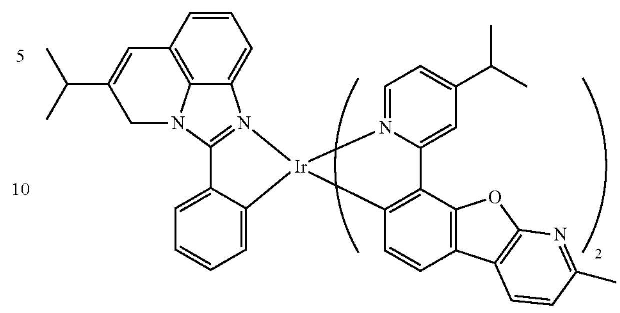
CPD 301
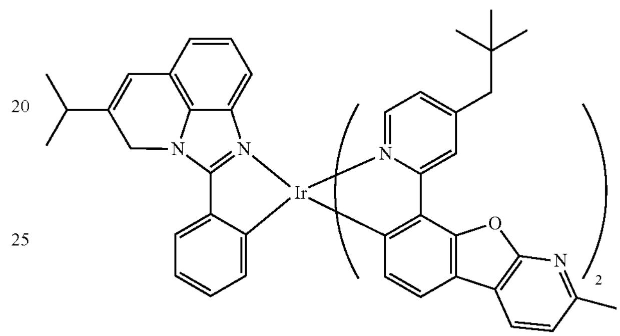
CPD 302
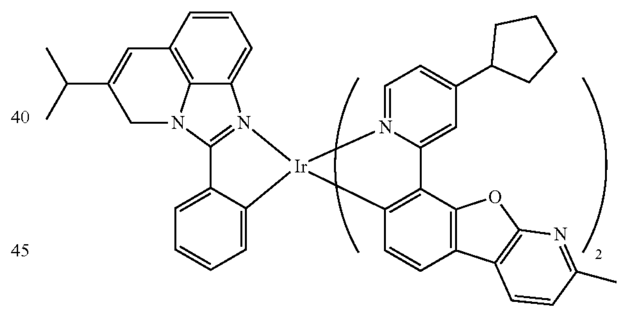
CPD 303
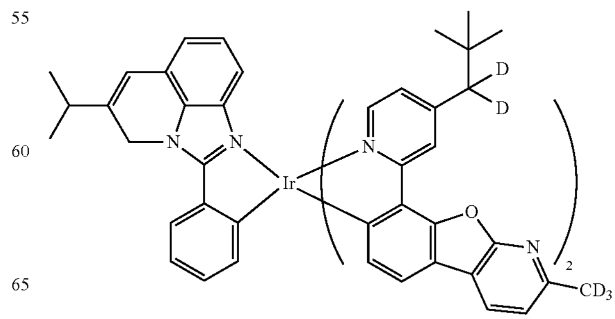

CPD 304
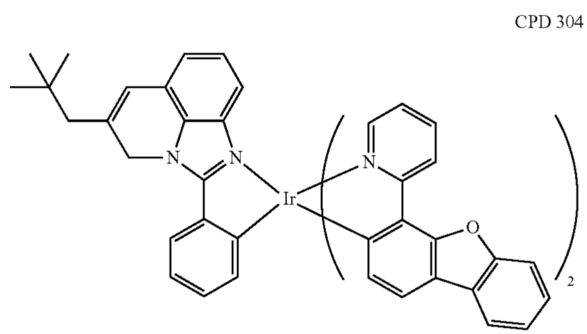
CPD 305
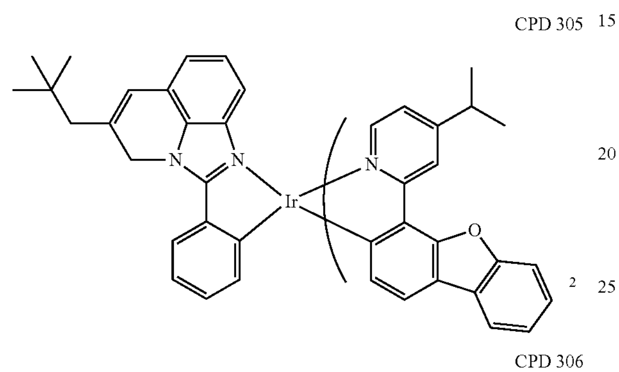
CPD 306
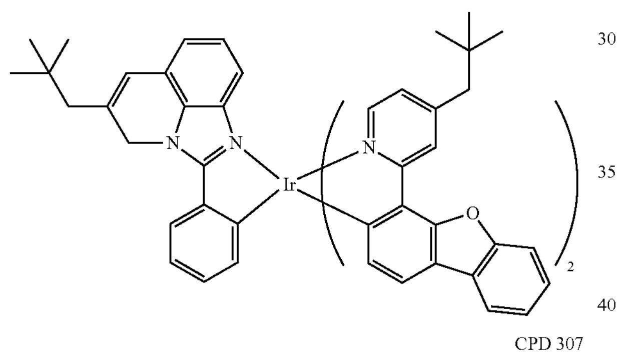
CPD 307
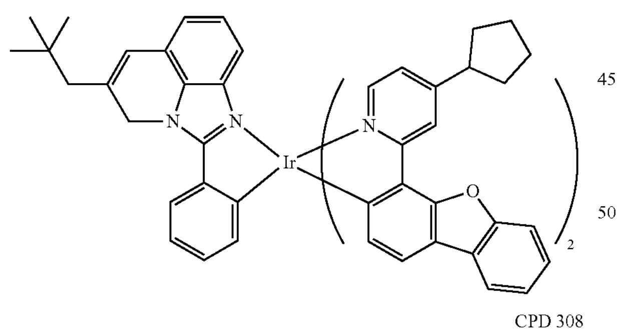
CPD 308
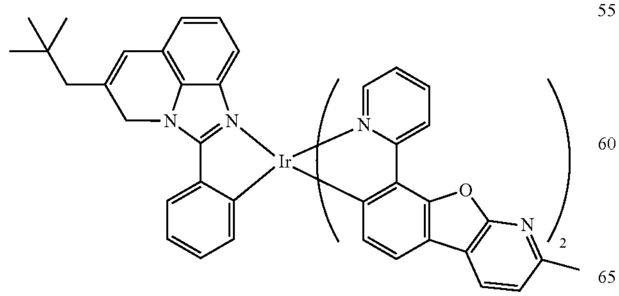
CPD 309
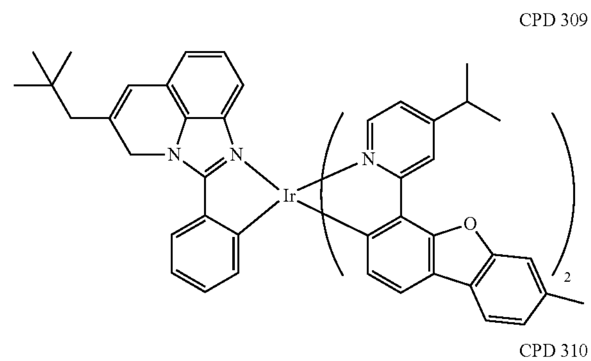
CPD 310
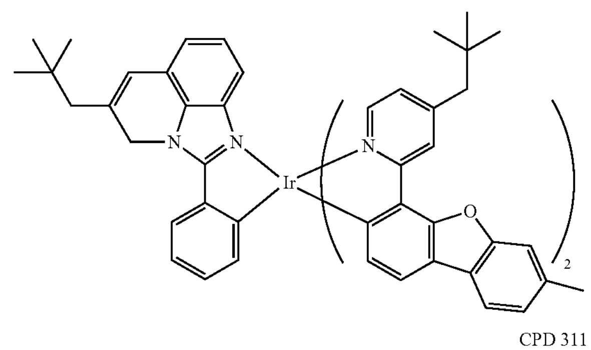
CPD 311
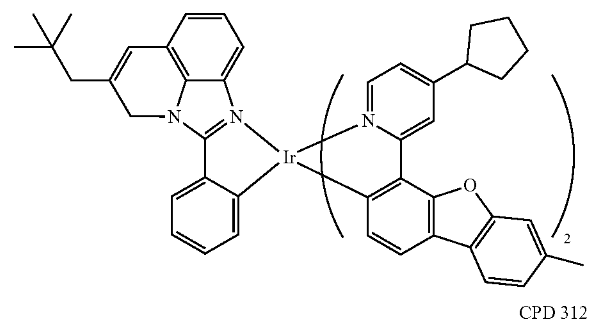
CPD 312
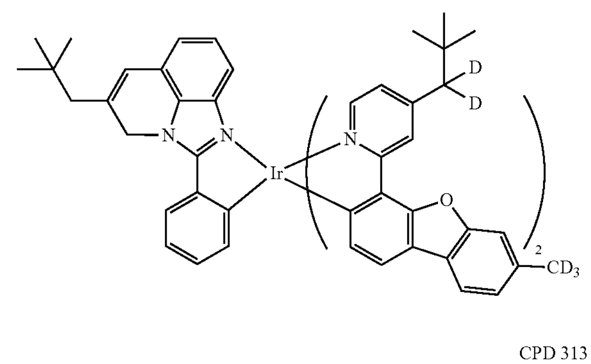
CPD 313
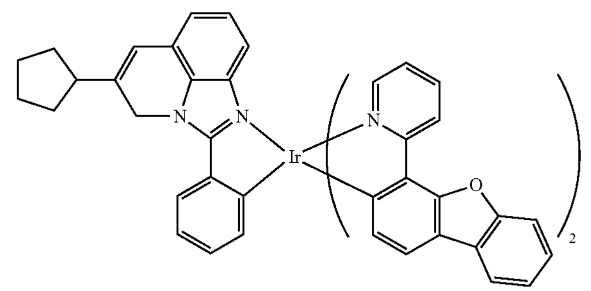

-continued

CPD 314

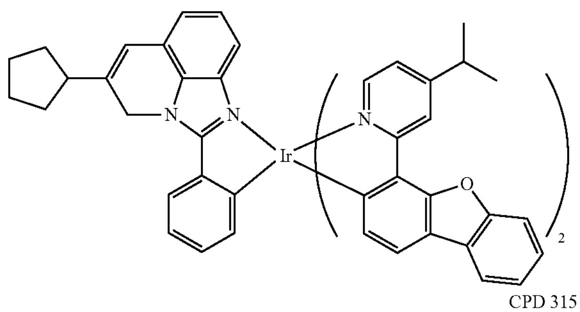

CPD 315

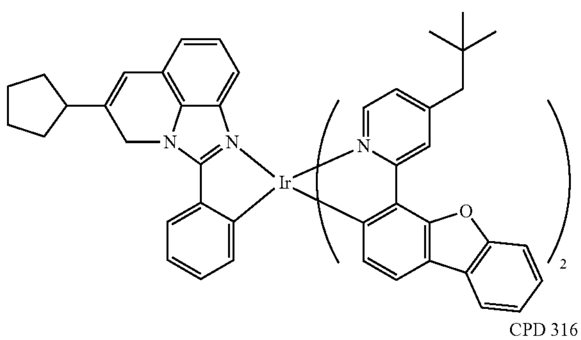

CPD 316

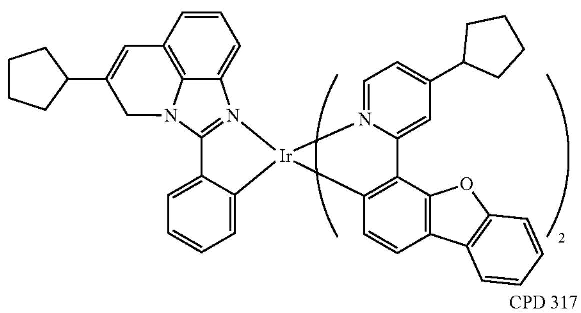

CPD 317

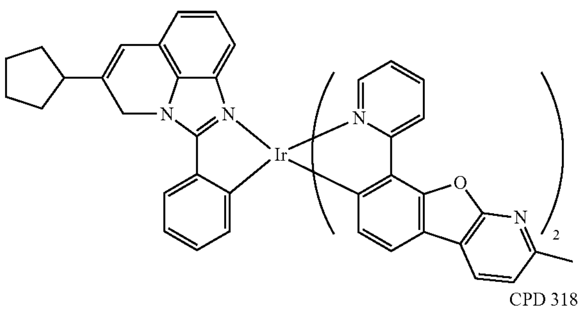

CPD 318

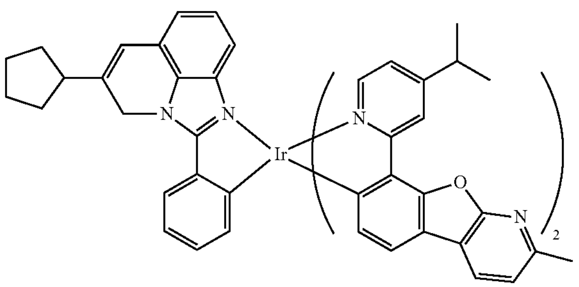

-continued

CPD 319

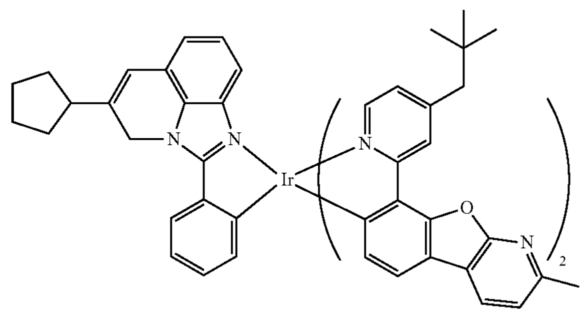

CPD 320

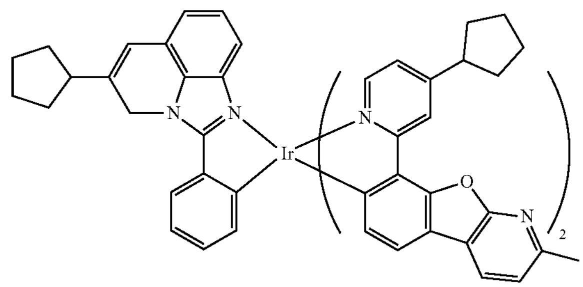

CPD 321

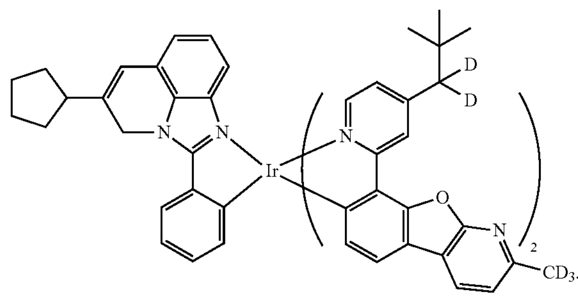

16. The organometallic compound according to claim 1 in an organic electroluminescent device.

17. The organometallic compound according to claim 16, wherein the organometallic compound is used as a green light-emitting doping material of a light-emitting layer in the organic electroluminescent device.

18. The organometallic compound according to claim 3, wherein at least one of the Rb and the Rc is not hydrogen.

19. The organometallic compound according to claim 2 in an organic electroluminescent device.

20. The organometallic compound according to claim 3 in an organic electroluminescent device.

* * * * *